United States Patent
Hall et al.

(10) Patent No.: US 9,744,858 B2
(45) Date of Patent: Aug. 29, 2017

(54) SYSTEM FOR WIRELESS ENERGY DISTRIBUTION IN A VEHICLE

(71) Applicant: WiTricity Corporation, Watertown, MA (US)

(72) Inventors: Katherine L. Hall, Arlington, MA (US); Konrad J. Kulikowski, Pine, CO (US); Morris P. Kesler, Bedford, MA (US); Andre B. Kurs, Chestnut Hill, MA (US); Steven J. Ganem, Medfield, MA (US); David A. Schatz, Needham, MA (US); Eric R. Giler, Boston, MA (US)

(73) Assignee: WiTricity Corporation, Watertown, MA (US)

( * ) Notice: Subject to any disclaimer, the term of this patent is extended or adjusted under 35 U.S.C. 154(b) by 0 days.

(21) Appl. No.: 15/130,246

(22) Filed: Apr. 15, 2016

(65) Prior Publication Data
US 2016/0221441 A1 Aug. 4, 2016

Related U.S. Application Data

(63) Continuation-in-part of application No. 13/834,366, filed on Mar. 15, 2013, now Pat. No. 9,318,922, (Continued)

(51) Int. Cl.
*B60L 1/00* (2006.01)
*H02J 50/12* (2016.01)
(Continued)

(52) U.S. Cl.
CPC .............. *B60L 1/00* (2013.01); *B60L 11/182* (2013.01); *H02J 5/005* (2013.01); *H02J 17/00* (2013.01);
(Continued)

(58) Field of Classification Search
CPC .... Y02T 10/7072; Y02T 90/14; Y02T 90/122
(Continued)

(56) References Cited

U.S. PATENT DOCUMENTS 645,576 A 3/1900 Telsa
649,621 A 5/1900 Tesla
(Continued)

FOREIGN PATENT DOCUMENTS

CA 142352 8/1912
CN 102239633 11/2011
(Continued)

OTHER PUBLICATIONS

"Intel CTO Says Gap between Humans, Machines Will Close by 2050", *Intel News Release*, (See intel.com/.../20080821comp.htm?iid=S . . . ) (Printed Nov. 6, 2009).
(Continued)

*Primary Examiner* — Robert Deberadinis
(74) *Attorney, Agent, or Firm* — Fish & Richardson P.C.

(57) ABSTRACT

Described herein are improved capabilities for a system and method for wireless energy distribution to a mechanically removable vehicle seat, comprising a source resonator coupled to an energy source of a vehicle, the source resonator positioned proximate to the mechanically removable vehicle seat, the source resonator generating an oscillating magnetic field with a resonant frequency and comprising a high-conductivity material adapted and located between the source resonator and a vehicle surface to direct the oscillating magnetic field away from the vehicle surface, and a receiving resonator integrated into the mechanically removable vehicle seat, the receiving resonator having a resonant frequency similar to that of the source resonator, and receiv-
(Continued)

ing wireless energy from the source resonator, and providing power to electrical components integrated with the mechanically removable vehicle seat.

18 Claims, 36 Drawing Sheets

Related U.S. Application Data which is a continuation-in-part of application No. 13/283,811, filed on Oct. 28, 2011, now abandoned, and a continuation-in-part of application No. 12/567,716, filed on Sep. 25, 2009, now Pat. No. 8,461,719, said application No. 13/283,811 is a continuation-in-part of application No. 13/232,868, filed on Sep. 14, 2011, now Pat. No. 9,065,423, and a continuation-in-part of application No. 12/899,281, filed on Oct. 6, 2010, now abandoned, which is a continuation-in-part of application No. 12/770,137, filed on Apr. 29, 2010, now abandoned, and a continuation-in-part of application No. 12/721,118, filed on Mar. 10, 2010, now Pat. No. 8,723,366, and a continuation-in-part of application No. 12/613,686, filed on Nov. 6, 2009, now Pat. No. 8,305,255, which is a continuation-in-part of application No. 12/567,716, filed on Sep. 25, 2009, now Pat. No. 8,461,719, said application No. 13/232,868 is a continuation-in-part of application No. 13/222,915, filed on Aug. 31, 2011, now abandoned, and a continuation-in-part of application No. 13/154,131, filed on Jun. 6, 2011, now Pat. No. 9,577,436, and a continuation-in-part of application No. 13/090,369, filed on Apr. 20, 2011, now Pat. No. 8,937,408, and a continuation-in-part of application No. 13/021,965, filed on Feb. 7, 2011, now Pat. No. 8,947,186, which is a continuation-in-part of application No. 12/986,018, filed on Jan. 6, 2011, now Pat. No. 8,643,326, said application No. 13/154,131 is a continuation-in-part of application No. 12/986,018, filed on Jan. 6, 2011, now Pat. No. 8,643,326, and a continuation-in-part of application No. 12/789,611, filed on May 28, 2010, now Pat. No. 8,598,743, which is a continuation-in-part of application No. 12/770,137, filed on Apr. 29, 2010, now abandoned, and a continuation-in-part of application No. 12/767,633, filed on Apr. 26, 2010, now Pat. No. 8,497,601, and a continuation-in-part of application No. 12/759,047, filed on Apr. 13, 2010, now Pat. No. 9,601,261, which is a continuation-in-part of application No. 12/757, 716, filed on Apr. 9, 2010, now abandoned, which is a continuation-in-part of application No. 12/749,571, filed on Mar. 30, 2010, now Pat. No. 8,692,412, which is a continuation-in-part of application No. 12/693,489, filed on Dec. 16, 2009, now Pat. No. 8,410,636, and a continuation-in-part of application No. 12/647,705, filed on Dec. 28, 2009, now Pat. No. 8,482,158, and a continuation-in-part of application No. 12/567,716, filed on Sep. 25, 2009, now Pat. No. 8,461,719, said application No. 12/757,716 is a continuation-in-part of application No. 12/721,118, filed on Mar. 10, 2010, now Pat. No. 8,723,366, which is a continuation-in-part of application No. 12/705,582, filed on Feb. 13, 2010, now Pat. No. 9,184,595, said application No. 13/283,811 is a continuation-in-part of application No. 12/860,375, filed on Aug. 20, 2010, now Pat. No. 8,772,973, which is a continuation-in-part of application No. 12/759,047, filed on Apr. 13, 2010, now Pat. No. 9,601,261, said application No. 13/283,811 is a continuation-in-part of application No. 12/722,050, filed on Mar. 11, 2010, now Pat. No. 8,106,539, which is a continuation-in-part of application No. 12/612,880, filed on Nov. 5, 2009, now Pat. No. 8,400,017, said application No. 12/722,050 is a continuation of application No. 12/698,523, filed on Feb. 2, 2010, now Pat. No. 8,552,592, said application No. 12/698,523 is a continuation-in-part of application No. 12/567,716, filed on Sep. 25, 2009, now Pat. No. 8,461,719, said application No. 12/612, 880 is a continuation-in-part of application No. 12/567,716, filed on Sep. 25, 2009, now Pat. No. 8,461,719.

(60) Provisional application No. 61/382,806, filed on Sep. 14, 2010, provisional application No. 61/378,600, filed on Aug. 31, 2010, provisional application No. 61/411,490, filed on Nov. 9, 2010, provisional application No. 61/351,492, filed on Jun. 4, 2010, provisional application No. 61/326,051, filed on Apr. 20, 2010, provisional application No. 61/292,768, filed on Jan. 6, 2010, provisional application No. 61/173,747, filed on Apr. 29, 2009, provisional application No. 61/172,633, filed on Apr. 24, 2009, provisional application No. 61/100,721, filed on Sep. 27, 2008, provisional application No. 61/108,743, filed on Oct. 27, 2008, provisional application No. 61/147,386, filed on Jan. 26, 2009, provisional application No. 61/152,086, filed on Feb. 12, 2009, provisional application No. 61/178,508, filed on May 15, 2009, provisional application No. 61/182,768, filed on Jun. 1, 2009, provisional application No. 61/121,159, filed on Dec. 9, 2008, provisional application No. 61/142,977, filed on Jan. 7, 2009, provisional application No. 61/142,885, filed on Jan. 6, 2009, provisional application No. 61/142,796, filed on Jan. 6, 2009, provisional application No. 61/142,889, filed on Jan. 6, 2009, provisional application No. 61/142,880, filed on Jan. 6, 2009, provisional application No. 61/142,818, filed on Jan. 6, 2009, provisional application No. 61/142,887, filed on Jan. 6, 2009, provisional application No. 61/156,764, filed on Mar. 2, 2009, provisional application No. 61/143,058, filed on Jan. 7, 2009, provisional application No. 61/163,695, filed on Mar. 26, 2009, provisional application No. 61/172,633, filed on Apr. 24, 2009, provisional application No. 61/169,240, filed on Apr. 14, 2009, provisional application No. 61/173,747, filed on Apr. 29, 2009, provisional application No. 61/152,390, filed on Feb. 13, 2009, provisional application No. 61/254,559, filed on Oct. 23, 2009.

(51) Int. Cl.
*H02J 50/90* (2016.01)
*H02J 50/80* (2016.01)
*H02J 5/00* (2016.01)
*H02J 17/00* (2006.01)
*B60L 11/18* (2006.01)
*H03H 7/40* (2006.01)

(52) U.S. Cl.
CPC .............. *H02J 50/12* (2016.02); *H02J 50/80* (2016.02); *H02J 50/90* (2016.02); *B60L 2200/26* (2013.01); *H03H 7/40* (2013.01);

Y02T 10/7005 (2013.01); Y02T 10/7072 (2013.01); Y02T 90/122 (2013.01); Y02T 90/14 (2013.01)

(58) Field of Classification Search
USPC .......................................................... 307/9.1
See application file for complete search history.

(56) References Cited

U.S. PATENT DOCUMENTS

| | | |
|---|---|---|
| 787,412 A | 4/1905 | Tesla |
| 1,119,732 A | 12/1914 | Tesla |
| 2,133,494 A | 10/1938 | Waters |
| 3,517,350 A | 6/1970 | Beaver |
| 3,535,543 A | 10/1970 | Dailey |
| 3,780,425 A | 12/1973 | Penn et al. |
| 3,871,176 A | 3/1975 | Schukei |
| 4,088,999 A | 5/1978 | Fletcher et al. |
| 4,095,998 A | 6/1978 | Hanson |
| 4,180,795 A | 12/1979 | Matsuda et al. |
| 4,280,129 A | 7/1981 | Wells |
| 4,450,431 A | 5/1984 | Hochstein |
| 4,588,978 A | 5/1986 | Allen |
| 5,027,709 A | 7/1991 | Slagle |
| 5,033,295 A | 7/1991 | Schmid et al. |
| 5,034,658 A | 7/1991 | Hiering et al. |
| 5,053,774 A | 10/1991 | Schuermann et al. |
| 5,070,293 A | 12/1991 | Ishii et al. |
| 5,118,997 A | 6/1992 | El-Hamamsy |
| 5,216,402 A | 6/1993 | Carosa |
| 5,229,652 A | 7/1993 | Hough |
| 5,287,112 A | 2/1994 | Schuermann |
| 5,341,083 A | 8/1994 | Klontz et al. |
| 5,367,242 A | 11/1994 | Hulman |
| 5,374,930 A | 12/1994 | Schuermann |
| 5,408,209 A | 4/1995 | Tanzer et al. |
| 5,437,057 A | 7/1995 | Richley et al. |
| 5,455,467 A | 10/1995 | Young et al. |
| 5,493,691 A | 2/1996 | Barrett |
| 5,522,856 A | 6/1996 | Reineman |
| 5,528,113 A | 6/1996 | Boys et al. |
| 5,541,604 A | 7/1996 | Meier |
| 5,550,452 A | 8/1996 | Shirai et al. |
| 5,565,763 A | 10/1996 | Arrendale et al. |
| 5,630,835 A | 5/1997 | Brownlee |
| 5,697,956 A | 12/1997 | Bornzin |
| 5,703,461 A | 12/1997 | Minoshima et al. |
| 5,703,573 A | 12/1997 | Fujimoto et al. |
| 5,710,413 A | 1/1998 | King et al. |
| 5,742,471 A | 4/1998 | Barbee, Jr. et al. |
| 5,821,728 A | 10/1998 | Sshwind |
| 5,821,731 A | 10/1998 | Kuki et al. |
| 5,864,323 A | 1/1999 | Berthon |
| 5,898,579 A | 4/1999 | Boys et al. |
| 5,903,134 A | 5/1999 | Takeuchi |
| 5,923,544 A | 7/1999 | Urano |
| 5,940,509 A | 8/1999 | Jovanovich et al. |
| 5,957,956 A | 9/1999 | Kroll et al. |
| 5,959,245 A | 9/1999 | Moe et al. |
| 5,986,895 A | 11/1999 | Stewart et al. |
| 5,993,996 A | 11/1999 | Firsich |
| 5,999,308 A | 12/1999 | Nelson et al. |
| 6,012,659 A | 1/2000 | Nakazawa et al. |
| 6,047,214 A | 4/2000 | Mueller et al. |
| 6,066,163 A | 5/2000 | John |
| 6,067,473 A | 5/2000 | Greeninger et al. |
| 6,108,579 A | 8/2000 | Snell et al. |
| 6,127,799 A | 10/2000 | Krishnan |
| 6,176,433 B1 | 1/2001 | Uesaka et al. |
| 6,184,651 B1 | 2/2001 | Fernandez et al. |
| 6,207,887 B1 | 3/2001 | Bass et al. |
| 6,232,841 B1 | 5/2001 | Bartlett et al. |
| 6,238,387 B1 | 5/2001 | Miller, III |
| 6,252,762 B1 | 6/2001 | Amatucci |
| 6,436,299 B1 | 8/2002 | Baarman et al. |
| 6,450,946 B1 | 9/2002 | Forsell |
| 6,452,465 B1 | 9/2002 | Brown et al. |
| 6,459,218 B2 | 10/2002 | Boys et al. |
| 6,473,028 B1 | 10/2002 | Luc |
| 6,483,202 B1 | 11/2002 | Boys |
| 6,515,878 B1 | 2/2003 | Meins et al. |
| 6,535,133 B2 | 3/2003 | Gohara |
| 6,561,975 B1 | 5/2003 | Pool et al. |
| 6,563,425 B2 | 5/2003 | Nicholson et al. |
| 6,597,076 B2 | 7/2003 | Scheible et al. |
| 6,609,023 B1 | 8/2003 | Fischell et al. |
| 6,631,072 B1 | 10/2003 | Paul et al. |
| 6,650,227 B1 | 11/2003 | Bradin |
| 6,664,770 B1 | 12/2003 | Bartels |
| 6,673,250 B2 | 1/2004 | Kuennen et al. |
| 6,683,256 B2 | 1/2004 | Kao |
| 6,696,647 B2 | 2/2004 | Ono et al. |
| 6,703,921 B1 | 3/2004 | Wuidart et al. |
| 6,731,071 B2 | 5/2004 | Baarman |
| 6,749,119 B2 | 6/2004 | Scheible et al. |
| 6,772,011 B2 | 8/2004 | Dolgin |
| 6,798,716 B1 | 9/2004 | Charych |
| 6,803,744 B1 | 10/2004 | Sabo |
| 6,806,649 B2 | 10/2004 | Mollema et al. |
| 6,812,645 B2 | 11/2004 | Baarman |
| 6,825,620 B2 | 11/2004 | Kuennen et al. |
| 6,831,417 B2 | 12/2004 | Baarman |
| 6,839,035 B1 | 1/2005 | Addonisio et al. |
| 6,844,702 B2 | 1/2005 | Giannopoulos et al. |
| 6,856,291 B2 | 2/2005 | Mickle et al. |
| 6,858,970 B2 | 2/2005 | Malkin et al. |
| 6,906,495 B2 | 6/2005 | Cheng et al. |
| 6,917,163 B2 | 7/2005 | Baarman |
| 6,917,431 B2 | 7/2005 | Soljacic et al. |
| 6,937,130 B2 | 8/2005 | Scheible et al. |
| 6,960,968 B2 | 11/2005 | Odendaal et al. |
| 6,961,619 B2 | 11/2005 | Casey |
| 6,967,462 B1 | 11/2005 | Landis |
| 6,975,198 B2 | 12/2005 | Baarman |
| 6,988,026 B2 | 1/2006 | Breed et al. |
| 7,027,311 B2 | 4/2006 | Vanderelli et al. |
| 7,035,076 B1 | 4/2006 | Stevenson |
| 7,042,196 B2 | 5/2006 | Ka-Lai et al. |
| 7,069,064 B2 | 6/2006 | Govorgian et al. |
| 7,084,605 B2 | 8/2006 | Mickle et al. |
| 7,116,200 B2 | 10/2006 | Baarman et al. |
| 7,118,240 B2 | 10/2006 | Baarman et al. |
| 7,126,450 B2 | 10/2006 | Baarman et al. |
| 7,127,293 B2 | 10/2006 | MacDonald |
| 7,132,918 B2 | 11/2006 | Baarman et al. |
| 7,147,604 B1 | 12/2006 | Allen et al. |
| 7,180,248 B2 | 2/2007 | Kuennen et al. |
| 7,191,007 B2 | 3/2007 | Desai et al. |
| 7,193,418 B2 | 3/2007 | Freytag |
| D541,322 S | 4/2007 | Garrett et al. |
| 7,212,414 B2 | 5/2007 | Baarman |
| 7,233,137 B2 | 6/2007 | Nakamura et al. |
| D545,855 S | 7/2007 | Garrett et al. |
| 7,239,110 B2 | 7/2007 | Cheng et al. |
| 7,248,017 B2 | 7/2007 | Cheng et al. |
| 7,251,527 B2 | 7/2007 | Lyden |
| 7,288,918 B2 | 10/2007 | DiStefano |
| 7,340,304 B2 | 3/2008 | MacDonald |
| 7,375,492 B2 | 5/2008 | Calhoon et al. |
| 7,375,493 B2 | 5/2008 | Calhoon et al. |
| 7,378,817 B2 | 5/2008 | Calhoon et al. |
| 7,382,636 B2 | 6/2008 | Baarman et al. |
| 7,385,357 B2 | 6/2008 | Kuennen et al. |
| 7,443,135 B2 | 10/2008 | Cho |
| 7,462,951 B1 | 12/2008 | Baarman |
| 7,466,213 B2 | 12/2008 | Lobl et al. |
| 7,471,062 B2 | 12/2008 | Bruning |
| 7,474,058 B2 | 1/2009 | Baarman |
| 7,492,247 B2 | 2/2009 | Schmidt et al. |
| 7,514,818 B2 | 4/2009 | Abe et al. |
| 7,518,267 B2 | 4/2009 | Baarman |
| 7,521,890 B2 | 4/2009 | Lee et al. |
| 7,525,283 B2 | 4/2009 | Cheng et al. |
| 7,545,337 B2 | 6/2009 | Guenther |
| 7,554,316 B2 | 6/2009 | Stevens et al. |
| 7,599,743 B2 | 10/2009 | Hassler, Jr. et al. |

(56) References Cited

U.S. PATENT DOCUMENTS

| | | |
|---|---|---|
| 7,615,936 B2 | 11/2009 | Baarman et al. |
| 7,639,514 B2 | 12/2009 | Baarman |
| 7,741,734 B2 | 6/2010 | Joannopoulos et al. |
| 7,795,708 B2 | 9/2010 | Katti |
| 7,825,543 B2 | 11/2010 | Karalis et al. |
| 7,825,544 B2 | 11/2010 | Jansen et al. |
| 7,835,417 B2 | 11/2010 | Heideman et al. |
| 7,843,288 B2 | 11/2010 | Lee et al. |
| 7,844,306 B2 | 11/2010 | Shearer et al. |
| 7,863,859 B2 | 1/2011 | Soar |
| 7,880,337 B2 | 2/2011 | Farkas |
| 7,884,697 B2 | 2/2011 | Wei et al. |
| 7,885,050 B2 | 2/2011 | Lee |
| 7,919,886 B2 | 4/2011 | Tanaka |
| 7,923,870 B2 | 4/2011 | Jin |
| 7,932,798 B2 | 4/2011 | Tolle et al. |
| 7,948,209 B2 | 5/2011 | Jung |
| 7,952,322 B2 | 5/2011 | Partovi et al. |
| 7,963,941 B2 | 6/2011 | Wilk |
| 7,969,045 B2 | 6/2011 | Schmidt et al. |
| 7,994,880 B2 | 8/2011 | Chen et al. |
| 7,999,506 B1 | 8/2011 | Hollar et al. |
| 8,022,576 B2 | 9/2011 | Joannopoulos et al. |
| 8,035,255 B2 | 10/2011 | Kurs et al. |
| 8,076,800 B2 | 12/2011 | Joannopoulos et al. |
| 8,076,801 B2 | 12/2011 | Karalis et al. |
| 8,084,889 B2 | 12/2011 | Joannopoulos et al. |
| 8,097,983 B2 | 1/2012 | Karalis et al. |
| 8,106,539 B2 | 1/2012 | Schatz et al. |
| 8,115,448 B2 | 2/2012 | John |
| 8,131,378 B2 | 3/2012 | Greenberg et al. |
| 8,178,995 B2 | 5/2012 | Amano et al. |
| 8,193,769 B2 | 6/2012 | Azancot et al. |
| 8,212,414 B2 | 7/2012 | Howard et al. |
| 8,260,200 B2 | 9/2012 | Shimizu et al. |
| 8,304,935 B2 | 11/2012 | Karalis et al. |
| 8,324,759 B2 | 12/2012 | Karalis et al. |
| 8,334,620 B2 | 12/2012 | Park et al. |
| 8,362,651 B2 | 1/2013 | Hamam et al. |
| 8,395,282 B2 | 3/2013 | Joannopoulos et al. |
| 8,395,283 B2 | 3/2013 | Joannopoulos et al. |
| 8,400,017 B2 | 3/2013 | Kurs et al. |
| 8,400,018 B2 | 3/2013 | Joannopoulos et al. |
| 8,400,019 B2 | 3/2013 | Joannopoulos et al. |
| 8,400,020 B2 | 3/2013 | Joannopoulos et al. |
| 8,400,021 B2 | 3/2013 | Joannopoulos et al. |
| 8,400,022 B2 | 3/2013 | Joannopoulos et al. |
| 8,400,023 B2 | 3/2013 | Joannopoulos et al. |
| 8,400,024 B2 | 3/2013 | Joannopoulos et al. |
| 8,410,636 B2 | 4/2013 | Kurs et al. |
| 8,441,154 B2 | 5/2013 | Karalis et al. |
| 8,457,547 B2 | 6/2013 | Meskens |
| 8,461,719 B2 | 6/2013 | Kesler et al. |
| 8,461,720 B2 | 6/2013 | Kurs et al. |
| 8,461,721 B2 | 6/2013 | Karalis et al. |
| 8,461,722 B2 | 6/2013 | Kurs et al. |
| 8,461,817 B2 | 6/2013 | Martin et al. |
| 8,466,583 B2 | 6/2013 | Karalis et al. |
| 8,471,410 B2 | 6/2013 | Karalis et al. |
| 8,476,788 B2 | 7/2013 | Karalis et al. |
| 8,482,157 B2 | 7/2013 | Cook et al. |
| 8,482,158 B2 | 7/2013 | Kurs et al. |
| 8,487,480 B1 | 7/2013 | Kesler et al. |
| 8,497,601 B2 | 7/2013 | Hall et al. |
| 8,552,592 B2 | 10/2013 | Schatz et al. |
| 8,569,914 B2 | 10/2013 | Karalis et al. |
| 8,587,153 B2 | 11/2013 | Schatz et al. |
| 8,587,155 B2 | 11/2013 | Giler et al. |
| 8,598,743 B2 | 12/2013 | Hall et al. |
| 8,618,696 B2 | 12/2013 | Kurs et al. |
| 8,629,578 B2 | 1/2014 | Kurs et al. |
| 8,643,326 B2 | 2/2014 | Campanella et al. |
| 8,783,752 B2 | 7/2014 | Lambert et al. |
| 2002/0032471 A1 | 3/2002 | Loftin et al. |
| 2002/0105343 A1 | 8/2002 | Scheible et al. |
| 2002/0118004 A1 | 8/2002 | Scheible et al. |
| 2002/0130642 A1 | 9/2002 | Ettes et al. |
| 2002/0167294 A1 | 11/2002 | Odaohhara |
| 2003/0038641 A1 | 2/2003 | Scheible |
| 2003/0062794 A1 | 4/2003 | Scheible et al. |
| 2003/0062980 A1 | 4/2003 | Scheible et al. |
| 2003/0071034 A1 | 4/2003 | Thompson et al. |
| 2003/0124050 A1 | 7/2003 | Yadav et al. |
| 2003/0126948 A1 | 7/2003 | Yadav et al. |
| 2003/0160590 A1 | 8/2003 | Schaefer et al. |
| 2003/0199778 A1 | 10/2003 | Mickle et al. |
| 2003/0214255 A1 | 11/2003 | Baarman et al. |
| 2004/0000974 A1 | 1/2004 | Odenaal et al. |
| 2004/0026998 A1 | 2/2004 | Henriott et al. |
| 2004/0100338 A1 | 5/2004 | Clark |
| 2004/0113847 A1 | 6/2004 | Qi et al. |
| 2004/0130425 A1 | 7/2004 | Dayan et al. |
| 2004/0130915 A1 | 7/2004 | Baarman |
| 2004/0130916 A1 | 7/2004 | Baarman |
| 2004/0142733 A1 | 7/2004 | Parise |
| 2004/0150934 A1 | 8/2004 | Baarman |
| 2004/0189246 A1 | 9/2004 | Bulai et al. |
| 2004/0201361 A1 | 10/2004 | Koh et al. |
| 2004/0222751 A1 | 11/2004 | Mollema et al. |
| 2004/0227057 A1 | 11/2004 | Tuominen et al. |
| 2004/0232845 A1 | 11/2004 | Baarman |
| 2004/0233043 A1 | 11/2004 | Yazawa et al. |
| 2004/0267501 A1 | 12/2004 | Freed et al. |
| 2005/0007067 A1 | 1/2005 | Baarman et al. |
| 2005/0021134 A1 | 1/2005 | Opie |
| 2005/0027192 A1 | 2/2005 | Govari et al. |
| 2005/0033382 A1 | 2/2005 | Single |
| 2005/0085873 A1 | 4/2005 | Gord et al. |
| 2005/0093475 A1 | 5/2005 | Kuennen et al. |
| 2005/0104064 A1 | 5/2005 | Hegarty et al. |
| 2005/0104453 A1 | 5/2005 | Vanderelli et al. |
| 2005/0116650 A1 | 6/2005 | Baarman |
| 2005/0116683 A1 | 6/2005 | Cheng et al. |
| 2005/0122058 A1 | 6/2005 | Baarman et al. |
| 2005/0122059 A1 | 6/2005 | Baarman et al. |
| 2005/0125093 A1 | 6/2005 | Kikuchi et al. |
| 2005/0127849 A1 | 6/2005 | Baarman et al. |
| 2005/0127850 A1 | 6/2005 | Baarman et al. |
| 2005/0127866 A1 | 6/2005 | Hamilton et al. |
| 2005/0135122 A1 | 6/2005 | Cheng et al. |
| 2005/0140482 A1 | 6/2005 | Cheng et al. |
| 2005/0151511 A1 | 7/2005 | Chary |
| 2005/0156560 A1 | 7/2005 | Shimaoka et al. |
| 2005/0189945 A1 | 9/2005 | Reiderman |
| 2005/0194926 A1 | 9/2005 | DiStefano |
| 2005/0253152 A1 | 11/2005 | Klimov et al. |
| 2005/0288739 A1 | 12/2005 | Hassler, Jr. et al. |
| 2005/0288740 A1 | 12/2005 | Hassler, Jr. et al. |
| 2005/0288741 A1 | 12/2005 | Hassler, Jr. et al. |
| 2005/0288742 A1 | 12/2005 | Giordano et al. |
| 2006/0001509 A1 | 1/2006 | Gibbs |
| 2006/0010902 A1 | 1/2006 | Trinh et al. |
| 2006/0022636 A1 | 2/2006 | Xian et al. |
| 2006/0053296 A1 | 3/2006 | Busboom et al. |
| 2006/0061323 A1 | 3/2006 | Cheng et al. |
| 2006/0066443 A1 | 3/2006 | Hall |
| 2006/0090956 A1 | 5/2006 | Peshkovskiy et al. |
| 2006/0132045 A1 | 6/2006 | Baarman |
| 2006/0164866 A1 | 7/2006 | Vanderelli et al. |
| 2006/0181242 A1 | 8/2006 | Freed et al. |
| 2006/0184209 A1 | 8/2006 | John et al. |
| 2006/0184210 A1 | 8/2006 | Singhal et al. |
| 2006/0185809 A1 | 8/2006 | Elfrink et al. |
| 2006/0199620 A1 | 9/2006 | Greene et al. |
| 2006/0202665 A1 | 9/2006 | Hsu |
| 2006/0205381 A1 | 9/2006 | Beart et al. |
| 2006/0214626 A1 | 9/2006 | Nilson et al. |
| 2006/0219448 A1 | 10/2006 | Grieve et al. |
| 2006/0238365 A1 | 10/2006 | Vecchione et al. |
| 2006/0270440 A1 | 11/2006 | Shearer et al. |
| 2006/0281435 A1 | 12/2006 | Shearer et al. |
| 2007/0010295 A1 | 1/2007 | Greene et al. |
| 2007/0013483 A1 | 1/2007 | Stewart |
| 2007/0016089 A1 | 1/2007 | Fischell et al. |

(56) References Cited

U.S. PATENT DOCUMENTS

| | | |
|---|---|---|
| 2007/0021140 A1 | 1/2007 | Keyes, IV et al. |
| 2007/0024246 A1 | 2/2007 | Flaugher |
| 2007/0064406 A1 | 3/2007 | Beart |
| 2007/0069687 A1 | 3/2007 | Suzuki |
| 2007/0096875 A1 | 5/2007 | Waterhouse et al. |
| 2007/0105429 A1 | 5/2007 | Kohl et al. |
| 2007/0117596 A1 | 5/2007 | Greene et al. |
| 2007/0126650 A1 | 6/2007 | Guenther |
| 2007/0145830 A1 | 6/2007 | Lee et al. |
| 2007/0164839 A1 | 7/2007 | Naito |
| 2007/0171681 A1 | 7/2007 | Baarman |
| 2007/0176840 A1 | 8/2007 | Pristas et al. |
| 2007/0178945 A1 | 8/2007 | Cook et al. |
| 2007/0182367 A1 | 8/2007 | Partovi |
| 2007/0208263 A1 | 9/2007 | John et al. |
| 2007/0222542 A1 | 9/2007 | Joannopoulos et al. |
| 2007/0257636 A1 | 11/2007 | Phillips et al. |
| 2007/0267918 A1 | 11/2007 | Gyland |
| 2007/0276538 A1 | 11/2007 | Kjellsson et al. |
| 2008/0012569 A1 | 1/2008 | Hall et al. |
| 2008/0014897 A1 | 1/2008 | Cook et al. |
| 2008/0030415 A1 | 2/2008 | Homan et al. |
| 2008/0036588 A1 | 2/2008 | Iverson et al. |
| 2008/0047727 A1 | 2/2008 | Sexton et al. |
| 2008/0051854 A1 | 2/2008 | Bulkes et al. |
| 2008/0067874 A1 | 3/2008 | Tseng |
| 2008/0132909 A1 | 6/2008 | Jascob et al. |
| 2008/0154331 A1 | 6/2008 | John et al. |
| 2008/0176521 A1 | 7/2008 | Singh et al. |
| 2008/0191638 A1 | 8/2008 | Kuennen et al. |
| 2008/0197710 A1 | 8/2008 | Kreitz et al. |
| 2008/0197802 A1 | 8/2008 | Onishi et al. |
| 2008/0211320 A1 | 9/2008 | Cook et al. |
| 2008/0238364 A1 | 10/2008 | Weber et al. |
| 2008/0255901 A1 | 10/2008 | Carroll et al. |
| 2008/0265684 A1 | 10/2008 | Farkas |
| 2008/0266748 A1 | 10/2008 | Lee |
| 2008/0272860 A1 | 11/2008 | Pance |
| 2008/0273242 A1 | 11/2008 | Woodgate et al. |
| 2008/0278264 A1 | 11/2008 | Karalis et al. |
| 2008/0291277 A1 | 11/2008 | Jacobsen et al. |
| 2008/0300657 A1 | 12/2008 | Stultz |
| 2008/0300660 A1 | 12/2008 | John |
| 2009/0010028 A1 | 1/2009 | Baarman et al. |
| 2009/0015075 A1 | 1/2009 | Cook et al. |
| 2009/0033280 A1 | 2/2009 | Choi et al. |
| 2009/0033564 A1 | 2/2009 | Cook et al. |
| 2009/0038623 A1 | 2/2009 | Farbarik et al. |
| 2009/0045772 A1 | 2/2009 | Cook et al. |
| 2009/0051224 A1 | 2/2009 | Cook et al. |
| 2009/0058189 A1 | 3/2009 | Cook et al. |
| 2009/0058361 A1 | 3/2009 | John |
| 2009/0067198 A1 | 3/2009 | Graham et al. |
| 2009/0072627 A1 | 3/2009 | Cook et al. |
| 2009/0072628 A1 | 3/2009 | Cook et al. |
| 2009/0072629 A1 | 3/2009 | Cook et al. |
| 2009/0072782 A1 | 3/2009 | Randall |
| 2009/0079268 A1 | 3/2009 | Cook et al. |
| 2009/0079387 A1 | 3/2009 | Jin et al. |
| 2009/0085408 A1 | 4/2009 | Bruhn |
| 2009/0085706 A1 | 4/2009 | Baarman et al. |
| 2009/0096413 A1 | 4/2009 | Patovi et al. |
| 2009/0102292 A1 | 4/2009 | Cook et al. |
| 2009/0108679 A1 | 4/2009 | Porwal |
| 2009/0108997 A1 | 4/2009 | Patterson et al. |
| 2009/0115628 A1 | 5/2009 | Dicks et al. |
| 2009/0127937 A1 | 5/2009 | Widmer et al. |
| 2009/0134712 A1 | 5/2009 | Cook et al. |
| 2009/0146892 A1 | 6/2009 | Shimizu et al. |
| 2009/0153273 A1 | 6/2009 | Chen |
| 2009/0160261 A1 | 6/2009 | Elo |
| 2009/0161078 A1 | 6/2009 | Wu et al. |
| 2009/0167449 A1 | 7/2009 | Cook et al. |
| 2009/0174263 A1 | 7/2009 | Baarman et al. |
| 2009/0179502 A1 | 7/2009 | Cook et al. |
| 2009/0188396 A1 | 7/2009 | Hofmann et al. |
| 2009/0189458 A1 | 7/2009 | Kawasaki |
| 2009/0195332 A1 | 8/2009 | Joannopoulos et al. |
| 2009/0195333 A1 | 8/2009 | Joannopoulos et al. |
| 2009/0212636 A1 | 8/2009 | Cook et al. |
| 2009/0213028 A1 | 8/2009 | Cook et al. |
| 2009/0218884 A1 | 9/2009 | Soar |
| 2009/0224608 A1 | 9/2009 | Cook et al. |
| 2009/0224609 A1 | 9/2009 | Cook et al. |
| 2009/0224723 A1 | 9/2009 | Tanabe |
| 2009/0224856 A1 | 9/2009 | Karalis et al. |
| 2009/0230777 A1 | 9/2009 | Baarman et al. |
| 2009/0237194 A1 | 9/2009 | Waffenschmidt et al. |
| 2009/0243394 A1 | 10/2009 | Levine |
| 2009/0243397 A1 | 10/2009 | Cook et al. |
| 2009/0251008 A1 | 10/2009 | Sugaya |
| 2009/0261778 A1 | 10/2009 | Kook |
| 2009/0267558 A1 | 10/2009 | Jung |
| 2009/0267709 A1 | 10/2009 | Joannopoulos et al. |
| 2009/0267710 A1 | 10/2009 | Joannopoulos et al. |
| 2009/0271047 A1 | 10/2009 | Wakamatsu |
| 2009/0271048 A1 | 10/2009 | Wakamatsu |
| 2009/0273242 A1 | 11/2009 | Cook |
| 2009/0273318 A1 | 11/2009 | Rondoni et al. |
| 2009/0281678 A1 | 11/2009 | Wakamatsu |
| 2009/0284082 A1 | 11/2009 | Mohammadian |
| 2009/0284083 A1 | 11/2009 | Karalis et al. |
| 2009/0284218 A1 | 11/2009 | Mohammadian et al. |
| 2009/0284220 A1 | 11/2009 | Toncich et al. |
| 2009/0284227 A1 | 11/2009 | Mohammadian et al. |
| 2009/0284245 A1 | 11/2009 | Kirby et al. |
| 2009/0284369 A1 | 11/2009 | Toncich et al. |
| 2009/0286470 A1 | 11/2009 | Mohammadian et al. |
| 2009/0286475 A1 | 11/2009 | Toncich et al. |
| 2009/0286476 A1 | 11/2009 | Toncich et al. |
| 2009/0289595 A1 | 11/2009 | Chen et al. |
| 2009/0299918 A1 | 12/2009 | Cook et al. |
| 2009/0308933 A1 | 12/2009 | Osada |
| 2009/0322158 A1 | 12/2009 | Stevens et al. |
| 2009/0322280 A1 | 12/2009 | Kamijo et al. |
| 2010/0015918 A1 | 1/2010 | Liu et al. |
| 2010/0017249 A1 | 1/2010 | Fincham et al. |
| 2010/0033021 A1 | 2/2010 | Bennett |
| 2010/0034238 A1 | 2/2010 | Bennett |
| 2010/0036773 A1 | 2/2010 | Bennett |
| 2010/0038970 A1 | 2/2010 | Cook et al. |
| 2010/0045114 A1 | 2/2010 | Sample et al. |
| 2010/0052431 A1 | 3/2010 | Mita |
| 2010/0052811 A1 | 3/2010 | Smith et al. |
| 2010/0060077 A1 | 3/2010 | Paulus et al. |
| 2010/0065352 A1 | 3/2010 | Ichikawa |
| 2010/0066349 A1 | 3/2010 | Lin et al. |
| 2010/0076524 A1 | 3/2010 | Forsberg et al. |
| 2010/0081379 A1 | 4/2010 | Cooper et al. |
| 2010/0094381 A1 | 4/2010 | Kim et al. |
| 2010/0096934 A1 | 4/2010 | Joannopoulos et al. |
| 2010/0102639 A1 | 4/2010 | Joannopoulos et al. |
| 2010/0102640 A1 | 4/2010 | Joannopoulos et al. |
| 2010/0102641 A1 | 4/2010 | Joannopoulos et al. |
| 2010/0104031 A1 | 4/2010 | Lacour |
| 2010/0109443 A1 | 5/2010 | Cook et al. |
| 2010/0109445 A1 | 5/2010 | Kurs et al. |
| 2010/0109604 A1 | 5/2010 | Boys et al. |
| 2010/0115474 A1 | 5/2010 | Takada et al. |
| 2010/0117454 A1 | 5/2010 | Cook et al. |
| 2010/0117455 A1 | 5/2010 | Joannopoulos et al. |
| 2010/0117456 A1 | 5/2010 | Karalis et al. |
| 2010/0117596 A1 | 5/2010 | Cook et al. |
| 2010/0123353 A1 | 5/2010 | Joannopoulos et al. |
| 2010/0123354 A1 | 5/2010 | Joannopoulos et al. |
| 2010/0123355 A1 | 5/2010 | Joannopoulos et al. |
| 2010/0123452 A1 | 5/2010 | Amano et al. |
| 2010/0123530 A1 | 5/2010 | Park et al. |
| 2010/0127573 A1 | 5/2010 | Joannopoulos et al. |
| 2010/0127574 A1 | 5/2010 | Joannopoulos et al. |
| 2010/0127575 A1 | 5/2010 | Joannopoulos et al. |
| 2010/0127660 A1 | 5/2010 | Cook et al. |
| 2010/0133918 A1 | 6/2010 | Joannopoulos et al. |
| 2010/0133919 A1 | 6/2010 | Joannopoulos et al. |

(56) References Cited

U.S. PATENT DOCUMENTS

| | | |
|---|---|---|
| 2010/0133920 A1 | 6/2010 | Joannopoulos et al. |
| 2010/0141042 A1 | 6/2010 | Kesler et al. |
| 2010/0148589 A1 | 6/2010 | Hamam et al. |
| 2010/0148723 A1 | 6/2010 | Cook et al. |
| 2010/0151808 A1 | 6/2010 | Toncich et al. |
| 2010/0156346 A1 | 6/2010 | Takada et al. |
| 2010/0156355 A1 | 6/2010 | Bauerle et al. |
| 2010/0156570 A1 | 6/2010 | Hong et al. |
| 2010/0164295 A1 | 7/2010 | Ichikawa et al. |
| 2010/0164296 A1 | 7/2010 | Kurs |
| 2010/0164297 A1 | 7/2010 | Kurs et al. |
| 2010/0164298 A1 | 7/2010 | Karalis et al. |
| 2010/0171368 A1 | 7/2010 | Schatz et al. |
| 2010/0171370 A1 | 7/2010 | Karalis et al. |
| 2010/0179384 A1 | 7/2010 | Hoeg et al. |
| 2010/0181843 A1 | 7/2010 | Schatz et al. |
| 2010/0181844 A1 | 7/2010 | Karalis et al. |
| 2010/0181845 A1 | 7/2010 | Fiorello et al. |
| 2010/0181961 A1 | 7/2010 | Novak et al. |
| 2010/0181964 A1 | 7/2010 | Huggins et al. |
| 2010/0184371 A1 | 7/2010 | Cook et al. |
| 2010/0187911 A1 | 7/2010 | Joannopoulos et al. |
| 2010/0187913 A1 | 7/2010 | Sample |
| 2010/0188183 A1 | 7/2010 | Shpiro |
| 2010/0190435 A1 | 7/2010 | Cook et al. |
| 2010/0190436 A1 | 7/2010 | Cook et al. |
| 2010/0194206 A1 | 8/2010 | Burdo et al. |
| 2010/0194207 A1 | 8/2010 | Graham |
| 2010/0194334 A1 | 8/2010 | Kirby et al. |
| 2010/0194335 A1 | 8/2010 | Kirby et al. |
| 2010/0201189 A1 | 8/2010 | Kirby et al. |
| 2010/0201201 A1 | 8/2010 | Mobarhan et al. |
| 2010/0201202 A1 | 8/2010 | Kirby et al. |
| 2010/0201203 A1 | 8/2010 | Schatz et al. |
| 2010/0201204 A1 | 8/2010 | Sakoda et al. |
| 2010/0201205 A1 | 8/2010 | Karalis et al. |
| 2010/0201310 A1 | 8/2010 | Vorenkamp et al. |
| 2010/0201312 A1 | 8/2010 | Kirby et al. |
| 2010/0201313 A1 | 8/2010 | Vorenkamp et al. |
| 2010/0201316 A1 | 8/2010 | Takada et al. |
| 2010/0201513 A1 | 8/2010 | Vorenkamp et al. |
| 2010/0207458 A1 | 8/2010 | Joannopoulos et al. |
| 2010/0210233 A1 | 8/2010 | Cook et al. |
| 2010/0213770 A1 | 8/2010 | Kikuchi |
| 2010/0213895 A1 | 8/2010 | Keating et al. |
| 2010/0217553 A1 | 8/2010 | Von Novak et al. |
| 2010/0219694 A1 | 9/2010 | Kurs et al. |
| 2010/0219695 A1 | 9/2010 | Komiyama et al. |
| 2010/0219696 A1 | 9/2010 | Kojima |
| 2010/0222010 A1 | 9/2010 | Ozaki et al. |
| 2010/0225175 A1 | 9/2010 | Karalis et al. |
| 2010/0225270 A1 | 9/2010 | Jacobs et al. |
| 2010/0225271 A1 | 9/2010 | Oyobe et al. |
| 2010/0225272 A1 | 9/2010 | Kirby et al. |
| 2010/0231053 A1 | 9/2010 | Karalis et al. |
| 2010/0231163 A1 | 9/2010 | Mashinsky |
| 2010/0231340 A1 | 9/2010 | Fiorello et al. |
| 2010/0234922 A1 | 9/2010 | Forsell |
| 2010/0235006 A1 | 9/2010 | Brown |
| 2010/0237706 A1 | 9/2010 | Karalis et al. |
| 2010/0237707 A1 | 9/2010 | Karalis et al. |
| 2010/0237708 A1 | 9/2010 | Karalis et al. |
| 2010/0237709 A1 | 9/2010 | Hall et al. |
| 2010/0244576 A1 | 9/2010 | Hillan et al. |
| 2010/0244577 A1 | 9/2010 | Shimokawa |
| 2010/0244578 A1 | 9/2010 | Yoshikawa |
| 2010/0244579 A1 | 9/2010 | Sogabe et al. |
| 2010/0244580 A1 | 9/2010 | Uchida et al. |
| 2010/0244581 A1 | 9/2010 | Uchida |
| 2010/0244582 A1 | 9/2010 | Yoshikawa |
| 2010/0244583 A1 | 9/2010 | Shimokawa |
| 2010/0244767 A1 | 9/2010 | Turner et al. |
| 2010/0244839 A1 | 9/2010 | Yoshikawa |
| 2010/0248622 A1 | 9/2010 | Kirby et al. |
| 2010/0253152 A1 | 10/2010 | Karalis et al. |
| 2010/0253281 A1 | 10/2010 | Li |
| 2010/0256481 A1 | 10/2010 | Mareci et al. |
| 2010/0256831 A1 | 10/2010 | Abramo et al. |
| 2010/0259108 A1 | 10/2010 | Giler et al. |
| 2010/0259109 A1 | 10/2010 | Sato |
| 2010/0259110 A1 | 10/2010 | Kurs et al. |
| 2010/0264745 A1 | 10/2010 | Karalis et al. |
| 2010/0264746 A1 | 10/2010 | Kazama et al. |
| 2010/0264747 A1 | 10/2010 | Hall et al. |
| 2010/0276995 A1 | 11/2010 | Marzetta et al. |
| 2010/0277003 A1 | 11/2010 | Von Novak et al. |
| 2010/0277004 A1 | 11/2010 | Suzuki et al. |
| 2010/0277005 A1 | 11/2010 | Karalis et al. |
| 2010/0277120 A1 | 11/2010 | Cook et al. |
| 2010/0277121 A1 | 11/2010 | Hall et al. |
| 2010/0289341 A1 | 11/2010 | Ozaki et al. |
| 2010/0289449 A1 | 11/2010 | Elo |
| 2010/0295505 A1 | 11/2010 | Jung et al. |
| 2010/0295506 A1 | 11/2010 | Ichikawa |
| 2010/0308939 A1 | 12/2010 | Kurs |
| 2010/0314946 A1 | 12/2010 | Budde et al. |
| 2010/0327660 A1 | 12/2010 | Karalis et al. |
| 2010/0327661 A1 | 12/2010 | Karalis et al. |
| 2010/0328044 A1 | 12/2010 | Waffenschmidt et al. |
| 2011/0004269 A1 | 1/2011 | Strother et al. |
| 2011/0012431 A1 | 1/2011 | Karalis et al. |
| 2011/0018361 A1 | 1/2011 | Karalis et al. |
| 2011/0025131 A1 | 2/2011 | Karalis et al. |
| 2011/0031928 A1 | 2/2011 | Soar |
| 2011/0043046 A1 | 2/2011 | Joannopoulos et al. |
| 2011/0043047 A1 | 2/2011 | Karalis et al. |
| 2011/0043048 A1 | 2/2011 | Karalis et al. |
| 2011/0043049 A1 | 2/2011 | Karalis et al. |
| 2011/0049995 A1 | 3/2011 | Hashiguchi |
| 2011/0049996 A1 | 3/2011 | Karalis et al. |
| 2011/0049998 A1 | 3/2011 | Karalis et al. |
| 2011/0074218 A1 | 3/2011 | Karalis et al. |
| 2011/0074346 A1 | 3/2011 | Hall et al. |
| 2011/0074347 A1 | 3/2011 | Karalis et al. |
| 2011/0089895 A1 | 4/2011 | Karalis et al. |
| 2011/0095618 A1 | 4/2011 | Schatz et al. |
| 2011/0115303 A1 | 5/2011 | Baarman et al. |
| 2011/0115431 A1 | 5/2011 | Dunworth et al. |
| 2011/0121920 A1 | 5/2011 | Kurs et al. |
| 2011/0128015 A1 | 6/2011 | Dorairaj et al. |
| 2011/0140544 A1 | 6/2011 | Karalis et al. |
| 2011/0148219 A1 | 6/2011 | Karalis et al. |
| 2011/0162895 A1 | 7/2011 | Karalis et al. |
| 2011/0169339 A1 | 7/2011 | Karalis et al. |
| 2011/0181122 A1 | 7/2011 | Karalis et al. |
| 2011/0193416 A1 | 8/2011 | Campanella et al. |
| 2011/0193419 A1 | 8/2011 | Karalis et al. |
| 2011/0198939 A1 | 8/2011 | Karalis et al. |
| 2011/0215086 A1 | 9/2011 | Yeh |
| 2011/0221278 A1 | 9/2011 | Karalis et al. |
| 2011/0227528 A1 | 9/2011 | Karalis et al. |
| 2011/0227530 A1 | 9/2011 | Karalis et al. |
| 2011/0241618 A1 | 10/2011 | Karalis et al. |
| 2011/0248573 A1 | 10/2011 | Kanno et al. |
| 2011/0254377 A1 | 10/2011 | Wildmer et al. |
| 2011/0254503 A1 | 10/2011 | Widmer et al. |
| 2011/0266878 A9 | 11/2011 | Cook et al. |
| 2011/0278943 A1 | 11/2011 | Eckhoff et al. |
| 2012/0001492 A9 | 1/2012 | Cook et al. |
| 2012/0001593 A1 | 1/2012 | DiGuardo |
| 2012/0007435 A1 | 1/2012 | Sada et al. |
| 2012/0007441 A1 | 1/2012 | John et al. |
| 2012/0025602 A1 | 2/2012 | Boys et al. |
| 2012/0032522 A1 | 2/2012 | Schatz et al. |
| 2012/0038525 A1 | 2/2012 | Monsalve Carcelen et al. |
| 2012/0062345 A1 | 3/2012 | Kurs et al. |
| 2012/0068549 A1 | 3/2012 | Karalis et al. |
| 2012/0086284 A1 | 4/2012 | Capanella et al. |
| 2012/0086867 A1 | 4/2012 | Kesler et al. |
| 2012/0091794 A1 | 4/2012 | Campanella et al. |
| 2012/0091795 A1 | 4/2012 | Fiorello et al. |
| 2012/0091796 A1 | 4/2012 | Kesler et al. |
| 2012/0091797 A1 | 4/2012 | Kesler et al. |
| 2012/0091819 A1 | 4/2012 | Kulikowski et al. |

(56) References Cited

U.S. PATENT DOCUMENTS

| | | |
|---|---|---|
| 2012/0091820 A1 | 4/2012 | Campanella et al. |
| 2012/0091949 A1 | 4/2012 | Campanella et al. |
| 2012/0091950 A1 | 4/2012 | Campanella et al. |
| 2012/0098350 A1 | 4/2012 | Campanella et al. |
| 2012/0112531 A1 | 5/2012 | Kesler et al. |
| 2012/0112532 A1 | 5/2012 | Kesler et al. |
| 2012/0112534 A1 | 5/2012 | Kesler et al. |
| 2012/0112535 A1 | 5/2012 | Karalis et al. |
| 2012/0112536 A1 | 5/2012 | Karalis et al. |
| 2012/0112538 A1 | 5/2012 | Kesler et al. |
| 2012/0112691 A1 | 5/2012 | Kurs et al. |
| 2012/0119569 A1 | 5/2012 | Karalis et al. |
| 2012/0119575 A1 | 5/2012 | Kurs et al. |
| 2012/0119576 A1 | 5/2012 | Kesler et al. |
| 2012/0119698 A1 | 5/2012 | Karalis et al. |
| 2012/0139355 A1 | 6/2012 | Ganem et al. |
| 2012/0146575 A1 | 6/2012 | Armstrong et al. |
| 2012/0153732 A1 | 6/2012 | Kurs et al. |
| 2012/0153733 A1 | 6/2012 | Schatz et al. |
| 2012/0153734 A1 | 6/2012 | Kurs et al. |
| 2012/0153735 A1 | 6/2012 | Karalis et al. |
| 2012/0153736 A1 | 6/2012 | Karalis et al. |
| 2012/0153737 A1 | 6/2012 | Karalis et al. |
| 2012/0153738 A1 | 6/2012 | Karalis et al. |
| 2012/0153893 A1 | 6/2012 | Schatz et al. |
| 2012/0184338 A1 | 7/2012 | Kesler et al. |
| 2012/0206096 A1 | 8/2012 | John |
| 2012/0223573 A1 | 9/2012 | Schatz et al. |
| 2012/0228952 A1 | 9/2012 | Hall et al. |
| 2012/0228953 A1 | 9/2012 | Kesler et al. |
| 2012/0228954 A1 | 9/2012 | Kesler et al. |
| 2012/0235500 A1 | 9/2012 | Ganem et al. |
| 2012/0235501 A1 | 9/2012 | Kesler et al. |
| 2012/0235502 A1 | 9/2012 | Kesler et al. |
| 2012/0235503 A1 | 9/2012 | Kesler et al. |
| 2012/0235504 A1 | 9/2012 | Kesler et al. |
| 2012/0235505 A1 | 9/2012 | Schatz et al. |
| 2012/0235566 A1 | 9/2012 | Karalis et al. |
| 2012/0235567 A1 | 9/2012 | Karalis et al. |
| 2012/0235633 A1 | 9/2012 | Kesler et al. |
| 2012/0235634 A1 | 9/2012 | Hall et al. |
| 2012/0239117 A1 | 9/2012 | Kesler et al. |
| 2012/0242159 A1 | 9/2012 | Lou et al. |
| 2012/0242225 A1 | 9/2012 | Karalis et al. |
| 2012/0248884 A1 | 10/2012 | Karalis et al. |
| 2012/0248886 A1 | 10/2012 | Kesler et al. |
| 2012/0248887 A1 | 10/2012 | Kesler et al. |
| 2012/0248888 A1 | 10/2012 | Kesler et al. |
| 2012/0248981 A1 | 10/2012 | Karalis et al. |
| 2012/0256494 A1 | 10/2012 | Kesler et al. |
| 2012/0267960 A1 | 10/2012 | Low et al. |
| 2012/0280765 A1 | 11/2012 | Kurs et al. |
| 2012/0313449 A1 | 12/2012 | Kurs et al. |
| 2012/0313742 A1 | 12/2012 | Kurs et al. |
| 2013/0007949 A1 | 1/2013 | Kurs et al. |
| 2013/0020878 A1 | 1/2013 | Karalis et al. |
| 2013/0033118 A1 | 2/2013 | Karalis et al. |
| 2013/0038402 A1 | 2/2013 | Karalis et al. |
| 2013/0057364 A1 | 3/2013 | Kesler et al. |
| 2013/0062966 A1 | 3/2013 | Verghese et al. |
| 2013/0069441 A1 | 3/2013 | Verghese et al. |
| 2013/0069753 A1 | 3/2013 | Kurs et al. |
| 2013/0099587 A1 | 4/2013 | Lou et al. |
| 2013/0154383 A1 | 6/2013 | Kasturi et al. |
| 2013/0154389 A1 | 6/2013 | Kurs et al. |
| 2013/0159956 A1 | 6/2013 | Verghese et al. |
| 2013/0175874 A1 | 7/2013 | Lou et al. |
| 2013/0175875 A1 | 7/2013 | Kurs et al. |
| 2013/0200716 A1 | 8/2013 | Kesler et al. |
| 2013/0200721 A1 | 8/2013 | Kurs et al. |
| 2013/0221744 A1 | 8/2013 | Hall et al. |
| 2013/0278073 A1 | 10/2013 | Kurs et al. |
| 2013/0278074 A1 | 10/2013 | Kurs et al. |
| 2013/0278075 A1 | 10/2013 | Kurs et al. |
| 2013/0300353 A1 | 11/2013 | Kurs et al. |
| 2013/0307349 A1 | 11/2013 | Hall et al. |
| 2013/0320773 A1 | 12/2013 | Schatz et al. |
| 2013/0334892 A1 | 12/2013 | Hall et al. |
| 2014/0002012 A1 | 1/2014 | McCauley et al. |
| 2014/0070764 A1 | 3/2014 | Keeling |
| 2015/0015198 A1 | 1/2015 | Okada et al. |

FOREIGN PATENT DOCUMENTS

| | | |
|---|---|---|
| CN | 102439669 | 5/2012 |
| CN | 103329397 | 9/2013 |
| DE | 38 24 972 | 1/1989 |
| DE | 100 29147 | 12/2001 |
| DE | 200 16 655 | 3/2002 |
| DE | 102 21 484 | 11/2003 |
| DE | 103 04 584 | 8/2004 |
| DE | 10 2005 036290 | 2/2007 |
| DE | 10 2006 044057 | 4/2008 |
| EP | 1 335 477 | 8/2003 |
| EP | 1 521 206 | 4/2005 |
| EP | 1 524 010 | 4/2005 |
| EP | 2 357 716 | 8/2011 |
| JP | 02-097005 | 4/1990 |
| JP | 4-265875 | 9/1992 |
| JP | 6-341410 | 12/1994 |
| JP | 9-182323 | 7/1997 |
| JP | 9-298847 | 11/1997 |
| JP | 10-164837 | 6/1998 |
| JP | 11-75329 | 3/1999 |
| JP | 11-188113 | 7/1999 |
| JP | 2001-309580 | 11/2001 |
| JP | 2002-010535 | 1/2002 |
| JP | 2003-179526 | 6/2003 |
| JP | 2004-166459 | 6/2004 |
| JP | 2004-201458 | 7/2004 |
| JP | 2004-229144 | 8/2004 |
| JP | 2005-57444 | 3/2005 |
| JP | 2005-149238 | 6/2005 |
| JP | 2006-074848 | 3/2006 |
| JP | 2007-505480 | 3/2007 |
| JP | 2007-266892 | 10/2007 |
| JP | 2007-537637 | 12/2007 |
| JP | 2008-508842 | 3/2008 |
| JP | 2008-206231 | 9/2008 |
| JP | 2008-206327 | 9/2008 |
| JP | 2011-072074 | 4/2011 |
| JP | 2012-504387 | 2/2012 |
| JP | 2013-543718 | 12/2013 |
| KR | 10-2007-0017804 | 2/2007 |
| KR | 10-2008-0007635 | 1/2008 |
| KR | 10-2009-0122072 | 11/2009 |
| KR | 10-2011-0050920 | 5/2011 |
| KR | 10-2012-0048306 | 5/2012 |
| SG | 112842 | 7/2005 |
| WO | WO 92/17929 | 10/1992 |
| WO | WO 93/23908 | 11/1993 |
| WO | WO 94/28560 | 12/1994 |
| WO | WO 95/11545 | 4/1995 |
| WO | WO 96/02970 | 2/1996 |
| WO | WO 98/50993 | 11/1998 |
| WO | WO 00/77910 | 12/2000 |
| WO | WO 03/092329 | 11/2003 |
| WO | WO 03/096361 | 11/2003 |
| WO | WO 03/096512 | 11/2003 |
| WO | WO 2004/015885 | 2/2004 |
| WO | WO 2004/038888 | 5/2004 |
| WO | WO 2004/055654 | 7/2004 |
| WO | WO 2004/073150 | 8/2004 |
| WO | WO 2004/073166 | 8/2004 |
| WO | WO 2004/073176 | 8/2004 |
| WO | WO 2004/073177 | 8/2004 |
| WO | WO 2004/112216 | 12/2004 |
| WO | WO 2005/024865 | 3/2005 |
| WO | WO 2005/060068 | 6/2005 |
| WO | WO 2005/109597 | 11/2005 |
| WO | WO 2005/109598 | 11/2005 |
| WO | WO 2006/011769 | 2/2006 |
| WO | WO 2007/008646 | 1/2007 |
| WO | WO 2007/020583 | 2/2007 |

(56) References Cited

FOREIGN PATENT DOCUMENTS

| | | |
|---|---|---|
| WO | WO 2007/042952 | 4/2007 |
| WO | WO 2007/084716 | 7/2007 |
| WO | WO 2007/084717 | 7/2007 |
| WO | WO 2008/109489 | 9/2008 |
| WO | WO 2008/118178 | 10/2008 |
| WO | WO 2009/009559 | 1/2009 |
| WO | WO 2009/018568 | 2/2009 |
| WO | WO 2009/023155 | 2/2009 |
| WO | WO 2009/023646 | 2/2009 |
| WO | WO 2009/033043 | 3/2009 |
| WO | WO 2009/062438 | 5/2009 |
| WO | WO 2009/070730 | 6/2009 |
| WO | WO 2009/126963 | 10/2009 |
| WO | WO 2009/140506 | 11/2009 |
| WO | WO 2009/149464 | 12/2009 |
| WO | WO 2009/155000 | 12/2009 |
| WO | WO 2010/030977 | 3/2010 |
| WO | WO 2010/036980 | 4/2010 |
| WO | WO 2010/039967 | 4/2010 |
| WO | WO 2010/090538 | 8/2010 |
| WO | WO 2010/090539 | 8/2010 |
| WO | WO 2010/093997 | 8/2010 |
| WO | WO 2010/104569 | 9/2010 |
| WO | WO 2011/061388 | 5/2011 |
| WO | WO 2011/061821 | 5/2011 |
| WO | WO 2011/062827 | 5/2011 |
| WO | WO 2011/112795 | 9/2011 |
| WO | WO 2012/037279 | 3/2012 |
| WO | WO 2012/170278 | 12/2012 |
| WO | WO 2013/013235 | 1/2013 |
| WO | WO 2013/020138 | 2/2013 |
| WO | WO 2013/036947 | 3/2013 |
| WO | WO 2013/059441 | 4/2013 |
| WO | WO 2013/067484 | 5/2013 |
| WO | WO 2013/113017 | 8/2013 |
| WO | WO 2013/142840 | 9/2013 |
| WO | WO 2014/004843 | 1/2014 |

OTHER PUBLICATIONS

"Physics Update, Unwired Energy", *Physics Today*, pp. 26, (Jan. 2007) (See http://arxiv.org/abs/physics/0611063.).

"In pictures: A year in technology", *BBC News*, (Dec. 28, 2007).

"Next Little Thing 2010 Electricity without wires", CNN Money (See money.cnn.com/galleries/2009/smallbusiness/0911/gallery.next_little_thing_2010.smb/) (dated Nov. 30, 2009).

Abe et al. "A Noncontact Charger Using a Resonant Converter with Parallel Capacitor of the Secondary Coil". IEEE, 36(2):444-451, Mar./Apr. 2000.

Ahmadian, M. et al., "Miniature Transmitter for Implantable Micro Systems", *Proceedings of the 25th Annual International Conference of the IEEE EMBS* Cancun, Mexico, pp. 3028-3031 (Sep. 17-21, 2003).

Aoki, T. et al., "Observation of strong coupling between one atom and a monolithic microresonator", Nature, vol. 443:671-674 (2006).

Apneseth et al. "Introducing wireless proximity switches" ABB Review Apr. 2002.

Aristeidis Karalis et al., "Efficient Wireless *non-radiative mid-range* energy transfer", *Annals of Physics*, vol. 323, pp. 34-48 (2008).

Baker et al., "Feedback Analysis and Design of RF Power Links for Low-Power Bionic Systems," *IEEE Transactions on Biomedical Circuits and Systems*, vol. 1(1):28-38 (Mar. 2007).

Balanis, C.A., "Antenna Theory: Analysis and Design," 3rd Edition, Sections 4.2, 4.3, 5.2, 5.3 (Wiley, New Jersey, 2005).

Berardelli, P., "Outlets Are Out", ScienceNOW Daily News, Science Now, http://sciencenow.sciencemag.org/ cgi/content/full/2006/1114/2, (Nov. 14, 2006) 2 pages.

Biever, C., "Evanescent coupling' could power gadgets wirelessly", NewScientistsTech.com, http://www. newscientisttech.com/article.ns?id=dn1 0575&print=true, (Nov. 15, 2006) 2 pages.

Borenstein, S., "Man tries wirelessly boosting batteries", (The Associated Press), USA Today, (Nov. 16, 2006) 1 page.

Borenstein, S., "Man tries wirelessly boosting batteries", AP Science Writer, Boston.com, (See http://www.boston.com/business/technology/articles/2006/11/15/man_tries_wirelessly_b . . . ) (Nov. 15, 2006).

Boyle, A., "Electro-nirvana? Not so fast", MSNBC, http://lcosmiclog.msnbc.msn.com/_news/2007/06/08/4350760-electro-nirvana-not-so-fast, (Jun. 8, 2007) 1 page.

Budhia, M. et al., "A New IPT Magnetic Coupler for Electric Vehicle Charging Systems", IECON 2010—36th Annual Conference on IEEE Industrial Electronics Society, Glendale, AZ, pp. 2487-2492 (Nov. 7-10, 2010).

Budhia, M. et al., "Development and evaluation of single sided flux couplers for contactless electric vehicle charging", 2011 IEEE Energy Conversion Congress and Exposition (ECCE), Phoenix, AZ, pp. 614-621 (Sep. 17-22, 2011).

Budhia, M. et al.,"Development of a Single-Sided Flux Magnetic Coupler for Electric Vehicle IPT", *IEEE Transactions on Industrial Electronics*, vol. 60:318-328 (Jan. 2013).

Bulkeley, W. M., "MIT Scientists Pave the Way for Wireless Battery Charging", The Wall Street Journal (See http://online.wsj.com/article/SB118123955549228045.html?mod=googlenews_wsj), (Jun. 8, 2007) 2 pages.

Burri et al., "Invention Description", (Feb. 5, 2008).

Cass, S., "Air Power—Wireless data connections are common—now scientists are working on wireless power", Sponsored by IEEE Spectrum, http://spectrum.ieee.org/computing/hardware/air-power, (Nov. 2006) 2 pages.

Castelvecchi, Davide, "The Power of Induction—Cutting the last cord could resonate with our increasingly gadget dependent lives", *Science News Online*, vol. 172, No. 3, Jul. 21, 2007, 6 pages.

Chang, A., "Recharging the Wireless Way—Even physicists forget to recharge their cell phones sometimes.", PC Magazine, ABC News Internet Ventures, (Dec. 12, 2006) 1 page.

Chinaview, ,"Scientists light bulb with 'wireless electricity'",www.Chinaview.cn, http://news.xinhuanet.com/english/2007-06/08/content_6215681.htm,Jun. 2007,1 page.

Cooks, G., "The vision of an MIT physicist: Getting rid of pesky rechargers", Boston.com, (Dec. 11, 2006) 1 page.

Derbyshire, D., "The end of the plug? Scientists invent wireless device that beams electricity through your home", Daily Mail, http://www.dailymail.co.uk/pages/live/articles/technology/technology.html?in_article_id=4 . . . ), (Jun. 7, 2007) 3 pages.

Eisenberg, Anne, "Automatic Recharging, From a Distance", The New York Times, (see www.nytimes.com/2012/03/11/business/built-in-wireless-chargeing-for-electronic-devices.html?_r=0) (published on Mar. 10, 2012).

Esser et al., "A New Approach to Power Supplies for Robots", IEEE, vol. 27(5):872-875, (Sep./Oct. 1991).

Fan, Shanhui et al., "Rate-Equation Analysis of Output Efficiency and Modulation Rate of Photomic-Crystal Light-Emitting Diodes", IEEE Journal of Quantum Electronics, vol. 36(10):1123-1130 (Oct. 2000).

Fenske et al., "Dielectric Materials at Microwave Frequencies", Applied Microwave & Wireless, pp. 92-100 (2000).

Fernandez, C. et al., "A simple dc-dc converter for the power supply of a cochlear implant", *IEEE*, pp. 1965-1970 (2003).

Ferris, David, "How Wireless Charging Will Make Life Simpler (And Greener)", Forbes (See forbes.com/sites/davidferris/2012/07/24/how-wireless-charging-will-make-life-simpler-and-greener/print/) (dated Jul. 24, 2012).

Fildes, J., "Physics Promises Wireless Power", (Science and Technology Reporter), BBC News, (Nov. 15, 2006) 3 pages.

Fildes, J., "The technology with impact 2007", BBC News, (Dec. 27, 2007) 3 pages.

Fildes, J., "Wireless energy promise powers up", BBC News, http://news.bbc.co.uk/2/hi/technology/6725955.stm, (Jun. 7, 2007) 3 pages.

Finkenzeller, Klaus, "RFID Handbook—Fundamentals and Applications in Contactless Smart Cards", Nikkan Kohgyo-sya, Kanno Taihei, first version, pp. 32-37, 253 (Aug. 21, 2001).

(56) References Cited

OTHER PUBLICATIONS

Finkenzeller, Klaus, "RFID Handbook (2nd Edition)", The Nikkan Kogyo Shimbun, Ltd., pp. 19, 20, 38, 39, 43, 44, 62, 63, 67, 68, 87, 88, 291, 292 (Published on May 31, 2004).
Freedman, D. H., "Power on a Chip", MIT Technology Review, (Nov. 2004).
Gary Peterson, "MIT WiTricity Not So Original After All", *Feed Line* No. 9, (See http://www.tfcbooks.com/articles/witricity.htm) printed Nov. 12, 2009.
Geyi, Wen, "A Method for the Evaluation of Small Antenna Q", IEEE Transactions on Antennas and Propagation, vol. 51(8):2124-2129 (Aug. 2003).
Hadley, F., "Goodbye Wires—MIT Team Experimentally Demonstrates Wireless Power Transfer, Potentially Useful for Power Laptops, Cell-Phones Without Cords", Massachusetts Institute of Technology, Institute for Soldier D Nanotechnologies, http://web.mit.edu/newsoffice/2007/wireless-0607.html, (Jun. 7, 2007) 3 pages.
Haus, H.A., "Waves and Fields in Optoelectronics," Chapter 7 "Coupling of Modes—Reasonators and Couplers" (Prentice-Hall, New Jersey, 1984).
Heikkinen et al., "Performance and Efficiency of Planar Rectennas for Short-Range Wireless Power Transfer at 2.45 GHz", Microwave and Optical Technology Letters, vol. 31(2):86-91, (Oct. 20, 2001).
Highfield, R., "Wireless revolution could spell end of plugs-",(Science Editor), Telegraph.co.uk, http://www.telegraph.co.uk/news/main.jhtml?xml=/news/2007/06/07/nwireless1 07.xml, (Jun. 7, 2007) 3 pages.
Hirai et al., "Integral Motor with Driver and Wireless Transmission of Power and Information for Autonomous Subspindle Drive", IEEE, vol. 15(1):13-20, (Jan. 2000).
Hirai et al., "Practical Study on Wireless Transmission of Power and Information for Autonomous Decentralized Manufacturing System", IEEE, vol. 46(2):349-359, Apr. 1999.
Hirai et al., "Study on Intelligent Battery Charging Using Inductive Transmission of Power and Information", IEEE, vol. 15(2):335-345, (Mar. 2000).
Hirai et al., "Wireless Transmission of Power and Information and Information for Cableless Linear Motor Drive", IEEE, vol. 15(1):21-27, (Jan. 2000).
Hirayama, M., "Splashpower—World Leaders in Wireless Power", PowerPoint presentation, Splashpower Japan, (Sep. 3, 2007) 30 pages.
Ho, S. L. et al., "A Comparative Study Between Novel Witricity and Traditional Inductive Magnetic Coupling in Wireless Charging", IEEE Transactions on Magnetics, vol. 47(5):1522-1525 (May 2011).
Infotech Online, "Recharging gadgets without cables", infotech.indiatimes.com, (Nov. 17, 2006) 1 page.
Jackson, J. D., "Classical Electrodynamics", 3rd Edition, Wiley, New York, 1999, pp. 201-203.
Jackson, J.D., "Classical Electrodynamics," 3rd Edition, Sections 1.11, 5.5, 5.17, 6.9, 8.1, 8.8, 9.2, 9.3 (Wiley, New York, 1999).
Jacob, M. V. et al., "Lithium Tantalate—A High Permittivity Dielectric Material for Microwave Communication Systems", *Proceedings of IEEE TENCON—Poster Papers*, pp. 1362-1366, 2003.
Karalis, Aristeidis, "Electricity Unplugged", Feature: Wireless Energy Physics World, physicsworld.com, pp. 23-25 (Feb. 2009).
Kawamura et al., "Wireless Transmission of Power and Information Through One High-Frequency Resonant AC Link Inverter for Robot Manipulator Applications", IEEE, vol. 32(3):503-508, (May/Jun. 1996).
Kurs, A. et al., "Wireless Power Transfer via Strongly Coupled Magnetic Resources", *Science* vol. 317, pp. 83-86 (Jul. 6, 2007).
Kurs, A. et al., "Simultaneous mid-range power transfer to multiple devices", *Applied Physics Letts*, vol. 96, No. 044102 (2010).
Kurs, A. et al.,"Optimized design of a low-resistance electrical conductor for the multimegahertz range", *Applied Physics Letters*, vol. 98:172504-172504-3 (Apr. 2011).

Lamb, Gregory M. ,"Look Ma—no wires!—Electricity broadcast through the air may someday run your home",The Christian Science Monitor,http://www.csmonitor.com/2006/1116/p14s01-stct.html,Nov. 15, 2006,2 pages.
Lee, "Antenna Circuit Design for RFID Applications," Microchip Technology Inc., AN710, 50 pages. (2003).
Lee, "RFID Coil Design," Microchip Technology Inc., AN678, 21 pages (1998).
Liang et al., "Silicon waveguide two-photon absorption detector at 1.5 μm wavelength for autocorrelation measurements," Applied Physics Letters, 81(7):1323-1325 (Aug. 12, 2002).
Markoff, J. ,"Intel Moves to Free Gadgets of Their Recharging Cords", The New York Times—nytimes.com, Aug. 21, 2008, 2 pages.
Mediano, A. et al. "Design of class E amplifier with nonlinear and linear shunt capacitances for any duty cycle", IEEE Trans. Microwave Theor. Tech., vol. 55, No. 3, pp. 484-492, (2007).
Microchip Technology Inc., "microID 13.56 MHz Design Guide—MCRF355/360 Reader Reference Design," 24 pages (2001).
Minkel, J R. ,"Wireless Energy Lights Bulb from Seven Feet Away—Physicists vow to cut the cord between your laptop battery and the wall socket—with just a simple loop of wire",Scientific American,http://www.scientificamerican.com/article.cfm?id=wireless-energy-lights-bulb-from-seven-feet-away,Jun. 7, 2007,1 page.
Minkel, J R. ,"Wireless Energy Transfer May Power Devices at a Distance",Scientific American,Nov. 14, 2006,1 page.
Morgan, J., "Lab report: Pull the plug for a positive charge", The Herald, Web Issue 2680, (Nov. 16, 2006) 3 pages.
Moskvitch, Katia, "Wireless charging—the future for electric cars?", BBC News Technology (See www.bbc.co.uk/news/technology-14183409) (dated Jul. 21, 2011).
O'Brien et al., "Analysis of Wireless Power Supplies for Industrial Automation Systems", IEEE, pp. 367-372 (Nov. 2-6, 2003).
O'Brien et al., "Design of Large Air-Gap Transformers for Wireless Power Supplies", IEEE, pp. 1557-1562 (Jun. 15-19, 2003).
Pendry, J. B., "A Chiral Route to Negative Refraction", Science, vol. 306:1353-1355 (2004).
Physics Today, "Unwired energy questions asked answered", Sep. 2007, pp. 16-17.
Powercast LLC. "White Paper" Powercast simply wire free, 2003.
PR News Wire, "The Big Story for CES 2007: The public debut of eCoupled Intelligent Wireless Power", Press Release, Fulton Innovation LLC, Las Vegas, NV, (Dec. 27, 2006) 3 pages.
Press Release, "The world's first sheet-type wireless power transmission system: Will a socket be replaced by e-wall?",Public Relations Office, School of Engineering, University of Tokyo, Japan,Dec. 12, 2006,4 pages.
PressTV, "Wireless power transfer possible", http://edition.presstv.ir/detail/12754.html, Jun. 11, 2007, 1 page.
Reidy, C. (Globe Staff), "MIT discovery could unplug your iPod forever", Boston.com, http://www.boston.com/ business/ticker/2007/06/mit_discovery_c.html, (Jun. 7, 2007) 3 pages.
Risen, C., "Wireless Energy", The New York Times, (Dec. 9, 2007) 1 page.
Sakamoto et al., "A Novel Circuit for Non-Contact Charging Through Electro-Magnetic Coupling", IEEE, pp. 168-174 (1992).
Scheible, G. et al., "Novel Wireless Power Supply System for Wireless Communication Devices in Industrial Automation Systems", IEEE, pp. 1358-1363, (Nov. 5-8, 2002).
Schneider, D. "A Critical Look at Wireless Power", *IEEE Spectrum*, pp. 35-39 (May 2010).
Schneider, David, "Electrons Unplugged. Wireless power at a distance is still far away", *IEEE Spectrum*, pp. 35-39 (May 2010).
Schuder, J. C. et al., "An Inductively Coupled RF System for the Transmission of 1 kW of Power Through the Skin", *IEEE Transactions on Bio-Medical Engineering*, vol. BME-18, No. 4, pp. 265-273 (Jul. 1971).
Schuder, J. C., "Powering an Artificial Heart: Birth of the Inductively Coupled-Radio Frequency System in 1960", *Artificial Organs*, vol. 26:909-915 (2002).

(56) References Cited

OTHER PUBLICATIONS

Schuder, J.C. et al., "Energy Transport Into the Closed Chest From a Set of Very-Large Mutually Orthogonal Coils", Communication Electronics, vol. 64:527-534 (Jan. 1963).

Schutz, J. et al., "Load Adaptive Medium Frequency Resonant Power Supply", IEEE, pp. 282-287 (Nov. 2002).

Sekitani et al. "A large-area wireless power-transmission sheet using printed organic transistors and plastic MEMS switches" www.nature.com/naturematerials. Published online Apr. 29, 2007.

Sekitani et al., "A large-area flexible wireless power transmission sheet using printed plastic MEMS switches and organic field-effect transistors", IEDM '06, International Electron Devices Meeting, (Dec. 11-13, 2006) 4 pages.

Sekiya, H. et al., "FM/PWM control scheme in class DE inverter", IEEE Trans. Circuits Syst. I, vol. 51(7) (Jul. 2004).

Senge, M., "MIT's wireless electricity for mobile phones", Vanguard, http://www.vanguardngr.com/articles/2002/features/gsm/gsm211062007.htm, (Jun. 11, 2007) 1 page.

Sensiper, S., "Electromagnetic wave propogation on helical conductors", Technical Report No. 194 (based on PhD Thesis), Massachusetts Institute of Technology, (May 16, 1951) 126 pages.

Soljacic, M. , "Wireless Non-Radiative Energy Transfer—PowerPoint presentation". Massachusetts Institute of Technology, (Oct. 6, 2005).

Soljacic, M. et al., "Wireless Energy Transfer Can Potentially Recharge Laptops Cell Phones Without Cords", (Nov. 14, 2006) 3 pages.

Soljacic, M. et al., "Photonic-crystal slow-light enhancement of nonlinear phase sensitivity", *J. Opt. Soc. Am B*, vol. 19, No. 9, pp. 2052-2059 (Sep. 2002).

Soljacic, M., "Wireless nonradiative energy transfer", *Visions of Discovery New Light on Physics, Cosmology, and Consciousness*, Cambridge University Press, New York, NY pp. 530-542 (2011).

Someya, Takao. "The world's first sheet-type wireless power transmission system". University of Tokyo, (Dec. 12, 2006).

Staelin, David H. et al., Electromagnetic Waves, Chapters 2, 3, 4, and 8, pp. 46-176 and 336-405 (Prentice Hall Upper Saddle River, New Jersey 1998).

Stark III, Joseph C., "Wireless Power Transmission Utilizing a Phased Array of Tesla Coils", Master Thesis, Massachusetts Institute of Technology (2004).

Stewart, W., "The Power to Set you Free", Science, vol. 317:55-56 (Jul. 6, 2007).

Tang, S.C. et al., "Evaluation of the Shielding Effects on Printed-Circuit-Board Transformers Using Ferrite Plates and Copper Sheets", *IEEE Transactions on Power Electronics*, vol. 17:1080-1088 (Nov. 2002).

Tesla, Nikola, "High Frequency Oscillators for Electro-Therapeutic and Other Purposes", *Proceedings of the IEEE*, vol. 87:1282-1292 (Jul. 1999).

Tesla, Nikola, "High Frequency Oscillators for Electro-Therapeutic and Other Purposes", *The Electrical Engineer*, vol. XXVI, No. 50 (Nov. 17, 1898).

Texas Instruments, "HF Antenna Design Notes—Technical Application Report," Literature No. 11-08-26-003, 47 pages (Sep. 2003).

Thomsen et al., "Ultrahigh speed all-optical demultiplexing based on two-photon absorption in a laser diode," Electronics Letters, 34(19):1871-1872 (Sep. 17, 1998).

UPM Rafsec, "Tutorial overview of inductively coupled RFID Systems," 7 pages (May 2003).

Valtchev et al. "Efficient Resonant Inductive Coupling Energy Transfer Using New Magnetic and Design Criteria". IEEE, pp. 1293-1298, 2005.

Vandevoorde et al., "Wireless energy transfer for stand-alone systems: a comparison between low and high power applicability", Sensors and Actuators, vol. 92:305-311 (2001).

Vilkomerson, David et al., "Implantable Doppler System for Self-Monitoring Vascular Grafts", *IEEE Ultrasonics Symposium*, pp. 461-465 (2004).

Villeneuve, Pierre R. et al., "Microcavities in photonic crystals: Mode symmetry, tunability, and coupling efficiency", *Physical Review B*, vol. 54:7837-7842 (Sep. 15, 1996).

Yariv, Amnon et al., "Coupled-resonator optical waveguide: a proposal and analysis", *Optics Letters*, vol. 24(11):711-713 (Jun. 1, 1999).

Yates, David C. et al., "Optimal Transmission Frequency for Ultralow-Power Short-Range Radio Links", IEEE Transactions on Circuits and Systems—1, Regular Papers, vol. 51:1405-1413 (Jul. 2004).

Yoshihiro Konishi, *Microwave Electronic Circuit Technology*, Chapter 4, pp. 145-197 (Marcel Dekker, Inc., New York, NY 1998).

Ziaie, Babak et al., "A Low-Power Miniature Transmitter Using a Low-Loss Silicon Platform For Biotelemetry", *Proceedings—19th International Conference IEEE/EMBS*, pp. 2221-2224, (Oct. 30-Nov. 2, 1997) 4 pages.

Zierhofer, Clemens M. et al., "High-Efficiency Coupling-Insensitive Transcutaneous Power and Data Transmssion Via an Inductive Link", *IEEE Transactions on Biomedical Engineering*, vol 37, No. 7, pp. 716-722 (Jul. 1990).

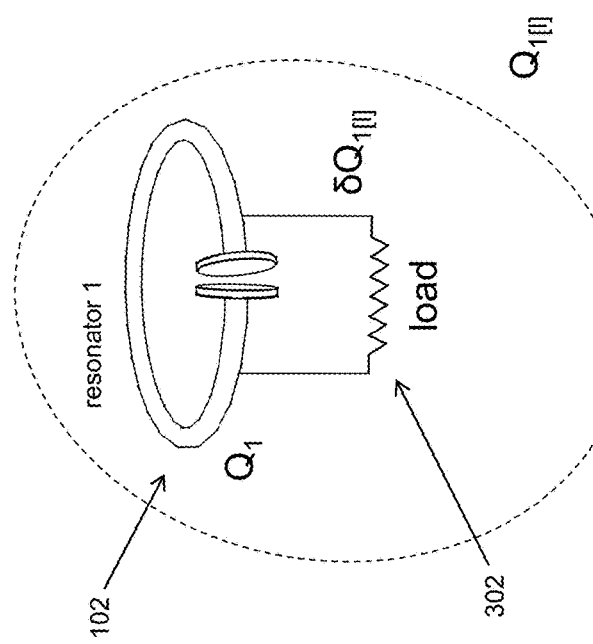

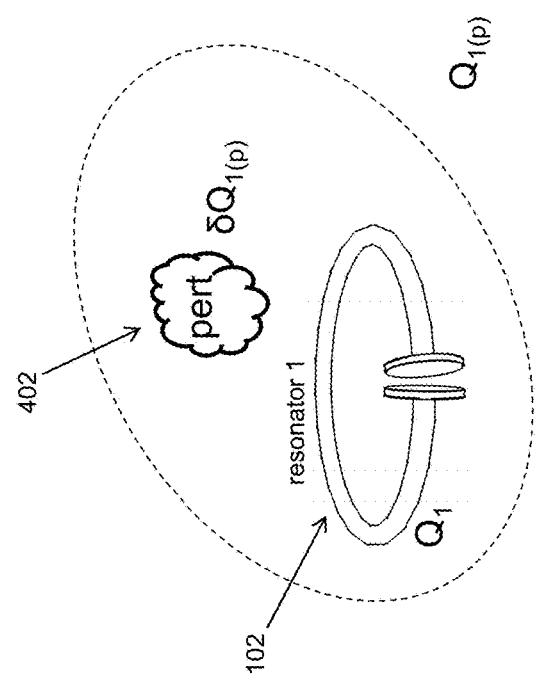

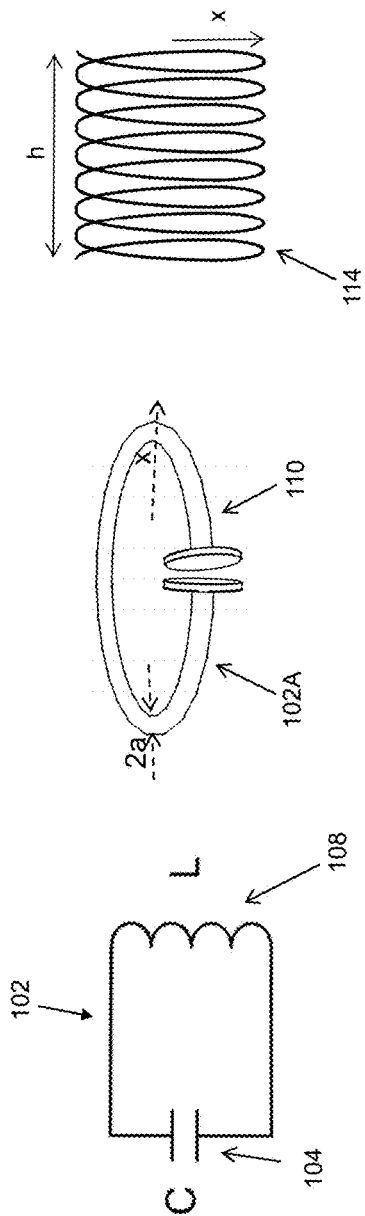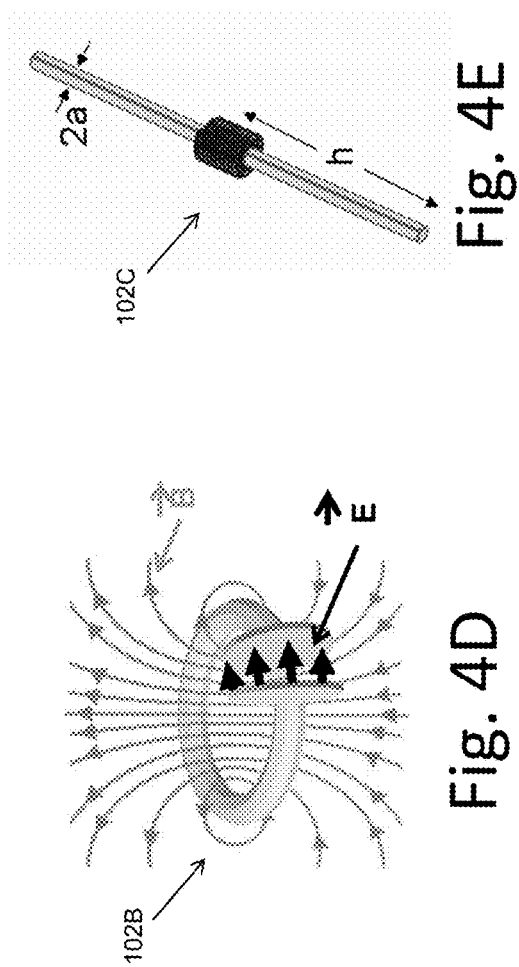

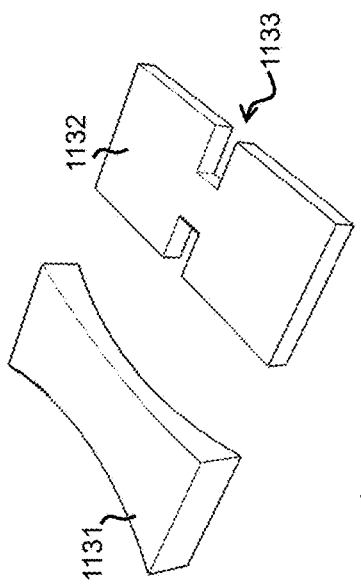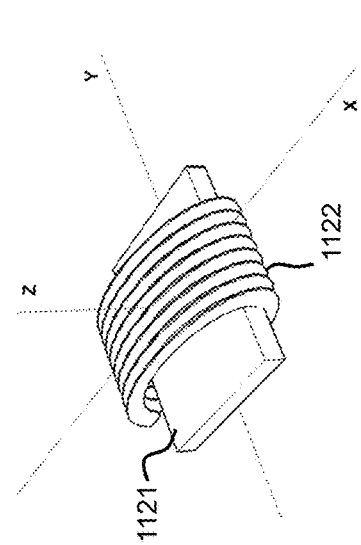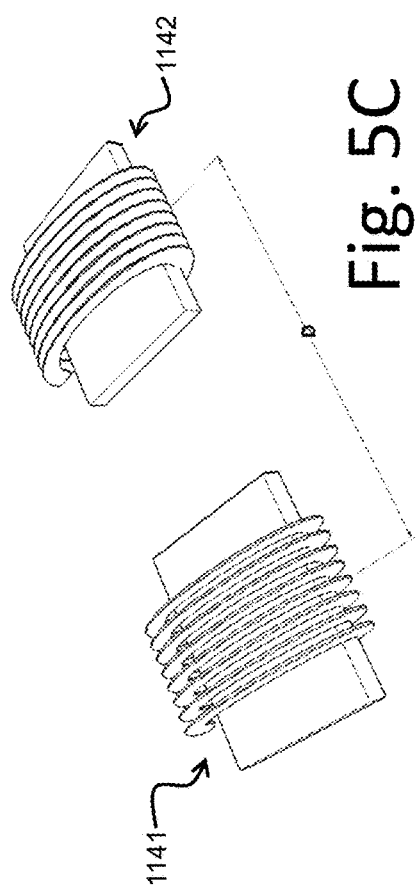

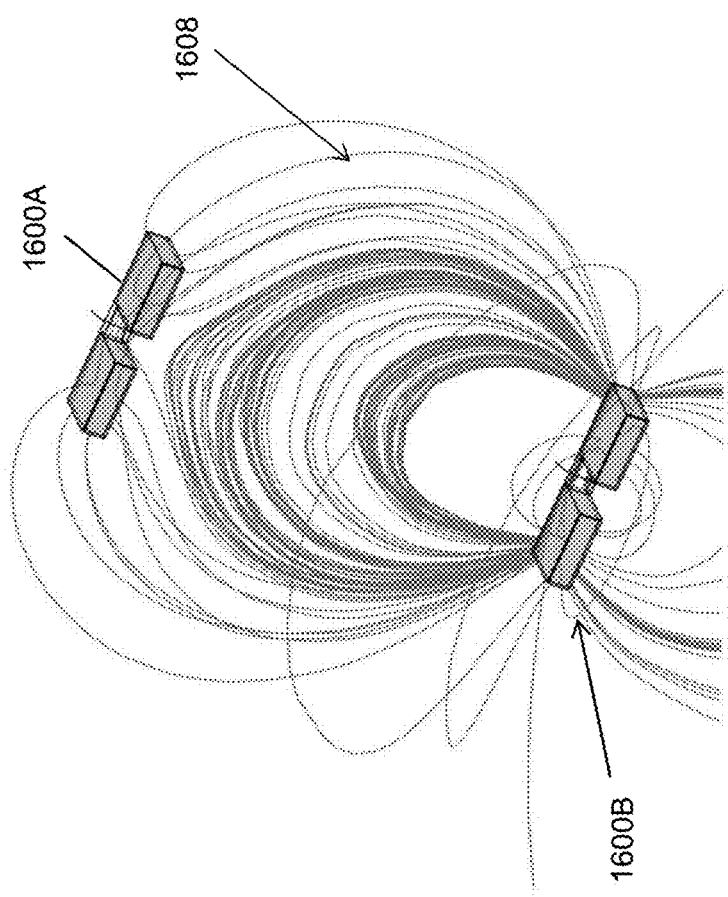
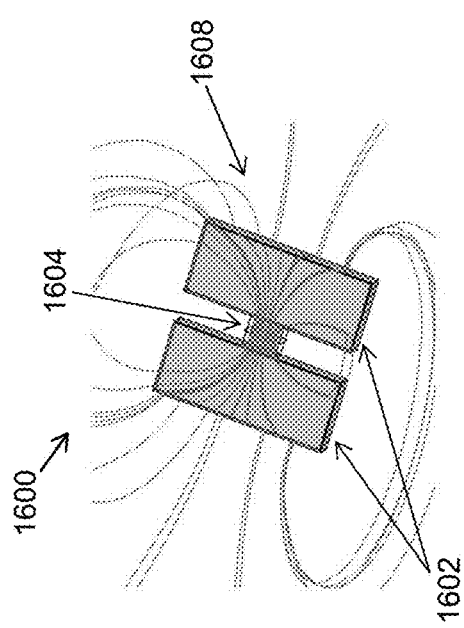
Fig. 6B
Fig. 6A

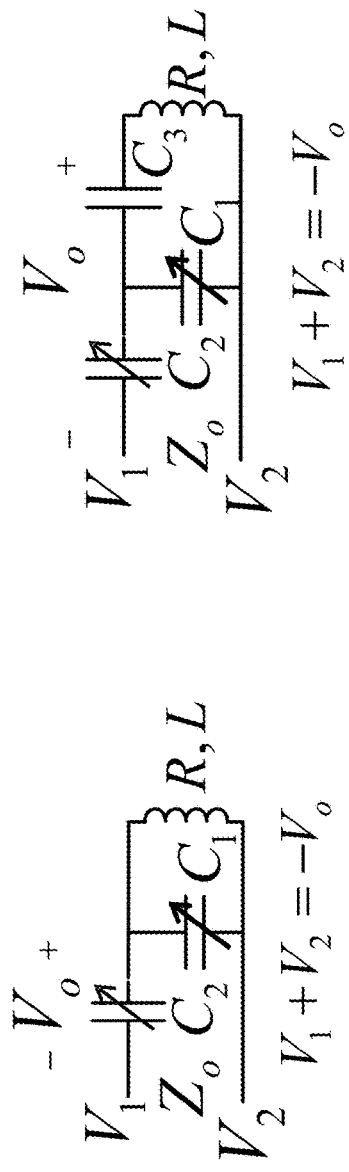
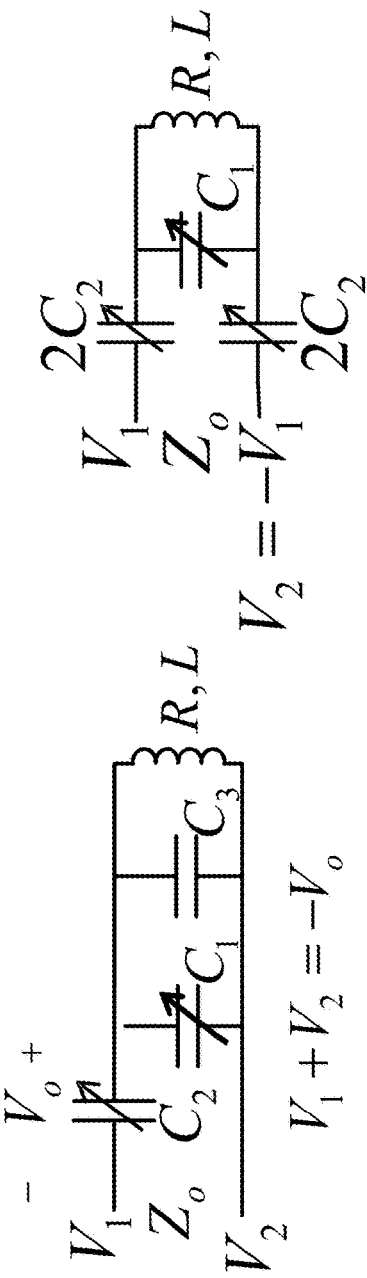
Fig. 8A Fig. 8B Fig. 8C Fig. 8D

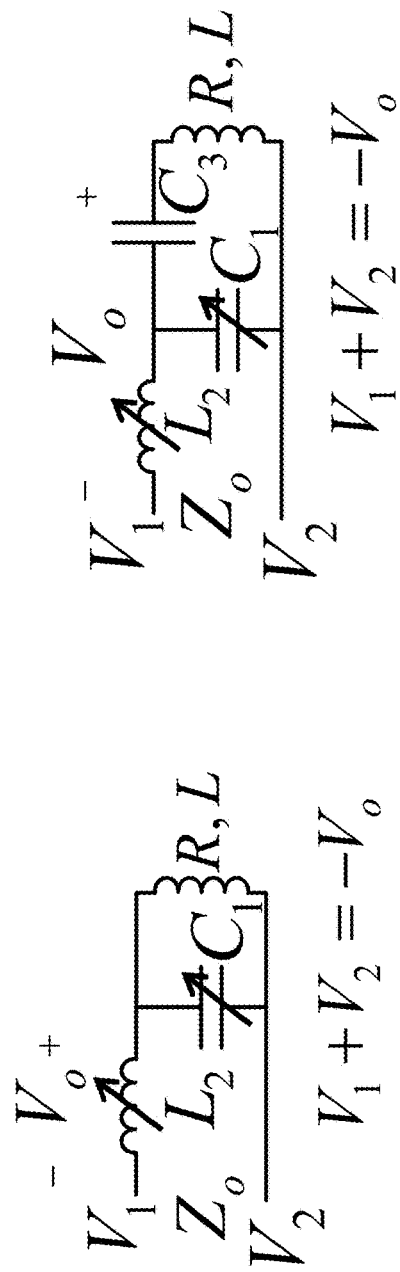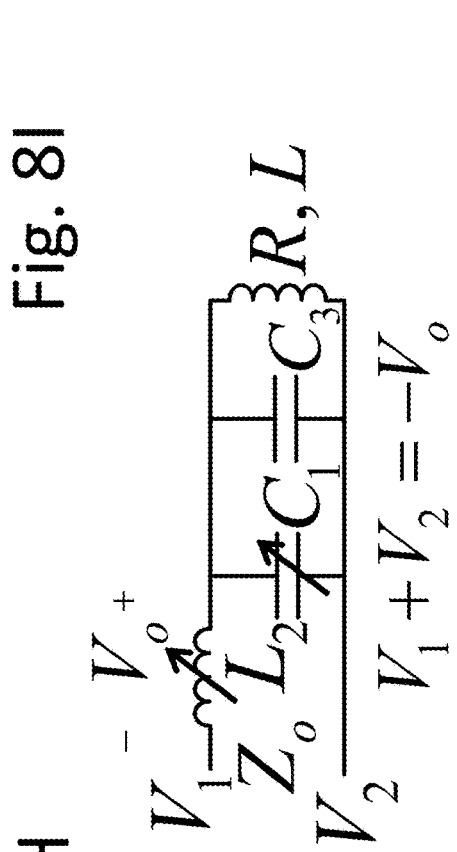

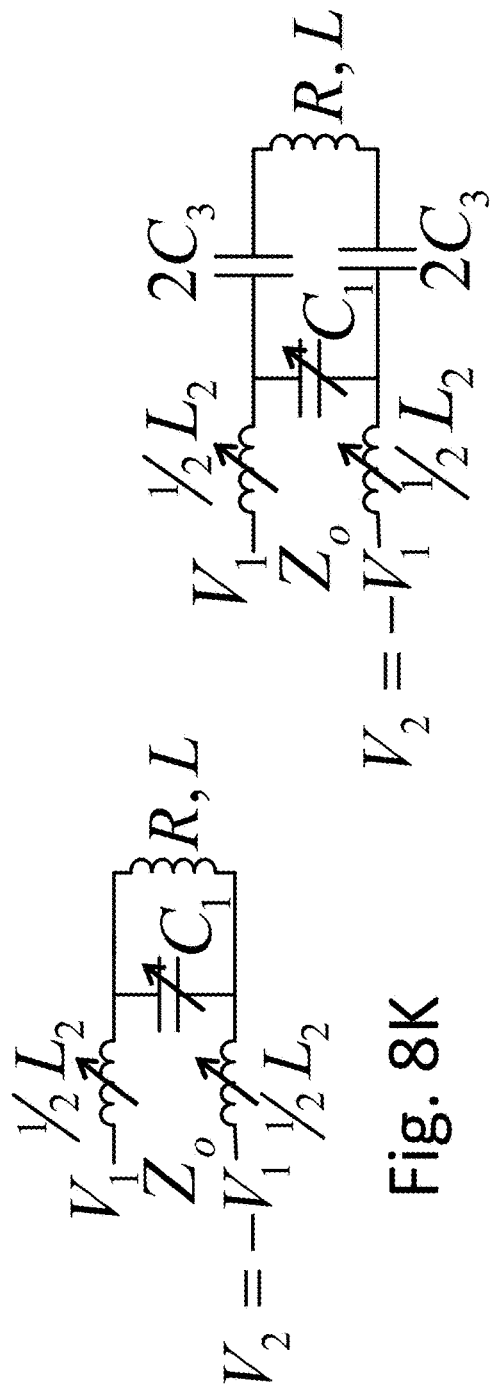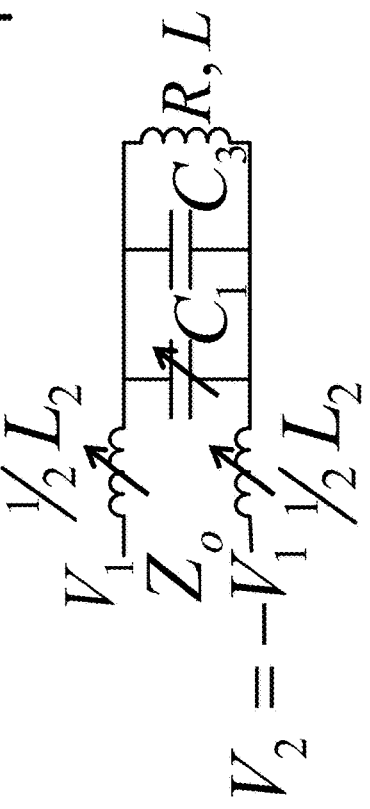
Fig. 8K
Fig. 8L
Fig. 8M

SYSTEM FOR WIRELESS ENERGY DISTRIBUTION IN A VEHICLE

CROSS-REFERENCE TO RELATED APPLICATIONS

This application claims the benefit of the following U.S. patent applications, each of which is hereby incorporated by reference in its entirety:

This application is a continuation-in-part of U.S. application Ser. No. 13/834,366, filed Mar. 15, 2013. Application Ser. No. 13/834,366 is a continuation-in-part of the following applications: U.S. application Ser. No. 12/567,716, filed Sep. 25, 2009 and U.S. application Ser. No. 13/283,811, filed Oct. 28, 2011.

The Ser. No. 12/567,716 application claims the benefit of the following U.S. patent applications, each of which is hereby incorporated by reference in its entirety:

U.S. App. No. 61/100,721 filed Sep. 27, 2008; U.S. App. No. 61/108,743 filed Oct. 27, 2008; U.S. App. No. 61/147,386 filed Jan. 26, 2009; U.S. App. No. 61/152,086 filed Feb. 12, 2009; U.S. App. No. 61/178,508 filed May 15, 2009; U.S. App. No. 61/182,768 filed Jun. 1, 2009; U.S. App. No. 61/121,159 filed Dec. 9, 2008; U.S. App. No. 61/142,977 filed Jan. 7, 2009; U.S. App. No. 61/142,885 filed Jan. 6, 2009; U.S. App. No. 61/142,796 filed Jan. 6, 2009; U.S. App. No. 61/142,889 filed Jan. 6, 2009; U.S. App. No. 61/142,880 filed Jan. 6, 2009; U.S. App. No. 61/142,818 filed Jan. 6, 2009; U.S. App. No. 61/142,887 filed Jan. 6, 2009; U.S. App. No. 61/156,764 filed Mar. 2, 2009; U.S. App. No. 61/143,058 filed Jan. 7, 2009; U.S. App. No. 61/152,390 filed Feb. 13, 2009; U.S. App. No. 61/163,695 filed Mar. 26, 2009; U.S. App. No. 61/172,633 filed Apr. 24, 2009; U.S. App. No. 61/169,240 filed Apr. 14, 2009, and U.S. App. No. 61/173,747 filed Apr. 29, 2009.

Application Ser. No. 13/283,811 is a continuation-in-part of the following applications: U.S. application Ser. No. 13/232,868 filed Sep. 14, 2011; U.S. application Ser. No. 12/899,281 filed Oct. 6, 2010; U.S. application Ser. No. 12/860,375 filed Aug. 20, 2010; U.S. application Ser. No. 12/722,050 filed Mar. 11, 2010; U.S. application Ser. No. 12/612,880 filed Nov. 5, 2009.

The Ser. No. 12/722,050 application is a continuation-in-part of U.S. Ser. No. 12/698,523 filed Feb. 2, 2010 which claims the benefit of U.S. Provisional patent application 61/254,559 filed Oct. 23, 2009. The Ser. No. 12/698,523 application is a continuation-in-part of U.S. Ser. No. 12/567,716 filed Sep. 25, 2009.

The Ser. No. 12/612,880 application is a continuation-in-part of U.S. Ser. No. 12/567,716 filed Sep. 25, 2009 and claims the benefit of U.S. Provisional App. No. 61/254,559 filed Oct. 23, 2009.

The Ser. No. 12/899,281 application is a continuation-in-part of U.S. Ser. No. 12/770,137 filed Apr. 29, 2010, a continuation-in-part of U.S. Ser. No. 12/721,118 filed, Mar. 10, 2010, a continuation-in-part of U.S. Ser. No. 12/613,686 filed Nov. 6, 2009.

The Ser. No. 12/613,686 application is a continuation of U.S. application Ser. No. 12/567,716 filed Sep. 25, 2009.

The Ser. No. 13/232,868 application claims the benefit of U.S. Provisional Appl. No. 61/382,806 filed Sep. 14, 2010.

The Ser. No. 13/232,868 application is a continuation-in-part of U.S. Ser. No. 13/222,915 filed Aug. 31, 2011 which claims the benefit of U.S. Provisional Appl. No. 61/378,600 filed Aug. 31, 2010 and U.S. Provisional Appl. No. 61/411,490 filed Nov. 9, 2010.

The Ser. No. 13/222,915 application is a continuation-in-part of U.S. Ser. No. 13/154,131 filed Jun. 6, 2011 which claims the benefit of U.S. Provisional Appl. No. 61/351,492 filed Jun. 4, 2010.

The Ser. No. 13/154,131 application is a continuation-in-part of U.S. Ser. No. 13/090,369 filed Apr. 20, 2011 which claims the benefit of U.S. Provisional Appl. No. 61/326,051 filed Apr. 20, 2010.

The Ser. No. 13/090,369 application is a continuation-in-part of U.S. patent application Ser. No. 13/021,965 filed Feb. 7, 2011 which is a continuation-in-part of U.S. patent application Ser. No. 12/986,018 filed Jan. 6, 2011, which claims the benefit of U.S. Provisional Appl. No. 61/292,768 filed Jan. 6, 2010.

The Ser. No. 13/154,131 application is also a continuation-in-part of U.S. patent application Ser. No. 12/986,018 filed Jan. 6, 2011 which claims the benefit of U.S. Provisional Appl. No. U.S. 61/292,768 filed Jan. 6, 2010.

The Ser. No. 12/986,018 application is a continuation-in-part of U.S. patent application Ser. No. 12/789,611 filed May 28, 2010.

The Ser. No. 12/789,611 application is a continuation-in-part of U.S. patent application Ser. No. 12/770,137 filed Apr. 29, 2010 which claims the benefit of U.S. Provisional Application No. 61/173,747 filed Apr. 29, 2009.

The Ser. No. 12/770,137 application is a continuation-in-part of U.S. application Ser. No. 12/767,633 filed Apr. 26, 2010, which claims the benefit of U.S. Provisional Application No. 61/172,633 filed Apr. 24, 2009.

Application Ser. No. 12/767,633 is a continuation-in-part of U.S. application Ser. No. 12/759,047 filed Apr. 13, 2010.

Application Ser. No. 12/860,375 is a continuation-in-part of U.S. application Ser. No. 12/759,047 filed Apr. 13, 2010.

Application Ser. No. 12/759,047 is a continuation-in-part of U.S. application Ser. No. 12/757,716 filed Apr. 9, 2010, which is a continuation-in-part of U.S. application Ser. No. 12/749,571 filed Mar. 30, 2010.

The Ser. No. 12/749,571 application is a continuation-in-part of the following U.S. applications: U.S. application Ser. No. 12/639,489 filed Dec. 16, 2009; U.S. application Ser. No. 12/647,705 filed Dec. 28, 2009, and U.S. application Ser. No. 12/567,716 filed Sep. 25, 2009.

The Ser. No. 12/757,716 application is a continuation-in-part of U.S. application Ser. No. 12/721,118 filed Mar. 10, 2010.

The Ser. No. 12/721,118 application is a continuation-in-part of U.S. application Ser. No. 12/705,582 filed Feb. 13, 2010.

The Ser. No. 12/705,582 application claims the benefit of U.S. Provisional Application No. 61/152,390 filed Feb. 13, 2009.

BACKGROUND

Field

This disclosure relates to wireless energy transfer, also referred to as wireless power transmission.

Description of the Related Art

Energy or power may be transferred wirelessly using a variety of known radiative, or far-field, and non-radiative, or near-field, techniques. For example, radiative wireless information transfer using low-directionality antennas, such as those used in radio and cellular communications systems and home computer networks, may be considered wireless energy transfer. However, this type of radiative transfer is very inefficient because only a tiny portion of the supplied or radiated power, namely, that portion in the direction of, and overlapping with, the receiver is picked up. The vast majority of the power is radiated away in all the other directions and lost in free space. Such inefficient power transfer may be acceptable for data transmission, but is not practical for transferring useful amounts of electrical energy for the purpose of doing work, such as for powering or charging electrical devices. One way to improve the transfer efficiency of some radiative energy transfer schemes is to use directional antennas to confine and preferentially direct the radiated energy towards a receiver. However, these directed radiation schemes may require an uninterruptible line-of-sight and potentially complicated tracking and steering mechanisms in the case of mobile transmitters and/or receivers. In addition, such schemes may pose hazards to objects or people that cross or intersect the beam when modest to high amounts of power are being transmitted. A known non-radiative, or near-field, wireless energy transfer scheme, often referred to as either induction or traditional induction, does not (intentionally) radiate power, but uses an oscillating current passing through a primary coil, to generate an oscillating magnetic near-field that induces currents in a near-by receiving or secondary coil. Traditional induction schemes have demonstrated the transmission of modest to large amounts of power, however only over very short distances, and with very small offset tolerances between the primary power supply unit and the secondary receiver unit. Electric transformers and proximity chargers are examples of devices that utilize this known short range, near-field energy transfer scheme.

Therefore a need exists for a wireless power transfer scheme that is capable of transferring useful amounts of electrical power over mid-range distances or alignment offsets. Such a wireless power transfer scheme should enable useful energy transfer over greater distances and alignment offsets than those realized with traditional induction schemes, but without the limitations and risks inherent in radiative transmission schemes.

SUMMARY

There is disclosed herein a non-radiative or near-field wireless energy transfer scheme that is capable of transmitting useful amounts of power over mid-range distances and alignment offsets. This inventive technique uses coupled electromagnetic resonators with long-lived oscillatory resonant modes to transfer power from a power supply to a power drain. The technique is general and may be applied to a wide range of resonators, even where the specific examples disclosed herein relate to electromagnetic resonators. If the resonators are designed such that the energy stored by the electric field is primarily confined within the structure and that the energy stored by the magnetic field is primarily in the region surrounding the resonator. Then, the energy exchange is mediated primarily by the resonant magnetic near-field. These types of resonators may be referred to as magnetic resonators. If the resonators are designed such that the energy stored by the magnetic field is primarily confined within the structure and that the energy stored by the electric field is primarily in the region surrounding the resonator. Then, the energy exchange is mediated primarily by the resonant electric near-field. These types of resonators may be referred to as electric resonators. Either type of resonator may also be referred to as an electromagnetic resonator. Both types of resonators are disclosed herein.

The omni-directional but stationary (non-lossy) nature of the near-fields of the resonators we disclose enables efficient wireless energy transfer over mid-range distances, over a wide range of directions and resonator orientations, suitable for charging, powering, or simultaneously powering and charging a variety of electronic devices. As a result, a system may have a wide variety of possible applications where a first resonator, connected to a power source, is in one location, and a second resonator, potentially connected to electrical/electronic devices, batteries, powering or charging circuits, and the like, is at a second location, and where the distance from the first resonator to the second resonator is on the order of centimeters to meters.

Energy exchange between two electromagnetic resonators can be optimized when the resonators are tuned to substantially the same frequency and when the losses in the system are minimal. Wireless energy transfer systems may be designed so that the "coupling-time" between resonators is much shorter than the resonators' "loss-times". Therefore, the systems and methods described herein may utilize high quality factor (high-Q) resonators with low intrinsic-loss rates. In addition, the systems and methods described herein may use sub-wavelength resonators with near-fields that extend significantly longer than the characteristic sizes of the resonators, so that the near-fields of the resonators that exchange energy overlap at mid-range distances. This is a regime of operation that has not been practiced before and that differs significantly from traditional induction designs.

It is important to appreciate the difference between the high-Q magnetic resonator scheme disclosed here and the known close-range or proximity inductive schemes, namely, that those known schemes do not conventionally utilize high-Q resonators. Using coupled-mode theory (CMT), (see, for example, *Waves and Fields in Optoelectronics*, H. A. Haus, Prentice Hall, 1984), one may show that a high-Q resonator-coupling mechanism can enable orders of magnitude more efficient power delivery between resonators spaced by mid-range distances than is enabled by traditional inductive schemes. Coupled high-Q resonators have demonstrated efficient energy transfer over mid-range distances and improved efficiencies and offset tolerances in short range energy transfer applications.

The systems and methods described herein may provide for near-field wireless energy transfer via strongly coupled high-Q resonators, a technique with the potential to transfer power levels from picowatts to kilowatts, safely, and over distances much larger than have been achieved using traditional induction techniques. Efficient energy transfer may be realized for a variety of general systems of strongly coupled resonators, such as systems of strongly coupled acoustic resonators, nuclear resonators, mechanical resonators, and the like, as originally described by researchers at M.I.T. in their publications, "Efficient wireless non-radiative mid-range energy transfer", *Annals of Physics*, vol. 323, Issue 1, p. 34 (2008) and "Wireless Power Transfer via Strongly Coupled Magnetic Resonances", *Science*, vol. 317, no. 5834, p. 83, (2007). Disclosed herein are electromagnetic resonators and systems of coupled electromagnetic resonators, also referred to more specifically as coupled magnetic resonators and coupled electric resonators, with operating frequencies below 10 GHz.

This disclosure describes wireless energy transfer technologies, also referred to as wireless power transmission technologies. Throughout this disclosure, we may use the terms wireless energy transfer, wireless power transfer, wireless power transmission, and the like, interchangeably. We may refer to supplying energy or power from a source, an AC or DC source, a battery, a source resonator, a power supply, a generator, a solar panel, and thermal collector, and the like, to a device, a remote device, to multiple remote devices, to a device resonator or resonators, and the like. We may describe intermediate resonators that extend the range of the wireless energy transfer system by allowing energy to hop, transfer through, be temporarily stored, be partially dissipated, or for the transfer to be mediated in any way, from a source resonator to any combination of other device and intermediate resonators, so that energy transfer networks, or strings, or extended paths may be realized. Device resonators may receive energy from a source resonator, convert a portion of that energy to electric power for powering or charging a device, and simultaneously pass a portion of the received energy onto other device or mobile device resonators. Energy may be transferred from a source resonator to multiple device resonators, significantly extending the distance over which energy may be wirelessly transferred. The wireless power transmission systems may be implemented using a variety of system architectures and resonator designs. The systems may include a single source or multiple sources transmitting power to a single device or multiple devices. The resonators may be designed to be source or device resonators, or they may be designed to be repeaters. In some cases, a resonator may be a device and source resonator simultaneously, or it may be switched from operating as a source to operating as a device or a repeater. One skilled in the art will understand that a variety of system architectures may be supported by the wide range of resonator designs and functionalities described in this application.

In the wireless energy transfer systems we describe, remote devices may be powered directly, using the wirelessly supplied power or energy, or the devices may be coupled to an energy storage unit such as a battery, a super-capacitor, an ultra-capacitor, or the like (or other kind of power drain), where the energy storage unit may be charged or re-charged wirelessly, and/or where the wireless power transfer mechanism is simply supplementary to the main power source of the device. The devices may be powered by hybrid battery/energy storage devices such as batteries with integrated storage capacitors and the like. Furthermore, novel battery and energy storage devices may be designed to take advantage of the operational improvements enabled by wireless power transmission systems.

Other power management scenarios include using wirelessly supplied power to recharge batteries or charge energy storage units while the devices they power are turned off, in an idle state, in a sleep mode, and the like. Batteries or energy storage units may be charged or recharged at high (fast) or low (slow) rates. Batteries or energy storage units may be trickle charged or float charged. Multiple devices may be charged or powered simultaneously in parallel or power delivery to multiple devices may be serialized such that one or more devices receive power for a period of time after which other power delivery is switched to other devices. Multiple devices may share power from one or more sources with one or more other devices either simultaneously, or in a time multiplexed manner, or in a frequency multiplexed manner, or in a spatially multiplexed manner, or in an orientation multiplexed manner, or in any combination of time and frequency and spatial and orientation multiplexing. Multiple devices may share power with each other, with at least one device being reconfigured continuously, intermittently, periodically, occasionally, or temporarily, to operate as wireless power sources. It would be understood by one of ordinary skill in the art that there are a variety of ways to power and/or charge devices, and the variety of ways could be applied to the technologies and applications described herein.

Wireless energy transfer has a variety of possible applications including for example, powering or recharging electric-engine vehicles, such as buses and/or hybrid cars and medical devices, such as wearable or implantable devices. Additional example applications include the ability to power or recharge autonomous electronics (e.g. laptops, cell-phones, portable music players, house-hold robots, GPS navigation systems, displays, etc), sensors and communications and navigation equipment, including equipment built into vehicles.

Wireless energy transfer techniques as described herein may be applied to wireless energy transfer applications in association with electrical components of a vehicle. In embodiments, systems and methods may provide for wireless energy distribution to a mechanically removable vehicle seat, comprising a source resonator coupled to an energy source of a vehicle, the source resonator positioned proximate to the mechanically removable vehicle seat, the source resonator generating an oscillating magnetic field with a resonant frequency and comprising a high-conductivity material adapted and located between the source resonator and a vehicle surface to direct the oscillating magnetic field away from the vehicle surface, and a receiving resonator integrated into the mechanically removable vehicle seat, the receiving resonator having a resonant frequency similar to that of the source resonator, and receiving wireless energy from the source resonator, and providing power to electrical components integrated with the mechanically removable vehicle seat. In embodiments, at least one of the electrical components may be a second resonator integrated proximate to the back portion of the vehicle seat, the second resonator comprising a high-conductivity material adapted and located between the second resonator and the interior of the vehicle seat to direct the oscillating magnetic field away from the interior of the vehicle seat, wherein the second resonator provides an effective wireless energy transfer area concentrated dominantly behind the vehicle seat. The second resonator may be electrically connected to the receiving resonator through a wired connection. A wireless energy enabled electrical device located within the wireless energy transfer area may receive wireless energy from the second resonator. In embodiments, a repeater resonator may be integrated proximate to the back portion of the vehicle seat the repeater resonator having a resonant frequency similar to the source resonant frequency and comprising a high-conductivity material adapted and located between the repeater resonator and the interior of the vehicle seat to direct the oscillating magnetic field away from the interior of the vehicle seat, wherein the repeater resonator provides an effective wireless energy transfer area substantially behind the vehicle seat. A wireless energy enabled electrical device located within the wireless energy transfer area may receive wireless energy from the repeater resonator. In embodiments, the at least one of the electrical components may be a seat heater, an electric seat-position adjustment actuator, an entertainment device, and the like. In embodiments, the high-conductivity material may be used to shape the resonator fields of the source resonator such that they avoid lossy objects in the vehicle surface. The high-conductivity material may be covered on at least one side by a layer of magnetic material to improve the electromagnetic coupling between the source resonator and the receiving resonator.

Throughout this disclosure we may refer to the certain circuit components such as capacitors, inductors, resistors, diodes, switches and the like as circuit components or elements. We may also refer to series and parallel combinations of these components as elements, networks, topologies, circuits, and the like. We may describe combinations of capacitors, diodes, varactors, transistors, and/or switches as adjustable impedance networks, tuning networks, matching networks, adjusting elements, and the like. We may also refer to "self-resonant" objects that have both capacitance, and inductance distributed (or partially distributed, as opposed to solely lumped) throughout the entire object. It would be understood by one of ordinary skill in the art that adjusting and controlling variable components within a circuit or network may adjust the performance of that circuit or network and that those adjustments may be described generally as tuning, adjusting, matching, correcting, and the like. Other methods to tune or adjust the operating point of the wireless power transfer system may be used alone, or in addition to adjusting tunable components such as inductors and capacitors, or banks of inductors and capacitors.

Unless otherwise defined, all technical and scientific terms used herein have the same meaning as commonly understood by one of ordinary skill in the art to which this disclosure belongs. In case of conflict with publications, patent applications, patents, and other references mentioned or incorporated herein by reference, the present specification, including definitions, will control.

Any of the features described above may be used, alone or in combination, without departing from the scope of this disclosure. Other features, objects, and advantages of the systems and methods disclosed herein will be apparent from the following detailed description and figures.

BRIEF DESCRIPTION OF FIGURES

FIG. 2 shows an exemplary resonator in the presence of a "loading" object, labeled according to the labeling convention described in this disclosure.

FIG. 3 shows an exemplary resonator in the presence of a "perturbing" object, labeled according to the labeling convention described in this disclosure.

FIG. 4A shows a circuit diagram of one example of a resonator FIG. 4B shows a diagram of one example of a capacitively-loaded inductor loop magnetic resonator, FIG. 4C shows a drawing of a self-resonant coil with distributed capacitance and inductance, FIG. 4D shows a simplified drawing of the electric and magnetic field lines associated with an exemplary magnetic resonator of the current disclosure, and FIG. 4E shows a diagram of one example of an electric resonator.

FIG. 5A shows a perspective view diagram of a planar magnetic resonator, FIG. 5B shows a perspective view diagram of a two planar magnetic resonator with various geometries, and FIG. 5C shows is a perspective view diagram of a two planar magnetic resonators separated by a distance D.

FIG. 6A shows a 3D finite element model of a copper and magnetic material structure driven by a square loop of current around the choke point at its center. In this example, a structure may be composed of two boxes made of a conducting material such as copper, covered by a layer of magnetic material, and connected by a block of magnetic material. The inside of the two conducting boxes in this example would be shielded from AC electromagnetic fields generated outside the boxes and may house lossy objects that might lower the Q of the resonator or sensitive components that might be adversely affected by the AC electromagnetic fields. Also shown are the calculated magnetic field streamlines generated by this structure, indicating that the magnetic field lines tend to follow the lower reluctance path in the magnetic material. FIG. 6B shows interaction, as indicated by the calculated magnetic field streamlines, between two identical structures as shown in FIG. 6A. Because of symmetry, and to reduce computational complexity, only one half of the system is modeled (but the computation assumes the symmetrical arrangement of the other half).

DETAILED DESCRIPTION

Figure 1A:
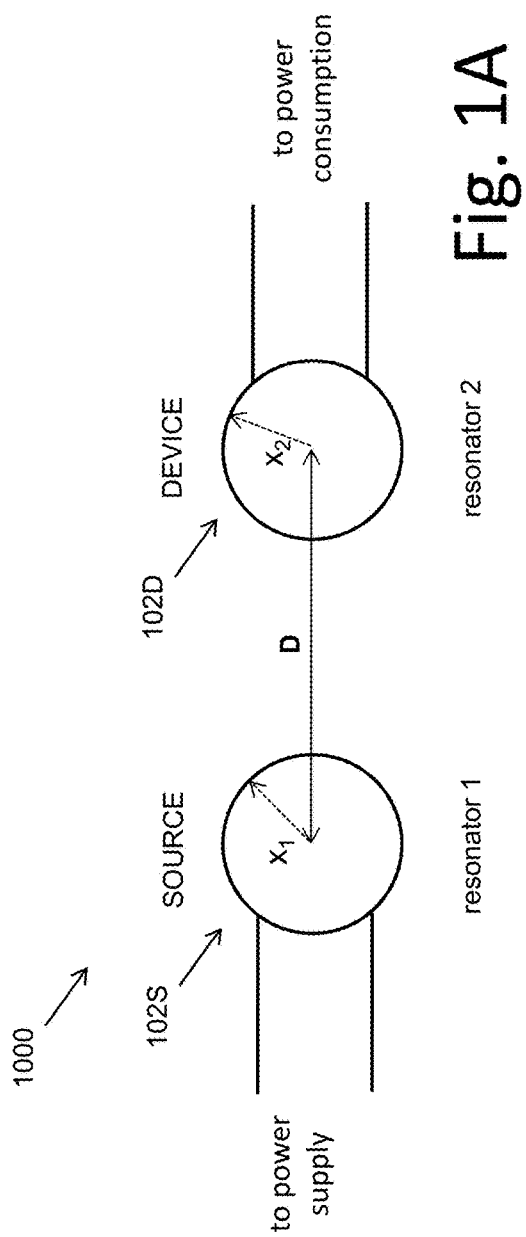
FIG. 1A and FIG. 1B depict exemplary wireless power systems containing a source resonator 1 and device resonator 2 separated by a distance D.

As described above, this disclosure relates to coupled electromagnetic resonators with long-lived oscillatory resonant modes that may wirelessly transfer power from a power supply to a power drain. However, the technique is not restricted to electromagnetic resonators, but is general and may be applied to a wide variety of resonators and resonant objects. Therefore, we first describe the general technique, and then disclose electromagnetic examples for wireless energy transfer.

Resonators

A resonator may be defined as a system that can store energy in at least two different forms, and where the stored energy is oscillating between the two forms. The resonance has a specific oscillation mode with a resonant (modal) frequency, f, and a resonant (modal) field. The angular resonant frequency, $\omega$, may be defined as $\omega=2\pi f$, the resonant wavelength, $\lambda$, may be defined as $\lambda=c/f$, where c is the speed of light, and the resonant period, T, may be defined as $T=1/f=2\pi/\omega$. In the absence of loss mechanisms, coupling mechanisms or external energy supplying or draining mechanisms, the total resonator stored energy, W, would stay fixed and the two forms of energy would oscillate, wherein one would be maximum when the other is minimum and vice versa.

In the absence of extraneous materials or objects, the energy in the resonator 102 shown in FIG. 1 may decay or be lost by intrinsic losses. The resonator fields then obey the following linear equation:

$$\frac{da(t)}{dt} = -i(\omega - i\Gamma)a(t),$$

where the variable a(t) is the resonant field amplitude, defined so that the energy contained within the resonator is given by $|a(t)|^2$. $\Gamma$ is the intrinsic energy decay or loss rate (e.g. due to absorption and radiation losses).

The Quality Factor, or Q-factor, or Q, of the resonator, which characterizes the energy decay, is inversely proportional to these energy losses. It may be defined as $Q=\omega*W/P$, where P is the time-averaged power lost at steady state. That is, a resonator 102 with a high-Q has relatively low intrinsic losses and can store energy for a relatively long time. Since the resonator loses energy at its intrinsic decay rate, $2\Gamma$, its Q, also referred to as its intrinsic Q, is given by $Q=\omega/2\Gamma$. The quality factor also represents the number of oscillation periods, T, it takes for the energy in the resonator to decay by a factor of e.

As described above, we define the quality factor or Q of the resonator as that due only to intrinsic loss mechanisms. A subscript index such as $Q_1$, indicates the resonator (resonator 1 in this case) to which the Q refers.

Extraneous objects and/or additional resonators in the vicinity of a first resonator may perturb or load the first resonator, thereby perturbing or loading the Q of the first resonator, depending on a variety of factors such as the distance between the resonator and object or other resonator, the material composition of the object or other resonator, the structure of the first resonator, the power in the first resonator, and the like. Unintended external energy losses or coupling mechanisms to extraneous materials and objects in the vicinity of the resonators may be referred to as "perturbing" the Q of a resonator, and may be indicated by a subscript within rounded parentheses, ( ). Intended external energy losses, associated with energy transfer via coupling to other resonators and to generators and loads in the wireless energy transfer system may be referred to as "loading" the Q of the resonator, and may be indicated by a subscript within square brackets, [ ].

The Q of a resonator 102 connected or coupled to a power generator, g, or load 302, l, may be called the "loaded quality factor" or the "loaded Q" and may be denoted by $Q_{[g]}$ or $Q_{[l]}$, as illustrated in FIG. 2. In general, there may be more than one generator or load 302 connected to a resonator 102. However, we do not list those generators or loads separately but rather use "g" and "l" to refer to the equivalent circuit loading imposed by the combinations of generators and loads. In general descriptions, we may use the subscript "l" to refer to either generators or loads connected to the resonators.

In some of the discussion herein, we define the "loading quality factor" or the "loading Q" due to a power generator or load connected to the resonator, as $\delta Q_{[l]}$, where, $1/\delta Q_{[l]} \equiv 1/Q_{[l]} - 1/Q$. Note that the larger the loading Q, $\delta Q_{[l]}$, of a generator or load, the less the loaded Q, $Q_{[l]}$, deviates from the unloaded Q of the resonator.

The Q of a resonator in the presence of an extraneous object 402, p, that is not intended to be part of the energy transfer system may be called the "perturbed quality factor" or the "perturbed Q" and may be denoted by $Q_{(p)}$, as illustrated in FIG. 3. In general, there may be many extraneous objects, denoted as p1, p2, etc., or a set of extraneous objects {p}, that perturb the Q of the resonator 102. In this case, the perturbed Q may be denoted $Q_{(p1+p2+\ldots)}$ or $Q_{(\{p\})}$. For example, $Q_{1(brick+wood)}$ may denote the perturbed quality factor of a first resonator in a system for wireless power exchange in the presence of a brick and a piece of wood, and $Q_{2(\{office\})}$ may denote the perturbed quality factor of a second resonator in a system for wireless power exchange in an office environment.

In some of the discussion herein, we define the "perturbing quality factor" or the "perturbing Q" due to an extraneous object, p, as $\delta Q_{(p)}$, where $1/\delta Q_{(p)} \equiv 1/Q_{(p)} - 1/Q$. As stated before, the perturbing quality factor may be due to multiple extraneous objects, p1, p2, etc. or a set of extraneous objects, {p}. The larger the perturbing Q, $\delta Q_{(p)}$, of an object, the less the perturbed Q, $Q_{(p)}$, deviates from the unperturbed Q of the resonator.

In some of the discussion herein, we also define $\Theta_{(p)} \equiv Q_{(p)}/Q$ and call it the "quality factor insensitivity" or the "Q-insensitivity" of the resonator in the presence of an extraneous object. A subscript index, such as $\Theta_{1(p)}$, indicates the resonator to which the perturbed and unperturbed quality factors are referring, namely, $\Theta_{1(p)} \equiv Q_{1(p)}/Q_1$.

Note that the quality factor, Q, may also be characterized as "unperturbed", when necessary to distinguish it from the perturbed quality factor, $Q_{(p)}$, and "unloaded", when necessary to distinguish it from the loaded quality factor, $Q_{[l]}$. Similarly, the perturbed quality factor, $Q_{(p)}$, may also be characterized as "unloaded", when necessary to distinguish them from the loaded perturbed quality factor, $Q_{(p)[l]}$.

Coupled Resonators

Resonators having substantially the same resonant frequency, coupled through any portion of their near-fields may interact and exchange energy. There are a variety of physical pictures and models that may be employed to understand, design, optimize and characterize this energy exchange. One way to describe and model the energy exchange between two coupled resonators is using coupled mode theory (CMT).

In coupled mode theory, the resonator fields obey the following set of linear equations:

$$\frac{da_m(t)}{dt} = -i(\omega_m - i\Gamma_m)a_m(t) + i\sum_{n \neq m} \kappa_{mn} a_n(t)$$

where the indices denote different resonators and $\kappa_{mn}$ are the coupling coefficients between the resonators. For a reciprocal system, the coupling coefficients may obey the relation $\kappa_{mn} = \kappa_{nm}$. Note that, for the purposes of the present specification, far-field radiation interference effects will be ignored and thus the coupling coefficients will be considered real. Furthermore, since in all subsequent calculations of system performance in this specification the coupling coefficients appear only with their square, $\kappa_{mn}^2$, we use $\kappa_{mn}$ to denote the absolute value of the real coupling coefficients.

Note that the coupling coefficient, $\kappa_{mn}$, from the CMT described above is related to the so-called coupling factor, $k_{mn}$, between resonators m and n by $k_{mn} = 2\kappa_{mn}/\sqrt{\omega_m \omega_n}$. We define a "strong-coupling factor", $U_{mn}$, as the ratio of the coupling and loss rates between resonators m and n, by $U_{mn} = \kappa_{mn}/\sqrt{\Gamma_m \Gamma_n} = k_{mn}\sqrt{Q_m Q_n}$.

The quality factor of a resonator m, in the presence of a similar frequency resonator n or additional resonators, may be loaded by that resonator n or additional resonators, in a fashion similar to the resonator being loaded by a connected power generating or consuming device. The fact that resonator m may be loaded by resonator n and vice versa is simply a different way to see that the resonators are coupled.

The loaded Q's of the resonators in these cases may be denoted as $Q_{m[n]}$ and $Q_{n[m]}$. For multiple resonators or loading supplies or devices, the total loading of a resonator may be determined by modeling each load as a resistive loss, and adding the multiple loads in the appropriate parallel and/or series combination to determine the equivalent load of the ensemble.

In some of the discussion herein, we define the "loading quality factor" or the "loading $Q_m$" of resonator m due to resonator n as $\delta Q_{m[n]}$, where $1/\delta Q_{m[n]} \equiv 1/Q_{m[n]} - 1/Q_m$. Note that resonator n is also loaded by resonator m and its "loading $Q_n$" is given by $1/\delta Q_{n[m]} \equiv 1/Q_{n[m]} - 1/Q_n$.

When one or more of the resonators are connected to power generators or loads, the set of linear equations is modified to:

$$\frac{da_m(t)}{dt} = -i(\omega_m - i\Gamma_m)a_m(t) + i\sum_{n \neq m} \kappa_{mn} a_n(t) - \kappa_m a_m(t) + \sqrt{2\kappa_m}\, s_{+m}(t)$$

$$s_{-m}(t) = \sqrt{2\kappa_m}\, a_m(t) - s_{+m}(t),$$

where $s_{+m}(t)$ and $s_{-m}(t)$ are respectively the amplitudes of the fields coming from a generator into the resonator m and going out of the resonator m either back towards the generator or into a load, defined so that the power they carry is given by $|s_{+m}(t)|^2$ and $|s_{-m}(t)|^2$. The loading coefficients $\kappa_m$ relate to the rate at which energy is exchanged between the resonator m and the generator or load connected to it.

Note that the loading coefficient, $\kappa_m$, from the CMT described above is related to the loading quality factor, $\delta Q_{m[l]}$, defined earlier, by $\delta Q_{m[l]} = \omega_m/2\kappa_m$.

We define a "strong-loading factor", $U_{m[l]}$, as the ratio of the loading and loss rates of resonator m, $U_{m[l]} = \kappa_m/\Gamma_m = Q_m/\delta Q_{m[l]}$.

FIG. 1A shows an example of two coupled resonators 1000, a first resonator 102S, configured as a source resonator and a second resonator 102D, configured as a device resonator. Energy may be transferred over a distance D between the resonators. The source resonator 102S may be driven by a power supply or generator (not shown). Work may be extracted from the device resonator 102D by a power consuming drain or load (e.g. a load resistor, not shown). Let us use the subscripts "s" for the source, "d" for the device, "g" for the generator, and "l" for the load, and, since in this example there are only two resonators and $\kappa_{sd}=\kappa_{ds}$, let us drop the indices on $\kappa_{sd}$, $k_{sd}$, and $U_{sd}$, and denote them as $\kappa$, k, and U, respectively.

The power generator may be constantly driving the source resonator at a constant driving frequency, f, corresponding to an angular driving frequency, $\omega$, where $\omega=2\pi f$.

In this case, the efficiency, $\eta=|s_{-d}|^2/|s_{+s}|^2$, of the power transmission from the generator to the load (via the source and device resonators) is maximized under the following conditions: The source resonant frequency, the device resonant frequency and the generator driving frequency have to be matched, namely $$\omega_s=\omega_d=\omega.$$

Furthermore, the loading Q of the source resonator due to the generator, $\delta Q_{s[g]}$, has to be matched (equal) to the loaded Q of the source resonator due to the device resonator and the load, $Q_{s[dl]}$, and inversely the loading Q of the device resonator due to the load, $\delta Q_{d[l]}$, has to be matched (equal) to the loaded Q of the device resonator due to the source resonator and the generator, $Q_{d[sg]}$, namely $$\delta Q_{s[g]}=Q_{s[dl]} \text{ and } \delta Q_{d[l]}=Q_{d[sg]}.$$

These equations determine the optimal loading rates of the source resonator by the generator and of the device resonator by the load as $$U_{d[l]}=\kappa_d/\Gamma_d=Q_d/\delta Q_{d[l]}=\sqrt{1+U^2}=$$
$$\sqrt{1+(\kappa/\sqrt{\Gamma_s\Gamma_d})^2}=Q_s/\delta Q_{s[g]}=\kappa_s/\Gamma_s=U_{s[g]}.$$

Note that the above frequency matching and Q matching conditions are together known as "impedance matching" in electrical engineering.

Under the above conditions, the maximized efficiency is a monotonically increasing function of only the strong-coupling factor, $U=\kappa/\sqrt{\Gamma_s\Gamma_d}=k\sqrt{Q_sQ_d}$, between the source and device resonators and is given by, $\eta=U^2/(1+\sqrt{1+U^2})^2$. Note that the coupling efficiency, $\eta$, is greater than 1% when U is greater than 0.2, is greater than 10% when U is greater than 0.7, is greater than 17% when U is greater than 1, is greater than 52% when U is greater than 3, is greater than 80% when U is greater than 9, is greater than 90% when U is greater than 19, and is greater than 95% when U is greater than 45. In some applications, the regime of operation where U>1 may be referred to as the "strong-coupling" regime.

Since a large $U=\kappa/\sqrt{\Gamma_s\Gamma_d}=(2\kappa/\sqrt{\omega_s\omega_d})\sqrt{Q_sQ_d}$ is desired in certain circumstances, resonators may be used that are high-Q. The Q of each resonator may be high. The geometric mean of the resonator Q's, $\sqrt{Q_sQ_d}$ may also or instead be high.

The coupling factor, k, is a number between $0 \leq k \leq 1$, and it may be independent (or nearly independent) of the resonant frequencies of the source and device resonators, rather it may determined mostly by their relative geometry and the physical decay-law of the field mediating their coupling. In contrast, the coupling coefficient, $\kappa=k\sqrt{\omega_s\omega_d}/2$, may be a strong function of the resonant frequencies. The resonant frequencies of the resonators may be chosen preferably to achieve a high Q rather than to achieve a low $\Gamma$, as these two goals may be achievable at two separate resonant frequency regimes.

A high-Q resonator may be defined as one with Q>100. Two coupled resonators may be referred to as a system of high-Q resonators when each resonator has a Q greater than 100, $Q_s$>100 and $Q_d$>100. In other implementations, two coupled resonators may be referred to as a system of high-Q resonators when the geometric mean of the resonator Q's is greater than 100, $\sqrt{Q_sQ_d}$>100.

The resonators may be named or numbered. They may be referred to as source resonators, device resonators, first resonators, second resonators, repeater resonators, and the like. It is to be understood that while two resonators are shown in FIG. 1, and in many of the examples below, other implementations may include three (3) or more resonators. For example, a single source resonator 102S may transfer energy to multiple device resonators 102D or multiple devices. Energy may be transferred from a first device to a second, and then from the second device to the third, and so forth. Multiple sources may transfer energy to a single device or to multiple devices connected to a single device resonator or to multiple devices connected to multiple device resonators. Resonators 102 may serve alternately or simultaneously as sources, devices, or they may be used to relay power from a source in one location to a device in another location. Intermediate electromagnetic resonators 102 may be used to extend the distance range of wireless energy transfer systems. Multiple resonators 102 may be daisy chained together, exchanging energy over extended distances and with a wide range of sources and devices. High power levels may be split between multiple sources 102S, transferred to multiple devices and recombined at a distant location.

The analysis of a single source and a single device resonator may be extended to multiple source resonators and/or multiple device resonators and/or multiple intermediate resonators. In such an analysis, the conclusion may be that large strong-coupling factors, $U_{mn}$, between at least some or all of the multiple resonators is preferred for a high system efficiency in the wireless energy transfer. Again, implementations may use source, device and intermediate resonators that have a high Q. The Q of each resonator may be high. The geometric mean $\sqrt{Q_mQ_n}$ of the Q's for pairs of resonators m and n, for which a large $U_{mn}$ is desired, may also or instead be high.

Note that since the strong-coupling factor of two resonators may be determined by the relative magnitudes of the loss mechanisms of each resonator and the coupling mechanism between the two resonators, the strength of any or all of these mechanisms may be perturbed in the presence of extraneous objects in the vicinity of the resonators as described above.

Continuing the conventions for labeling from the previous sections, we describe k as the coupling factor in the absence of extraneous objects or materials. We denote the coupling factor in the presence of an extraneous object, p, as $k_{(p)}$, and call it the "perturbed coupling factor" or the "perturbed k". Note that the coupling factor, k, may also be characterized as "unperturbed", when necessary to distinguish from the perturbed coupling factor $k_{(p)}$.

We define $\delta k_{(p)} \equiv k_{(p)}-k$ and we call it the "perturbation on the coupling factor" or the "perturbation on k" due to an extraneous object, p.

We also define $\beta_{(p)} \equiv k_{(p)}/k$ and we call it the "coupling factor insensitivity" or the "k-insensitivity". Lower indices, such as $\beta_{12(p)}$, indicate the resonators to which the perturbed and unperturbed coupling factor is referred to, namely $\beta_{12(p)} \equiv k_{12(p)}/k_{12}$.

Similarly, we describe U as the strong-coupling factor in the absence of extraneous objects. We denote the strong-coupling factor in the presence of an extraneous object, p, as $U_{(p)}$, $U_{(p)} = k_{(p)}\sqrt{Q_{1(p)}Q_{2(p)}}$, and call it the "perturbed strong-coupling factor" or the "perturbed U". Note that the strong-coupling factor U may also be characterized as "unperturbed", when necessary to distinguish from the perturbed strong-coupling factor $U_{(p)}$. Note that the strong-coupling factor U may also be characterized as "unperturbed", when necessary to distinguish from the perturbed strong-coupling factor $U_{(p)}$.

We define $\delta U_{(p)} \equiv U_{(p)} - U$ and call it the "perturbation on the strong-coupling factor" or the "perturbation on U" due to an extraneous object, p.

We also define $\Xi_{(p)} \equiv U_{(p)}/U$ and call it the "strong-coupling factor insensitivity" or the "U-insensitivity". Lower indices, such as $\Xi_{12(p)}$, indicate the resonators to which the perturbed and unperturbed coupling factor refers, namely $\Xi_{12(p)} \equiv U_{12(p)}/U_{12}$.

The efficiency of the energy exchange in a perturbed system may be given by the same formula giving the efficiency of the unperturbed system, where all parameters such as strong-coupling factors, coupling factors, and quality factors are replaced by their perturbed equivalents. For example, in a system of wireless energy transfer including one source and one device resonator, the optimal efficiency may calculated as $\eta_{(p)} = [U_{(p)}/(1+\sqrt{1+U_{(p)}^2})]^2$. Therefore, in a system of wireless energy exchange which is perturbed by extraneous objects, large perturbed strong-coupling factors, $U_{mn(p)}$, between at least some or all of the multiple resonators may be desired for a high system efficiency in the wireless energy transfer. Source, device and/or intermediate resonators may have a high $Q_{(p)}$.

Some extraneous perturbations may sometimes be detrimental for the perturbed strong-coupling factors (via large perturbations on the coupling factors or the quality factors). Therefore, techniques may be used to reduce the effect of extraneous perturbations on the system and preserve large strong-coupling factor insensitivities.

Efficiency of Energy Exchange

The so-called "useful" energy in a useful energy exchange is the energy or power that must be delivered to a device (or devices) in order to power or charge the device. The transfer efficiency that corresponds to a useful energy exchange may be system or application dependent. For example, high power vehicle charging applications that transfer kilowatts of power may need to be at least 80% efficient in order to supply useful amounts of power resulting in a useful energy exchange sufficient to recharge a vehicle battery, without significantly heating up various components of the transfer system. In some consumer electronics applications, a useful energy exchange may include any energy transfer efficiencies greater than 10%, or any other amount acceptable to keep rechargeable batteries "topped off" and running for long periods of time. For some wireless sensor applications, transfer efficiencies that are much less than 1% may be adequate for powering multiple low power sensors from a single source located a significant distance from the sensors. For still other applications, where wired power transfer is either impossible or impractical, a wide range of transfer efficiencies may be acceptable for a useful energy exchange and may be said to supply useful power to devices in those applications. In general, an operating distance is any distance over which a useful energy exchange is or can be maintained according to the principles disclosed herein.

A useful energy exchange for a wireless energy transfer in a powering or recharging application may be efficient, highly efficient, or efficient enough, as long as the wasted energy levels, heat dissipation, and associated field strengths are within tolerable limits. The tolerable limits may depend on the application, the environment and the system location. Wireless energy transfer for powering or recharging applications may be efficient, highly efficient, or efficient enough, as long as the desired system performance may be attained for the reasonable cost restrictions, weight restrictions, size restrictions, and the like. Efficient energy transfer may be determined relative to that which could be achieved using traditional inductive techniques that are not high-Q systems. Then, the energy transfer may be defined as being efficient, highly efficient, or efficient enough, if more energy is delivered than could be delivered by similarly sized coil structures in traditional inductive schemes over similar distances or alignment offsets.

Note that, even though certain frequency and Q matching conditions may optimize the system efficiency of energy transfer, these conditions may not need to be exactly met in order to have efficient enough energy transfer for a useful energy exchange. Efficient energy exchange may be realized so long as the relative offset of the resonant frequencies $(|\omega_m - \omega_n|/\sqrt{\omega_m \omega_n})$ is less than approximately the maximum among $1/Q_{m(p)}$, $1/Q_{n(p)}$ and $k_{mn(p)}$. The Q matching condition may be less critical than the frequency matching condition for efficient energy exchange. The degree by which the strong-loading factors, $U_{m[l]}$, of the resonators due to generators and/or loads may be away from their optimal values and still have efficient enough energy exchange depends on the particular system, whether all or some of the generators and/or loads are Q-mismatched and so on.

Therefore, the resonant frequencies of the resonators may not be exactly matched, but may be matched within the above tolerances. The strong-loading factors of at least some of the resonators due to generators and/or loads may not be exactly matched to their optimal value. The voltage levels, current levels, impedance values, material parameters, and the like may not be at the exact values described in the disclosure but will be within some acceptable tolerance of those values. The system optimization may include cost, size, weight, complexity, and the like, considerations, in addition to efficiency, Q, frequency, strong coupling factor, and the like, considerations. Some system performance parameters, specifications, and designs may be far from optimal in order to optimize other system performance parameters, specifications and designs.

In some applications, at least some of the system parameters may be varying in time, for example because components, such as sources or devices, may be mobile or aging or because the loads may be variable or because the perturbations or the environmental conditions are changing etc. In these cases, in order to achieve acceptable matching conditions, at least some of the system parameters may need to be dynamically adjustable or tunable. All the system parameters may be dynamically adjustable or tunable to achieve approximately the optimal operating conditions. However, based on the discussion above, efficient enough energy exchange may be realized even if some system parameters are not variable. In some examples, at least some of the devices may not be dynamically adjusted. In some examples, at least some of the sources may not be dynamically adjusted. In some examples, at least some of the intermediate resonators may not be dynamically adjusted. In some examples, none of the system parameters may be dynamically adjusted.

Electromagnetic Resonators

The resonators used to exchange energy may be electromagnetic resonators. In such resonators, the intrinsic energy decay rates, $\Gamma_m$, are given by the absorption (or resistive) losses and the radiation losses of the resonator.

The resonator may be constructed such that the energy stored by the electric field is primarily confined within the structure and that the energy stored by the magnetic field is primarily in the region surrounding the resonator. Then, the energy exchange is mediated primarily by the resonant magnetic near-field. These types of resonators may be referred to as magnetic resonators.

The resonator may be constructed such that the energy stored by the magnetic field is primarily confined within the structure and that the energy stored by the electric field is primarily in the region surrounding the resonator. Then, the energy exchange is mediated primarily by the resonant electric near-field. These types of resonators may be referred to as electric resonators.

Note that the total electric and magnetic energies stored by the resonator have to be equal, but their localizations may be quite different. In some cases, the ratio of the average electric field energy to the average magnetic field energy specified at a distance from a resonator may be used to characterize or describe the resonator.

Electromagnetic resonators may include an inductive element, a distributed inductance, or a combination of inductances with inductance, L, and a capacitive element, a distributed capacitance, or a combination of capacitances, with capacitance, C. A minimal circuit model of an electromagnetic resonator 102 is shown in FIG. 4A. The resonator may include an inductive element 108 and a capacitive element 104. Provided with initial energy, such as electric field energy stored in the capacitor 104, the system will oscillate as the capacitor discharges transferring energy into magnetic field energy stored in the inductor 108 which in turn transfers energy back into electric field energy stored in the capacitor 104.

The resonators 102 shown in FIGS. 4B-4D may be referred to as magnetic resonators. Magnetic resonators may be preferred for wireless energy transfer applications in populated environments because most everyday materials including animals, plants, and humans are non-magnetic (i.e., $\mu_r \approx 1$), so their interaction with magnetic fields is minimal and due primarily to eddy currents induced by the time-variation of the magnetic fields, which is a second-order effect. This characteristic is important both for safety reasons and because it reduces the potential for interactions with extraneous environmental objects and materials that could alter system performance.

FIG. 4D shows a simplified drawing of some of the electric and magnetic field lines associated with an exemplary magnetic resonator 102B. The magnetic resonator 102B may include a loop of conductor acting as an inductive element 108 and a capacitive element 104 at the ends of the conductor loop. Note that this drawing depicts most of the energy in the region surrounding the resonator being stored in the magnetic field, and most of the energy in the resonator (between the capacitor plates) stored in the electric field. Some electric field, owing to fringing fields, free charges, and the time varying magnetic field, may be stored in the region around the resonator, but the magnetic resonator may be designed to confine the electric fields to be close to or within the resonator itself, as much as possible.

The inductor 108 and capacitor 104 of an electromagnetic resonator 102 may be bulk circuit elements, or the inductance and capacitance may be distributed and may result from the way the conductors are formed, shaped, or positioned, in the structure. For example, the inductor 108 may be realized by shaping a conductor to enclose a surface area, as shown in FIGS. 4(b)(c)(d). This type of resonator 102 may be referred to as a capacitively-loaded loop inductor. Note that we may use the terms "loop" or "coil" to indicate generally a conducting structure (wire, tube, strip, etc.), enclosing a surface of any shape and dimension, with any number of turns. In FIG. 4B, the enclosed surface area is circular, but the surface may be any of a wide variety of other shapes and sizes and may be designed to achieve certain system performance specifications. As an example to indicate how inductance scales with physical dimensions, the inductance for a length of circular conductor arranged to form a circular single-turn loop is approximately, $$L = \mu_0 x \left( \ln \frac{8x}{a} - 2 \right),$$

where $\mu_0$ is the magnetic permeability of free space, x, is the radius of the enclosed circular surface area and, a, is the radius of the conductor used to form the inductor loop. A more precise value of the inductance of the loop may be calculated analytically or numerically.

The inductance for other cross-section conductors, arranged to form other enclosed surface shapes, areas, sizes, and the like, and of any number of wire turns, may be calculated analytically, numerically or it may be determined by measurement. The inductance may be realized using inductor elements, distributed inductance, networks, arrays, series and parallel combinations of inductors and inductances, and the like. The inductance may be fixed or variable and may be used to vary impedance matching as well as resonant frequency operating conditions.

There are a variety of ways to realize the capacitance required to achieve the desired resonant frequency for a resonator structure. Capacitor plates 110 may be formed and utilized as shown in FIG. 4B, or the capacitance may be distributed and be realized between adjacent windings of a multi-loop conductor 114, as shown in FIG. 4C. The capacitance may be realized using capacitor elements, distributed capacitance, networks, arrays, series and parallel combinations of capacitances, and the like. The capacitance may be fixed or variable and may be used to vary impedance matching as well as resonant frequency operating conditions.

It is to be understood that the inductance and capacitance in an electromagnetic resonator 102 may be lumped, distributed, or a combination of lumped and distributed inductance and capacitance and that electromagnetic resonators may be realized by combinations of the various elements, techniques and effects described herein.

Electromagnetic resonators 102 may be include inductors, inductances, capacitors, capacitances, as well as additional circuit elements such as resistors, diodes, switches, amplifiers, diodes, transistors, transformers, conductors, connectors and the like.

Resonant Frequency of an Electromagnetic Resonator

An electromagnetic resonator 102 may have a characteristic, natural, or resonant frequency determined by its physical properties. This resonant frequency is the frequency at which the energy stored by the resonator oscillates between that stored by the electric field, $W_E$, ($W_E = q^2/2C$, where q is the charge on the capacitor, C) and that stored by the magnetic field, $W_B$, ($W_B = Li^2/2$, where i is the current through the inductor, L) of the resonator. In the absence of any losses in the system, energy would continually be exchanged between the electric field in the capacitor 104 and the magnetic field in the inductor 108. The frequency at which this energy is exchanged may be called the characteristic frequency, the natural frequency, or the resonant frequency of the resonator, and is given by ω, $$\omega = 2\pi f = \sqrt{\frac{1}{LC}}.$$

The resonant frequency of the resonator may be changed by tuning the inductance, L, and/or the capacitance, C, of the resonator. The resonator frequency may be design to operate at the so-called ISM (Industrial, Scientific and Medical) frequencies as specified by the FCC. The resonator frequency may be chosen to meet certain field limit specifications, specific absorption rate (SAR) limit specifications, electromagnetic compatibility (EMC) specifications, electromagnetic interference (EMI) specifications, component size, cost or performance specifications, and the like.

Quality Factor of an Electromagnetic Resonator

The energy in the resonators 102 shown in FIG. 4 may decay or be lost by intrinsic losses including absorptive losses (also called ohmic or resistive losses) and/or radiative losses. The Quality Factor, or Q, of the resonator, which characterizes the energy decay, is inversely proportional to these losses. Absorptive losses may be caused by the finite conductivity of the conductor used to form the inductor as well as by losses in other elements, components, connectors, and the like, in the resonator. An inductor formed from low loss materials may be referred to as a "high-Q inductive element" and elements, components, connectors and the like with low losses may be referred to as having "high resistive Q's". In general, the total absorptive loss for a resonator may be calculated as the appropriate series and/or parallel combination of resistive losses for the various elements and components that make up the resonator. That is, in the absence of any significant radiative or component/connection losses, the Q of the resonator may be given by, $Q_{abs}$, $$Q_{abs} = \frac{\omega L}{R_{abs}},$$

where ω, is the resonant frequency, L, is the total inductance of the resonator and the resistance for the conductor used to form the inductor, for example, may be given by $R_{abs} = l\rho/A$, (l is the length of the wire, ρ is the resistivity of the conductor material, and A is the cross-sectional area over which current flows in the wire). For alternating currents, the cross-sectional area over which current flows may be less than the physical cross-sectional area of the conductor owing to the skin effect. Therefore, high-Q magnetic resonators may be composed of conductors with high conductivity, relatively large surface areas and/or with specially designed profiles (e.g. Litz wire) to minimize proximity effects and reduce the AC resistance.

The magnetic resonator structures may include high-Q inductive elements composed of high conductivity wire, coated wire, Litz wire, ribbon, strapping or plates, tubing, paint, gels, traces, and the like. The magnetic resonators may be self-resonant, or they may include external coupled elements such as capacitors, inductors, switches, diodes, transistors, transformers, and the like. The magnetic resonators may include distributed and lumped capacitance and inductance. In general, the Q of the resonators will be determined by the Q's of all the individual components of the resonator.

Because Q is proportional to inductance, L, resonators may be designed to increase L, within certain other constraints. One way to increase L, for example, is to use more than one turn of the conductor to form the inductor in the resonator. Design techniques and trade-offs may depend on the application, and a wide variety of structures, conductors, components, and resonant frequencies may be chosen in the design of high-Q magnetic resonators.

In the absence of significant absorption losses, the Q of the resonator may be determined primarily by the radiation losses, and given by, $Q_{rad} = \omega L/R_{rad}$, where $R_{rad}$ is the radiative loss of the resonator and may depend on the size of the resonator relative to the frequency, ω, or wavelength, λ, of operation. For the magnetic resonators discussed above, radiative losses may scale as $R_{rad} \sim (x/\lambda)^4$ (characteristic of magnetic dipole radiation), where x is a characteristic dimension of the resonator, such as the radius of the inductive element shown in FIG. 6B, and where λ=c/f, where c is the speed of light and f is as defined above. The size of the magnetic resonator may be much less than the wavelength of operation so radiation losses may be very small. Such structures may be referred to as sub-wavelength resonators. Radiation may be a loss mechanism for non-radiative wireless energy transfer systems and designs may be chosen to reduce or minimize $R_{rad}$. Note that a high-$Q_{rad}$ may be desirable for non-radiative wireless energy transfer schemes.

Note too that the design of resonators for non-radiative wireless energy transfer differs from antennas designed for communication or far-field energy transmission purposes. Specifically, capacitively-loaded conductive loops may be used as resonant antennas (for example in cell phones), but those operate in the far-field regime where the radiation Q's are intentionally designed to be small to make the antenna efficient at radiating energy. Such designs are not appropriate for the efficient near-field wireless energy transfer technique disclosed in this application.

The quality factor of a resonator including both radiative and absorption losses is $Q = \omega L/(R_{abs} + R_{rad})$. Note that there may be a maximum Q value for a particular resonator and that resonators may be designed with special consideration given to the size of the resonator, the materials and elements used to construct the resonator, the operating frequency, the connection mechanisms, and the like, in order to achieve a high-Q resonator.

When the resonator is being described in terms of loss rates, the Q may be defined using the intrinsic decay rate, 2Γ, as described previously. The intrinsic decay rate is the rate at which an uncoupled and undriven resonator loses energy. For the magnetic resonators described above, the intrinsic loss rate may be given by $\Gamma = (R_{abs} + R_{rad})/2L$, and the quality factor, Q, of the resonator is given by $Q = \omega/2\Gamma$.

Note that a quality factor related only to a specific loss mechanism may be denoted as $Q_{mechanism}$, if the resonator is not specified, or as $Q_{1,mechanism}$, if the resonator is specified (e.g. resonator 1). For example, $Q_{1,rad}$ is the quality factor for resonator 1 related to its radiation losses.

Electromagnetic Resonator Near-Fields

The high-Q electromagnetic resonators used in the near-field wireless energy transfer system disclosed here may be sub-wavelength objects. That is, the physical dimensions of the resonator may be much smaller than the wavelength corresponding to the resonant frequency. Sub-wavelength magnetic resonators may have most of the energy in the region surrounding the resonator stored in their magnetic near-fields, and these fields may also be described as stationary or non-propagating because they do not radiate away from the resonator. The extent of the near-field in the area surrounding the resonator is typically set by the wavelength, so it may extend well beyond the resonator itself for a sub-wavelength resonator. The limiting surface, where the field behavior changes from near-field behavior to far-field behavior may be called the "radiation caustic".

The strength of the near-field is reduced the farther one gets away from the resonator. While the field strength of the resonator near-fields decays away from the resonator, the fields may still interact with objects brought into the general vicinity of the resonator. The degree to which the fields interact depends on a variety of factors, some of which may be controlled and designed, and some of which may not. The wireless energy transfer schemes described herein may be realized when the distance between coupled resonators is such that one resonator lies within the radiation caustic of the other.

The near-field profiles of the electromagnetic resonators may be similar to those commonly associated with dipole resonators or oscillators. Such field profiles may be described as omni-directional, meaning the magnitudes of the fields are non-zero in all directions away from the object.

Characteristic Size of an Electromagnetic Resonator

Spatially separated and/or offset magnetic resonators of sufficient Q may achieve efficient wireless energy transfer over distances that are much larger than have been seen in the prior art, even if the sizes and shapes of the resonator structures are different. Such resonators may also be operated to achieve more efficient energy transfer than was achievable with previous techniques over shorter range distances. We describe such resonators as being capable of mid-range energy transfer.

Mid-range distances may be defined as distances that are larger than the characteristic dimension of the smallest of the resonators involved in the transfer, where the distance is measured from the center of one resonator structure to the center of a spatially separated second resonator structure. In this definition, two-dimensional resonators are spatially separated when the areas circumscribed by their inductive elements do not intersect and three-dimensional resonators are spatially separated when their volumes do not intersect. A two-dimensional resonator is spatially separated from a three-dimensional resonator when the area circumscribed by the former is outside the volume of the latter.

It is to be understood that the characteristic sizes of resonators may be defined in terms of the size of the conductor and the area circumscribed or enclosed by the inductive element in a magnetic resonator and the length of the conductor forming the capacitive element of an electric resonator. Then, the characteristic size of a resonator, $x_{char}$, may be equal to the radius of the smallest sphere that can fit around the inductive or capacitive element of the magnetic or electric resonator respectively, and the center of the resonator structure is the center of the sphere. The characteristic thickness, $t_{char}$, of a resonator may be the smallest possible height of the highest point of the inductive or capacitive element in the magnetic or capacitive resonator respectively, measured from a flat surface on which it is placed. The characteristic width of a resonator, $w_{char}$, may be the radius of the smallest possible circle through which the inductive or capacitive element of the magnetic or electric resonator respectively, may pass while traveling in a straight line. For example, the characteristic width of a cylindrical resonator may be the radius of the cylinder.

In this inventive wireless energy transfer technique, energy may be exchanged efficiently over a wide range of distances, but the technique is distinguished by the ability to exchange useful energy for powering or recharging devices over mid-range distances and between resonators with different physical dimensions, components and orientations. Note that while k may be small in these circumstances, strong coupling and efficient energy transfer may be realized by using high-Q resonators to achieve a high U, $U=k\sqrt{Q_sQ_d}$. That is, increases in Q may be used to at least partially overcome decreases in k, to maintain useful energy transfer efficiencies.

Note too that while the near-field of a single resonator may be described as omni-directional, the efficiency of the energy exchange between two resonators may depend on the relative position and orientation of the resonators. That is, the efficiency of the energy exchange may be maximized for particular relative orientations of the resonators. The sensitivity of the transfer efficiency to the relative position and orientation of two uncompensated resonators may be captured in the calculation of either k or κ. While coupling may be achieved between resonators that are offset and/or rotated relative to each other, the efficiency of the exchange may depend on the details of the positioning and on any feedback, tuning, and compensation techniques implemented during operation.

High-Q Magnetic Resonators

In the near-field regime of a sub-wavelength capacitively-loaded loop magnetic resonator ($x<<\lambda$), the resistances associated with a circular conducting loop inductor composed of N turns of wire whose radius is larger than the skin depth, are approximately $R_{abs}=\sqrt{\mu_0\rho\omega/2}\cdot Nx/a$ and $R_{rad}=\pi/6\cdot\eta_0 N^2(\omega x/c)^4$, where ρ is the resistivity of the conductor material and $\eta_0\approx 120\,\pi\Omega$ is the impedance of free space. The inductance, L, for such a N-turn loop is approximately $N^2$ times the inductance of a single-turn loop given previously. The quality factor of such a resonator, $Q=\omega L/(R_{abs}+R_{rad})$, is highest for a particular frequency determined by the system parameters (FIG. 3). As described previously, at lower frequencies the Q is determined primarily by absorption losses and at higher frequencies the Q is determined primarily by radiation losses.

Note that the formulas given above are approximate and intended to illustrate the functional dependence of $R_{abs}$, $R_{rad}$ and L on the physical parameters of the structure. More accurate numerical calculations of these parameters that take into account deviations from the strict quasi-static limit, for example a non-uniform current/charge distribution along the conductor, may be useful for the precise design of a resonator structure.

Note that the absorptive losses may be minimized by using low loss conductors to form the inductive elements. The loss of the conductors may be minimized by using large surface area conductors such as conductive tubing, strapping, strips, machined objects, plates, and the like, by using specially designed conductors such as Litz wire, braided wires, wires of any cross-section, and other conductors with low proximity losses, in which case the frequency scaled behavior described above may be different, and by using low resistivity materials such as high-purity copper and silver, for example. One advantage of using conductive tubing as the conductor at higher operating frequencies is that it may be cheaper and lighter than a similar diameter solid conductor, and may have similar resistance because most of the current is traveling along the outer surface of the conductor owing to the skin effect.

To get a rough estimate of achievable resonator designs made from copper wire or copper tubing and appropriate for operation in the microwave regime, one may calculate the optimum Q and resonant frequency for a resonator composed of one circular inductive element (N=1) of copper wire ($\rho=1.69 \cdot 10^{-8} \Omega m$) with various cross sections. Then for an inductive element with characteristic size x=1 cm and conductor diameter a=1 mm, appropriate for a cell phone for example, the quality factor peaks at Q=1225 when f=380 MHz. For x=30 cm and a=2 mm, an inductive element size that might be appropriate for a laptop or a household robot, Q=1103 at f=17 MHz. For a larger source inductive element that might be located in the ceiling for example, x=1 m and a=4 mm, Q may be as high as Q=1315 at f=5 MHz. Note that a number of practical examples yield expected quality factors of Q≈1000-1500 at $\Delta/x \approx 50$-80. Measurements of a wider variety of coil shapes, sizes, materials and operating frequencies than described above show that Q's>100 may be realized for a variety of magnetic resonator structures using commonly available materials.

Figure 1B:
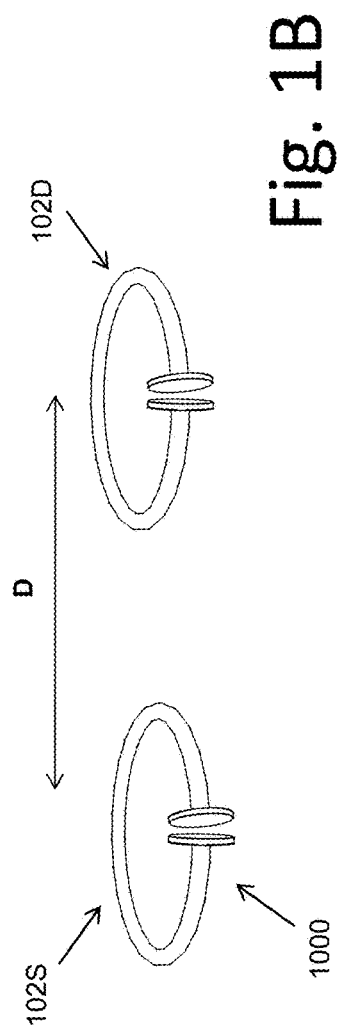

As described above, the rate for energy transfer between two resonators of characteristic size $x_1$ and $x_2$, and separated by a distance D between their centers, may be given by κ. To give an example of how the defined parameters scale, consider the cell phone, laptop, and ceiling resonator examples from above, at three (3) distances; D/x=10, 8, 6. In the examples considered here, the source and device resonators are the same size, $x_1=x_2$, and shape, and are oriented as shown in FIG. 1B. In the cell phone example, ω/2κ=3033, 1553, 655 respectively. In the laptop example, ω/2κ=7131, 3651, 1540 respectively and for the ceiling resonator example, ω/2κ=6481, 3318, 1400. The corresponding coupling-to-loss ratios peak at the frequency where the inductive element Q peaks and are κ/Γ=0.4, 0.79, 1.97 and 0.15, 0.3, 0.72 and 0.2, 0.4, 0.94 for the three inductive element sizes and distances described above. An example using different sized inductive elements is that of an $x_1=1$ m inductor (e.g. source in the ceiling) and an $x_2=30$ cm inductor (e.g. household robot on the floor) at a distance D=3 m apart (e.g. room height). In this example, the strong-coupling figure of merit, $U=\kappa/\sqrt{\Gamma_1\Gamma_2}=0.88$, for an efficiency of approximately 14%, at the optimal operating frequency of f=6.4 MHz. Here, the optimal system operating frequency lies between the peaks of the individual resonator Q's.

Inductive elements may be formed for use in high-Q magnetic resonators. We have demonstrated a variety of high-Q magnetic resonators based on copper conductors that are formed into inductive elements that enclose a surface. Inductive elements may be formed using a variety of conductors arranged in a variety of shapes, enclosing any size or shaped area, and they may be single turn or multiple turn elements. The inductive elements may be formed to enclose a circle, a rectangle, a square, a triangle, a shape with rounded corners, a shape that follows the contour of a particular structure or device, a shape that follows, fills, or utilizes, a dedicated space within a structure or device, and the like. The designs may be optimized for size, cost, weight, appearance, performance, and the like.

These conductors may be bent or formed into the desired size, shape, and number of turns. However, it may be difficult to accurately reproduce conductor shapes and sizes using manual techniques. In addition, it may be difficult to maintain uniform or desired center-to-center spacings between the conductor segments in adjacent turns of the inductive elements. Accurate or uniform spacing may be important in determining the self capacitance of the structure as well as any proximity effect induced increases in AC resistance, for example.

The inductive elements used in magnetic resonators may contain more than one loop and may spiral inward or outward or up or down or in some combination of directions. In general, the magnetic resonators may have a variety of shapes, sizes and number of turns and they may be composed of a variety of conducing materials.

Magnetic resonators may be composed of self-resonant coils of copper wire or copper tubing. Magnetic resonators composed of self-resonant conductive wire coils may include a wire of length l, and cross section radius a, wound into a helical coil of radius x, height h, and number of turns N, which may for example be characterized as $N=\sqrt{l^2-h^2}/2\pi x$.

A magnetic resonator structure may be configured so that x is about 30 cm, h is about 20 cm, a is about 3 mm and N is about 5.25, and, during operation, a power source coupled to the magnetic resonator may drive the resonator at a resonant frequency, f, where f is about 10.6 MHz. Where x is about 30 cm, h is about 20 cm, a is about 1 cm and N is about 4, the resonator may be driven at a frequency, f, where f is about 13.4 MHz. Where x is about 10 cm, h is about 3 cm, a is about 2 mm and N is about 6, the resonator may be driven at a frequency, f, where f is about 21.4 MHz.

High-Q Magnetic Resonators Using Magnetic Material Structures

It may be possible to use magnetic materials assembled to form an open magnetic circuit, albeit one with an air gap on the order of the size of the whole structure, to realize a magnetic resonator structure. In these structures, high conductivity materials are wound around a structure made from magnetic material to form the inductive element of the magnetic resonator. Capacitive elements may be connected to the high conductivity materials, with the resonant frequency then determined as described above. These magnetic resonators have their dipole moment in the plane of the two dimensional resonator structures, rather than perpendicular to it, as is the case for the capacitively-loaded inductor loop resonators.

A diagram of a single planar resonator structure is shown in FIG. 5A. The planar resonator structure is constructed of a core of magnetic material 1121, such as ferrite with a loop or loops of conducting material 1122 wrapped around the core 1121. The structure may be used as the source resonator that transfers power and the device resonator that captures energy. When used as a source, the ends of the conductor may be coupled to a power source. Alternating electrical current flowing through the conductor loops excites alternating magnetic fields. When the structure is being used to receive power, the ends of the conductor may be coupled to a power drain or load. Changing magnetic fields induce an electromotive force in the loop or loops of the conductor wound around the core magnetic material. The dipole moment of these types of structures is in the plane of the structures and is, for example, directed along the Y axis for the structure in FIG. 5A. Two such structures have strong coupling when placed substantially in the same plane (i.e.

the X,Y plane of FIGS. 5A-5C). The structures of FIGS. 5A-5C have the most favorable orientation when the resonators are aligned in the same plane along their Y axis.

The geometry and the coupling orientations of the described planar resonators may be preferable for some applications. The planar or flat resonator shape may be easier to integrate into many electronic devices that are relatively flat and planar. The planar resonators may be integrated into the whole back or side of a device without requiring a change in geometry of the device. Due to the flat shape of many devices, the natural position of the devices when placed on a surface is to lay with their largest dimension being parallel to the surface they are placed on. A planar resonator integrated into a flat device is naturally parallel to the plane of the surface and is in a favorable coupling orientation relative to the resonators of other devices or planar resonator sources placed on a flat surface.

As mentioned, the geometry of the planar resonators may allow easier integration into devices. Their low profile may allow a resonator to be integrated into or as part of a complete side of a device. When a whole side of a device is covered by the resonator, magnetic flux can flow through the resonator core without being obstructed by lossy material that may be part of the device or device circuitry.

The core of the planar resonator structure may be of a variety of shapes and thicknesses and may be flat or planar such that the minimum dimension does not exceed 30% of the largest dimension of the structure. The core may have complex geometries and may have indentations, notches, ridges, and the like. Geometric enhancements may be used to reduce the coupling dependence on orientation and they may be used to facilitate integration into devices, packaging, packages, enclosures, covers, skins, and the like. Two exemplary variations of core geometries are shown in FIG. 5B. For example, the planar core 1131 may be shaped such that the ends are substantially wider than the middle of the structure to create an indentation for the conductor winding. The core material may be of varying thickness with ends that are thicker and wider than the middle. The core material 1132 may have any number of notches or cutouts 1133 of various depths, width, and shapes to accommodate conductor loops, housing, packaging, and the like.

The shape and dimensions of the core may be further dictated by the dimensions and characteristics of the device that they are integrated into. The core material may curve to follow the contours of the device, or may require non-symmetric notches or cutouts to allow clearance for parts of the device. The core structure may be a single monolithic piece of magnetic material or may be composed of a plurality of tiles, blocks, or pieces that are arranged together to form the larger structure. The different layers, tiles, blocks, or pieces of the structure may be of similar or may be of different materials. It may be desirable to use materials with different magnetic permeability in different locations of the structure. Core structures with different magnetic permeability may be useful for guiding the magnetic flux, improving coupling, and affecting the shape or extent of the active area of a system.

The conductor of the planar resonator structure may be wound at least once around the core. In certain circumstances, it may be preferred to wind at least three loops. The conductor can be any good conductor including conducting wire, Litz wire, conducting tubing, sheets, strips, gels, inks, traces and the like.

The size, shape, or dimensions of the active area of source may be further enhanced, altered, or modified with the use of materials that block, shield, or guide magnetic fields. To create non-symmetric active area around a source once side of the source may be covered with a magnetic shield to reduce the strength of the magnetic fields in a specific direction. The shield may be a conductor or a layered combination of conductor and magnetic material which can be used to guide magnetic fields away from a specific direction. Structures composed of layers of conductors and magnetic materials may be used to reduce energy losses that may occur due to shielding of the source.

The plurality of planar resonators may be integrated or combined into one planar resonator structure. A conductor or conductors may be wound around a core structure such that the loops formed by the two conductors are not coaxial. The core may be rectangular or it may have various geometries with several extensions or protrusions. The protrusions may be useful for wrapping of a conductor, reducing the weight, size, or mass of the core, or may be used to enhance the directionality or omni-directionality of the resonator. A single conductor may be wrapped around a core to form loops that are not coaxial.

Non-uniform or asymmetric field profiles around the resonator comprising a plurality of conductor loops may be generated by driving some conductor loops with non-identical parameters. Some conductor loops of a source resonator with a plurality of conductor loops may be driven by a power source with a different frequency, voltage, power level, duty cycle, and the like all of which may be used to affect the strength of the magnetic field generated by each conductor.

The planar resonator may have additional components coupled to the conductor. Components such as capacitors, inductors, resistors, diodes, and the like may be coupled to the conductor and may be used to adjust or tune the resonant frequency and the impedance matching for the resonators.

A planar resonator structure of the type described above and shown in FIG. 5A, may be created, for example, with a quality factor, Q, of 100 or higher and even Q of 1,000 or higher. Energy may be wirelessly transferred from one planar resonator structure to another over a distance larger than the characteristic size of the resonators, as shown in FIG. 5C.

In addition to utilizing magnetic materials to realize a structure with properties similar to the inductive element in the magnetic resonators, it may be possible to use a combination of good conductor materials and magnetic material to realize such inductive structures. FIG. 6A shows a magnetic resonator structure 1602 that may include one or more enclosures made of high-conductivity materials (the inside of which would be shielded from AC electromagnetic fields generated outside) surrounded by at least one layer of magnetic material and linked by blocks of magnetic material 1604.

A structure may include a high-conductivity sheet of material covered on one side by a layer of magnetic material. The layered structure may instead be applied conformally to an electronic device, so that parts of the device may be covered by the high-conductivity and magnetic material layers, while other parts that need to be easily accessed (such as buttons or screens) may be left uncovered. The structure may also or instead include only layers or bulk pieces of magnetic material. Thus, a magnetic resonator may be incorporated into an existing device without significantly interfering with its existing functions and with little or no need for extensive redesign. Moreover, the layers of good conductor and/or magnetic material may be made thin enough (of the order of a millimeter or less) that they would add little extra weight and volume to the completed device. An oscillating current applied to a length of conductor wound around the structure, as shown by the square loop in the center of the structure in FIG. 6 may be used to excite the electromagnetic fields associated with this structure.

Quality Factor of the Structure

A structure of the type described above may be created with a quality factor, Q, of the order of 1,000 or higher. This high-Q is possible even if the losses in the magnetic material are high, if the fraction of magnetic energy within the magnetic material is small compared to the total magnetic energy associated with the object. For structures composed of layers conducting materials and magnetic materials, the losses in the conducting materials may be reduced by the presence of the magnetic materials as described previously. In structures where the magnetic material layer's thickness is of the order of 1/100 of the largest dimension of the system (e.g., the magnetic material may be of the order of 1 mm thick, while the area of the structure is of the order of 10 cm×10 cm), and the relative permeability is of the order of 1,000, it is possible to make the fraction of magnetic energy contained within the magnetic material only a few hundredths of the total magnetic energy associated with the object or resonator. To see how that comes about, note that the expression for the magnetic energy contained in a volume is $U_m = \int_V dr B(r)^2/(2\mu_r\mu_0)$, so as long as B (rather than H) is the main field conserved across the magnetic material-air interface (which is typically the case in open magnetic circuits), the fraction of magnetic energy contained in the high-$\mu_r$ region may be significantly reduced compared to what it is in air.

If the fraction of magnetic energy in the magnetic material is denoted by frac, and the loss tangent of the material is tan δ, then the Q of the resonator, assuming the magnetic material is the only source of losses, is Q=1/(frac×tan δ). Thus, even for loss tangents as high as 0.1, it is possible to achieve Q's of the order of 1,000 for these types of resonator structures.

Figure 7:
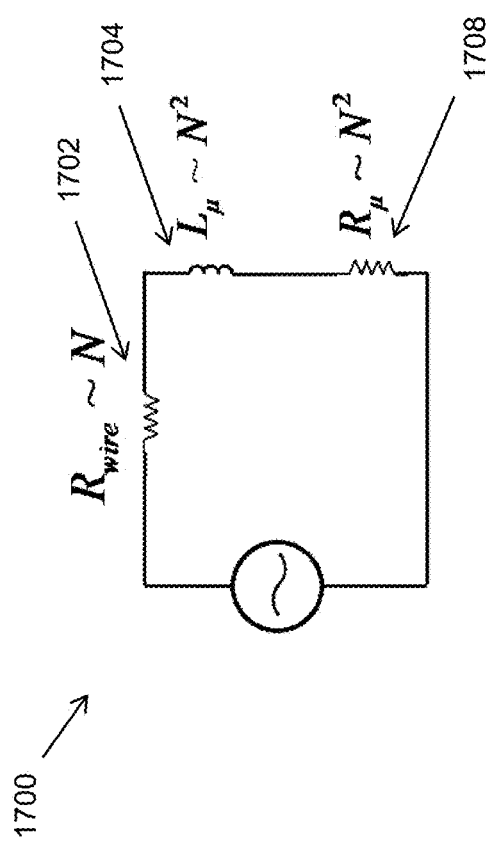
FIG. 7 shows an equivalent circuit representation of a magnetic resonator including a conducting wire wrapped N times around a structure, possibly containing magnetically permeable material. The inductance is realized using conducting loops wrapped around a structure comprising a magnetic material and the resistors represent loss mechanisms in the system ($R_{wire}$ for resistive losses in the loop, $R_\mu$ denoting the equivalent series resistance of the structure surrounded by the loop). Losses may be minimized to realize high-Q resonators.

If the structure is driven with N turns of wire wound around it, the losses in the excitation inductor loop can be ignored if N is sufficiently high. FIG. 7 shows an equivalent circuit 1700 schematic for these structures and the scaling of the loss mechanisms and inductance with the number of turns, N, wound around a structure made of conducting and magnetic material. If proximity effects can be neglected (by using an appropriate winding, or a wire designed to minimize proximity effects, such as Litz wire and the like), the resistance 1702 due to the wire in the looped conductor scales linearly with the length of the loop, which is in turn proportional to the number of turns. On the other hand, both the equivalent resistance 1708 and equivalent inductance 1704 of these special structures are proportional to the square of the magnetic field inside the structure. Since this magnetic field is proportional to N, the equivalent resistance 1708 and equivalent inductance 1704 are both proportional to $N^2$. Thus, for large enough N, the resistance 1702 of the wire is much smaller than the equivalent resistance 1708 of the magnetic structure, and the Q of the resonator asymptotes to $Q_{max} = \omega L_\mu/R_\mu$.

FIG. 6A shows a schematic diagram of a copper and magnetic material structure 1602 driven by a square loop of current around the narrowed segment at the center of the structure 1604 and the magnetic field streamlines generated by this structure 1608. This exemplary structure includes two 20 cm×8 cm×2 cm hollow regions enclosed with copper and then completely covered with a 2 mm layer of magnetic material having the properties $\mu'_r = 1,400$, $\mu''_r = 5$, and $\sigma = 0.5$ S/m. These two parallelepipeds are spaced 4 cm apart and are connected by a 2 cm×4 cm×2 cm block of the same magnetic material. The excitation loop is wound around the center of this block. At a frequency of 300 kHz, this structure has a calculated Q of 890. The conductor and magnetic material structure may be shaped to optimize certain system parameters. For example, the size of the structure enclosed by the excitation loop may be small to reduce the resistance of the excitation loop, or it may be large to mitigate losses in the magnetic material associated with large magnetic fields. Note that the magnetic streamlines and Q's associated with the same structure composed of magnetic material only would be similar to the layer conductor and magnetic material design shown here.

Electromagnetic Resonators Interacting with Other Objects

For electromagnetic resonators, extrinsic loss mechanisms that perturb the intrinsic Q may include absorption losses inside the materials of nearby extraneous objects and radiation losses related to scattering of the resonant fields from nearby extraneous objects. Absorption losses may be associated with materials that, over the frequency range of interest, have non-zero, but finite, conductivity, σ, (or equivalently a non-zero and finite imaginary part of the dielectric permittivity), such that electromagnetic fields can penetrate it and induce currents in it, which then dissipate energy through resistive losses. An object may be described as lossy if it at least partly includes lossy materials.

Consider an object including a homogeneous isotropic material of conductivity, σ and magnetic permeability, μ. The penetration depth of electromagnetic fields inside this object is given by the skin depth, $\delta = \sqrt{2/\omega\mu\sigma}$. The power dissipated inside the object, $P_d$, can be determined from $P_d = \int_V dr\sigma|E|^2 = \int_V dr|J|^2/\sigma$ where we made use of Ohm's law, J=σE, and where E is the electric field and J is the current density.

If over the frequency range of interest, the conductivity, σ, of the material that composes the object is low enough that the material's skin depth, δ, may be considered long, (i.e. δ is longer than the objects' characteristic size, or δ is longer than the characteristic size of the portion of the object that is lossy) then the electromagnetic fields, E and H, where H is the magnetic field, may penetrate significantly into the object. Then, these finite-valued fields may give rise to a dissipated power that scales as $P_d \sim \sigma V_{ol} \langle |E|^2 \rangle$, where $V_d$ is the volume of the object that is lossy and $\langle |E|^2 \rangle$ is the spatial average of the electric-field squared, in the volume under consideration. Therefore, in the low-conductivity limit, the dissipated power scales proportionally to the conductivity and goes to zero in the limit of a non-conducting (purely dielectric) material.

If over the frequency range of interest, the conductivity, σ, of the material that composes the object is high enough that the material's skin depth may be considered short, then the electromagnetic fields, E and H, may penetrate only a short distance into the object (namely they stay close to the 'skin' of the material, where δ is smaller than the characteristic thickness of the portion of the object that is lossy). In this case, the currents induced inside the material may be concentrated very close to the material surface, approximately within a skin depth, and their magnitude may be approximated by the product of a surface current density (mostly determined by the shape of the incident electromagnetic fields and, as long as the thickness of the conductor is much larger than the skin-depth, independent of frequency and conductivity to first order) K(x,y) (where x and y are coordinates parameterizing the surface) and a function decaying exponentially into the surface: exp(−z/δ)/δ (where z denotes the coordinate locally normal to the surface): $J(x,y,z)=K(x,y)\exp(-z/\delta)/\delta$. Then, the dissipated power, $P_d$, may be estimated by, $$P_d = \int dr |J(r)|^2/\sigma \cong \int dxdy |K(x,y)|^2 \int_0^\infty dz \exp(2z/\delta)/(\sigma\delta^2)) = \sqrt{\mu\omega/8\sigma} \int dxdy |K(x,y)|^2$$

Therefore, in the high-conductivity limit, the dissipated power scales inverse proportionally to the square-root of the conductivity and goes to zero in the limit of a perfectly-conducting material.

If over the frequency range of interest, the conductivity, $\sigma$, of the material that composes the object is finite, then the material's skin depth, $\delta$, may penetrate some distance into the object and some amount of power may be dissipated inside the object, depending also on the size of the object and the strength of the electromagnetic fields. This description can be generalized to also describe the general case of an object including multiple different materials with different properties and conductivities, such as an object with an arbitrary inhomogeneous and anisotropic distribution of the conductivity inside the object.

Note that the magnitude of the loss mechanisms described above may depend on the location and orientation of the extraneous objects relative to the resonator fields as well as the material composition of the extraneous objects. For example, high-conductivity materials may shift the resonant frequency of a resonator and detune it from other resonant objects. This frequency shift may be fixed by applying a feedback mechanism to a resonator that corrects its frequency, such as through changes in the inductance and/or capacitance of the resonator. These changes may be realized using variable capacitors and inductors, in some cases achieved by changes in the geometry of components in the resonators. Other novel tuning mechanisms, described below, may also be used to change the resonator frequency.

Where external losses are high, the perturbed Q may be low and steps may be taken to limit the absorption of resonator energy inside such extraneous objects and materials. Because of the functional dependence of the dissipated power on the strength of the electric and magnetic fields, one might optimize system performance by designing a system so that the desired coupling is achieved with shorter evanescent resonant field tails at the source resonator and longer at the device resonator, so that the perturbed Q of the source in the presence of other objects is optimized (or vice versa if the perturbed Q of the device needs to be optimized).

Note that many common extraneous materials and objects such as people, animals, plants, building materials, and the like, may have low conductivities and therefore may have little impact on the wireless energy transfer scheme disclosed here. An important fact related to the magnetic resonator designs we describe is that their electric fields may be confined primarily within the resonator structure itself, so it should be possible to operate within the commonly accepted guidelines for human safety while providing wireless power exchange over mid range distances.

Electromagnetic Resonators and Impedance Matching

Impedance Matching Architectures for Low-Loss Inductive Elements

For purposes of the present discussion, an inductive element may be any coil or loop structure (the 'loop') of any conducting material, with or without a (gapped or ungapped) core made of magnetic material, which may also be coupled inductively or in any other contactless way to other systems. The element is inductive because its impedance, including both the impedance of the loop and the so-called 'reflected' impedances of any potentially coupled systems, has positive reactance, X, and resistance, R.

Consider an external circuit, such as a driving circuit or a driven load or a transmission line, to which an inductive element may be connected. The external circuit (e.g. a driving circuit) may be delivering power to the inductive element and the inductive element may be delivering power to the external circuit (e.g. a driven load). The efficiency and amount of power delivered between the inductive element and the external circuit at a desired frequency may depend on the impedance of the inductive element relative to the properties of the external circuit. Impedance-matching networks and external circuit control techniques may be used to regulate the power delivery between the external circuit and the inductive element, at a desired frequency, f.

The external circuit may be a driving circuit configured to form a amplifier of class A, B, C, D, DE, E, F and the like, and may deliver power at maximum efficiency (namely with minimum losses within the driving circuit) when it is driving a resonant network with specific impedance $Z^*_0$, where $Z_0$ may be complex and * denotes complex conjugation. The external circuit may be a driven load configured to form a rectifier of class A, B, C, D, DE, E, F and the like, and may receive power at maximum efficiency (namely with minimum losses within the driven load) when it is driven by a resonant network with specific impedance $Z^*_0$, where $Z_0$ may be complex. The external circuit may be a transmission line with characteristic impedance, $Z_0$, and may exchange power at maximum efficiency (namely with zero reflections) when connected to an impedance $Z^*_0$. We will call the characteristic impedance $Z_0$ of an external circuit the complex conjugate of the impedance that may be connected to it for power exchange at maximum efficiency.

Typically the impedance of an inductive element, R+jX, may be much different from $Z^*_0$. For example, if the inductive element has low loss (a high X/R), its resistance, R, may be much lower than the real part of the characteristic impedance, $Z_0$, of the external circuit. Furthermore, an inductive element by itself may not be a resonant network. An impedance-matching network connected to an inductive element may typically create a resonant network, whose impedance may be regulated.

Therefore, an impedance-matching network may be designed to maximize the efficiency of the power delivered between the external circuit and the inductive element (including the reflected impedances of any coupled systems). The efficiency of delivered power may be maximized by matching the impedance of the combination of an impedance-matching network and an inductive element to the characteristic impedance of an external circuit (or transmission line) at the desired frequency.

An impedance-matching network may be designed to deliver a specified amount of power between the external circuit and the inductive element (including the reflected impedances of any coupled systems). The delivered power may be determined by adjusting the complex ratio of the impedance of the combination of the impedance-matching network and the inductive element to the impedance of the external circuit (or transmission line) at the desired frequency.

Impedance-matching networks connected to inductive elements may create magnetic resonators. For some applications, such as wireless power transmission using strongly-coupled magnetic resonators, a high Q may be desired for the resonators. Therefore, the inductive element may be chosen to have low losses (high X/R).

Since the matching circuit may typically include additional sources of loss inside the resonator, the components of the matching circuit may also be chosen to have low losses. Furthermore, in high-power applications and/or due to the high resonator Q, large currents may run in parts of the resonator circuit and large voltages may be present across some circuit elements within the resonator. Such currents and voltages may exceed the specified tolerances for particular circuit elements and may be too high for particular components to withstand. In some cases, it may be difficult to find or implement components, such as tunable capacitors for example, with size, cost and performance (loss and current/voltage-rating) specifications sufficient to realize high-Q and high-power resonator designs for certain applications. We disclose matching circuit designs, methods, implementations and techniques that may preserve the high Q for magnetic resonators, while reducing the component requirements for low loss and/or high current/voltage-rating.

Matching-circuit topologies may be designed that minimize the loss and current-rating requirements on some of the elements of the matching circuit. The topology of a circuit matching a low-loss inductive element to an impedance, $Z_0$, may be chosen so that some of its components lie outside the associated high-Q resonator by being in series with the external circuit. The requirements for low series loss or high current-ratings for these components may be reduced. Relieving the low series loss and/or high-current-rating requirement on a circuit element may be particularly useful when the element needs to be variable and/or to have a large voltage-rating and/or low parallel loss.

Matching-circuit topologies may be designed that minimize the voltage rating requirements on some of the elements of the matching circuit. The topology of a circuit matching a low-loss inductive element to an impedance, $Z_0$, may be chosen so that some of its components lie outside the associated high-Q resonator by being in parallel with $Z_0$. The requirements for low parallel loss or high voltage-rating for these components may be reduced. Relieving the low parallel loss and/or high-voltage requirement on a circuit element may be particularly useful when the element needs to be variable and/or to have a large current-rating and/or low series loss.

The topology of the circuit matching a low-loss inductive element to an external characteristic impedance, $Z_0$, may be chosen so that the field pattern of the associated resonant mode and thus its high Q are preserved upon coupling of the resonator to the external impedance. Otherwise inefficient coupling to the desired resonant mode may occur (potentially due to coupling to other undesired resonant modes), resulting in an effective lowering of the resonator Q.

For applications where the low-loss inductive element or the external circuit, may exhibit variations, the matching circuit may need to be adjusted dynamically to match the inductive element to the external circuit impedance, $Z_0$, at the desired frequency, f. Since there may typically be two tuning objectives, matching or controlling both the real and imaginary part of the impedance level, $Z_0$, at the desired frequency, f, there may be two variable elements in the matching circuit. For inductive elements, the matching circuit may need to include at least one variable capacitive element.

A low-loss inductive element may be matched by topologies using two variable capacitors, or two networks of variable capacitors. A variable capacitor may, for example, be a tunable butterfly-type capacitor having, e.g., a center terminal for connection to a ground or other lead of a power source or load, and at least one other terminal across which a capacitance of the tunable butterfly-type capacitor can be varied or tuned, or any other capacitor having a user-configurable, variable capacitance.

A low-loss inductive element may be matched by topologies using one, or a network of, variable capacitor(s) and one, or a network of, variable inductor(s).

A low-loss inductive element may be matched by topologies using one, or a network of, variable capacitor(s) and one, or a network of, variable mutual inductance(s), which transformer-couple the inductive element either to an external circuit or to other systems.

In some cases, it may be difficult to find or implement tunable lumped elements with size, cost and performance specifications sufficient to realize high-Q, high-power, and potentially high-speed, tunable resonator designs. The topology of the circuit matching a variable inductive element to an external circuit may be designed so that some of the variability is assigned to the external circuit by varying the frequency, amplitude, phase, waveform, duty cycle, and the like, of the drive signals applied to transistors, diodes, switches and the like, in the external circuit.

The variations in resistance, R, and inductance, L, of an inductive element at the resonant frequency may be only partially compensated or not compensated at all. Adequate system performance may thus be preserved by tolerances designed into other system components or specifications. Partial adjustments, realized using fewer tunable components or less capable tunable components, may be sufficient.

Matching-circuit architectures may be designed that achieve the desired variability of the impedance matching circuit under high-power conditions, while minimizing the voltage/current rating requirements on its tunable elements and achieving a finer (i.e. more precise, with higher resolution) overall tunability. The topology of the circuit matching a variable inductive element to an impedance, $Z_0$, may include appropriate combinations and placements of fixed and variable elements, so that the voltage/current requirements for the variable components may be reduced and the desired tuning range may be covered with finer tuning resolution. The voltage/current requirements may be reduced on components that are not variable.

The disclosed impedance matching architectures and techniques may be used to achieve the following:

To maximize the power delivered to, or to minimize impedance mismatches between, the source low-loss inductive elements (and any other systems wirelessly coupled to them) from the power driving generators.

To maximize the power delivered from, or to minimize impedance mismatches between, the device low-loss inductive elements (and any other systems wirelessly coupled to them) to the power driven loads.

To deliver a controlled amount of power to, or to achieve a certain impedance relationship between, the source low-loss inductive elements (and any other systems wirelessly coupled to them) from the power driving generators.

To deliver a controlled amount of power from, or to achieve a certain impedance relationship between, the device low-loss inductive elements (and any other systems wirelessly coupled to them) to the power driven loads.

Circuit Topologies

Variable circuit elements with satisfactory low-loss and high-voltage or current ratings may be difficult or expensive to obtain. In this disclosure, we describe impedance-matching topologies that may incorporate combinations of fixed and variable elements, such that large voltages or currents may be assigned to fixed elements in the circuit, which may be more likely to have adequate voltage and current ratings, and alleviating the voltage and current rating requirements on the variable elements in the circuit.

Variable circuit elements may have tuning ranges larger than those required by a given impedance-matching application and, in those cases, fine tuning resolution may be difficult to obtain using only such large-range elements. In this disclosure, we describe impedance-matching topologies that incorporate combinations of both fixed and variable elements, such that finer tuning resolution may be accomplished with the same variable elements.

Therefore, topologies using combinations of both fixed and variable elements may bring two kinds of advantages simultaneously: reduced voltage across, or current through, sensitive tuning components in the circuit and finer tuning resolution. Note that the maximum achievable tuning range may be related to the maximum reduction in voltage across, or current through, the tunable components in the circuit designs.

Element Topologies

A single variable circuit-element (as opposed to the network of elements discussed above) may be implemented by a topology using a combination of fixed and variable components, connected in series or in parallel, to achieve a reduction in the rating requirements of the variable components and a finer tuning resolution. This can be demonstrated mathematically by the fact that:

If $x_{|total|} = x_{|fixed|} + x_{|variable|}$, then $\Delta x_{|total|}/x_{|total|} = \Delta x_{|variable|}/(x_{|fixed|} + x_{|variable|})$, and $X_{variable}/X_{total} = X_{variable}/(X_{fixed} + X_{variable})$, where $x_{|subscript|}$ is any element value (e.g. capacitance, inductance), $X$ is voltage or current, and the "+sign" denotes the appropriate (series-addition or parallel-addition) combination of elements. Note that the subscript format for $x_{|subscript|}$, is chosen to easily distinguish it from the radius of the area enclosed by a circular inductive element (e.g. x, $x_1$, etc.).

Furthermore, this principle may be used to implement a variable electric element of a certain type (e.g. a capacitance or inductance) by using a variable element of a different type, if the latter is combined appropriately with other fixed elements.

In conclusion, one may apply a topology optimization algorithm that decides on the required number, placement, type and values of fixed and variable elements with the required tunable range as an optimization constraint and the minimization of the currents and/or voltages on the variable elements as the optimization objective.

EXAMPLES

In the following schematics, we show different specific topology implementations for impedance matching to and resonator designs for a low-loss inductive element. In addition, we indicate for each topology: which of the principles described above are used, the equations giving the values of the variable elements that may be used to achieve the matching, and the range of the complex impedances that may be matched (using both inequalities and a Smith-chart description). For these examples, we assume that $Z_0$ is real, but an extension to a characteristic impedance with a non-zero imaginary part is straightforward, as it implies only a small adjustment in the required values of the components of the matching network. We will use the convention that the subscript, n, on a quantity implies normalization to (division by) $Z_0$.

FIG. 8A-FIG. 8F show six examples of directly-coupled impedance-matching circuits, where the two tunable elements are capacitors, and FIG. 8H-FIG. 8M show six examples of directly-coupled impedance-matching circuits, where the two tunable elements are one capacitor and one inductor. For the topologies of FIG. 8A, FIG. 8B, FIG. 8C, FIG. 8H, FIG. 8I and FIG. 8J, a common-mode signal may be required at the two terminals to preserve the voltage node of the resonator at the center of the inductive element and thus the high Q. For the symmetric topologies of FIG. 8D, FIG. 8E, FIG. 8F, FIG. 8K, FIG. 8L and FIG. 8M, the two terminals may need to be driven anti-symmetrically (balanced drive) to preserve the voltage node of the resonator at the center of the inductive element and thus the high Q. It will be appreciated that a network of capacitors, as used herein, may in general refer to any circuit topology including one or more capacitors, including without limitation any of the circuits specifically disclosed herein using capacitors, or any other equivalent or different circuit structure(s), unless another meaning is explicitly provided or otherwise clear from the context.

Figure 8F:
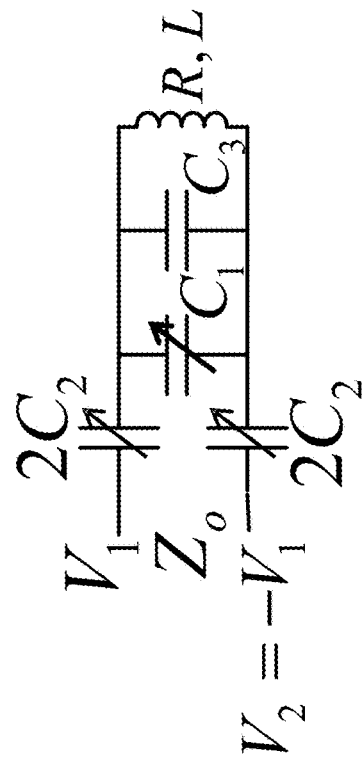
FIG. 8A-FIG. 8F depict six topologies of matching circuits directly coupled to a high-Q inductive element and including capacitors in series with $Z_0$. The topologies shown in FIG. 8A, FIG. 8B, and FIG. 8C are driven with a common-mode signal at the input terminals, while the topologies shown in FIG. 8D, FIG. 8E, and FIG. 8F are symmetric and receive a balanced drive. The highlighted portion of the Smith chart in FIG. 8G depicts the complex impedances that may be matched by these topologies.
Figure 8E:
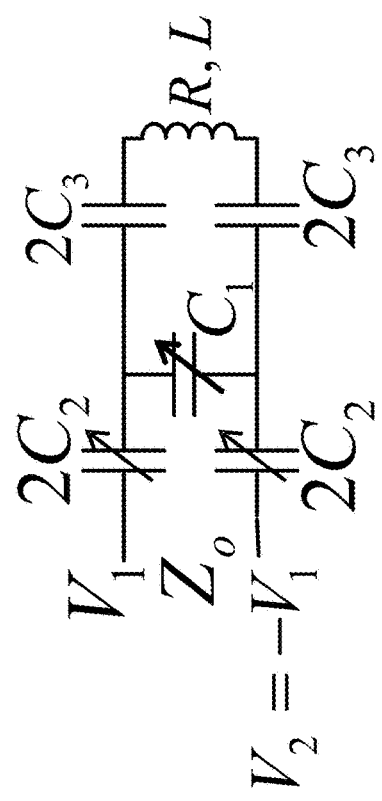
Figure 8G:
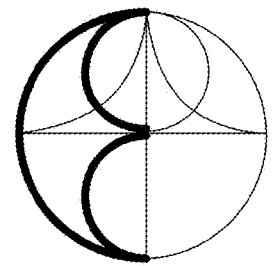
FIG. 8H, FIG. 8I, FIG. 8J, FIG. 8K, FIG. 8L and FIG. 8M depict six topologies of matching circuits directly coupled to a high-Q inductive element and including inductors in series with $Z_0$.
Figure 9B:
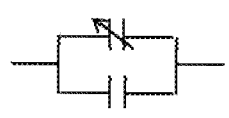
FIG. 9A-FIG. 9D depict four topologies of networks of fixed and variable capacitors designed to produce an overall variable capacitance with finer tuning resolution and some with reduced voltage on the variable capacitor.
Figure 9D:
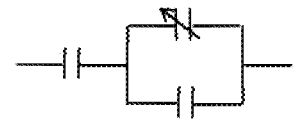
Figure 9A:
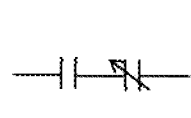
Figure 9C:
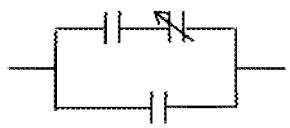

Let us define respectively $Z=R+j\omega L$ for FIG. 8A, FIG. 8D, FIG. 8H and FIG. 8K, $Z=R+j\omega L+1/j\omega C_3$ for FIG. 8B, FIG. 8E, FIG. 8I and FIG. 8L, and $Z=(R+j\omega L)\|(1/j\omega C_3)$ for FIG. 8C, FIG. 8F, FIG. 8J and FIG. 8M, where the symbol "$\|$" means "the parallel combination of", and then $R \equiv \mathrm{Re}\{Z\}$, $X \equiv \mathrm{Im}\{Z\}$. Then, for FIG. 8A-FIG. 8F the required values of the tunable elements may be given by:

$$\omega C_1 = \frac{X - \sqrt{X^2 R_n - R^2(1-R_n)}}{X^2 + R^2},$$

$$\omega C_2 = \frac{R_n \omega C_1}{1 - X\omega C_1 - R_n},$$

and these topologies can match the impedances satisfying the inequalities:

$$R_n \leq 1, X_n \geq \sqrt{R_n(1-R_n)}$$

which are shown by the area enclosed by the bold lines on the Smith chart of FIG. 8G. For FIG. 8H-FIG. 8M the required values of the tunable elements may be given by:

$$\omega C_1 = \frac{X + \sqrt{X^2 R_n - R^2(1-R_n)}}{X^2 + R^2},$$

$$\omega L_2 = -\frac{1 - X\omega C_1 - R_n}{R_n \omega C_1}.$$

In the circuits of FIG. 8 the capacitor, $C_2$, or the inductor, $L_2$, is (or the two capacitors, $2C_2$, or the two inductors, $L_2/2$, are) in series with the terminals and may not need to have very low series-loss or withstand a large current.

For the topologies of FIG. 8, where a capacitor, $C_3$, is used, the use of the capacitor, $C_3$, may lead to finer tuning of the frequency and the impedance. For the topologies of FIG. 8, the use of the fixed capacitor, $C_3$, in series with the inductive element may ensure that a large percentage of the high inductive-element voltage will be across this fixed capacitor, $C_3$, thus potentially alleviating the voltage rating requirements for the other elements of the impedance matching circuit, some of which may be variable. Whether or not such topologies are preferred depends on the availability, cost and specifications of appropriate fixed and tunable components.

In all the above examples, a pair of equal-value variable capacitors without a common terminal may be implemented using ganged-type capacitors or groups or arrays of varactors or diodes biased and controlled to tune their values as an ensemble. A pair of equal-value variable capacitors with one common terminal can be implemented using a tunable butterfly-type capacitor or any other tunable or variable capacitor or group or array of varactors or diodes biased and controlled to tune their capacitance values as an ensemble.

Another criterion which may be considered upon the choice of the impedance matching network is the response of the network to different frequencies than the desired operating frequency. The signals generated in the external circuit, to which the inductive element is coupled, may not be monochromatic at the desired frequency but periodic with the desired frequency, as for example the driving signal of a switching amplifier or the reflected signal of a switching rectifier. In some such cases, it may be desirable to suppress the amount of higher-order harmonics that enter the inductive element (for example, to reduce radiation of these harmonics from this element). Then the choice of impedance matching network may be one that sufficiently suppresses the amount of such harmonics that enters the inductive element.

The impedance matching network may be such that the impedance seen by the external circuit at frequencies higher than the fundamental harmonic is high, when the external periodic signal is a signal that can be considered to behave as a voltage-source signal (such as the driving signal of a class-D amplifier with a series resonant load), so that little current flows through the inductive element at higher frequencies. Among the topologies of FIG. 8, those which use an inductor, $L_2$, may then be preferable, as this inductor presents a high impedance at high frequencies.

The impedance matching network may be such that the impedance seen by the external circuit at frequencies higher than the fundamental harmonic is low, when the external periodic signal is a signal that can be considered to behave as a current-source signal, so that little voltage is induced across the inductive element at higher frequencies. Among the topologies of FIG. 8, those which use a capacitor, $C_2$, are then preferable, as this capacitor presents a low impedance at high frequencies.

FIG. 9A-FIG. 9D shows four examples of a variable capacitance, using networks of one variable capacitor and the rest fixed capacitors. Using these network topologies, fine tunability of the total capacitance value may be achieved. Furthermore, the topologies of FIG. 9A, FIG. 9C and FIG. 9D, may be used to reduce the voltage across the variable capacitor, since most of the voltage may be assigned across the fixed capacitors.

Figure 10A:
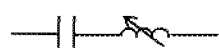
FIG. 10A and FIG. 10B depict two topologies of networks of fixed capacitors and a variable inductor designed to produce an overall variable capacitance.
Figure 10B:
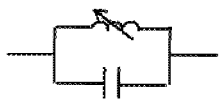

FIG. 10A and FIG. 10B show two examples of a variable capacitance, using networks of one variable inductor and fixed capacitors. In particular, these networks may provide implementations for a variable reactance, and, at the frequency of interest, values for the variable inductor may be used such that each network corresponds to a net negative variable reactance, which may be effectively a variable capacitance.

Tunable elements such as tunable capacitors and tunable inductors may be mechanically-tunable, electrically-tunable, thermally-tunable and the like. The tunable elements may be variable capacitors or inductors, varactors, diodes, Schottky diodes, reverse-biased PN diodes, varactor arrays, diode arrays, Schottky diode arrays and the like. The diodes may be Si diodes, GaN diodes, SiC diodes, and the like. GaN and SiC diodes may be particularly attractive for high power applications. The tunable elements may be electrically switched capacitor banks, electrically-switched mechanically-tunable capacitor banks, electrically-switched varactor-array banks, electrically-switched transformer-coupled inductor banks, and the like. The tunable elements may be combinations of the elements listed above.

As described above, the efficiency of the power transmission between coupled high-Q magnetic resonators may be impacted by how closely matched the resonators are in resonant frequency and how well their impedances are matched to the power supplies and power consumers in the system. Because a variety of external factors including the relative position of extraneous objects or other resonators in the system, or the changing of those relative positions, may alter the resonant frequency and/or input impedance of a high-Q magnetic resonator, tunable impedance networks may be required to maintain sufficient levels of power transmission in various environments or operating scenarios.

The capacitance values of the capacitors shown may be adjusted to adjust the resonant frequency and/or the impedance of the magnetic resonator. The capacitors may be adjusted electrically, mechanically, thermally, or by any other known methods. They may be adjusted manually or automatically, such as in response to a feedback signal. They may be adjusted to achieve certain power transmission efficiencies or other operating characteristics between the power supply and the power consumer.

The inductance values of the inductors and inductive elements in the resonator may be adjusted to adjust the frequency and/or impedance of the magnetic resonator. The inductance may be adjusted using coupled circuits that include adjustable components such as tunable capacitors, inductors and switches. The inductance may be adjusted using transformer coupled tuning circuits. The inductance may be adjusted by switching in and out different sections of conductor in the inductive elements and/or using ferromagnetic tuning and/or mu-tuning, and the like.

The resonant frequency of the resonators may be adjusted to or may be allowed to change to lower or higher frequencies. The input impedance of the resonator may be adjusted to or may be allowed to change to lower or higher impedance values. The amount of power delivered by the source and/or received by the devices may be adjusted to or may be allowed to change to lower or higher levels of power. The amount of power delivered to the source and/or received by the devices from the device resonator may be adjusted to or may be allowed to change to lower or higher levels of power. The resonator input impedances, resonant frequencies, and power levels may be adjusted depending on the power consumer or consumers in the system and depending on the objects or materials in the vicinity of the resonators. The resonator input impedances, frequencies, and power levels may be adjusted manually or automatically, and may be adjusted in response to feedback or control signals or algorithms.

Circuit elements may be connected directly to the resonator, that is, by physical electrical contact, for example to the ends of the conductor that forms the inductive element and/or the terminal connectors. The circuit elements may be soldered to, welded to, crimped to, glued to, pinched to, or closely position to the conductor or attached using a variety of electrical components, connectors or connection techniques. The power supplies and the power consumers may be connected to magnetic resonators directly or indirectly or inductively. Electrical signals may be supplied to, or taken from, the resonators through the terminal connections.

It is to be understood by one of ordinary skill in the art that in real implementations of the principles described herein, there may be an associated tolerance, or acceptable variation, to the values of real components (capacitors, inductors, resistors and the like) from the values calculated via the herein stated equations, to the values of real signals (voltages, currents and the like) from the values suggested by symmetry or anti-symmetry or otherwise, and to the values of real geometric locations of points (such as the point of connection of the ground terminal close to the center of the inductive element or the 'axis' points and the like) from the locations suggested by symmetry or otherwise.

Examples

System Block Diagrams

We disclose examples of high-Q resonators for wireless power transmission systems that may wirelessly power or charge devices at mid-range distances. High-Q resonator wireless power transmission systems also may wirelessly power or charge devices with magnetic resonators that are different in size, shape, composition, arrangement, and the like, from any source resonators in the system.

Figure 11:
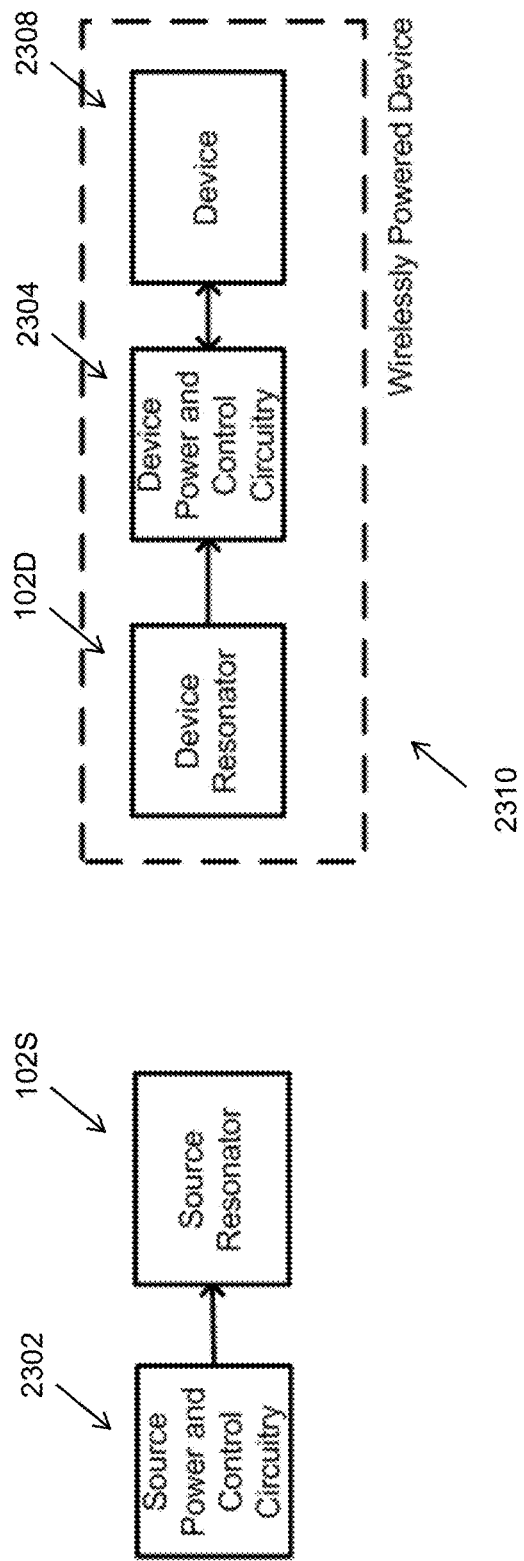
FIG. 11 depicts a high level block diagram of a wireless power transmission system.

FIG. 1A and FIG. 1B show high level diagrams of two exemplary two-resonator systems. These exemplary systems each have a single source resonator 102S or 104S and a single device resonator 102D or 104D. FIG. 11 shows a high level block diagram of a system with a few more features highlighted. The wirelessly powered or charged device 2310 may include or consist of a device resonator 102D, device power and control circuitry 2304, and the like, along with the device 2308 or devices, to which either DC or AC or both AC and DC power is transferred. The energy or power source for a system may include the source power and control circuitry 2302, a source resonator 102S, and the like. The device 2308 or devices that receive power from the device resonator 102D and power and control circuitry 2304 may be any kind of device 2308 or devices as described previously. The device resonator 102D and circuitry 2304 delivers power to the device/devices 2308 that may be used to recharge the battery of the device/devices, power the device/devices directly, or both when in the vicinity of the source resonator 102S.

The source and device resonators may be separated by many meters or they may be very close to each other or they may be separated by any distance in between. The source and device resonators may be offset from each other laterally or axially. The source and device resonators may be directly aligned (no lateral offset), or they may be offset by meters, or anything in between. The source and device resonators may be oriented so that the surface areas enclosed by their inductive elements are approximately parallel to each other. The source and device resonators may be oriented so that the surface areas enclosed by their inductive elements are approximately perpendicular to each other, or they may be oriented for any relative angle (0 to 360 degrees) between them.

The source and device resonators may be free standing or they may be enclosed in an enclosure, container, sleeve or housing. These various enclosures may be composed of almost any kind of material. Low loss tangent materials such as Teflon, REXOLITE, styrene, and the like may be preferable for some applications. The source and device resonators may be integrated in the power supplies and power consumers. For example, the source and device resonators may be integrated into keyboards, computer mice, displays, cell phones, etc. so that they are not visible outside these devices. The source and device resonators may be separate from the power supplies and power consumers in the system and may be connected by a standard or custom wires, cables, connectors or plugs.

The source 102S may be powered from a number of DC or AC voltage, current or power sources including a USB port of a computer. The source 102S may be powered from the electric grid, from a wall plug, from a battery, from a power supply, from an engine, from a solar cell, from a generator, from another source resonator, and the like. The source power and control circuitry 2302 may include circuits and components to isolate the source electronics from the power source, so that any reflected power or signals are not coupled out through the source input terminals. The source power and control circuits 2302 may include power factor correction circuits and may be configured to monitor power usage for monitoring accounting, billing, control, and like functionalities.

The system may be operated bi-directionally. That is, energy or power that is generated or stored in a device resonator may be fed back to a power source including the electric grid, a battery, any kind of energy storage unit, and the like. The source power and control circuits may include power factor correction circuits and may be configured to monitor power usage for monitoring accounting, billing, control, and like functionalities for bi-directional energy flow. Wireless energy transfer systems may enable or promote vehicle-to-grid (V2G) applications.

The source and the device may have tuning capabilities that allow adjustment of operating points to compensate for changing environmental conditions, perturbations, and loading conditions that can affect the operation of the source and device resonators and the efficiency of the energy exchange. The tuning capability may also be used to multiplex power delivery to multiple devices, from multiple sources, to multiple systems, to multiple repeaters or relays, and the like. The tuning capability may be manually controlled, or automatically controlled and may be performed continuously, periodically, intermittently or at scheduled times or intervals.

The device resonator and the device power and control circuitry may be integrated into any portion of the device, such as a battery compartment, or a device cover or sleeve, or on a mother board, for example, and may be integrated alongside standard rechargeable batteries or other energy storage units. The device resonator may include a device field reshaper which may shield any combination of the device resonator elements and the device power and control electronics from the electromagnetic fields used for the power transfer and which may deflect the resonator fields away from the lossy device resonator elements as well as the device power and control electronics. A magnetic material and/or high-conductivity field reshaper may be used to increase the perturbed quality factor Q of the resonator and increase the perturbed coupling factor of the source and device resonators.

The source resonator and the source power and control circuitry may be integrated into any type of electronic devices, vehicles, and the like. The source resonator may include a source field reshaper which may shield any combination of the source resonator elements and the source power and control electronics from the electromagnetic fields used for the power transfer and which may deflect the resonator fields away from the lossy source resonator elements as well as the source power and control electronics. A magnetic material and/or high-conductivity field reshaper may be used to increase the perturbed quality factor Q of the resonator and increase the perturbed coupling factor of the source and device resonators.

Figure 12:
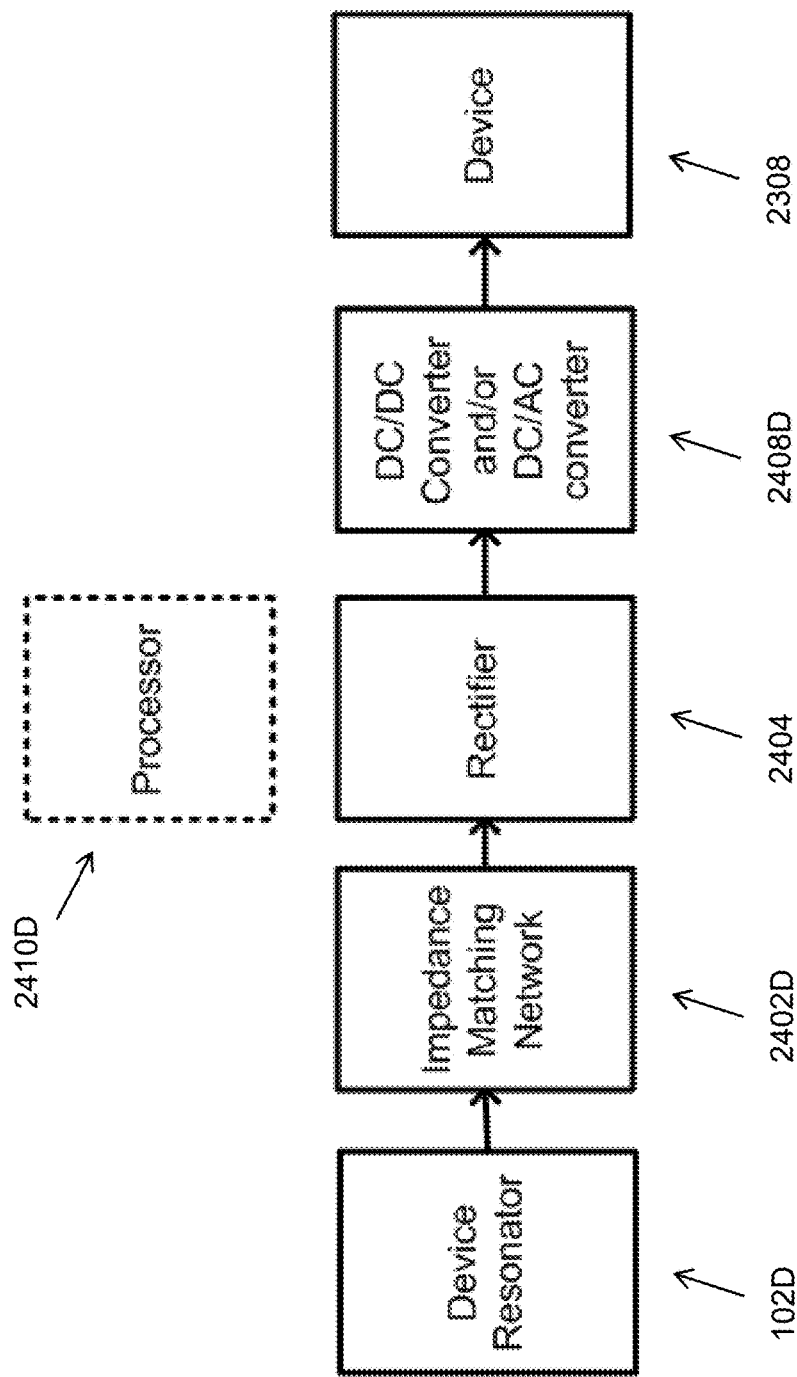
FIG. 12 depicts a block diagram of an exemplary wirelessly powered device.

A block diagram of the subsystems in an example of a wirelessly powered device is shown in FIG. 12. The power and control circuitry may be designed to transform the alternating current power from the device resonator 102D and convert it to stable direct current power suitable for powering or charging a device. The power and control circuitry may be designed to transform an alternating current power at one frequency from the device resonator to alternating current power at a different frequency suitable for powering or charging a device. The power and control circuitry may include or consist of impedance matching circuitry 2402D, rectification circuitry 2404, voltage limiting circuitry (not shown), current limiting circuitry (not shown), AC-to-DC converter 2408 circuitry, DC-to-DC converter 2408 circuitry, DC-to-AC converter 2408 circuitry, AC-to-AC converter 2408 circuitry, battery charge control circuitry (not shown), and the like.

The impedance-matching 2402D network may be designed to maximize the power delivered between the device resonator 102D and the device power and control circuitry 2304 at the desired frequency. The impedance matching elements may be chosen and connected such that the high-Q of the resonators is preserved. Depending on the operating conditions, the impedance matching circuitry 2402D may be varied or tuned to control the power delivered from the source to the device, from the source to the device resonator, between the device resonator and the device power and control circuitry, and the like. The power, current and voltage signals may be monitored at any point in the device circuitry and feedback algorithms circuits, and techniques, may be used to control components to achieve desired signal levels and system operation. The feedback algorithms may be implemented using analog or digital circuit techniques and the circuits may include a microprocessor, a digital signal processor, a field programmable gate array processor and the like.

The third block of FIG. 12 shows a rectifier circuit 2404 that may rectify the AC voltage power from the device resonator into a DC voltage. In this configuration, the output of the rectifier 2404 may be the input to a voltage clamp circuit. The voltage clamp circuit (not shown) may limit the maximum voltage at the input to the DC-to-DC converter 2408D or DC-to-AC converter 2408D. In general, it may be desirable to use a DC-to-DC/AC converter with a large input voltage dynamic range so that large variations in device position and operation may be tolerated while adequate power is delivered to the device. For example, the voltage level at the output of the rectifier may fluctuate and reach high levels as the power input and load characteristics of the device change. As the device performs different tasks it may have varying power demands. The changing power demands can cause high voltages at the output of the rectifier as the load characteristics change. Likewise as the device and the device resonator are brought closer and further away from the source, the power delivered to the device resonator may vary and cause changes in the voltage levels at the output of the rectifier. A voltage clamp circuit may prevent the voltage output from the rectifier circuit from exceeding a predetermined value which is within the operating range of the DC-to-DC/AC converter. The voltage clamp circuitry may be used to extend the operating modes and ranges of a wireless energy transfer system.

The next block of the power and control circuitry of the device is the DC-to-DC converter 2408D that may produce a stable DC output voltage. The DC-to-DC converter may be a boost converter, buck converter, boost-buck converter, single ended primary inductance converter (SEPIC), or any other DC-DC topology that fits the requirements of the particular application. If the device requires AC power, a DC-to-AC converter may be substituted for the DC-to-DC converter, or the DC-to-DC converter may be followed by a DC-to-AC converter. If the device contains a rechargeable battery, the final block of the device power and control circuitry may be a battery charge control unit which may manage the charging and maintenance of the battery in battery powered devices.

The device power and control circuitry 2304 may contain a processor 2410D, such as a microcontroller, a digital signal processor, a field programmable gate array processor, a microprocessor, or any other type of processor. The processor may be used to read or detect the state or the operating point of the power and control circuitry and the device resonator. The processor may implement algorithms to interpret and adjust the operating point of the circuits, elements, components, subsystems and resonator. The processor may be used to adjust the impedance matching, the resonator, the DC to DC converters, the DC to AC converters, the battery charging unit, the rectifier, and the like of the wirelessly powered device.

The processor may have wireless or wired data communication links to other devices or sources and may transmit or receive data that can be used to adjust the operating point of the system. Any combination of power, voltage, and current signals at a single, or over a range of frequencies, may be monitored at any point in the device circuitry. These signals may be monitored using analog or digital or combined analog and digital techniques. These monitored signals may be used in feedback loops or may be reported to the user in a variety of known ways or they may be stored and retrieved at later times. These signals may be used to alert a user of system failures, to indicate performance, or to provide audio, visual, vibrational, and the like, feedback to a user of the system.

Figure 13:
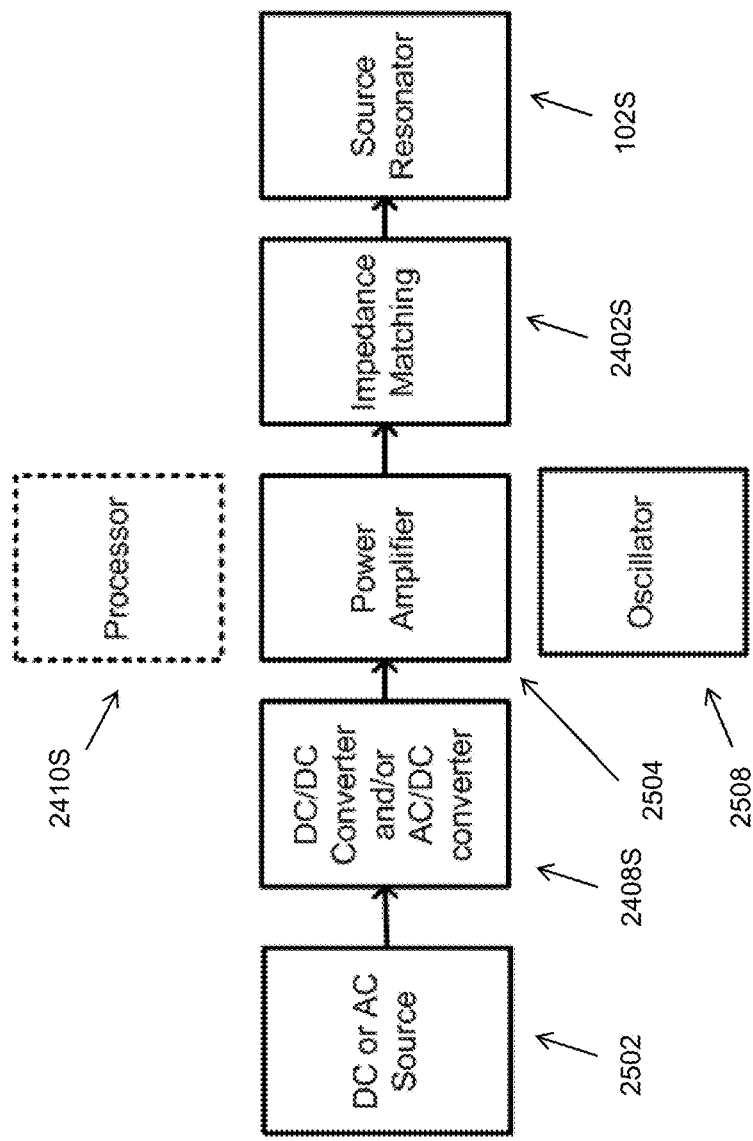
FIG. 13 depicts a block diagram of the source of an exemplary wireless power transfer system.

FIG. 13 shows components of source power and control circuitry 2302 of an exemplary wireless power transfer system configured to supply power to a single or multiple devices. The source power and control circuitry 2302 of the exemplary system may be powered from an AC voltage source 2502 such as a home electrical outlet, a DC voltage source such as a battery, a USB port of a computer, a solar cell, another wireless power source, and the like. The source power and control circuitry 2302 may drive the source resonator 102S with alternating current, such as with a frequency greater than 10 kHz and less than 100 MHz. The source power and control circuitry 2302 may drive the source resonator 102S with alternating current of frequency less than less than 10 GHz. The source power and control circuitry 2302 may include a DC-to-DC converter 2408S, an AC-to-DC converter 2408S, or both an AC-to-DC converter 2408S and a DC-to-DC 2408S converter, an oscillator 2508, a power amplifier 2504, an impedance matching network 2402S, and the like.

The source power and control circuitry 2302 may be powered from multiple AC-or-DC voltage sources 2502 and may contain AC-to-DC and DC-to-DC converters 2408S to provide necessary voltage levels for the circuit components as well as DC voltages for the power amplifiers that may be used to drive the source resonator. The DC voltages may be adjustable and may be used to control the output power level of the power amplifier. The source may contain power factor correction circuitry.

The oscillator 2508 output may be used as the input to a power amplifier 2504 that drives the source resonator 102S. The oscillator frequency may be tunable and the amplitude of the oscillator signal may be varied as one means to control the output power level from the power amplifier. The frequency, amplitude, phase, waveform, and duty cycle of the oscillator signal may be controlled by analog circuitry, by digital circuitry or by a combination of analog and digital circuitry. The control circuitry may include a processor 2410S, such as a microprocessor, a digital signal processor, a field programmable gate array processor, and the like.

The impedance matching blocks 2402 of the source and device resonators may be used to tune the power and control circuits and the source and device resonators. For example, tuning of these circuits may adjust for perturbation of the quality factor Q of the source or device resonators due to extraneous objects or changes in distance between the source and device in a system. Tuning of these circuits may also be used to sense the operating environment, control power flow to one or more devices, to control power to a wireless power network, to reduce power when unsafe or failure mode conditions are detected, and the like.

Any combination of power, voltage, and current signals may be monitored at any point in the source circuitry. These signals may be monitored using analog or digital or combined analog and digital techniques. These monitored signals may be used in feedback circuits or may be reported to the user in a variety of known ways or they may be stored and retrieved at later times. These signals may be used to alert a user to system failures, to alert a user to exceeded safety thresholds, to indicate performance, or to provide audio, visual, vibrational, and the like, feedback to a user of the system.

The source power and control circuitry may contain a processor. The processor may be used to read the state or the operating point of the power and control circuitry and the source resonator. The processor may implement algorithms to interpret and adjust the operating point of the circuits, elements, components, subsystems and resonator. The processor may be used to adjust the impedance matching, the resonator, the DC-to-DC converters, the AC-to-DC converters, the oscillator, the power amplifier of the source, and the like. The processor and adjustable components of the system may be used to implement frequency and/or time power delivery multiplexing schemes. The processor may have wireless or wired data communication links to devices and other sources and may transmit or receive data that can be used to adjust the operating point of the system.

Although detailed and specific designs are shown in these block diagrams, it should be clear to those skilled in the art that many different modifications and rearrangements of the components and building blocks are possible within the spirit of the exemplary system. The division of the circuitry was outlined for illustrative purposes and it should be clear to those skilled in the art that the components of each block may be further divided into smaller blocks or merged or shared. In equivalent examples the power and control circuitry may be composed of individual discrete components or larger integrated circuits. For example, the rectifier circuitry may be composed of discrete diodes, or use diodes integrated on a single chip. A multitude of other circuits and integrated devices can be substituted in the design depending on design criteria such as power or size or cost or application. The whole of the power and control circuitry or any portion of the source or device circuitry may be integrated into one chip.

The impedance matching network of the device and or source may include a capacitor or networks of capacitors, an inductor or networks of inductors, or any combination of capacitors, inductors, diodes, switches, resistors, and the like. The components of the impedance matching network may be adjustable and variable and may be controlled to affect the efficiency and operating point of the system. The impedance matching may be performed by controlling the connection point of the resonator, adjusting the permeability of a magnetic material, controlling a bias field, adjusting the frequency of excitation, and the like. The impedance matching may use or include any number or combination of varactors, varactor arrays, switched elements, capacitor banks, switched and tunable elements, reverse bias diodes, air gap capacitors, compression capacitors, BZT electrically tuned capacitors, MEMS-tunable capacitors, voltage variable dielectrics, transformer coupled tuning circuits, and the like. The variable components may be mechanically tuned, thermally tuned, electrically tuned, piezo-electrically tuned, and the like. Elements of the impedance matching may be silicon devices, gallium nitride devices, silicon carbide devices and the like. The elements may be chosen to withstand high currents, high voltages, high powers, or any combination of current, voltage and power. The elements may be chosen to be high-Q elements.

The matching and tuning calculations of the source may be performed on an external device through a USB port that powers the device. The device may be a computer a PDA or other computational platform.

A demonstration system used a source resonator, coupled to a device resonator, to wirelessly power/recharge multiple electronic consumer devices including, but not limited to, a laptop, a DVD player, a projector, a cell-phone, a display, a television, a projector, a digital picture frame, a light, a TV/DVD player, a portable music player, a circuit breaker, a hand-held tool, a personal digital assistant, an external battery charger, a mouse, a keyboard, a camera, an active load, and the like. A variety of devices may be powered simultaneously from a single device resonator. Device resonators may be operated simultaneously as source resonators. The power supplied to a device resonator may pass through additional resonators before being delivered to its intended device resonator.

Monitoring, Feedback and Control

So-called port parameter measurement circuitry may measure or monitor certain power, voltage, and current, signals in the system and processors or control circuits may adjust certain settings or operating parameters based on those measurements. In addition to these port parameter measurements, the magnitude and phase of voltage and current signals, and the magnitude of the power signals, throughout the system may be accessed to measure or monitor the system performance. The measured signals referred to throughout this disclosure may be any combination of the port parameter signals, as well as voltage signals, current signals, power signals, and the like. These parameters may be measured using analog or digital signals, they may be sampled and processed, and they may be digitized or converted using a number of known analog and digital processing techniques. Measured or monitored signals may be used in feedback circuits or systems to control the operation of the resonators and/or the system. In general, we refer to these monitored or measured signals as reference signals, or port parameter measurements or signals, although they are sometimes also referred to as error signals, monitor signals, feedback signals, and the like. We will refer to the signals that are used to control circuit elements such as the voltages used to drive voltage controlled capacitors as the control signals.

In some cases the circuit elements may be adjusted to achieve a specified or predetermined impedance value for the source and device resonators. In other cases the impedance may be adjusted to achieve a desired impedance value for the source and device resonators when the device resonator is connected to a power consumer or consumers. In other cases the impedance may be adjusted to mitigate changes in the resonant frequency, or impedance or power level changes owing to movement of the source and/or device resonators, or changes in the environment (such as the movement of interacting materials or objects) in the vicinity of the resonators. In other cases the impedance of the source and device resonators may be adjusted to different impedance values.

The coupled resonators may be made of different materials and may include different circuits, components and structural designs or they may be the same. The coupled resonators may include performance monitoring and measurement circuitry, signal processing and control circuitry or a combination of measurement and control circuitry. Some or all of the high-Q magnetic resonators may include tunable impedance circuits. Some or all of the high-Q magnetic resonators may include automatically controlled tunable impedance circuits.

Figure 14:
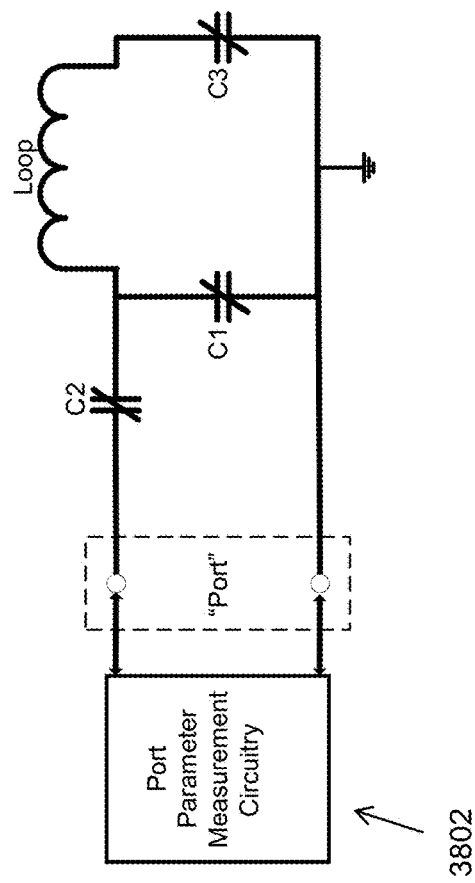
FIG. 14 shows an equivalent circuit diagram of a magnetic resonator. The slash through the capacitor symbol indicates that the represented capacitor may be fixed or variable. The port parameter measurement circuitry may be configured to measure certain electrical signals and may measure the magnitude and phase of signals.

FIG. 14 shows a magnetic resonator with port parameter measurement circuitry 3802 configured to measure certain parameters of the resonator. The port parameter measurement circuitry may measure the input impedance of the structure, or the reflected power. Port parameter measurement circuits may be included in the source and/or device resonator designs and may be used to measure two port circuit parameters such as S-parameters (scattering parameters), Z-parameters (impedance parameters), Y-parameters (admittance parameters), T-parameters (transmission parameters), H-parameters (hybrid parameters), ABCD-parameters (chain, cascade or transmission parameters), and the like. These parameters may be used to describe the electrical behavior of linear electrical networks when various types of signals are applied.

Different parameters may be used to characterize the electrical network under different operating or coupling scenarios. For example, S-parameters may be used to measure matched and unmatched loads. In addition, the magnitude and phase of voltage and current signals within the magnetic resonators and/or within the sources and devices themselves may be monitored at a variety of points to yield system performance information. This information may be presented to users of the system via a user interface such as a light, a read-out, a beep, a noise, a vibration or the like, or it may be presented as a digital signal or it may be provided to a processor in the system and used in the automatic control of the system. This information may be logged, stored, or may be used by higher level monitoring and control systems.

Figure 15:
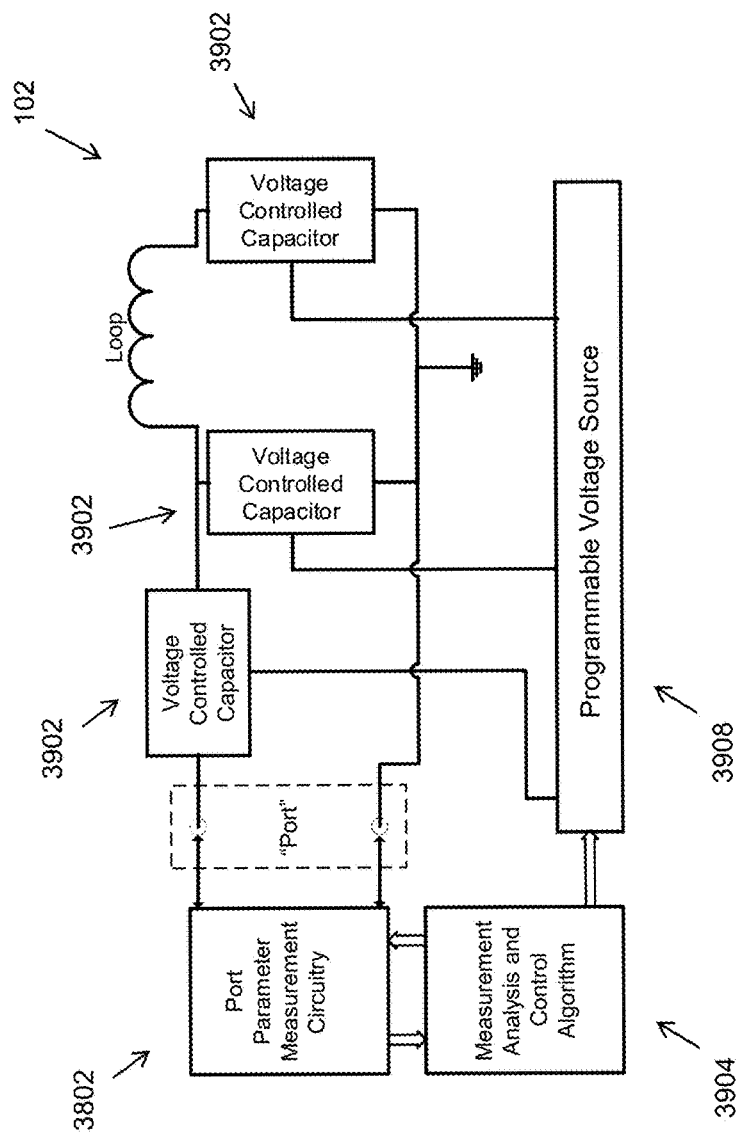
FIG. 15 shows a circuit diagram of a magnetic resonator where the tunable impedance network is realized with voltage controlled capacitors. Such an implementation may be adjusted, tuned or controlled by electrical circuits including programmable or controllable voltage sources and/or computer processors. The voltage controlled capacitors may be adjusted in response to data measured by the port parameter measurement circuitry and processed by measurement analysis and control algorithms and hardware. The voltage controlled capacitors may be a switched bank of capacitors.

FIG. 15 shows a circuit diagram of a magnetic resonator where the tunable impedance network may be realized with voltage controlled capacitors 3902 or capacitor networks. Such an implementation may be adjusted, tuned or controlled by electrical circuits and/or computer processors, such as a programmable voltage source 3908, and the like. For example, the voltage controlled capacitors may be adjusted in response to data acquired by the port parameter measurement circuitry 3802 and processed by a measurement analysis and control algorithm subsystem 3904. Reference signals may be derived from the port parameter measurement circuitry or other monitoring circuitry designed to measure the degree of deviation from a desired system operating point. The measured reference signals may include voltage, current, complex-impedance, reflection coefficient, power levels and the like, at one or several points in the system and at a single frequency or at multiple frequencies.

The reference signals may be fed to measurement analysis and control algorithm subsystem modules that may generate control signals to change the values of various components in a tunable impedance matching network. The control signals may vary the resonant frequency and/or the input impedance of the magnetic resonator, or the power level supplied by the source, or the power level drawn by the device, to achieve the desired power exchange between power supplies/generators and power drains/loads.

Adjustment algorithms may be used to adjust the frequency and/or impedance of the magnetic resonators. The algorithms may take in reference signals related to the degree of deviation from a desired operating point for the system and output correction or control signals related to that deviation that control variable or tunable elements of the system to bring the system back towards the desired operating point or points. The reference signals for the magnetic resonators may be acquired while the resonators are exchanging power in a wireless power transmission system, or they may be switched out of the circuit during system operation. Corrections to the system may be applied or performed continuously, periodically, upon a threshold crossing, digitally, using analog methods, and the like.

Figure 16:
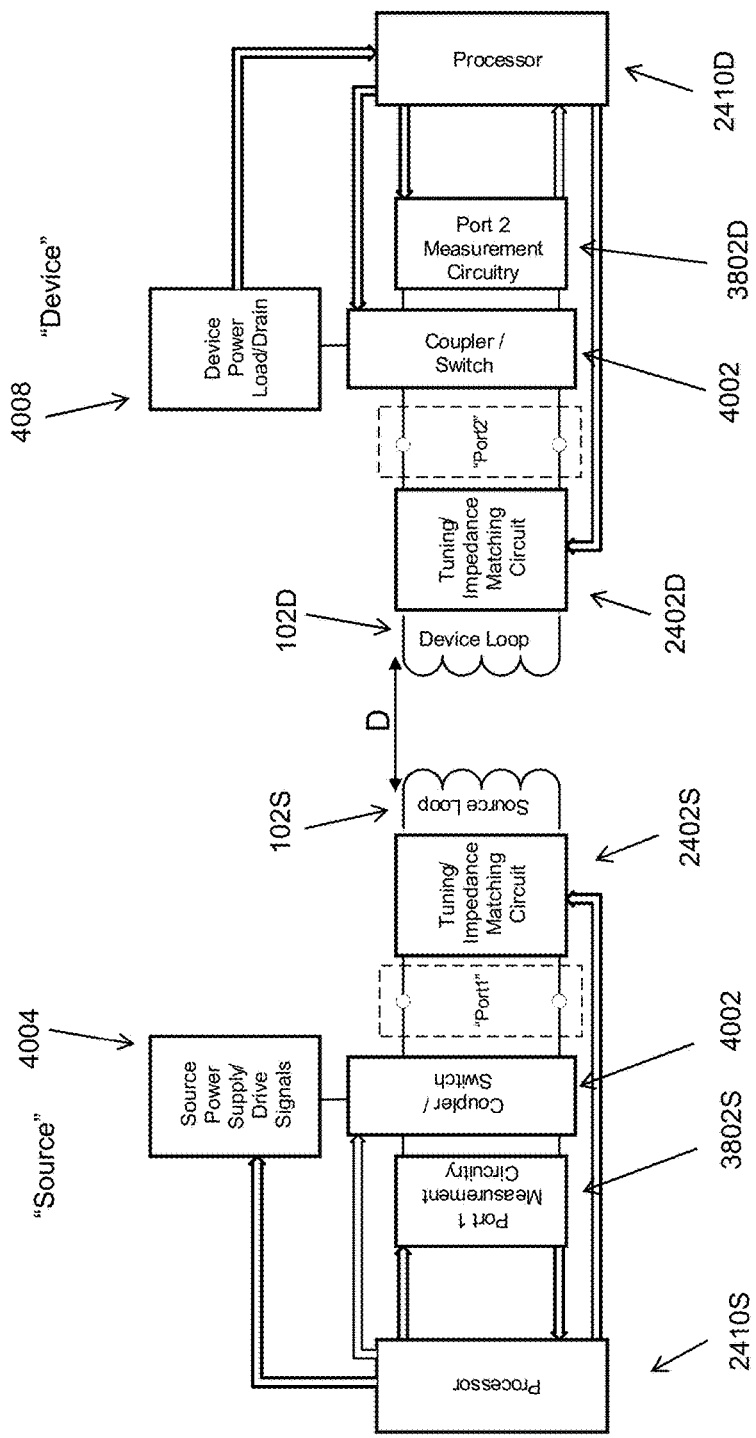
FIG. 16 shows an end-to-end wireless power transmission system. In this example, both the source and the device contain port measurement circuitry and a processor. The box labeled "coupler/switch" indicates that the port measurement circuitry may be connected to the resonator by a directional coupler or a switch, enabling the measurement, adjustment and control of the source and device resonators to take place in conjunction with, or separate from, the power transfer functionality.

FIG. 16 shows an end-to-end wireless power transmission system. Both the source and the device may include port measurement circuitry 3802 and a processor 2410. The box labeled "coupler/switch" 4002 indicates that the port measurement circuitry 3802 may be connected to the resonator 102 by a directional coupler or a switch, enabling the measurement, adjustment and control of the source and device resonators to take place in conjunction with, or separate from, the power transfer functionality.

The port parameter measurement and/or processing circuitry may reside with some, any, or all resonators in a system. The port parameter measurement circuitry may utilize portions of the power transmission signal or may utilize excitation signals over a range of frequencies to measure the source/device resonator response (i.e. transmission and reflection between any two ports in the system), and may contain amplitude and/or phase information. Such measurements may be achieved with a swept single frequency signal or a multi-frequency signal. The signals used to measure and monitor the resonators and the wireless power transmission system may be generated by a processor or processors and standard input/output (I/O) circuitry including digital to analog converters (DACs), analog to digital converters (ADCs), amplifiers, signal generation chips, passive components and the like. Measurements may be achieved using test equipment such as a network analyzer or using customized circuitry. The measured reference signals may be digitized by ADCs and processed using customized algorithms running on a computer, a microprocessor, a DSP chip, an ASIC, and the like. The measured reference signals may be processed in an analog control loop.

The measurement circuitry may measure any set of two port parameters such as S-parameters, Y-parameters, Z-parameters, H-parameters, G-parameters, T-parameters, ABCD-parameters, and the like. Measurement circuitry may be used to characterize current and voltage signals at various points in the drive and resonator circuitry, the impedance and/or admittance of the source and device resonators at opposite ends of the system, i.e. looking into the source resonator matching network ("port 1" in FIG. 16) towards the device and vice versa.

The device may measure relevant signals and/or port parameters, interpret the measurement data, and adjust its matching network to optimize the impedance looking into the coupled system independently of the actions of the source. The source may measure relevant port parameters, interpret the measurement data, and adjust its matching network to optimize the impedance looking into the coupled system independently of the actions of the device.

FIG. 16 shows a block diagram of a source and device in a wireless power transmission system. The system may be configured to execute a control algorithm that actively adjusts the tuning/matching networks in either of or both the source and device resonators to optimize performance in the coupled system. Port measurement circuitry 3802S may measure signals in the source and communicate those signals to a processor 2410. A processor 2410 may use the measured signals in a performance optimization or stabilization algorithm and generate control signals based on the outputs of those algorithms. Control signals may be applied to variable circuit elements in the tuning/impedance matching circuits 2402S to adjust the source's operating characteristics, such as power in the resonator and coupling to devices. Control signals may be applied to the power supply or generator to turn the supply on or off, to increase or decrease the power level, to modulate the supply signal and the like.

The power exchanged between sources and devices may depend on a variety of factors. These factors may include the effective impedance of the sources and devices, the Q's of the sources and devices, the resonant frequencies of the sources and devices, the distances between sources and devices, the interaction of materials and objects in the vicinity of sources and devices and the like. The port measurement circuitry and processing algorithms may work in concert to adjust the resonator parameters to maximize power transfer, to hold the power transfer constant, to controllably adjust the power transfer, and the like, under both dynamic and steady state operating conditions.

Figure 17:
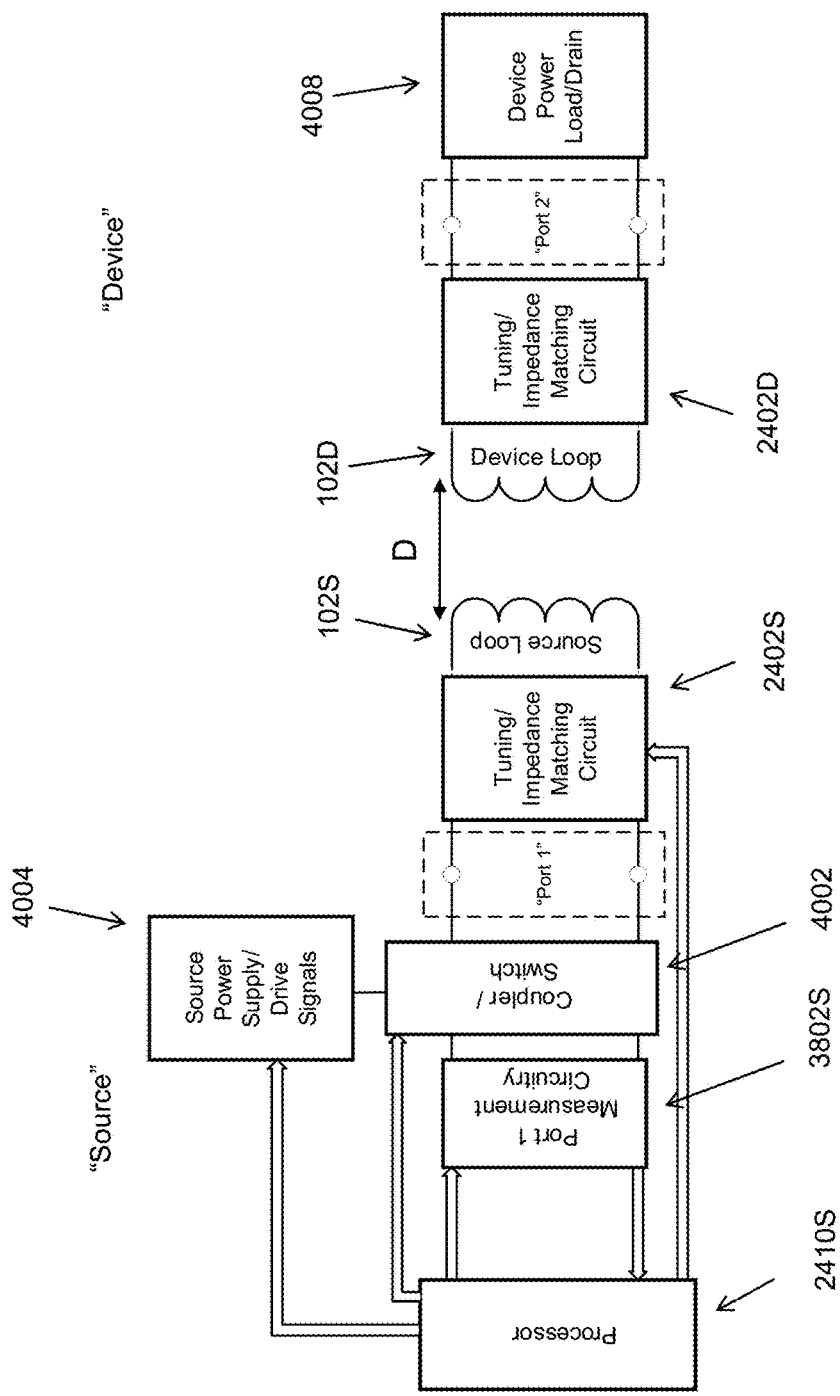
FIG. 17 shows an end-to-end wireless power transmission system. In this example, only the source contains port measurement circuitry and a processor. In this case, the device resonator operating characteristics may be fixed or may be adjusted by analog control circuitry and without the need for control signals generated by a processor.

Some, all or none of the sources and devices in a system implementation may include port measurement circuitry 3802S and processing 2410 capabilities. FIG. 17 shows an end-to-end wireless power transmission system in which only the source 102S contains port measurement circuitry 3802 and a processor 2410S. In this case, the device resonator 102D operating characteristics may be fixed or may be adjusted by analog control circuitry and without the need for control signals generated by a processor.

Figure 18:
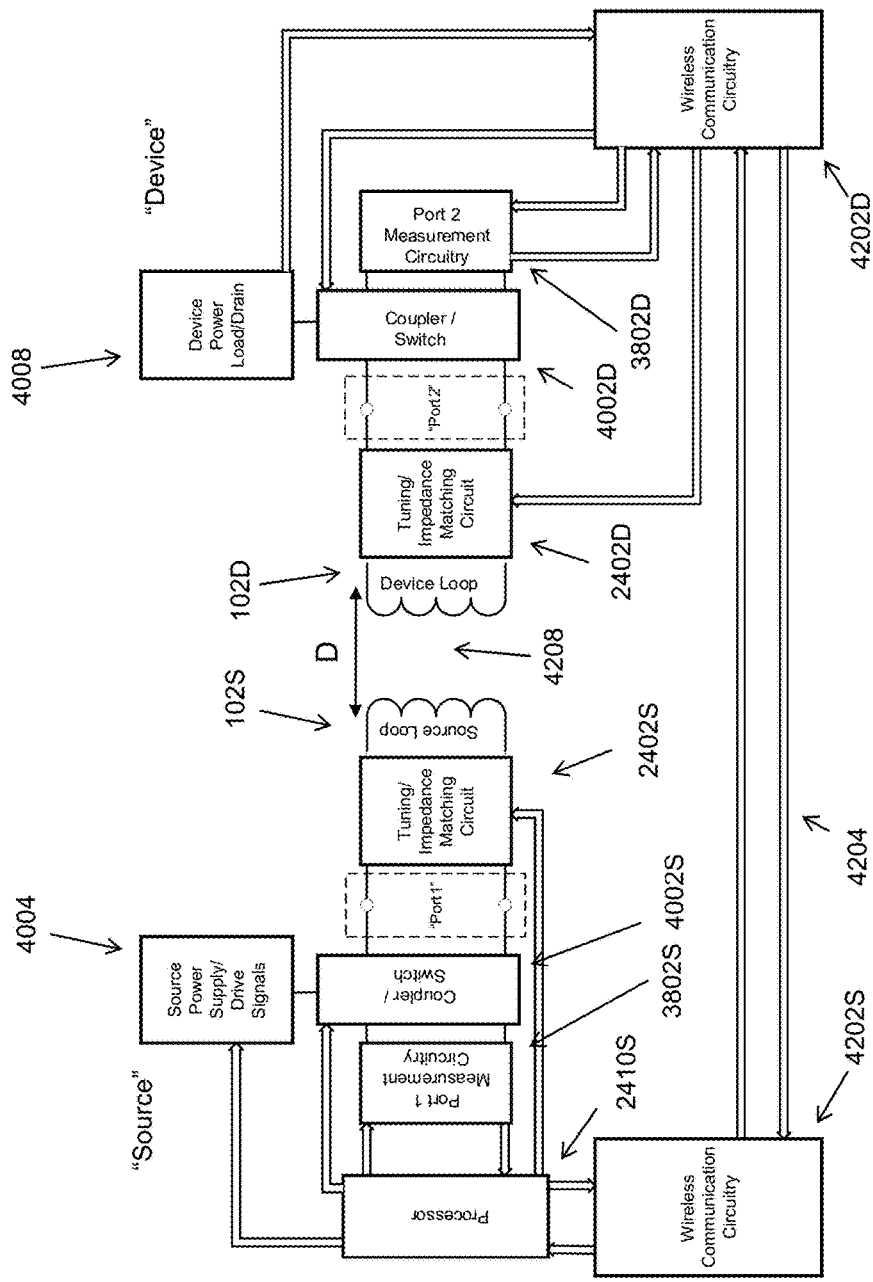
FIG. 18 shows an end-to-end wireless power transmission system. In this example, both the source and the device contain port measurement circuitry but only the source contains a processor. Data from the device is transmitted through a wireless communication channel, which could be implemented either with a separate antenna, or through some modulation of the source drive signal.

FIG. 18 shows an end-to-end wireless power transmission system. Both the source and the device may include port measurement circuitry 3802 but in the system of FIG. 18, only the source contains a processor 2410S. The source and device may be in communication with each other and the adjustment of certain system parameters may be in response to control signals that have been wirelessly communicated, such as though wireless communications circuitry 4202, between the source and the device. The wireless communication channel 4204 may be separate from the wireless power transfer channel 4208, or it may be the same. That is, the resonators 102 used for power exchange may also be used to exchange information. In some cases, information may be exchanged by modulating a component a source or device circuit and sensing that change with port parameter or other monitoring equipment.

Implementations where only the source contains a processor 2410 may be beneficial for multi-device systems where the source can handle all of the tuning and adjustment "decisions" and simply communicate the control signals back to the device(s). This implementation may make the device smaller and cheaper because it may eliminate the need for, or reduce the required functionality of, a processor in the device. A portion of or an entire data set from each port measurement at each device may be sent back to the source microprocessor for analysis, and the control instructions may be sent back to the devices. These communications may be wireless communications.

Figure 19:
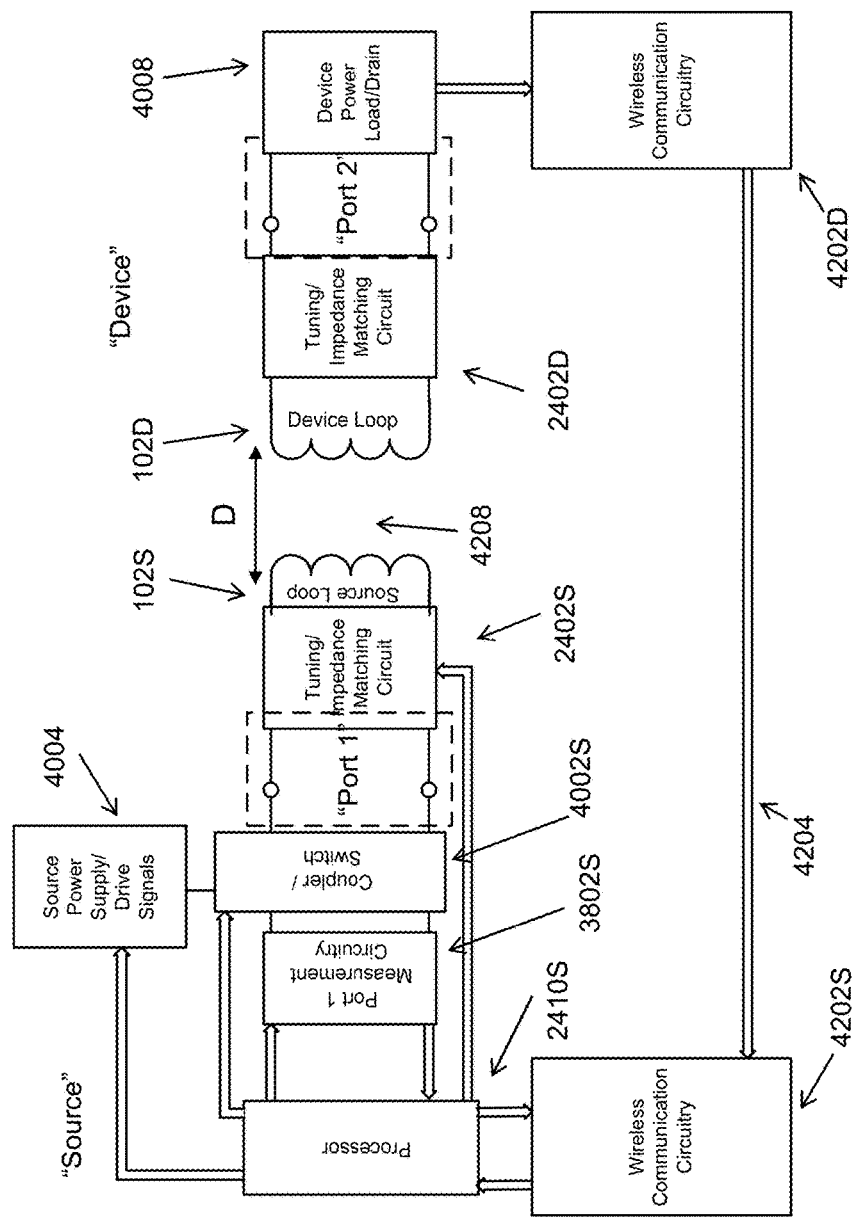
FIG. 19 shows an end-to-end wireless power transmission system. In this example, only the source contains port measurement circuitry and a processor. Data from the device is transmitted through a wireless communication channel, which could be implemented either with a separate antenna, or through some modulation of the source drive signal.

FIG. 19 shows an end-to-end wireless power transmission system. In this example, only the source contains port measurement circuitry 3802 and a processor 2410S. The source and device may be in communication, such as via wireless communication circuitry 4202, with each other and the adjustment of certain system parameters may be in response to control signals that have been wirelessly communicated between the source and the device.

Figure 20:
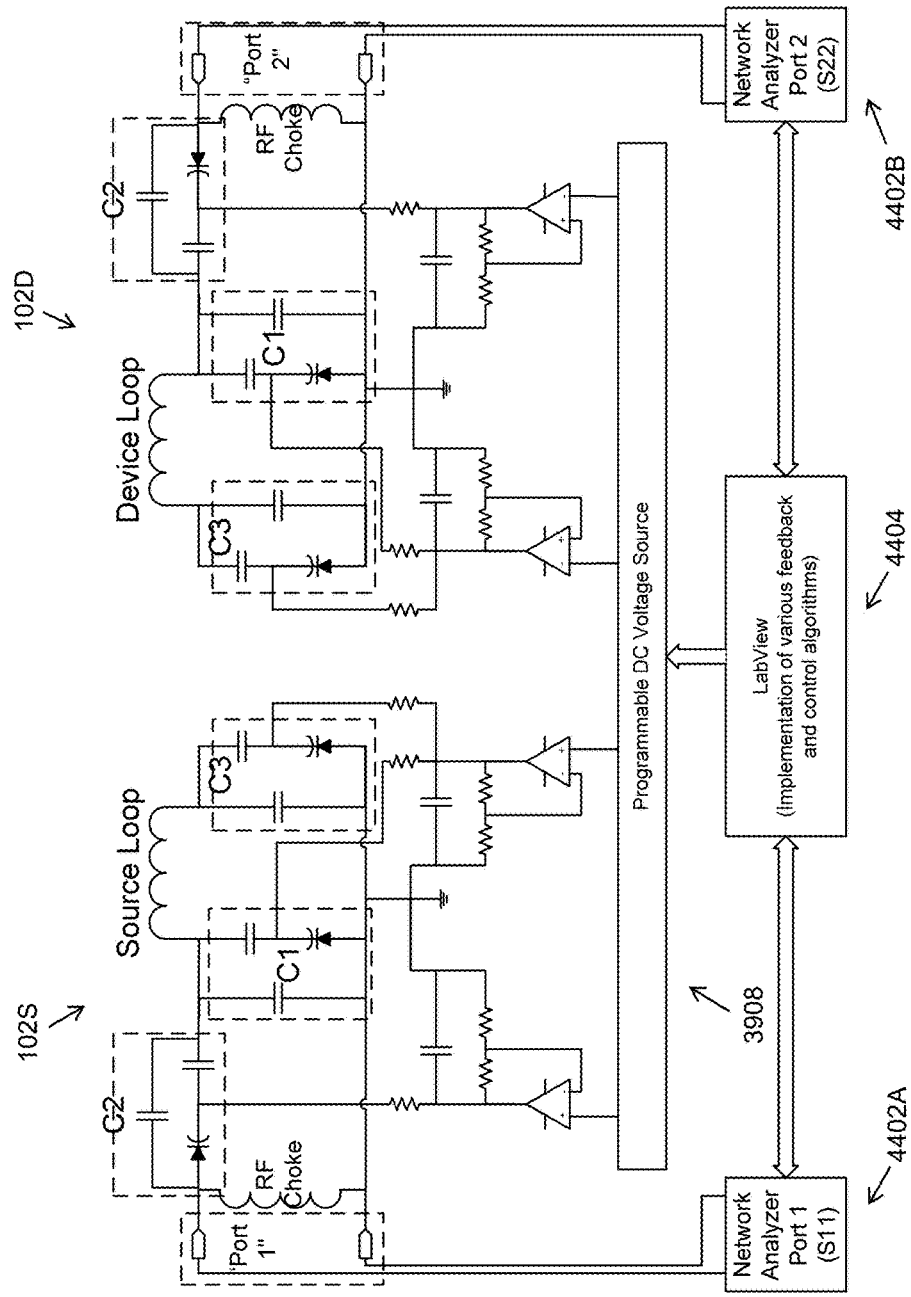
FIG. 20 shows coupled magnetic resonators whose frequency and impedance may be automatically adjusted using algorithms implemented using a processor or a computer.

FIG. 20 shows coupled electromagnetic resonators 102 whose frequency and impedance may be automatically adjusted using a processor or a computer. Resonant frequency tuning and continuous impedance adjustment of the source and device resonators may be implemented with reverse biased diodes, Schottky diodes and/or varactor elements contained within the capacitor networks shown as C1, C2, and C3 in FIG. 20. The circuit topology that was built and demonstrated and is described here is exemplary and is not meant to limit the discussion of automatic system tuning and control in any way. Other circuit topologies could be utilized with the measurement and control architectures discussed in this disclosure.

Device and source resonator impedances and resonant frequencies may be measured with a network analyzer 4402A-B, or by other means described above, and implemented with a controller, such as with Lab View 4404. The measurement circuitry or equipment may output data to a computer or a processor that implements feedback algorithms and dynamically adjusts the frequencies and impedances via a programmable DC voltage source.

In one arrangement, the reverse biased diodes (Schottky, semiconductor junction, and the like) used to realize the tunable capacitance drew very little DC current and could be reverse biased by amplifiers having large series output resistances. This implementation may enable DC control signals to be applied directly to the controllable circuit elements in the resonator circuit while maintaining a very high-Q in the magnetic resonator.

C2 biasing signals may be isolated from C1 and/or C3 biasing signals with a DC blocking capacitor as shown in FIG. 20, if the required DC biasing voltages are different. The output of the biasing amplifiers may be bypassed to circuit ground to isolate RF voltages from the biasing amplifiers, and to keep non-fundamental RF voltages from being injected into the resonator. The reverse bias voltages for some of the capacitors may instead be applied through the inductive element in the resonator itself, because the inductive element acts as a short circuit at DC.

The port parameter measurement circuitry may exchange signals with a processor (including any required ADCs and DACs) as part of a feedback or control system that is used to automatically adjust the resonant frequency, input impedance, energy stored or captured by the resonator or power delivered by a source or to a device load. The processor may also send control signals to tuning or adjustment circuitry in or attached to the magnetic resonator.

When utilizing varactors or diodes as tunable capacitors, it may be beneficial to place fixed capacitors in parallel and in series with the tunable capacitors operating at high reverse bias voltages in the tuning/matching circuits. This arrangement may yield improvements in circuit and system stability and in power handling capability by optimizing the operating voltages on the tunable capacitors.

Varactors or other reverse biased diodes may be used as a voltage controlled capacitor. Arrays of varactors may be used when higher voltage compliance or different capacitance is required than that of a single varactor component. Varactors may be arranged in an N by M array connected serially and in parallel and treated as a single two terminal component with different characteristics than the individual varactors in the array. For example, an N by N array of equal varactors where components in each row are connected in parallel and components in each column are connected in series may be used as a two terminal device with the same capacitance as any single varactor in the array but with a voltage compliance that is N times that of a single varactor in the array. Depending on the variability and differences of parameters of the individual varactors in the array additional biasing circuits composed of resistors, inductors, and the like may be needed.

Further improvements in system performance may be realized by careful selection of the fixed value capacitor(s) that are placed in parallel and/or in series with the tunable (varactor/diode/capacitor) elements. Multiple fixed capacitors that are switched in or out of the circuit may be able to compensate for changes in resonator Q's, impedances, resonant frequencies, power levels, coupling strengths, and the like, that might be encountered in test, development and operational wireless power transfer systems. Switched capacitor banks and other switched element banks may be used to assure the convergence to the operating frequencies and impedance values required by the system design.

An exemplary control algorithm for isolated and coupled magnetic resonators may be described for the circuit and system elements shown in FIG. 20. One control algorithm first adjusts each of the source and device resonator loops "in isolation", that is, with the other resonators in the system "shorted out" or "removed" from the system. For practical purposes, a resonator can be "shorted out" by making it resonant at a much lower frequency such as by maximizing the value of C1 and/or C3. This step effectively reduces the coupling between the resonators, thereby effectively reducing the system to a single resonator at a particular frequency and impedance.

Tuning a magnetic resonator in isolation includes varying the tunable elements in the tuning and matching circuits until the values measured by the port parameter measurement circuitry are at their predetermined, calculated or measured relative values. The desired values for the quantities measured by the port parameter measurement circuitry may be chosen based on the desired matching impedance, frequency, strong coupling parameter, and the like. For the exemplary algorithms disclosed below, the port parameter measurement circuitry measures S-parameters over a range of frequencies. The range of frequencies used to characterize the resonators may be a compromise between the system performance information obtained and computation/measurement speed. For the algorithms described below the frequency range may be approximately +/−20% of the operating resonant frequency.

Each isolated resonator may be tuned as follows. First, short out the resonator not being adjusted. Next minimize C1, C2, and C3, in the resonator that is being characterized and adjusted. In most cases there will be fixed circuit elements in parallel with C1, C2, and C3, so this step does not reduce the capacitance values to zero. Next, start increasing C2 until the resonator impedance is matched to the "target" real impedance at any frequency in the range of measurement frequencies described above. The initial "target" impedance may be less than the expected operating impedance for the coupled system.

C2 may be adjusted until the initial "target" impedance is realized for a frequency in the measurement range. Then C1 and/or C3 may be adjusted until the loop is resonant at the desired operating frequency.

Each resonator may be adjusted according to the above algorithm. After tuning each resonator in isolation, a second feedback algorithm may be applied to optimize the resonant frequencies and/or input impedances for wirelessly transferring power in the coupled system.

The required adjustments to C1 and/or C2 and/or C3 in each resonator in the coupled system may be determined by measuring and processing the values of the real and imaginary parts of the input impedance from either and/or both "port(s)" shown in FIG. 16. For coupled resonators, changing the input impedance of one resonator may change the input impedance of the other resonator. Control and tracking algorithms may adjust one port to a desired operating point based on measurements at that port, and then adjust the other port based on measurements at that other port. These steps may be repeated until both sides converge to the desired operating point.

S-parameters may be measured at both the source and device ports and the following series of measurements and adjustments may be made. In the description that follows, $Z_0$ is an input impedance and may be the target impedance. In some cases $Z_0$ is 50 ohms or is near 50 ohms. $Z_1$ and $Z_2$ are intermediate impedance values that may be the same value as $Z_0$ or may be different than $Z_0$. Re{value} means the real part of a value and Im{value} means the imaginary part of a value.

An algorithm that may be used to adjust the input impedance and resonant frequency of two coupled resonators is set forth below:

1) Adjust each resonator "in isolation" as described above.

2) Adjust source C1/C3 until, at $\omega_0$, Re{S11}=$(Z_1+/-\in_{Re})$ as follows:
   If Re{S11 @ $\omega_0$}>$(Z_1+\in_{Re})$, decrease C1/C3. If Re{S11 @ $\omega_0$}<$(Zo-\in_{Re})$, increase C1/C3.

3) Adjust source C2 until, at $\omega_0$, Im{S11}=$(+/-\in_{Im})$ as follows:
   If Im{S11 @ $\omega_0$}>$\in_{Im}$, decrease C2. If Im{S11 @ $\omega_0$}<$-\in_{Im}$, increase C2.

4) Adjust device C1/C3 until, at $\omega_0$, Re{S22}=$(Z_2+/-\in_{Re})$ as follows:
   If Re{S22 @ $\omega_0$}>$(Z_2+\in_{Re})$, decrease C1/C3. If Re{S22 @ $\omega_0$}<$(Zo-\in_{Re})$, increase C1/C3.

5) Adjust device C2 until, at $\omega_0$, Im{S22}=0 as follows:
   If Im{S22 @ $\omega_0$}>$\in_{Im}$, decrease C2. If Im{S22 @ $\omega_0$}<$-\in_{Im}$, increase C2.

We have achieved a working system by repeating steps 1-4 until both (Re{S11}, Im{S11}) and (Re{S22}, Im{S22}) converge to $((Z_0+/-\in_{Re}), (+/-\in_{Im}))$ at $\omega_0$, where $Z_0$ is the desired matching impedance and $\omega_0$ is the desired operating frequency. Here, $\in_{Im}$ represents the maximum deviation of the imaginary part, at $\omega_0$, from the desired value of 0, and $\in_{Re}$ represents the maximum deviation of the real part from the desired value of $Z_0$. It is understood that $\in_{Im}$ and $\in_{Re}$ can be adjusted to increase or decrease the number of steps to convergence at the potential cost of system performance (efficiency). It is also understood that steps 1-4 can be performed in a variety of sequences and a variety of ways other than that outlined above (i.e. first adjust the source imaginary part, then the source real part; or first adjust the device real part, then the device imaginary part, etc.) The intermediate impedances $Z_1$ and $Z_2$ may be adjusted during steps 1-4 to reduce the number of steps required for convergence. The desire or target impedance value may be complex, and may vary in time or under different operating scenarios.

Steps 1-4 may be performed in any order, in any combination and any number of times. Having described the above algorithm, variations to the steps or the described implementation may be apparent to one of ordinary skill in the art. The algorithm outlined above may be implemented with any equivalent linear network port parameter measurements (i.e., Z-parameters, Y-parameters, T-parameters, H-parameters, ABCD-parameters, etc.) or other monitor signals described above, in the same way that impedance or admittance can be alternatively used to analyze a linear circuit to derive the same result.

The resonators may need to be retuned owing to changes in the "loaded" resistances, Rs and Rd, caused by changes in the mutual inductance M (coupling) between the source and device resonators. Changes in the inductances, Ls and Ld, of the inductive elements themselves may be caused by the influence of external objects, as discussed earlier, and may also require compensation. Such variations may be mitigated by the adjustment algorithm described above.

A directional coupler or a switch may be used to connect the port parameter measurement circuitry to the source resonator and tuning/adjustment circuitry. The port parameter measurement circuitry may measure properties of the magnetic resonator while it is exchanging power in a wireless power transmission system, or it may be switched out of the circuit during system operation. The port parameter measurement circuitry may measure the parameters and the processor may control certain tunable elements of the magnetic resonator at start-up, or at certain intervals, or in response to changes in certain system operating parameters.

A wireless power transmission system may include circuitry to vary or tune the impedance and/or resonant frequency of source and device resonators. Note that while tuning circuitry is shown in both the source and device resonators, the circuitry may instead be included in only the source or the device resonators, or the circuitry may be included in only some of the source and/or device resonators. Note too that while we may refer to the circuitry as "tuning" the impedance and or resonant frequency of the resonators, this tuning operation simply means that various electrical parameters such as the inductance or capacitance of the structure are being varied. In some cases, these parameters may be varied to achieve a specific predetermined value, in other cases they may be varied in response to a control algorithm or to stabilize a target performance value that is changing. In some cases, the parameters are varied as a function of temperature, of other sources or devices in the area, of the environment, at the like.

Vehicle Applications

For each listed application, it will be understood by one of ordinary skill-in-the-art that there are a variety of ways that the resonator structures used to enable wireless power transmission may be connected or integrated with the objects that are supplying or being powered. The resonator may be physically separate from the source and device objects. The resonator may supply or remove power from an object using traditional inductive techniques or through direct electrical connection, with a wire or cable for example. The electrical connection may be from the resonator output to the AC or DC power input port on the object. The electrical connection may be from the output power port of an object to the resonator input.

The systems and methods described herein may be built-into, placed on, hung from, embedded into, integrated into, and the like, the structural portions of a vehicle. For example, a source resonator may be integrated into the dashboard of a user's car so that any device that is equipped with or connected to a device resonator may be supplied with power from the dashboard source resonator. In this way, devices brought into or integrated into the car may be constantly charged or powered while in the car.

The systems and methods described herein may provide power through the walls of vehicles, such as boats, cars, trucks, busses, trains, planes, satellites and the like. For instance, a user may not want to drill through the wall of the vehicle in order to provide power to an electric device on the outside of the vehicle. A source resonator may be placed inside the vehicle and a device resonator may be placed outside the vehicle (e.g. on the opposite side of a window, wall or structure). In this way the user may achieve greater flexibility in optimizing the placement, positioning and attachment of the external device to the vehicle, (such as without regard to supplying or routing electrical connections to the device). In addition, with the electrical power supplied wirelessly, the external device may be sealed such that it is water tight, making it safe if the electric device is exposed to weather (e.g. rain), or even submerged under water. Similar techniques may be employed in a variety of applications, such as in charging or powering hybrid vehicles, navigation and communications equipment, construction equipment, remote controlled or robotic equipment and the like, where electrical risks exist because of exposed conductors.

It may be noted that the present invention is explained using primarily a car, but those skilled in the art would appreciate that wireless power may be used in trucks, buses, jeeps, trailers, terrain vehicles, recreational vehicles, or a similar kind of automobile. Examples of the types of trucks in which wireless power may be used may include, but may not be limited to, utility trucks, tow trucks, road crew trucks, and the like. Examples of the types of buses in which wireless power may be used may include, but may not be limited to, private buses, public buses, or some other types of buses. Examples of the types of trailers in which wireless power may be used may include, but may not be limited to, commercial trailers, private trailers, and the like. Examples of the types of construction vehicles in which wireless power may be used may include, but may not be limited to, cranes, forklifts, cherry pickers, bulldozers, excavators, front loaders, cement trucks, asphalt pavers, and the like. Examples of the types of small vehicles in which wireless power may be used may include, but may not be limited to, golf carts, motor cycles, electric bikes, scooters, segway, neighborhood electric vehicle (NEV), and the like. To summarize, wireless power may be utilized in any of the land driven automobile devices.

The systems and methods described herein may provide wireless powering or charging capabilities to vehicles such as golf carts or other types of carts, all-terrain vehicles, electric bikes, scooters, cars, mowers, bobcats and other vehicles typically used for construction and landscaping and the like. The systems and methods described herein may provide wireless powering or charging capabilities to miniature mobile vehicles, such as mini-helicopters, airborne drones, remote control planes, remote control boats, remote controlled or robotic rovers, remote controlled or robotic lawn mowers or equipment, bomb detection robots, and the like. For instance, mini-helicopter flying above a military vehicle to increase its field of view can fly for a few minutes on standard batteries. If these mini-helicopters were fitted with a device resonator, and the control vehicle had a source resonator, the mini-helicopter might be able to fly indefinitely. The systems and methods described herein may provide an effective alternative to recharging or replacing the batteries for use in miniature mobile vehicles. In addition, the systems and methods described herein may provide power/charging to even smaller devices, such as microelectromechanical systems (MEMS), nano-robots, nano devices, and the like. In addition, the systems and methods described herein may be implemented by installing a source device in a mobile vehicle or flying device to enable it to serve as an in-field or in-flight re-charger, that may position itself autonomously in proximity to a mobile vehicle that is equipped with a device resonator.

The systems and methods described herein may be used in vehicles, such as for replacing wires, installing new equipment, powering devices brought into the vehicle, charging the battery of a vehicle (e.g. for a traditional gas powered engine, for a hybrid car, for an electric car, and the like), powering devices mounted to the interior or exterior of the vehicle, powering devices in the vicinity of the vehicle, and the like. For example, the systems and methods described herein may be used to replace wires such as those are used to power lights, fans and sensors distributed throughout a vehicle. As an example, a typical car may have 50 kg of wires associated with it, and the use of the systems and methods described herein may enable the elimination of a substantial amount of this wiring. The performance of larger and more weight sensitive vehicles such as airplanes or satellites could benefit greatly from having the number of cables that must be run throughout the vehicle reduced. The systems and methods described herein may allow the accommodation of removable or supplemental portions of a vehicle with electric and electrical devices without the need for electrical harnessing. For example, a motorcycle may have removable side boxes that act as a temporary trunk space for when the cyclist is going on a long trip. These side boxes may have exterior lights, interior lights, sensors, auto equipment, and the like, and if not for being equipped with the systems and methods described herein might require electrical connections and harnessing.

An in-vehicle wireless power transmission system may charge or power one or more mobile devices used in a car: mobile phone handset, Bluetooth headset, blue tooth hands free speaker phone, GPS, MP3 player, wireless audio transceiver for streaming MP3 audio through car stereo via FM, Bluetooth, and the like. The in vehicle wireless power source may utilize source resonators that are arranged in any of several possible configurations including charging pad on dash, charging pad otherwise mounted on floor, or between seat and center console, charging "cup" or receptacle that fits in cup holder or on dash, and the like.

The wireless power transmission source may utilize a rechargeable battery system such that said supply battery gets charged whenever the vehicle power is on such that when the vehicle is turned off the wireless supply can draw power from the supply battery and can continue to wirelessly charge or power mobile devices that are still in the car.

The systems and methods described herein may be used to power sensors on the vehicle, such as sensors in tires to measure air-pressure, or to run peripheral devices in the vehicle, such as cell phones, GPS devices, navigation devices, game players, audio or video players, DVD players, wireless routers, communications equipment, anti-theft devices, radar devices, and the like. For example, source resonators described herein may be built into the main compartment of the car in order to supply power to a variety of devices located both inside and outside of the main compartment of the car. Where the vehicle is a motorcycle or the like, devices described herein may be integrated into the body of the motorcycle, such as under the seat, and device resonators may be provided in a user's helmet, such as for communications, entertainment, signaling, and the like, or device resonators may be provided in the user's jacket, such as for displaying signals to other drivers for safety, and the like.

Vehicle Application Embodiments

Wireless power as described herein refers to methods and systems for wireless energy transfer, as described herein, between coupled resonators in association with a vehicle, including personal automobiles and trucks, specialist professional vehicles (e.g. construction vehicles, personnel transport vehicles, cargo transport vehicles), small vehicles (e.g. golf carts, motorcycles, mini-taxis), and the like. In embodiments, wireless power as applied to vehicles may include power transfer from one part of the vehicle to another part of the vehicle (e.g. to eliminate harnessing, to eliminate the need to cut through the chassis of the vehicle for running wired power lines), from outside the vehicle to the inside of the vehicle (e.g. vehicle charging from a charging station while the vehicle is at rest, from a charging facility associated with the road while the vehicle is in motion, from the outside of the chassis to an interior of the vehicle without the need to cut through the chassis for running wired power lines), from inside the vehicle to outside the vehicle (e.g. a mobile device powered by a resonator in the vehicle), from one vehicle to another vehicle (e.g. sharing power from one vehicle to another, transfer of power from a vehicle to a trailer attached to the vehicle), from a wireless power source inside the vehicle to a mobile electrical device of an person inside the vehicle (e.g. charging a user's cell phone when they enter the vehicle), and the like. For instance, an external resonator may charge an electric car for personal use, such as from inside an owner's garage. The car may also include relay resonators within the vehicle to transfer power wirelessly to serve functions of the car and of the user. For example, power may be distributed along the two sides of the vehicle with a plurality of resonators for transfer of wireless power to lights in car, electric windows in the door, devices in the dashboard of the car, to mobile electrical devices brought into the car by a passenger (e.g. a cell phone, a DVD player, a power tool), to other components within the car (e.g. to a seat of the car for a seat heater, seat motor, to relay power to another devices hung on the seat such as a DVD player), and the like. In embodiments, wireless power components may be incorporated into a vehicle as part of a vehicle's factory design, added as an option, added as an after-market product, used temporarily in the vehicle, and the like.

Vehicle application embodiments as described herein may utilize various resonator configurations, such as type-A, type-B, type-C, type-D, and type-E resonators, or any other configuration described herein. Vehicle application embodiments that utilize these type-'x' resonator configurations do so for the ease of description, and are not meant to be limiting in any way, but meant to provide a simplified descriptor for a general class of high-Q magnetic resonators when describing application embodiments. For instance, type-B, type-D, and type-E are resonator configurations that incorporate structures that shape the resonator fields away from lossy objects. Since many vehicles contain steel as part of their frame and body, these types of resonators may provide more optimal solutions for wireless energy transfer when the resonator is in proximity to one of the vehicle's steel portions. Combinations of resonator types may also be incorporated into vehicle application embodiments, providing more optimal performance for a given application. For instance, a type-B combined with a type-D resonator may be referred to herein as a type-B/D resonator, where the physical structure of the resonator is thin due to the type-D construction, but with the additional type-B characteristics producing an overall wireless power transfer profile that has both planar and omni-directional characteristics, where the fields are additionally shaped to avoid the steel of the roof that the resonator is mounted to, i.e., by way of the shielding components of the type-B/D configuration. For example, a source resonator mounted to the ceiling of a car to provide wireless energy to receiver resonators within the cab of the car may be optimally a type-B/D resonator, allowing the resonator to be flat against the ceiling and still provide wireless energy to devices in the cab of the vehicle. Alternately, a type-B/E resonator may be selected in order to further decrease the thickness of the resonator, and thus allow the resonator to have a lower profile as mounted on the ceiling of the car.

A vehicle's power distribution system may consist of a primary power source, such as a battery (e.g. as charged traditionally by way of an internal combustion engine, or by some alternate energy means, such as in the case of an electric vehicle, and the like). The battery may provide both wired and wireless power transfer infrastructure to power electrical components in the vehicle, including to source resonators that wirelessly power electrical devices equipped with receiving device resonators. Alternately, the source resonator may transfer energy to an intermediate 'relay' resonator, and on to a device resonator. For example, a vehicle powered by an internal combustion engine may connect the electrical systems of the engine by wired means (e.g. to the ignition system) but provide power to other electrical systems and components by way of wireless energy transfer, such as a source resonator transferring energy to the dashboard system, a series of source resonators for transferring energy down the frame of the vehicle to secondary electrical systems, the lighting system, external devices on the vehicle, mobile devices in the vehicle, and the like. Source resonators may be configured with a type-x resonator per the environment surrounding the source resonator as described herein, such as with type-B, -D, or -E resonators to shape the fields around lossy objects. Receiving device resonators may be configured with a type-x resonator per their surrounding environment, per the environment of the device it is powering, per the source resonator, and the like. The vehicle's power distribution system may comprise a combination of wired and wireless energy transfer systems to most efficiently provide power to the various electrical components of the vehicle, where the wireless energy transfer systems and methods of the present invention allow greater ease and flexibility in accommodating both factory-installed and after market electrical distribution needs in association with the vehicle and passengers.

Series Related Wireless Power Transfer in a Vehicle

Figure 31:
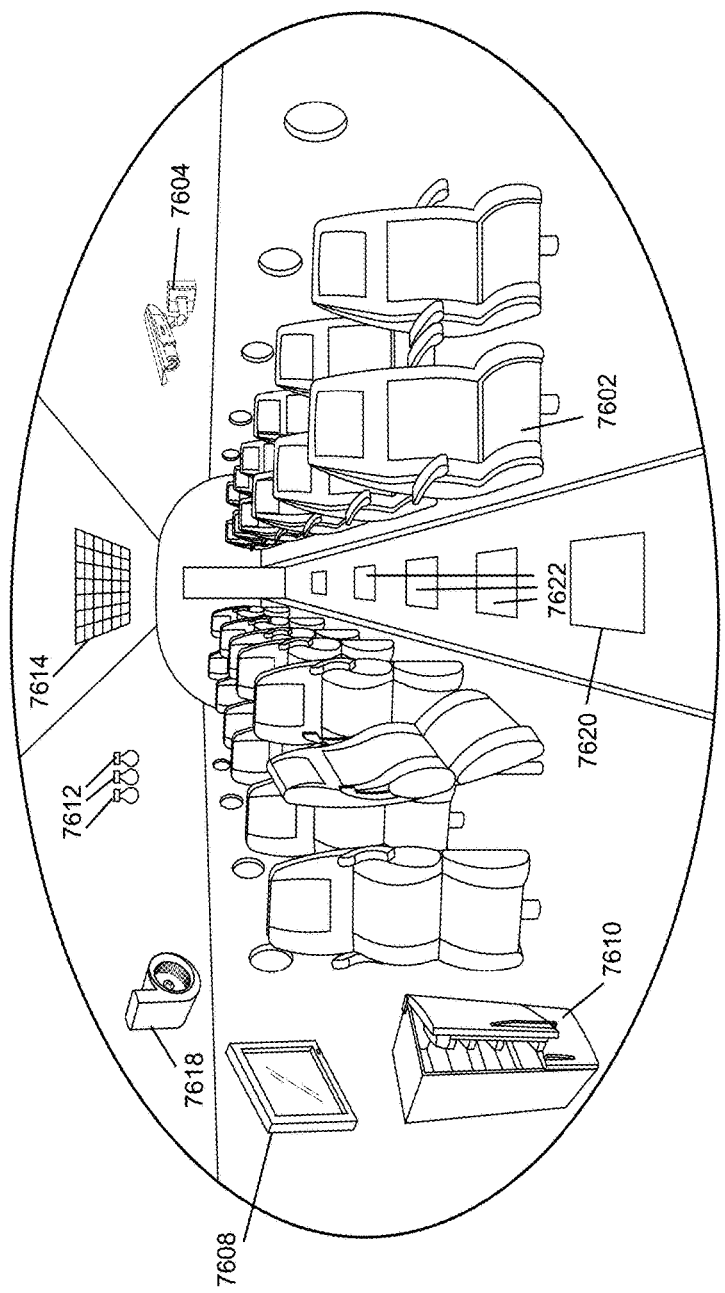
FIG. 31 depicts a passenger compartment for a commercial vehicle in embodiments of the present invention.

Referring to FIG. 31, in embodiments of the present invention, wireless power may be used to transfer power down through a compartment of a vehicle by way of at least one resonator 7622 in addition to a source resonator 7620, such as when the at least one resonator 7622 acts as a wireless power relay from the source resonator to an electrical load in the vehicle. For example, a source resonator 7620 may draw power from a power source in the vehicle, such as the battery in an automobile, and be located near the front of the vehicle passenger compartment. The at least one resonator 7622 may then be placed further back into the vehicle compartment receiving wireless energy from the source resonator 7620 and relaying wireless power to an electrical load in the back of the vehicle, such as to a seat 7602, an integrated DVD player, a power window, a passenger's laptop computer, and the like. The vehicle may be a long vehicle (e.g. plane, train, ferry, bus, limo) having a source resonator 7620 and a series of repeater resonators 7622 placed down through the vehicle in order to create an extended wireless power zone without the need to provide a harness down through the vehicle. This may be especially useful when retrofitting an existing bus, train, limo, and the like, where installing new harnessing with resonators could be prohibitive. As described herein, the resonators may include high-conductive materials (e.g. as in the Type-B, D, and E resonators) to steer the wireless magnetic fields away from a vehicle portion, where the vehicle portion may be a lossy material near the resonator (e.g. the chassis on the floor of the vehicle), a vehicle portion that is a lossy obstruction in the path between a resonator and the intended wireless load, and the like. In embodiments, at least one resonator may relay wireless energy up to a back portion of a vehicle seat, a seat tray-back table, and the like, to improve wireless power transfer to wireless power loads in the upper portion of the vehicle compartment. For example, a source resonator may be located at the end of a long isle way in a plane or train, where relay resonators are located along the isle way to create a wireless power zone down through the passenger compartment. Further, there may be resonators in the seat back trays available to passengers. In this way, wireless energy may be relayed down through the isle way, and then from isle way relay resonators up to seat back tray resonators. These seat back tray resonators may then provide a more proximate wireless energy source to wireless power loads in the vicinity of the seat back tray than directly from the relay resonators on the floor of the vehicle. Here again, high conductive materials may be used to steer the magnetic fields away from lossy materials in the surrounding vehicle environment and toward the intended wireless power zone.

In embodiments, method and systems may be provided for wireless energy distribution across a vehicle compartment of defined area, where a source resonator is coupled to an energy source of a vehicle and generates an oscillating magnetic field with a frequency, and at least one repeater resonator is positioned along the vehicle compartment. The at least one repeater resonator may be positioned in proximity to the source resonator, the at least one repeater resonator having a resonant frequency and comprising a high-conductivity material adapted and located between the at least one repeater resonator and a vehicle surface to direct the oscillating magnetic field away from the vehicle surface, where the at least one repeater resonator provides an effective wireless energy transfer area within the defined area. In embodiments, the vehicle may have a passenger compartment with an internal surface and wherein the at least one repeater resonator is positioned substantially in the plane of the internal surface, where the internal surface is a floor surface of the vehicle, where the floor surface of the vehicle is an isle way through the passenger compartment of the vehicle, where the vehicle surface is a ceiling surface of the vehicle, and the like. Further, a passenger seat may be located within the defined area of the vehicle, where the passenger seat has a seat repeater resonator, the seat repeater resonator receives wireless energy from the at least one repeater resonator and a second wireless energy transfer area is generated local to the seat repeater resonator. The seat repeater resonator may be located in the back of the passenger seat. The high-conductivity material may be used to shape the resonator fields of the seat repeater resonator such that they avoid lossy objects in the passenger seat. The seat repeater resonator may be located in a deployable tray of the passenger seat, where the deployable tray may fold down from the back of the passenger seat. The high-conductivity material may shape the resonator fields away from lossy objects in the vehicle surface. In embodiments, the high-conductivity material may be covered on at least one side by a layer of magnetic material.

Through-the-Vehicle Wireless Power Transfer to Devices External to the Vehicle

In embodiments, wireless power may be provided through the body or window of a vehicle to an external resonator on the outside of the vehicle (e.g. for powering an external emergency light, digital display sign, advertisement, business sign, sensor package), such as where the outside electrical device and/or resonator are waterproof sealed. For example, in the case where the roof of a vehicle is a non-lossy material (e.g. fiberglass, plastic, and the like), a resonator on the inside roof of the vehicle may provide a receiving Type-A resonator on the external roof of the vehicle to power a device, such as for instance a display sign for a business. Further, the display sign may be a wireless power device that receives wireless power from the resonator on the external roof. In this way, no wired connections need be made between the external sign and the vehicle's power source. In another example, a resonator on the inside of the vehicle may wirelessly transfer power though a window or non-lossy chassis material to a Type-E resonator mounted on the outside of the vehicle. The Type-E resonator is a low profile resonator that directs the oscillating magnetic field in a substantially planar-direction along the surface of the vehicle. In this way, the resonator provides a wireless power zone along the external surface of the vehicle, where the resonator is acting as a repeater for wireless energy sourced from a resonator on the inside of the vehicle.

In embodiments, a method and systems for wireless energy distribution across a defined external vehicle surface area of a vehicle may be provided, where a source resonator is coupled to an energy source of the vehicle and positioned interior and proximate to a window mounted in the vehicle surface, the source resonator generating an oscillating magnetic field with a frequency. A repeater resonator may then be positioned on the external vehicle surface proximate to the window, the repeater resonator having a similar resonant frequency and comprising a coil configuration that generates a magnetic field distribution substantially planar to the vehicle surface and a high-conductivity material adapted and located between the repeater resonator and the vehicle surface to direct the oscillating magnetic field away from the vehicle surface, where the repeater resonator provides an effective wireless energy transfer area concentrated substantially along the exterior surface of the vehicle. In embodiments, the source resonator may be mounted on the interior of the vehicle surface and comprising a high-conductivity material adapted and located between the source resonator and the vehicle surface to direct the oscillating magnetic field away from a lossy vehicle surface.

Mechanically Removable Wireless Power Seat Assembly

Figure 29:
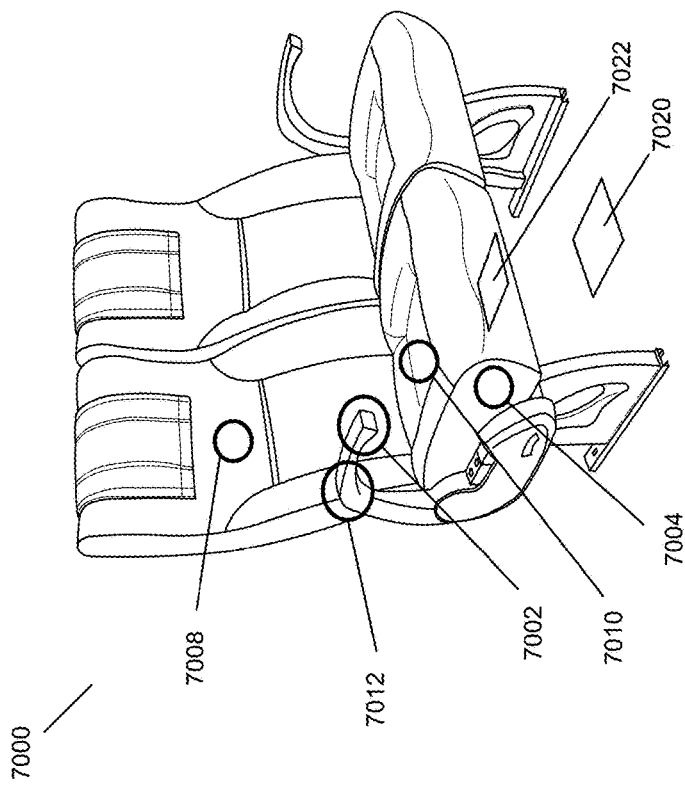
FIG. 29 depicts a plurality of wireless powered devices associated with seats of a commercial vehicle in accordance with an embodiment of the present invention.

Referring to FIG. 29, In embodiments wireless power may be transferred to a vehicle seat 7000, such as from a resonator 7020 mounted in a surface of the vehicle to a resonator 7022 in a mechanically removable wireless seat assembly in a vehicle, thus eliminating the wiring to the seat and allowing the seat to be removed from a vehicle without attention to wiring. Further, wireless power may be provided to the seat even when the seat has been removed from the vehicle but is still within range of a source resonator from the car, where a source resonator in the vehicle powers the mechanically removable seat while the seat is proximate to but outside the vehicle. The ability to provide wireless power to the mechanically removable wireless seat assembly may be further extended with a relay resonator provided external to the vehicle, such as for instance in a wireless power repeater ground pad placed on the ground outside the vehicle, or the like external wireless relay facility. In this way, the wireless power relay pad may be powered by a source resonator inside the vehicle and create a wireless power zone outside the vehicle to the mechanically removable wireless seat assembly, to other wireless mobile devices (e.g. entertainment devices, cell phones, lighting), and the like, when placed near the ground pad. In embodiments, the ground pad may comprise one or more wireless power transfer facilities, such as a mid range wireless power transfer facility as described herein or other short-range (near contact) technologies known in the art.

The ability to remove a vehicle seat 7000, that includes at least one vehicle-powered integrated electrical and/or electronic device such as a seat heater 7010, seat motors 7004, a music system 7012, massage device 7008, and the like, from its mounting position without the need to disconnect/connect electrical wired connections may provide useful for a plurality of applications. For example, a bucket seat in a minivan may have integrated seat motors, seat heaters, entertainment devices, and the like, where all are powered by the vehicle power source. Without wireless power facilities, a user would have to disconnect an electrical wire harness in order to remove such a vehicle seat. In addition, after the vehicle seat has been removed from its wired connection, there would remain an electrical outlet on the floor of the vehicle that has to be covered in order avoid exposure to damage, to avoid exposure to a person from electrical shock, and the like. With use of a wireless power transfer, a source resonator may be safely integrated with the vehicle away from user access, such as in the floor of the vehicle, with high-conductivity materials placed such as to steer the magnetic fields away from lossy portions of the vehicle (i.e. the metal portions of the vehicle chassis). Through the use of wireless power transfer facilities as described herein, the owner of the minivan may now remove the vehicle seat from the minivan without the need to address electrical wire connection/disconnections or exposure to the wire harness electrical connection. In addition, the manufacture of the vehicle may now design the vehicle in such a way that the vehicle seat can be moved to another location, such as by mechanically disconnecting the seat and moving it to another mounting position in the vehicle, by mechanically sliding the seat to a new position along a track system, and the like. In this way, the seating arrangement in the minivan may be reconfigured for use. One skilled in the art will appreciate that the mechanically removable wireless power seat assembly may be applied to any of a plurality of vehicle types, such as automobiles, trucks, busses, trains, planes, boats, and the like. For instance, one can easily image the utility of being able to rearrange the seats on a bus or an airliner to accommodate different seating arrangements/needs of passengers, especially in a private chartered arrangement, such as for a sports team, band, and the like.

In embodiments, method and systems may be provided for wireless energy distribution to a mechanically removable vehicle seat, where a source resonator is coupled to an energy source of a vehicle, the source resonator positioned proximate to the mechanically removable vehicle seat, the source resonator generating an oscillating magnetic field with a resonant frequency and comprising a high-conductivity material adapted and located between the source resonator and a vehicle surface to direct the oscillating magnetic field away from the vehicle surface. A receiving resonator may then be integrated into the mechanically removable vehicle seat, the receiving resonator having a resonant frequency similar to that of the source resonator, and receiving wireless energy from the source resonator, and providing power to electrical components integrated with the mechanically removable vehicle seat. In embodiments, at least one of the electrical components may be a second resonator integrated proximate to the back portion of the vehicle seat, the second resonator comprising a high-conductivity material adapted and located between the second resonator and the interior of the vehicle seat to direct the oscillating magnetic field away from the interior of the vehicle seat, wherein the second resonator provides an effective wireless energy transfer area concentrated dominantly behind the vehicle seat. The second resonator may be electrically connected to the receiving resonator through a wired connection. A wireless energy enabled electrical device located within the wireless energy transfer area may receive wireless energy from the second resonator. Further, a repeater resonator may be integrated proximate to the back portion of the vehicle seat the repeater resonator having a resonant frequency similar to the source resonant frequency and comprising a high-conductivity material adapted and located between the repeater resonator and the interior of the vehicle seat to direct the oscillating magnetic field away from the interior of the vehicle seat, wherein the repeater resonator provides an effective wireless energy transfer area substantially behind the vehicle seat. A wireless energy enabled electrical device located within the wireless energy transfer area may receive wireless energy from the repeater resonator. The electrical components may be a seat heater, an electric seat-position adjustment actuator, an entertainment device, and the like. The high-conductivity material may be used to shape the resonator fields of the source resonator such that they avoid lossy objects in the vehicle surface. The high-conductivity material may be covered on at least one side by a layer of magnetic material to improve the electromagnetic coupling between the source resonator and the receiving resonator.

Power Management of a Plurality of Wireless Power Transmitters

In embodiments, a power management facility for power management of a plurality of source resonators may be provided for a wireless power zone within a vehicle, where power management of the plurality of source resonators, powered from the primary power source (e.g. car battery) down through the vehicle, may provide a full coverage and managed wireless power zone within the vehicle to coordinate the power usage within the vehicle from a plurality of wireless power receiving devices. Power management may be provided through intelligence built into the sources and/or the devices so that the sources can be used to intelligently distribute power to all of the devices. The power management facility may provide a 'smart grid' for wireless energy loads within the vehicle, where power may be allocated to certain devices, prioritized for certain devices, or even borrowed from one device to power another.

The power management facility may also implement smart auto-tuning source algorithms, where end-to-end efficiency is increased by incorporation of tunable impedance matching and/or drive frequency circuits into the source electronics, and where intelligence is built into the source so that it is able to modulate the power it supplies. There are a variety of power modulation algorithms that may be utilized to improve the wireless power efficiency of different devices in the system, as well as the end-to-end power efficiency. In addition, smart source auto-tuning algorithms may be used to implement a variety of power control protocols including: a greedy algorithm, where the devices with the largest power draws are always supplied; a conservative algorithm, where the power in a central battery or power supply is monitored and the supplied power adjusted to ensure that it is never fully drained; a hierarchical algorithm, where certain devices are prioritized as more important than others, and the wireless source makes sure these prioritized devices have a certain amount of power before sharing with the lower priority devices; and the like. The most efficient and robust tuning protocols may include tuning capabilities in the device resonators and circuits as well as in the source. For example, if a wirelessly rechargeable battery in a first mobile device is fully charged, but the source resonator must still supply power to a second wirelessly rechargeable device, the first mobile device may detune itself from resonance so that it no longer efficiently receives power from the source. Then, the detuned first mobile device will no longer receive power and is not in danger of over-charging and damaging circuits and/or battery cells.

Another way to improve the end-to-end efficiency of these systems is to incorporate tunable impedance matching and/ or drive frequency circuits into the source electronics. For instance, if a source is powering a single device, the source may adjust its output power to match the power requested by a device. However, if multiple devices are being powered by a single source, the source may be required to supply power to a priority device or a far-away device while the other device in the system is fully charged. In such scenarios, a tunable impedance matching circuit in the device may be used to detune the second device resonator from resonance so that it is no longer capable of receiving power. In that case, the device would not be overcharged or otherwise damaged. Communication schemes and control algorithms implemented may utilize a variety of communication and control algorithms, such as PMA and Qi protocols suitable for one source to one device, A4WP and CEA protocols to support one source charging multiple devices, and the like.

Multi-modal power management component may also be provided, where for instance, one mode may be a vehicle operational mode (e.g. while a car is running power off the alternator), and another mode may be a conservation mode (e.g. when power is being provided by the battery—vehicle not running). A third mode may be emergency mode, such as when the battery capacity reaches some pre-determined level. Another mode may be related to the energy source or fuel being used, and the like.

Waterproof Wireless Power Transfer Systems in a Watercraft

In embodiments, wireless power transfer may be used in watercraft (e.g. boats, ships, ferries) where waterproof wireless power transfer configurations provide waterproof sealed resonators, such as a waterproof sealed source resonator wired to a primary power source (e.g. at the battery in a small boat), and waterproof sealed receiver resonator-electronics (e.g. dashboard controls, radios, lights, winches, and the like), where the source resonator provides the watercraft with a wireless power zone in which the receiver resonator-electronics operate as electrical loads (e.g. directly powered, recharging batteries, and the like). The source resonator may be waterproof sealed, such as with high-conductive materials that steer the source resonator fields away from lossy materials, including water in the boat's surrounding environment. The receiver resonators may be waterproof sealed, such as with high conductive materials that steer magnetic fields around lossy materials associated with the receiver device. For example, control panel electrical devices may be completely sealed, where power is received wirelessly, thus eliminating any wiring external to the device, such as for gauges, lights, radios, and the like. In another example, electric and/or electronic facilities may be provided as part of a seat assembly, where the electric and/or electronic facilities are waterproof sealed within the seat, and where the seat may be removed/moved without dealing with external wires that would otherwise be associated with the power being delivered to devices in the seat assembly. In another example, portable radio units for sailors onboard may be powered and/or recharged through the wireless power transfer system of the watercraft such that no external power jacks are needed for the radio unit, and where the radio unit will not run out of battery power while in use.

In embodiments, watercraft may be powered through wireless power transfer while the watercraft is at dock or at a mooring, where a waterproof source resonator is on the dock or at the mooring, and transfers power to a receiving resonator on the watercraft, such as for direct power usage, battery recharging, or both. Source resonators on the dock or mooring may be configured with high-conductive materials to steer the magnetic fields away from the nearby water. In embodiments, a waterproof source resonator may create a wireless power zone on the dock area, such as to power directly or recharge receiver resonator devices while on the dock. For example, a waterproof wireless power zone may be provided at the dock for party, where wireless powered lights and entertainment devices are placed on the dock for operation without the need for electrical wires. In embodiments, power may be transferred to the dock or mooring area by wireless power transfer means, or by any other wireless means known to the art. For instance, a radiative line-of-sight power transfer system may transfer power wirelessly to a location of a source resonator, where the source resonator creates a remote wireless power zone.

In embodiments, the watercraft may be a submersible, submarine, and the like vehicle, where wireless power transfer may provide benefits where waterproof sealed electrical and/or electronics may be essential for the safety and operation of the vehicle. For instance, in the event of a leak in some portion of a submersible vehicle, any exposed electrical wiring, contacts, electronics, and the like, may not only cause a malfunction, but also endanger the lives of sailors onboard. Wireless power transfer systems as described herein may provide for the safe wireless transfer of electrical power through the submersible vehicle, such as through the creation of wireless power zones, resonator-relayed power distribution across extended areas and down extended passageways, and the like. Resonators on the submersible vehicle may need to shape the transferred magnetic fields with high-conductive materials as described herein in order to avoid lossy materials in the walls of corridors and generally the structure of the submersible. For instance, a Type-B resonator may allow a source or relay resonator to provide wirelessly transmitted power through passageways by shaping the magnetic fields such that the lossy materials in the walls of a corridor, the walkway, the ceiling, and the like, less affect them.

Automobile Dashboard (Car, Trucks, Trailers, etc.)—Factory Supplied

Figure 21:
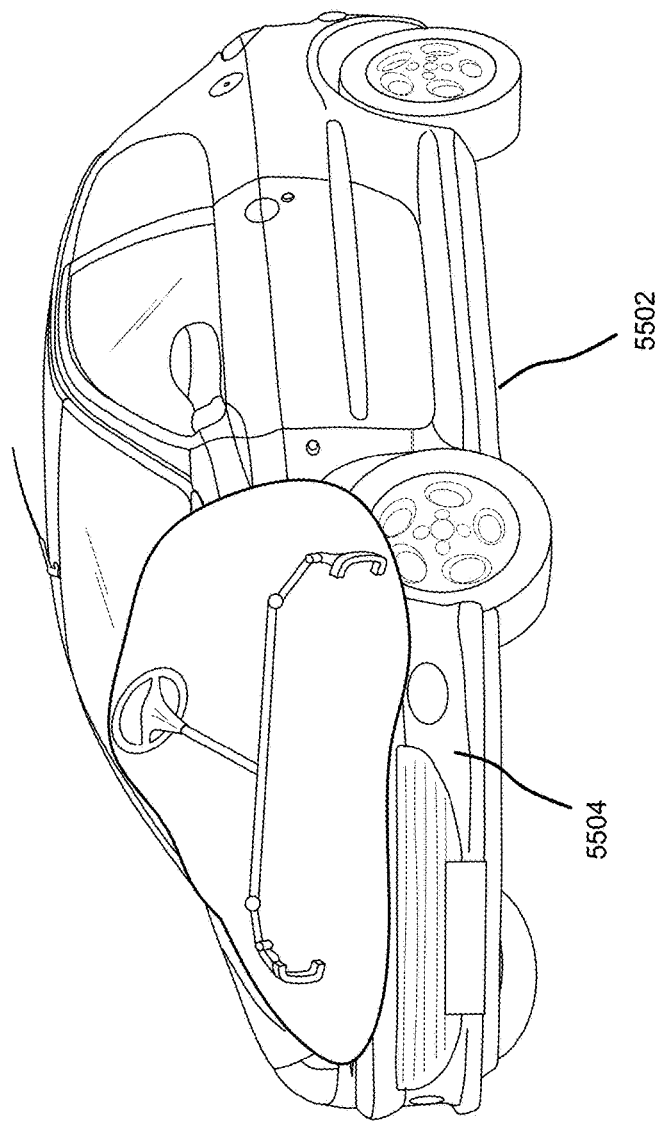
FIG. 21 depicts a car having a dashboard in accordance with an embodiment of the present invention.
Figure 22:
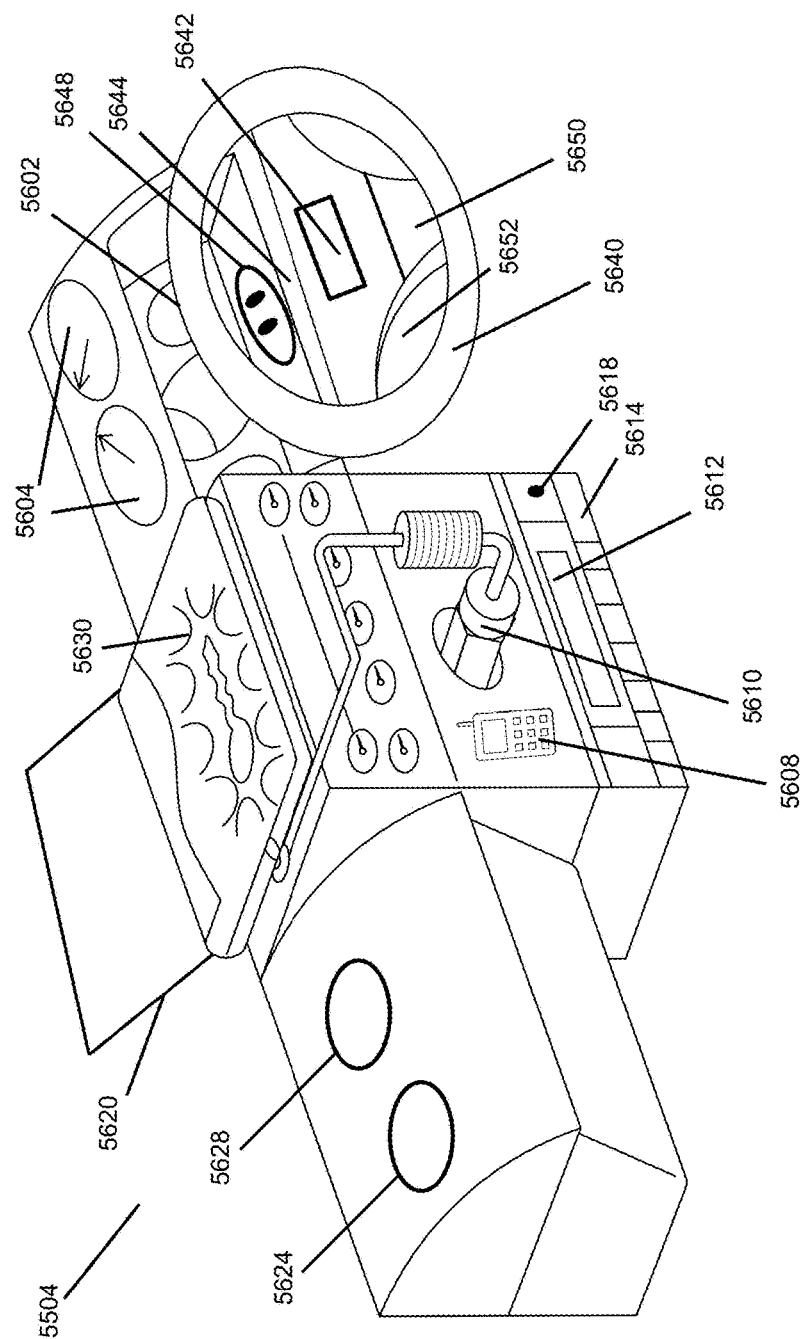
FIG. 22 depicts a plurality of wireless powered devices in the dashboard in accordance with an embodiment of the present invention.

In embodiments, referring to FIG. 21 and FIG. 22, wireless power may be utilized to provide electrical power to devices within the dashboard 5504 of a car 5502 in a manner that no electrical wiring may be required to bring electrical power to the electrical devices from the car's primary power source. This may prove advantageous for the initial design and manufacturing of the car 5502, as it may not only reduce the weight, cost, and manufacturing time associated with the otherwise needed wire harness, but may also improve reliability due to the absence of the harness across the multiple dashboard 5504 devices/components. For example, a source resonator and controller may be wire-connected to the vehicle's primary electrical system and placed in a position behind the dashboard 5504. Depending upon the placement of the dashboard electrical devices relative to the source resonator a type-B or type-D resonator may be optimal, where both provide a means of shaping the field from the source resonator to avoid portions of the vehicle's chassis associated with the vehicle's firewall and engine compartment near the source resonator that are deemed to be lossy. For instance, a type-B resonator may be more ideal in an instance where the dashboard electrical components are laid out in a three dimensional distribution, but a type-D resonator may be more ideal where component receiving resonators are located in a co-planar distribution. However, in using a type-B resonator, the resonator may be able to provide power to not only in-dash electrical components, but also resonator equipped user electrical devices in the vehicle, especially to mobile electrical devices located with passengers in the front portion of the vehicle.

In addition, having eliminated the need for electrical device/components to have an electrical harness connection to the vehicle's wired electrical system, the vehicle's manufacturer may now more easily add electrical components/devices to the dashboard 5504 of the car 5502 without affecting the layout, routing, and design of the power portion of the electrical harness. For instance, a vehicle may have a plurality of wireless powered dashboard devices available as options that may be snapped into place on the dashboard without the need for routing wired power to the device. Further, replacement of the device may become much more straightforward, where the owner of the car may only have to purchase a new wireless power enabled device and swap the new device out for the malfunctioning or older version of the device without the need to deal with power distribution lines.

It may be noted that the present invention has been explained by showing a car 5502, but those skilled in the art would appreciate that wireless power may be used in trucks, buses, jeeps, trailers, terrain vehicles, recreational vehicles, or a similar kind of automobile. Examples of the types of trucks in which wireless power may be used may include, but may not be limited to, utility trucks, tow trucks, road crew trucks, and the like. Examples of the types of buses in which wireless power may be used may include, but may not be limited to, private buses, public buses, or some other types of buses. Examples of the types of trailers in which wireless power may be used may include, but may not be limited to, commercial trailers, private trailers, and the like. Examples of the types of construction vehicles in which wireless power may be used may include, but may not be limited to, cranes, forklifts, cherry pickers, bulldozers, excavators, front loaders, cement trucks, asphalt pavers, and the like. Examples of the types of small vehicles in which wireless power may be used may include, but may not be limited to, golf carts, motor cycles, electric bikes, scooters, segway, neighborhood electric vehicle (NEV), and the like. To summarize, wireless power may be utilized in any of the land driven automobile devices.

Figure 23:
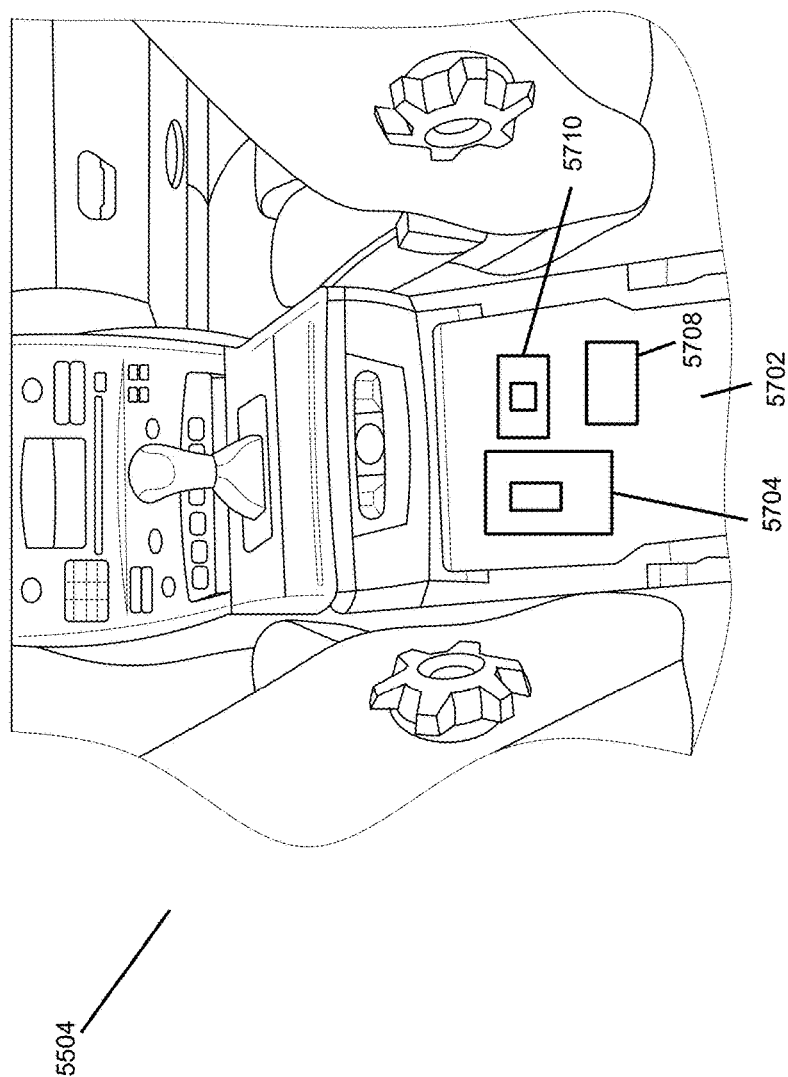
FIG. 23 depicts a plurality of wireless powered devices in the dashboard in accordance with another embodiment of the present invention.

In embodiments, as shown in FIG. 22 and FIG. 23, the electrical components/devices associated with the dashboard 5504 may be equipped with resonators for receiving wireless energy from the source resonator for the dashboard. The electrical components associated with the dashboard 5504 may include, but may not be limited to, wireless powered dashboard electronics 5602, wireless powered navigation devices 5604, a wireless powered phone 5608, a wireless powered lighter 5610, a wireless powered music system 5612, a wireless powered heating element/heater blower 5614, a wireless powered auxiliary power plug 5518, a wireless powered LCD screen 5620, wireless powered amplifiers 5624, wireless powered speakers 5628, a wireless powered DVD player 5630, and the like. The wireless powered music system 5612 may be a CD player, a radio, an MP3 player, and the like. Similarly, the wireless powered dashboard electronics 5602 may include a wireless powered speedometer, a wireless powered trip meter, a wireless powered engine oil display screen, a wireless powered brake-oil display screen, a wireless powered fuel display screen, and the like. Those skilled in the art would appreciate that the dashboard 5504 of the car 5502 may include the electrical devices/components that may be presently known in the art. Further, all these devices may take advantage of the present invention.

For example, on a long drive, a passenger of a car 5502 may want to see a movie on the DVD player and the LCD screen associated with the dashboard 5504. In the example, a normal DVD player and LCD screen may require a power harness connection to the main electrical power source in the car. However, with the wireless powered DVD player 5630 and the LCD screen 5620, there may be no need for power to be routed to these wireless powered components/devices, thus eliminating the power harness connection with the dashboard 5504. In embodiments, the wireless powered player may also be moved around the vehicle and remain powered, stored away in a compartment and charge an internal energy storage component, be removed from the vehicle and used in conjunction with an internal energy storage component and charged back up when brought within range of the wireless power source, used outside the vehicle while remaining in range of the wireless power source, and the like.

Similarly, it may be required that a navigation device be powered so as to get regular updates from the GPS system for the benefit of the car 5502 passenger/driver. In an example, a traditionally powered navigation device may require a power harness connection to the main electrical power source in the car, such as with an integrated harness as part of the vehicle, with external power lines such as plugged into a vehicle power outlet, and the like. However, with the wireless powered navigation device 5604, there may not be any need for power to be routed to the wireless powered navigation device 5604, thus minimizing the power harness associated with the dashboard 5504.

In addition, having eliminated the power portion of the electrical harness, the manufacturer of the car 5502 may be free to select a position/space for a wireless powered device anywhere in the car 5502. For example, the wireless powered LCD screen 5620 may be placed in a position that is out of the driver's range of vision since the LCD screen may be relocated now without the restrictions associated with traditional harnessing. By extending this implementation of wireless power to other electrical components, the car manufacturer may be able to substantially reduce the electrical harness from the dashboard 5504 area. In this way, the present invention may decrease the cost, weight, and integration time associated with the harness, while increasing the reliability of the functioning of the electrical devices. In addition, the wireless powered electrical dashboard components may now be more modular in design, in that they may be more easily added to a vehicle, changed, upgraded, moved, and the like, which in turn may potentially increase the manufacturer's ability to customize the vehicle as per user needs.

In embodiments, as shown in FIG. 21, FIG. 22, and FIG. 23, the wireless powered devices of the dashboard 5504 may be factory fitted. For example, the manufacturer of the car 5502 may fit the wireless powered DVD player 5630. Similarly, other devices associated with the dashboard 5504 may also be fitted by the manufacturer of the car 5502.

Further, it may be noted that the present invention has been explained by showing a dashboard 5504 of the car 5502, but those skilled in the art would appreciate that wireless power may also be used in the electrical components of the dashboard of trucks, buses, jeeps, trailers, recreational vehicles, and the like. For example, the electrical components associated with the dashboard of the truck may include, but may not be limited to, wireless powered dashboard electronics, wireless powered navigation devices, a wireless powered phone, a wireless powered lighter, a wireless powered music system, a wireless powered heating element/heater blower, a wireless powered auxiliary power plug, a wireless powered LCD screen, wireless powered amplifiers, wireless powered speakers, a wireless powered DVD player, and the like. The stated wireless powered devices of the dashboard of the truck may take advantage of the present invention. For example, as described above, the navigation device of the truck may not need the electrical harness and may use the wireless power (as explained for the car 5502). As described above, this may provide flexibility in the manufacturing design. In embodiments, the wireless powered electrical components/devices present in the dashboard of the truck may be factory fitted.

Similarly, wireless power may be used in the electrical components of the dashboard of utility trucks, tow trucks, road crew trucks, and the like. On the same pattern, wireless power may be used in the electrical components of the dashboard of buses, which may include, but may not be limited to, private buses, public buses, and the like. Wireless power may also be used in the electrical components of the dashboard of trailers, which may include but may not be limited to, commercial trailers, private trailers, and the like. To extend the implementation, wireless power may be used in the electrical components of the dashboard of construction vehicles, which may include but may not be limited to, cranes, forklifts, cherry pickers, bulldozers, excavators, front loaders, cement trucks, asphalt pavers, and the like. In embodiments, all the wireless powered electrical devices associated with the dashboard of trucks, buses, jeeps, trailers, recreational vehicles, and the like, may be company fitted.

Automobile Dashboard (Car, Trucks, Trailers, etc.)—After Market Installations

In embodiments, some of the wireless powered devices of the dashboard 5504, as shown in FIG. 21, FIG. 22, and FIG. 23, may be installed after the car 5502 is manufactured. These wireless powered devices may be installed based on the user's preference.

The wireless powered components associated with the dashboard 5504 installed after the car is manufactured may include a wireless powered DVD Player, a wireless powered LCD screen, a wireless powered mobile phone charger, a wireless powered auxiliary plug, wireless powered auxiliary speakers, a wireless powered cleaning device, and the like, and may require the installation of a source resonator for operation. That is, if the car has not been factory-equipped with a source resonator, one would need to be installed in order to energize the vicinity in which the wireless powered components are to be operating.

In embodiments, after-market wireless energy transfer systems for an automobile dashboard may utilize one or more resonator configurations, such as type-A, type-B, type-C, type-D, and type-E resonators, or any other configuration described herein. Type-B, type-D, and type-E resonator configurations incorporate structures that shape the resonator fields away from lossy objects, and so may be particularly useful in such applications where the resonator may be in close proximity to steel portions of the body of the vehicle. Combinations of resonator types may also be incorporated into such application embodiments, providing more optimal performance for the given application. In an example, an after-market source resonator may be installed to provide a region of wireless power around the dashboard of the vehicle by wiring a type-A source resonator to the vehicle's wired electrical system and mounting the resonator to the dashboard of the vehicle. Alternately, the source resonator may be fitted to plug into an electrical outlet on the dashboard, or operate on some alternate form of energy, such as a battery, a solar cell taking energy through the glass of the vehicle, and the like.

For example, the user of the car 5502 may wish to install an after-market music system instead of using a factory fitted music system. If the user of the car 5502 chooses to install the wireless powered music system in the dashboard 5504, the existing electrical harness may remain undisturbed.

In addition, having eliminated the power portion of the electrical harness from the dashboard 5504, the manufacturer of the car 5502 may be free to select a position/space on the dashboard 5504 for the after-market music system. In this way, the wireless powered devices/components may decrease the cost, weight, and integration time associated with the harness, while increasing the reliability of the electrical system. In addition, wireless powered electrical dashboard components may now be more modular in design, in that they may be more easily added to a vehicle, changed, upgraded, moved, and the like, thus potentially increasing the manufacturer's ability to accommodate customization of user needs.

It may be noted that the present invention has been explained by installing some electrical components on the dashboard 5504 of the car 5502, but those skilled in the art would appreciate that wireless power may be used by other installed electrical components on the dashboard of trucks, buses, jeeps, trailers, recreational vehicles, terrain vehicles, and the like. For example, the wireless powered components installed on the dashboard after the truck is manufactured may include a wireless powered DVD Player, a wireless powered LCD screen, a wireless powered mobile phone charger, a wireless powered auxiliary plug, wireless powered auxiliary speakers, a wireless powered cleaning device, and the like. The stated wireless powered devices of the dashboard of the truck may take advantage of the present invention. For example, as described above, an after-market music system of the truck may be powered using wireless power (as explained for the car 5502). As described above, this may provide flexibility in the manufacturing design.

Similarly, wireless power may be used to power the electrical components of the dashboard of utility trucks, tow trucks, road crew trucks, and the like. These components may be installed after the truck is manufactured. On the same pattern, wireless power may be used in the post-production installation of the electrical components of the dashboard of buses, which may include but may not be limited to, private buses, public buses, and the like. Correspondingly, wireless power may be used in the electrical components of the dashboard of trailers, which may include but may not be limited to, commercial trailers, private trailers, and the like. These components may be installed after the trailer is manufactured. To extend the implementation, wireless power may be used in the electrical components of the dashboard of construction vehicles, which may include but may not be limited to, cranes, forklifts, cherry pickers, bulldozers, excavators, front loaders, cement trucks, asphalt pavers, and the like. These components may be installed after the construction vehicle is manufactured.

Automobile Steering Wheel (Car, Trucks, Trailers, etc.)—Factory Supplied

In embodiments, referring to FIG. 22, wireless power may be utilized to provide electrical power to devices associated with the steering wheel 5640 of the car 5502 such that no electrical wiring may be required to bring electrical power to the device from the car's primary power source. As explained earlier, this may prove advantageous for the initial design and manufacture of the car 5502, as it may not only reduce the weight, cost, and manufacturing time associated with the otherwise needed wire harness, but may also improve reliability due to the absence of the harness across the multiple devices/components associated with the steering wheel 5640. In addition, having eliminated the need for every electrical device/component to have an electrical harness connection, the car 5502 manufacturer may now more easily add electrical components/devices to the steering wheel 5640 of the car 5502 without affecting the layout, routing, and design of the power portion of the electrical harness. It may be noted that the present invention has been explained by showing the steering wheel 5640 of the car 5502, but those skilled in the art would appreciate that wireless power may be used in the components associated with the steering wheel of a truck, jeep, and the like.

In embodiments, as shown in FIG. 22, the electrical components/devices associated with the steering wheel 5640 that may take advantage of the present invention may include, but may not be limited to, a wireless powered heater 5644, a wireless powered electronic locking system 5642, a wireless powered lighting system 5648, a wireless powered honking system 5650, a wireless powered fan 5652, and the like. Those skilled in the art would appreciate that the steering wheel 5640 of the car 5502 may include the electrical devices/components that may be presently known in the art.

In embodiments, factory installed wireless energy transfer systems for a steering wheel system may utilize one or more resonator configurations, such as type-A, type-B, type-C, type-D, and type-E resonators, or any other configuration described herein. Type-B, type-D, and type-E resonator configurations incorporate structures that shape the resonator fields away from lossy objects, and so may be particularly useful in such applications where the resonator may be in close proximity to steel portions of the body of the vehicle. Combinations of resonator types may also be incorporated into such application embodiments, providing more optimal performance for the given application. In an example, a factory installed source resonator may be installed to provide a region of wireless power in the steering wheel of the vehicle by wiring a type-B/C source resonator to the vehicle's wired electrical system and mounting the resonator to the center of the steering assembly of the vehicle. This resonator configuration may then provide a planar field profile for wireless energy transfer to device resonators within the plane of the steering wheel, as well as to the area occupied by the driver, such as for delivering wireless energy to mobile devices in the proximity of the driver (e.g. a cell phone in the driver's pocket, a navigation device placed in the center console). Any of a plurality of resonator devices may be designed into the steering wheel to receive wireless energy from the source resonator. For example, a passenger of the car 5502 may like to use the heater associated with the steering wheel 5640. In the example, a normal heater may require a power harness connected to the main electrical power source in the car 5502. However, with a wireless powered heater 5644, there may not be any need for power to be routed to it, thus minimizing the power harness associated with the steering wheel 5640.

Similarly, the passenger of the car 5502 may like the honking system to be available at a custom location on the steering wheel for ease of access and safe driving. In the example, usually a honking system may require a power harness connection to the main electrical power source in the car 5502. However, with the wireless powered honking system 5650, there may be no need for power to be routed to it, thus minimizing the power harness associated with the steering wheel 5640, and enable the mounting of the system as meets the needs of the driver.

By extending this implementation of wireless power and wireless communications to all electrical components, the car 5502 manufacturer may be able to completely eliminate the electrical harness from the steering wheel 5640. In addition, as the devices associated with the steering wheel 5640 are wireless powered, the car 5502 manufacturer may like to relocate the components associated with the steering wheel 5640 to lower the cost the steering wheel 5640 while making it more reliable.

In embodiments, as shown in the FIG. 22, the wireless powered devices of the steering wheel 5640 may be company fitted. For example, the manufacturer of the car 5502 may fit the wireless powered honking system 5650. Similarly, other devices associated with the steering wheel 5640 may also be fitted by the manufacturer of the car 5502.

It may be noted that the present invention has been explained by showing a steering wheel 5640 of the car 5502, but those skilled in the art would appreciate that wireless power may be used in the electrical components associated with the steering wheel of trucks, buses, jeeps, trailers, recreational vehicles, and the like. For example, the electrical components associated with the dashboard of the truck may include, but may not be limited to, a wireless powered heater, a wireless powered electronic locking system, a wireless powered lighting system, a wireless powered honking system, a wireless powered fan, and the like. The stated wireless powered devices of the steering wheel of the truck may take advantage of the present invention. For example, as described above, the wireless powered honking system of the truck may be powered by using wireless power of the present invention (as explained for the car 5502). As described above, this may provide flexibility in the manufacturing design. In embodiments, the wireless powered electrical components/devices present in the dashboard of the truck may be company fitted.

Similarly, wireless power may be used in the electrical components of the steering wheel of utility trucks, tow trucks, road crew trucks, and the like. On the same pattern, wireless power may be used in the electrical components of the steering wheel of buses, which may include but may not be limited to, private buses, public buses, and the like. Correspondingly, wireless power may be used in the electrical components of the steering wheel of trailers, which may include but may not be limited to, commercial trailers, private trailers, and the like. To extend the implementation, wireless power may be used in the electrical components of the steering wheel of construction vehicles, which may include but may not be limited to, cranes, forklifts, cherry pickers, bulldozers, excavators, front loaders, cement trucks, asphalt pavers, and the like. In embodiments, all the wireless powered electrical devices associated with the steering wheel of trucks, buses, jeeps, trailers, terrain vehicles, and recreational vehicles may also be company fitted.

Automobile Center Console (Car, Trucks, Trailers, etc.)—Factory Supplied

In embodiments, referring to FIG. 23, wireless power may be utilized to provide electrical power to devices within the central console 5702 of the car 5502 such that no electrical wiring may be required to bring electrical power to the electrical device from the car's primary power source. As discussed earlier, this may prove advantageous for the initial design and manufacture of the car 5502, as it may not only reduce the weight, cost, and manufacturing time associated with the otherwise needed wire harness, but may also improve reliability due to the absence of the harness across the multiple devices/components associated with the central console 5702. In addition, having eliminated the need for every electrical device/component to have an electrical harness, the car manufacturer may now more easily add electrical components/devices to the central console 5702 of the car 5502, without affecting the layout, routing, and design of the power portion of the electrical harness.

In embodiments, as shown in FIG. 23, the electrical components/devices associated with the central console 5702 may take advantage of the present invention. The electrical components associated with the central console 5702 may include, but may not be limited to, wireless powered cup heaters 5704, wireless powered control electronics 5708, wireless powered cooler 5710, and the like.

In embodiments, factory installed wireless energy transfer systems for vehicle center console may utilize one or more resonator configurations, such as type-A, type-B, type-C, type-D, and type-E resonators, or any other configuration described herein. Type-B, type-D, and type-E resonator configurations incorporate structures that shape the resonator fields away from lossy objects, and so may be particularly useful in such applications where the resonator may be in close proximity to steel portions of the body of the vehicle. Combinations of resonator types may also be incorporated into such application embodiments, providing more optimal performance for the given application. In an example, a factory installed source resonator may be installed to provide a region of wireless power around the center console of the vehicle by wiring a type-A source resonator to the vehicle's wired electrical system and mounting the resonator within proximity of the center console of the vehicle, thereby providing wireless energy to wireless devices placed in and around the console (e.g. mobile phone, navigation device, DVD player) or designed into the console. For example, a passenger of the car 5502 may like to regulate the temperature of the cooler 5710 associated with the central console 5702. In the example, to install a wired cooler in the console would traditionally require a power harness connection to the main electrical power source in the car 5502. However, with the wireless powered cooler 5710, there may be no need for power to be routed to the wireless powered components/devices, thus minimizing the power harness associated with the central console 5702.

In addition, having eliminated the power portion of the electrical harness from the central console 5702, the manufacturer of the car 5502 may be free to select a position/space for the wireless powered cooler 5710 anywhere in the car 5502 that is within the range of a source resonator (e.g. the console's source resonator or any other source resonator in the vehicle), thus potentially eliminating the need for any harnessing associated with the wireless powered cooler 5710 on the central console 5702. And by extending this implementation of wireless power and wireless communications to all electrical components in the central console 5702, the car 5502 manufacturer may be able to completely eliminate the electrical harness from the area. It may be noted that the present invention may be explained by using the example of the wireless powered cooler 5710 associated with the central console 5702. However, those skilled in the art would appreciate that the present invention may be applicable to any wireless powered component associated with the central console 5702.

It may also be noted that the present invention has been explained by showing the central console 5702 of the car 5502, but those skilled in the art would appreciate that wireless power may be used in the central console of trucks, buses, jeeps, trailers, recreational vehicles, and the like. For example, the electrical components associated with the central console of the truck may include, but may not be limited to, wireless powered cup heaters, wireless powered control electronics, a wireless powered coolers, wireless powered refrigerator, and the like. The stated wireless powered devices of the central console of the truck may take advantage of the present invention. For example, as described above, the wireless powered cooler of the truck may be powered without the electrical harness (as explained for the car 5502). As described above, this may provide flexibility in the manufacturing design. In embodiments, the electrical components/devices present in the central console of the truck may be company fitted.

Similarly, wireless power may be used in the electrical components of the central console of utility trucks, tow trucks, road crew trucks, and the like. On the same pattern, wireless power may be used in the electrical components of the central console of buses, which may include but may not be limited to, private buses, public buses, and the like. In like manner, wireless power may be used in the electrical components of the central console of trailers, which may include but may not be limited to, commercial trailers, private trailers, and the like. To extend the implementation, wireless power may be used in the electrical components of the central console of construction vehicles, which may include but may not be limited to, cranes, forklifts, cherry pickers, bulldozers, excavators, front loaders, cement trucks, asphalt pavers, and the like. In embodiments, all the wireless powered electrical devices associated with the central console of trucks, buses, jeeps, trailers, and recreational vehicles may be company fitted.

Automobile Seats (Car, Trucks, Trailers, etc.)—Factory Supplied

Figure 24:
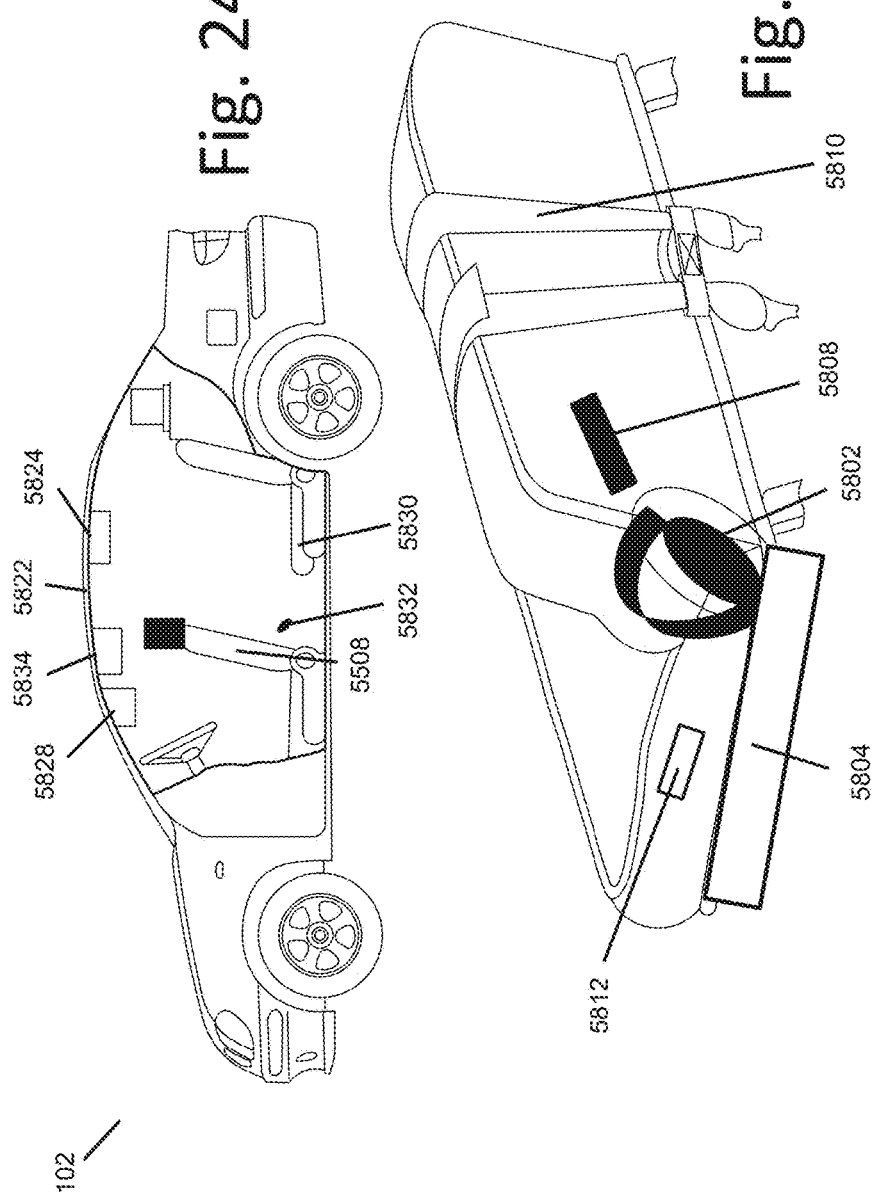
FIG. 24A depicts a prospective view of factory fitted car seats in accordance with an embodiment of the present invention.
FIG. 24B depicts a plurality of wireless powered devices associated with car seats in accordance with an embodiment of the present invention.

In embodiments, referring to FIG. 24A, and FIG. 24B, wireless power may be utilized to provide electrical power to devices associated with the seats of the car 5502 such that no electrical wiring may be required to bring electrical power to the electrical device from the car's primary power source. As discussed earlier, this may also prove advantageous for the initial design and manufacture of the seats of the car 5502, as it may not only reduce the weight, cost, and manufacturing time associated with the otherwise needed wire harness, but may also improve reliability due to the absence of the harness across the multiple devices/components associated with the seats of the car 5502. In addition, having eliminated the need for every electrical device/component to have an electrical harness connection, the car manufacturer may now more easily add electrical components/devices to the seats of the car 5502 without affecting the layout, routing, and design of the power portion of the electrical harness.

For explaining this embodiment, a specific car seat 5508 is shown in FIG. 24A. However, those skilled in art would appreciate that embodiments may be applicable to all the seats associated with the car 5502.

In embodiments, as shown in FIG. 24A and FIG. 24B, the electrical components/devices associated with the seat 5508 may take advantage of the present invention. The electrical components may include, but may not be limited to, a wireless powered seat motor 5802, a wireless powered seat heater 5804, a wireless powered rear facing DVD 5808, a wireless powered communication system 5810, wireless powered seat electronics 5812, and the like. It may be noted that seat 5508 may have similar kind of wireless powered devices presently known in the art.

In embodiments, factory installed wireless energy transfer systems for a vehicle seat assembly may utilize one or more resonator configurations, such as type-A, type-B, type-C, type-D, and type-E resonators, or any other configuration described herein. Type-B, type-D, and type-E resonator configurations incorporate structures that shape the resonator fields away from lossy objects, and so may be particularly useful in such applications where the resonator may be in close proximity to steel portions of the body of the vehicle. Combinations of resonator types may also be incorporated into such application embodiments, providing more optimal performance for the given application. In an example, a factory installed source resonator may be installed to provide a region of wireless power below the seat of the vehicle by wiring a type-B source resonator to the vehicle's wired electrical system and mounting the resonator under each front seat of the vehicle. In this instance, the selection of the type-B source resonator enables the vehicle's designer to provide field shaping to help avoid the steel structure of the vehicle's chassis under the resonator (i.e. under the location of the seat) while providing wireless energy transfer to device resonators within the seat assembly for powering various electrical components incorporated within the seat assembly. For example, a driver of the car 5502 may like to tilt the seat 5508 to have a comfortable position using the seat electronics and the seat motors. In the example, the normal seat motor and seat electronics may require a power harness connection to the main electrical power source in the car 5502. However, with the wireless powered seat electronics 5812 and the wireless powered seat motors 5802, there may be no need for power to be routed to them using electrical harnessing, thus minimizing the power harness associated with the seats.

In addition, with the power portion of the electrical harness eliminated from the seat 5508, the manufacturer of the car 5502 may be free to select a position/space on the seat 5508 for the wireless powered seat electronics 5812 and the wireless powered seat motors 5802, thus potentially eliminating the need for any harnessing associated with the motors. For example, the wireless powered electronics 5812 of the driver's seat may be placed in the passengers' seats and the passenger of the car 5502, seated in the back seat, may be able to tilt the driver's seat. And by extending this implementation of wireless power and wireless communications to all electrical components, the car 5502 manufacturer may be able to completely eliminate the electrical harness from the seat 5508. In this way, the present invention may decrease the cost, weight, and integration time associated with the harness, while increasing the reliability of the electrical system. In addition, wireless powered electrical seat components may now be more modular in design, in that they may be more easily added to a vehicle, changed, moved, removed, upgraded, and the like, thus potentially increasing the manufacturer's ability to accommodate customization to user needs.

It may be noted that the present invention may be explained by using the example of the wireless powered seat electronics 5812 and the wireless powered seat motors 5802 associated with the seat 5508. However, those skilled in the art would appreciate that the present invention may be applicable to any of the wireless powered components associated with the seat 5508.

In embodiments, as shown in the FIG. 24A and FIG. 24B, the wireless powered devices of the seat 5508 may be company fitted. For example, the manufacturer of the car 5502 may fit the wireless powered seat motors 5802. Similarly, other devices associated with the seats 5508 may be fitted by the manufacturer of the car 5502.

It may be noted that the present invention has been explained by showing a seat 5508 of the car 5502, but those skilled in the art would appreciate that wireless power may be used in the seat of trucks, buses, jeeps, trailers, recreational vehicles, and the like. For example, the electrical components associated with the seat of the truck may include, but may not be limited to, a wireless powered seat motor, a wireless powered seat heater, a wireless powered rear facing DVD, a wireless powered communication system, wireless powered seat electronics, and the like. The stated wireless powered devices of the seat of the truck may take advantage of the present invention. For example, as described above, the wireless powered seat electronics and the wireless powered seat motors of the truck may be powered using the wireless power of the present invention (as explained for the car 5502). As described above, this may provide flexibility in the manufacturing design. In embodiments, the electrical components/devices present in the seats of the truck may be company fitted.

Similarly, wireless power may be used in the electrical components of the seats of utility trucks, tow trucks, road crew trucks, and the like. On the same pattern, wireless power may be used in the electrical components of the seats of buses, which may include but may not be limited to, private buses, public buses, and the like. In like manner, wireless power may be used in the electrical components of the seats of trailers, which may include but may not be limited to, commercial trailers, private trailers, and the like.

To extend the implementation, wireless power may be used in the electrical components of the seats of construction vehicles, which may include but may not be limited to, cranes, forklifts, cherry pickers, bulldozers, excavators, front loaders, cement trucks, asphalt pavers, and the like. In embodiments, all the electrical devices associated with the seats of trucks, buses, jeeps, trailers, and recreational vehicles may be company fitted.

Automobile Seats (Car, Trucks, Trailers, etc.)—After Market Installation

In embodiments, some of the wireless powered devices of the seats 5508, as shown in the FIG. 24A and FIG. 24B, may be installed after the car 5502 is manufactured. These wireless powered devices may be installed based on user's preference.

The wireless powered components associated with the seat 5508 that may be installed after the car 5502 is manufactured may include a wireless powered DVD Player (not shown in FIG. 24A and FIG. 24B), a wireless powered head phone set (not shown in FIG. 24A and FIG. 24B), a wireless powered electric heating mat (not shown in FIG. 24A and FIG. 24B), and the like. It may be noted that similar kind of wireless powered devices presently known in the art may be installed or fitted with the seat 5508 after the car 5502 is manufactured.

In embodiments, after-market wireless energy transfer systems for the seat assembly may utilize one or more resonator configurations, such as type-A, type-B, type-C, type-D, and type-E resonators, or any other configuration described herein. Type-B, type-D, and type-E resonator configurations incorporate structures that shape the resonator fields away from lossy objects, and so may be particularly useful in such applications where the resonator may be in close proximity to steel portions of the body of the vehicle. Combinations of resonator types may also be incorporated into such application embodiments, providing more optimal performance for the given application. In an example, an after-market source resonator may be installed to provide a region of wireless power around and around or within the seat of the vehicle by wiring a type-A or type-B source resonator to the vehicle's wired electrical system and mounting the resonator behind the seat, under the seat, and the like, of the vehicle. Alternately, the source resonator may be fitted to plug into an electrical outlet or operate on some alternate form of energy, such as a battery, a solar cell taking energy through the glass of the vehicle, and the like. A type-B source resonator may be placed under the seat, where field shaping may be required to accommodate the steel chassis below. A Type-A source resonator may be used in the instance where the source resonator is placed in or on the back of the seat where there may be significantly fewer lossy objects. For example, a user of the car 5502 may like to listen to songs by attaching or installing a headphone electrical system, such as to the seat. In an example, the user may use the services of a mechanic or a vendor to install a normal headphone set requiring a power harness connection to the main electrical power source in the car. Traditionally, the mechanic or the vendor would have to connect to or modify the existing wire harness of the car 5502 to make the new installation. However, with a wireless powered head phone set, and a wireless source resonator located in or on the vehicle's seat, there may be no need for power to be routed to the new electrical system, thus minimizing the power harness associated with the seat 5508 and making the process of installation simpler and more reliable.

Further, wireless powered electrical seat components may now be more modular in design, in that they may be more easily added to a vehicle, changed, moved, removed, upgraded, and the like, which may potentially increase the ability to accommodate customization to user needs.

It may be noted that the present invention has been explained by installing electrical components on a seat 5508 of the car 5502, but those skilled in the art would appreciate that wireless power may be used by these installed electrical components on the seats of trucks, buses, jeeps, trailers, recreational vehicles, terrain vehicles, and the like. For example, the wireless powered components which may be installed on the seat after the truck is manufactured may include, but may not be limited to, a wireless powered DVD Player, a wireless powered head phone set, a wireless powered electric heating mat, and the like. The stated wireless powered devices of the seat of the truck may take advantage of the present invention. For example, as described above, the headphone set of the truck may use wireless power of the present invention (as explained for the car 5502). As described above, this may provide flexibility in the manufacturing design. In embodiments, the electrical components/devices present in the seats of the truck may be fitted post-production.

Similarly, wireless power may be used in the electrical components of the seats of utility trucks, tow trucks, road crew trucks, and the like. These components may be installed after the truck is manufactured. On the same pattern, wireless power may be used in the electrical components of the seats of buses, which may include but may not be limited to, private buses, public buses, and the like. These components may be installed after the bus is manufactured. In like manner, wireless power may be used in the electrical components of the seats of trailers, which may include but may not be limited to, commercial trailers, private trailers, and the like and may be installed after the trailer is manufactured. To extend the implementation, wireless power may be used in the post-production installation of electrical components of the seats of construction vehicles, which may include but may not be limited to, cranes, forklifts, cherry pickers, bulldozers, excavators, front loaders, cement trucks, asphalt pavers, and the like.

Automobile Door (Car, Trucks, Trailers, etc.)—Factory Supplied

Figure 25:
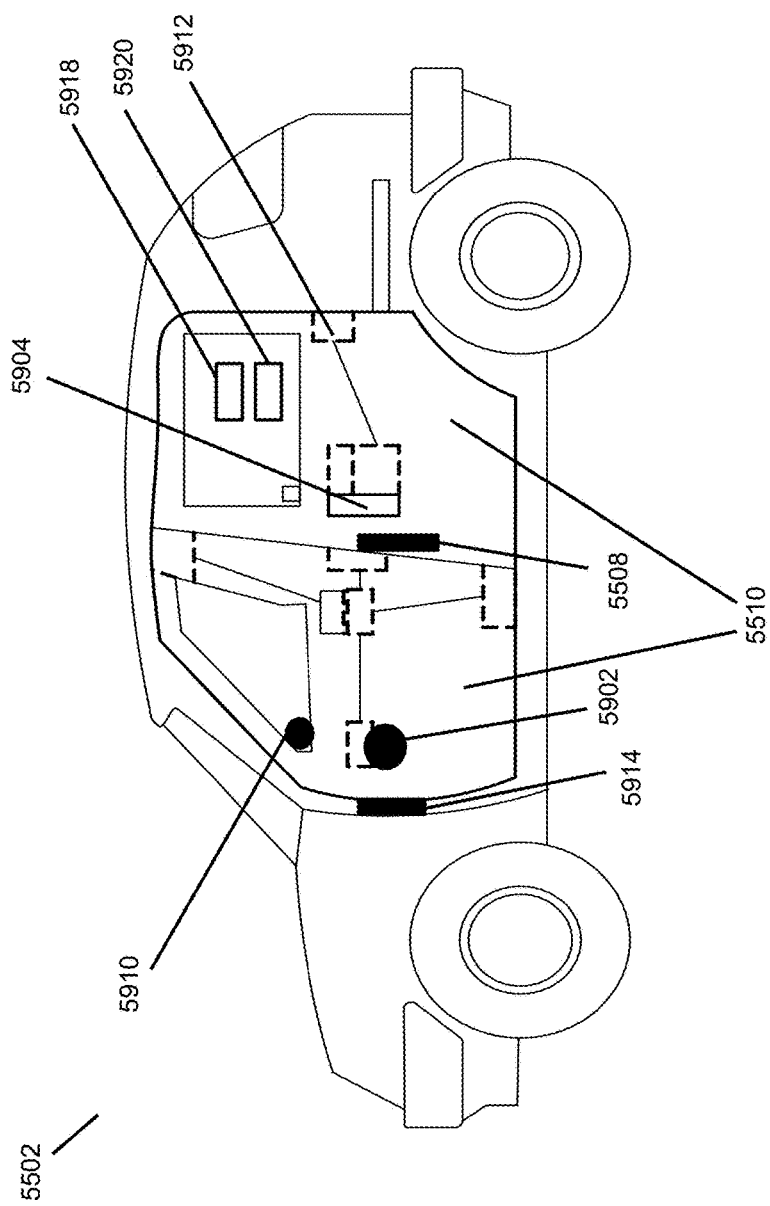
FIG. 25 depicts a plurality of wireless powered devices associated with car doors in accordance with an embodiment of the present invention.

In embodiments, referring to FIG. 25, wireless power may be utilized to provide electrical power to devices within the passenger doors 5510 of the car 5502 such that no electrical wiring may be required to bring electrical power to the electrical device from the car's primary power source. As discussed herein, this may also prove advantageous for the initial design and manufacture of the car 5502, as it may not only reduce the weight, cost, and manufacturing time associated with the otherwise needed wire harness, but may also improve reliability due to the absence of the harness stretching from the main body to the automobile door. In addition, having eliminated the need for every electrical component to have an electrical harness connection, the car manufacturer may now more easily add electrical components to the automobile door, without affecting the layout, routing, and design of the power portion of the electrical harness.

In embodiments, electrical components associated with the car doors 5510 that may take advantage of the present invention may include a wireless powered electric lock motor 5902, a wireless powered electronic combination lock 5904, a wireless powered electric window motor 5908, a wireless powered electric door release 5912, a wireless powered electric side view mirror motor 5910, and the like. The electronic components may also include features not shown in FIG. 25 such as a wireless powered speaker amplifier, a wireless powered sound system interface, wireless powered control electronics, a wireless powered honking system, a wireless powered hinge motor, and the like.

In embodiments, factory installed wireless energy transfer systems for a vehicle's door assembly may utilize one or more resonator configurations, such as type-A, type-B, type-C, type-D, and type-E resonators, or any other configuration described herein. Type-B, type-D, and type-E resonator configurations incorporate structures that shape the resonator fields away from lossy objects, and so may be particularly useful in such applications where the resonator may be in close proximity to steel portions of the body of the vehicle. Combinations of resonator types may also be incorporated into such application embodiments, providing more optimal performance for the given application. In an example, a factory installed source resonator may be installed to provide a region of wireless power around in and around the door of the vehicle by wiring a type-D source resonator to the vehicle's wired electrical system and mounting the resonator within the door of the vehicle. The type-D source resonator may then provide a shaped and planar field profile for delivering wireless energy to resonator devices within the door. Alternately, the source resonator may be placed in the frame of the vehicle to energize device resonators within the door, thus eliminating the need to wire electrical power to the door at all. That is, all the electrical components within the door may be powered wirelessly from the source resonator external to the door. For example, the car 5502 may include a window motor for raising or lowering the window in the doors 5510 section. Normally, this window motor would require a power harness connection to the main electrical power source in the automobile. However, with wireless powered window motors 5908, there may be no need for power to be wire-routed to it, thus minimizing the power harness associated with the doors 5510.

By extending this implementation of wireless power and wireless communications to all electrical components, the automobile manufacturer may be able to completely eliminate the electrical harness from the doors 5510. In this way, the present invention may decrease the cost, weight, and integration time associated with the harness, while increasing the reliability of the electrical system. In addition, wireless powered electrical door components may now be more modular in design, in that they may be more easily added to a vehicle, changed, upgraded, and the like, which may potentially increase the manufacturer's ability to accommodate customization to user needs.

It may be noted that the present invention has been explained by showing doors 5510 of the car 5502, but those skilled in the art would appreciate that wireless power may be used in the electrical components of the doors of trucks, buses, jeeps, trailers, recreational vehicles, and the like. For example, the electrical components associated with the doors of the truck may include, but may not be limited to, a wireless powered electric lock motor, a wireless powered electronic combination lock, a wireless powered electric window motor, a wireless powered electric door release, a wireless powered electric side view mirror motor, and the like. The stated wireless powered devices of the truck doors may take advantage of the present invention. For example, as described above, the wireless powered window motor of the truck door may be powered using the wireless power of the present invention (as explained for the car 5502). As described above, this may provide flexibility in the manufacturing design. In embodiments, the electrical components/devices present in the truck doors may be company fitted.

Similarly, wireless power may be used in the electrical components of the doors of utility trucks, tow trucks, road crew trucks, and the like. On the same pattern, wireless power may be used in the electrical components of the doors of buses, which may include but may not be limited to, private buses, public buses, and the like. Correspondingly, wireless power may be used in the electrical components of trailer doors, which may include but may not be limited to, commercial trailers, private trailers, and the like. To extend the implementation, wireless power may be used in the electrical components of the doors of construction vehicles, which may include but may not be limited to, cranes, forklifts, cherry pickers, bulldozers, excavators, front loaders, cement trucks, asphalt pavers, and the like. In embodiments, all the electrical devices associated with the doors of trucks, buses, jeeps, trailers, and recreational vehicles may be company fitted.

Automobile Door (Car, Trucks, Trailers, etc.)—After Market Installation

In embodiments, some of the wireless powered devices of the doors 5510, as shown in FIG. 25, may be installed after the car 5502 is manufactured. These wireless powered devices may be installed based on the user's preference.

The wireless powered components associated with the doors 5510 and installed after the car 5502 is manufactured may include a wireless powered adjustable lock system 5914, a wireless powered anti fog system 5918, a wireless powered anti glare system 5920, and the like.

In embodiments, after-market wireless energy transfer systems for a vehicle door assembly may utilize one or more resonator configurations, such as type-A, type-B, type-C, type-D, and type-E resonators, or any other configuration described herein. Type-B, type-D, and type-E resonator configurations incorporate structures that shape the resonator fields away from lossy objects, and so may be particularly useful in such applications where the resonator may be in close proximity to steel portions of the body of the vehicle. Combinations of resonator types may also be incorporated into such application embodiments, providing more optimal performance for the given application. In an example, an after-market source resonator may be installed to provide a region of wireless power within and/or around the door of the vehicle by wiring a type-B source resonator to the vehicle's wired electrical system and mounting the resonator to the door of the vehicle. Alternately, the source resonator may mounted to the door and fitted to plug into an electrical outlet or operate on some alternate form of energy, such as a battery, a solar cell taking energy through the glass of the vehicle, and the like. In an example, a user of the car 5502 may like to install an anti fog system to the windows of the doors 5510. In the example, the user may use the services of a mechanic or a vendor to install the anti fog system requiring a power harness connection to the main electrical power source in the car 5502. Traditionally, the mechanic or the vendor may have to modify the existing wire harness of the car 5502 to make the new installation. However, with the wireless powered anti fog system 5918, there may be no need for power to be routed to the system, thus minimizing the power harness associated with the doors 5510.

Moreover, the wireless powered anti fog system 5918 may be detached easily from the windows of the door 5510 as there may not be any electrical harness to restrict removal. In addition, wireless powered electrical door components may now be more modular in design, in that they may be more easily added to a vehicle, changed, moved, removed, upgraded, and the like, which may potentially increase the ability to accommodate customization to user needs.

It may be noted that the present invention has been explained by installing some electrical components on the doors 5510 of the car 5502, but those skilled in the art would appreciate that wireless power may be used to install electrical components on the doors of trucks, buses, jeeps, trailers, recreational vehicles, and the like. For example, the wireless powered components, which may be installed on the doors after the truck is manufactured, may include wireless powered adjustable lock system, a wireless powered anti fog system, a wireless powered anti glare system, and the like. The stated wireless powered devices of the truck doors may take advantage of the present invention. For example, as described above, the anti fog system of the truck may be powered using the wireless power of the present invention (as explained for the car 5502). As described above, this may provide flexibility in the manufacturing design.

Similarly, wireless power may be used in the electrical components of the doors of utility trucks, tow trucks, road crew trucks, and the like, and installed after the truck is manufactured. On the same pattern, wireless power may be used in the electrical components of the doors of buses, which may include but may not be limited to, private buses, public buses, and the like. These components may be installed after the bus is manufactured. In like manner, wireless power may be used in the electrical components of the doors of trailers, which may include but may not be limited to, commercial trailers, private trailers, and the like. These components may be installed after the trailer is manufactured. To extend the implementation, wireless power may be used in the electrical components of the doors of construction vehicles, which may include but may not be limited to, cranes, forklifts, cherry pickers, bulldozers, excavators, front loaders, cement trucks, asphalt pavers, and the like. These components may be installed after the construction vehicle is manufactured.

Ceiling and Floor (Car, Trucks, Trailers, etc.)—Factory Supplied

In embodiments, referring again to FIG. 24A, wireless power may be utilized to provide electrical power to devices associated with the ceiling 5822 and floor 5830 of the car 5502 such that no electrical wiring may be required to bring electrical power to the electrical device from the car's primary power source.

In embodiments, electrical components associated with the ceiling 5822 and floor 5830 may take advantage of the present invention and may include a wireless powered lighting system 5824, a wireless powered DVD system 5828, an auxiliary power plug 5832, and the like.

In embodiments, factory installed wireless energy transfer systems for installing a resonator to the ceiling or floor of the vehicle may utilize one or more resonator configurations, such as type-A, type-B, type-C, type-D, and type-E resonators, or any other configuration described herein. Type-B, type-D, and type-E resonator configurations incorporate structures that shape the resonator fields away from lossy objects, and so may be particularly useful in such applications where the resonator may be in close proximity to steel portions of the body of the vehicle. Combinations of resonator types may also be incorporated into such application embodiments, providing more optimal performance for the given application. In an example, a factory installed source resonator may be installed to provide a region of wireless power within and/or around the ceiling or door of the vehicle by wiring a type-B/D source resonator to the vehicle's wired electrical system and mounting the resonator to the ceiling or door of the vehicle. For example, the car 5502 may include lighting system above all seats. With the type-B/D resonator a field profile may be created that shields the field from the lossy materials of the ceiling, provides a planar field for other ceiling lights mounted to the ceiling with device resonators, and also provides a more omni-directional field for energizing wireless devices within the cabin of the vehicle (e.g. mobile wireless devices of the passengers). Normally, a lighting system would require a power harness connection to the main electrical power source in the car 5502. However, with wireless powered lighting system 5824, there may be no need for power to be routed to the ceiling 5822, thus minimizing the power harness associated with the ceiling 5822.

Moreover, the wireless powered lighting system 5824 may enable positioning of various lights at preferable positions. In addition, with the power portion of the electrical harness eliminated from the wireless powered ceiling 5822, the manufacturer may be free to select a wireless communication system to control the position from other locations in the car 5502, such as from the driver's seat, thus potentially eliminating the need for any complicated harnessing associated with the ceiling 5822. And by extending this implementation of wireless power and wireless communications to all electrical components, the automobile manufacturer may be able to completely eliminate the electrical harness from the ceiling 5822 and the floor 5830. In this way, the present invention may decrease the cost, weight, and integration time associated with the harness, while providing a more reliable electrical system. In addition, wireless powered electrical ceiling and floor components may now be more modular in design, in that they may be more easily added to a vehicle, changed, moved, upgraded, and the like, which may potentially increase the manufacturer's ability to accommodate customization to user needs.

It may be noted that the present invention has been explained by showing a ceiling 5822 and floor 5830 of the car 5502, but those skilled in the art would appreciate that wireless power may be used in the electrical components of the ceiling and the floor of trucks, buses, jeeps, trailers, recreational vehicles, and the like. For example, the electrical components associated with the ceiling and the floor of the truck may include, but may not be limited to, a wireless powered lighting system, a wireless powered DVD system, an auxiliary power plug, and the like. The stated wireless powered devices of the ceiling and the floor of the truck may take advantage of the present invention. For example, as described above, the wireless power of the present invention may power the lighting system of the truck (as explained for the car 5502). As described above, this may provide flexibility in the manufacturing design. In embodiments, the electrical components/devices present in the ceiling and the floor of the truck may be company fitted.

Similarly, wireless power may be used in the electrical components of the ceiling and the floor of utility trucks, tow trucks, road crew trucks, and the like. On the same pattern, wireless power may be used in the electrical components of the ceiling and the floor of buses, which may include but may not be limited to, private buses, public buses, and the like. In like manner, wireless power may be used in the electrical components of the ceiling and the floor of trailers, which may include but may not be limited to, commercial trailers, private trailers, and the like. To extend the implementation, wireless power may be used in the electrical components of the ceiling and the floor of construction vehicles, which may include but may not be limited to, cranes, forklifts, cherry pickers, bulldozers, excavators, front loaders, cement trucks, asphalt pavers, and the like. In embodiments, all the electrical devices associated with the ceiling and the floor of trucks, buses, jeeps, trailers, and recreational vehicles may be company fitted.

Ceiling and Floor (Car, Trucks, Trailers, etc.)—After Market Installations

In embodiments, referring to FIG. 24A, some of the wireless powered devices of the ceiling 5822 and the floor 5830 may be installed after the car 5502 is manufactured. These wireless powered devices may be installed based on the user's preference.

The wireless powered components associated with the ceiling 5822 and the floor 5830 and installed after the car 5502 is manufactured may include a wireless powered extra lighting system, wireless powered speakers, a wireless powered electric shock absorbing system, and the like.

In embodiments, after-market wireless energy transfer systems for mounting a resonator to the ceiling or floor of the vehicle may utilize one or more resonator configurations, such as type-A, type-B, type-C, type-D, and type-E resonators, or any other configuration described herein. Type-B, type-D, and type-E resonator configurations incorporate structures that shape the resonator fields away from lossy objects, and so may be particularly useful in such applications where the resonator may be in close proximity to steel portions of the body of the vehicle. Combinations of resonator types may also be incorporated into such application embodiments, providing more optimal performance for the given application. In an example, an after-market source resonator may be installed to provide a region of wireless power within and/or around the ceiling or door of the vehicle by wiring a type-B source resonator to the vehicle's wired electrical system and mounting the resonator to the ceiling or door of the vehicle. Alternately, the source resonator may be fitted to plug into an electrical outlet or operate on some alternate form of energy, such as a battery, a solar cell taking energy through the glass of the vehicle, and the like. For example, a user of the car 5502 may like to install extra light above the driver's seat to facilitate better view of various components of the dashboard 5504. With the type-B resonator a field profile may be created that shields the field from the lossy materials of the ceiling, as well as providing an omni-directional field for energizing wireless devices within the front passenger compartment of the vehicle (e.g. mobile wireless devices of the passengers). In the example, the user may use the services of a mechanic or a vendor to install an extra lighting system requiring a power harness connection to the main electrical power source in the car. The mechanic or the vendor may have to modify the existing wire harness of the ceiling 5822 of the car 5502 to make the new installation. However, with wireless powered extra light 5834, there may be no need for power to be routed to the device, thus minimizing the power harness associated with the ceiling 5822.

In addition, the wireless powered electrical ceiling and the floor components/devices may now be more modular in design, in that they may be more easily added to a vehicle, changed, moved, removed, upgraded, and the like, thus potentially increasing the manufacturer's ability to accommodate customization to user needs.

In a similar fashion, a wireless powered plug 5832 may be installed in the floor 5830 of the car 5502, thereby improving the design flexibility of the car 5502.

It may be noted that the present invention has been explained by installing some electrical components on the ceiling 5822 and the floor 5830 of the car 5502, but those skilled in the art would appreciate that wireless power may be used by these installed electrical components on the ceiling and the floor of trucks, buses, jeeps, trailers, recreational vehicles, and the like. For example, the wireless powered components, which may be installed on the ceiling and the floor after the truck is manufactured, may include a wireless powered extra lighting system, wireless powered speakers, a wireless powered electrical shock absorbing system, and the like. The stated wireless powered devices of the ceiling and the floor of the truck may take advantage of the present invention. For example, as described above, the wireless power of the present invention may provide power to the extra lighting system of the truck (as explained for the car 5502). As described above, this may provide flexibility in the manufacturing design.

Similarly, wireless power may be used in the electrical components of the ceiling and the floor of utility trucks, tow trucks, road crew trucks, and the like. These components may be installed after the truck is manufactured. On the same pattern, wireless power may be used in the electrical components of the ceiling and the floor of buses, which may include but may not be limited to, private buses, public buses, and the like. These components may be installed after the bus is manufactured. In like manner, wireless power may be used in the electrical components of the ceiling and the floor of the trailers, which may include but may not be limited to, commercial trailers, private trailers, and the like. These components may be installed after the trailer is manufactured. To extend the implementation, wireless power may be used in the electrical components of the ceiling and the floor of construction vehicles, which may include but may not be limited to, cranes, forklifts, cherry pickers, bulldozers, excavators, front loaders, cement trucks, asphalt pavers, and the like. Again, these components may be installed after the construction vehicle is manufactured.

External Lighting (Car, Trucks, Trailers, etc.)—Factory Supplied

In embodiments, referring again to FIG. 26, wireless power may be utilized to provide electrical power to devices associated with the external lighting of the car 5502 such that no electrical wiring may be required to bring electrical power to the electrical device from the car's primary power source.

In embodiments, electrical components associated with the external lighting, which may take advantage of the present invention, may include wireless powered head lights 6002, wireless powered plurality of indicators 6004, wireless powered back lights 6010, wireless powered brake lights 6012, wireless powered rear view mirror lighting system 6014, and the like.

In embodiments, factory installed wireless energy transfer systems for external lighting of the vehicle may utilize one or more resonator configurations, such as type-A, type-B, type-C, type-D, and type-E resonators, or any other configuration described herein. Type-B, type-D, and type-E resonator configurations incorporate structures that shape the resonator fields away from lossy objects, and so may be particularly useful in such applications where the resonator may be in close proximity to steel portions of the body of the vehicle. Combinations of resonator types may also be incorporated into such application embodiments, providing more optimal performance for the given application. In an example, a factory installed source resonator may be installed to provide a region of wireless power within and/or around the external lights of the vehicle by wiring a type-B source resonator to the vehicle's wired electrical system and mounting the resonator in conjunction with an external light of the vehicle, where the type-B source resonator may provide shielding of the field to avoid lossy materials included in the light and surrounding environment. For example, the car 5502 may include headlights that normally require a power harness connection to the main electrical power source in the car 5502. However, with wireless powered lights there may be no need for power to be routed to the wireless powered headlights 6002, thus minimizing the power harness associated with the car 5502.

In addition, to install and to provide power to the wireless powered electrical devices of the external lighting, the manufacturer may not have to route power harnessing through the body of the vehicle by drilling through the car 5502 body. In addition, by installing the wireless powered devices associated with the external lighting system, which may not require power harness, these devices may be water sealed appropriately, thereby increasing their durability. For example, the wireless powered plurality of indicators 6004 may be sealed properly. Moreover, the wireless powered headlights 6002 may enable positioning of various lights at preferable positions. And by extending this implementation of wireless power and wireless communications to all electrical components, the automobile manufacturer may be able to completely eliminate the electrical harness from the external lighting system. In this way, the present invention may decrease the cost, weight, and integration time associated with the harness, while increasing the reliability of the electrical system. In addition, wireless powered external lighting may now be more modular in design, in that they may be more easily added to a vehicle, changed, upgraded, and the like, which may potentially increase the manufacturer's ability to accommodate customization to user needs.

It may be noted that the present invention has been explained by showing the external lighting system of the car 5502, but those skilled in the art would appreciate that wireless power may be used in the external lighting system of trucks, buses, jeeps, trailers, recreational vehicles, and the like. For example, the electrical components associated with the external lighting system of the truck may include, but may not be limited to, wireless powered head lights, wireless powered plurality of indicators, wireless powered back lights, wireless powered brake lights, a wireless powered rear view mirror lighting system, and the like. The stated wireless powered devices of the external lighting system of the truck may take advantage of the present invention. For example, as described above, the headlights of the truck may use wireless power of the present invention (as explained for the car 5502). As described above, this may provide flexibility in the manufacturing design. In embodiments, the electrical components/devices present in the external lighting system of the truck may be company fitted.

Similarly, wireless power may be used in the electrical components of the external lighting system of utility trucks, tow trucks, road crew trucks, and the like. On the same pattern, wireless power may be used in the electrical components of the external lighting system of buses, which may include but may not be limited to, private buses, public buses, and the like. In like manner, wireless power may be used in the electrical components of the external lighting system of trailers, which may include but may not be limited to, commercial trailers, private trailers, and the like. To extend the implementation, wireless power may be used in the electrical components of the external lighting system of construction vehicles, which may include but may not be limited to, cranes, forklifts, cherry pickers, bulldozers, excavators, front loaders, cement trucks, asphalt pavers, and the like. In embodiments, all the electrical devices associated with the external lighting system of trucks, buses, jeeps, trailers, and recreational vehicles may be company fitted.

External Lighting (Cars, Trucks, Trailers)—After Market Supplied Embodiments

Figure 26:
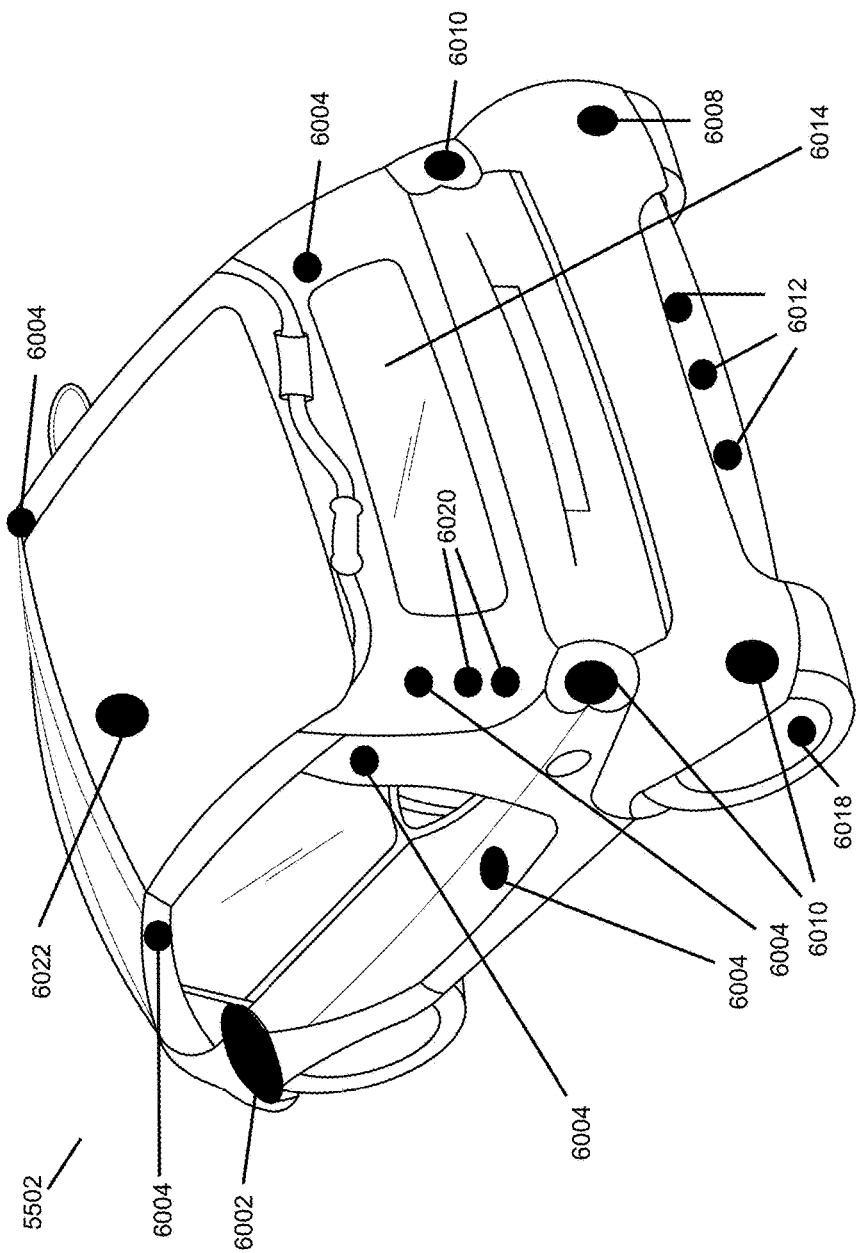
FIG. 26 depicts a plurality of wireless powered devices associated with the external lighting system of the car in accordance with an embodiment of the present invention.

In embodiments, referring to FIG. 26, some of the wireless powered devices of the external lighting system may be installed after the car 6002 is manufactured. These wireless powered devices may be installed based on the user's preference.

The wireless powered components associated with the external lighting that may be installed after the car 5502 is manufactured may include wireless powered license plate lights 6010, wireless powered luggage lights 6022, wireless powered brake lights 6008, wireless powered hub lights 6018, wireless powered embellishment lights 6020, emergency vehicle lighting, and the like.

In embodiments, after-market wireless energy transfer systems for external lighting may utilize one or more resonator configurations, such as type-A, type-B, type-C, type-D, and type-E resonators, or any other configuration described herein. Type-B, type-D, and type-E resonator configurations incorporate structures that shape the resonator fields away from lossy objects, and so may be particularly useful in such applications where the resonator may be in close proximity to steel portions of the body of the vehicle. Combinations of resonator types may also be incorporated into such application embodiments, providing more optimal performance for the given application. In an example, an after-market source resonator may be installed to provide a region of wireless power within and/or around the external lights of the vehicle by wiring a type-B source resonator to the vehicle's wired electrical system and mounting the resonator to the lights of the vehicle, where the type-B source resonator may provide shielding of the field to avoid lossy materials included in the light and surrounding environment. Alternately, the source resonator may be fitted to plug into an electrical outlet or operate on some alternate form of energy, such as a battery, a solar cell taking energy through the glass of the vehicle, and the like. In an example, a user of the car 5502 may like to install license plate lights 6010. In the example, the user may use the services of a mechanic or a vendor to install license plate lights requiring a power harness connection to the main electrical power source in the car. The mechanic or the vendor may have to modify the existing wire harness of the lighting system of the car 5502 to make the new installation. However, with wireless powered license plate lights 6010, there may be no need for power to be routed to the wireless powered license plate lights 6010, thus minimizing the power harness associated with the external lighting.

Further, to install and to provide power to the wireless powered license plate lights 6010, the manufacturer may not have to route power harnessing through the body of the car 5502 by drilling through the car 5502 body. In addition, by installing the wireless powered license plate lights 6010 associated with the external lighting system, these devices may be water sealed appropriately, thereby increasing durability.

It may be noted that the present invention has been explained by installing some electrical components on external lighting system of the car 5502, but those skilled in the art would appreciate that wireless power may be used by these installed electrical components on the external lighting system of trucks, buses, jeeps, trailers, recreational vehicles, and the like. For example, the wireless powered components, which may be installed on the external lighting system after the truck is manufactured, may include wireless powered license plate lights, wireless powered luggage lights, wireless powered brake lights, wireless powered hub lights, wireless powered embellishment lights, and the like. The stated wireless powered devices of the external lighting system of the truck may take advantage of the present invention. For example, as described above, the license plate lights of the truck may use wireless power of the present invention (as explained for the car 5502). As described above, this may provide flexibility in the manufacturing design.

Similarly, wireless power may be used in the electrical components of the external lighting system of utility trucks, tow trucks, road crew trucks, and the like. These components may be installed after the truck is manufactured. On the same pattern, wireless power may be used in the electrical components of the external lighting system of buses, which may include but may not be limited to, private buses, public buses, and the like. These components may be installed after the bus is manufactured. In like manner, wireless power may be used in the electrical components of the external lighting system of trailers, which may include but may not be limited to, commercial trailers, private trailers, and the like. These components may be installed after the trailer is manufactured. To extend the implementation, wireless power may be used in the electrical components of the external lighting system of construction vehicles, which may include but may not be limited to, cranes, forklifts, cherry pickers, bulldozers, excavators, front loaders, cement trucks, asphalt pavers, and the like. These components may be installed after the construction vehicle is manufactured.

Trunk (Cars, Trucks, Trailers, etc.)—Factory Supplied

Figure 27:
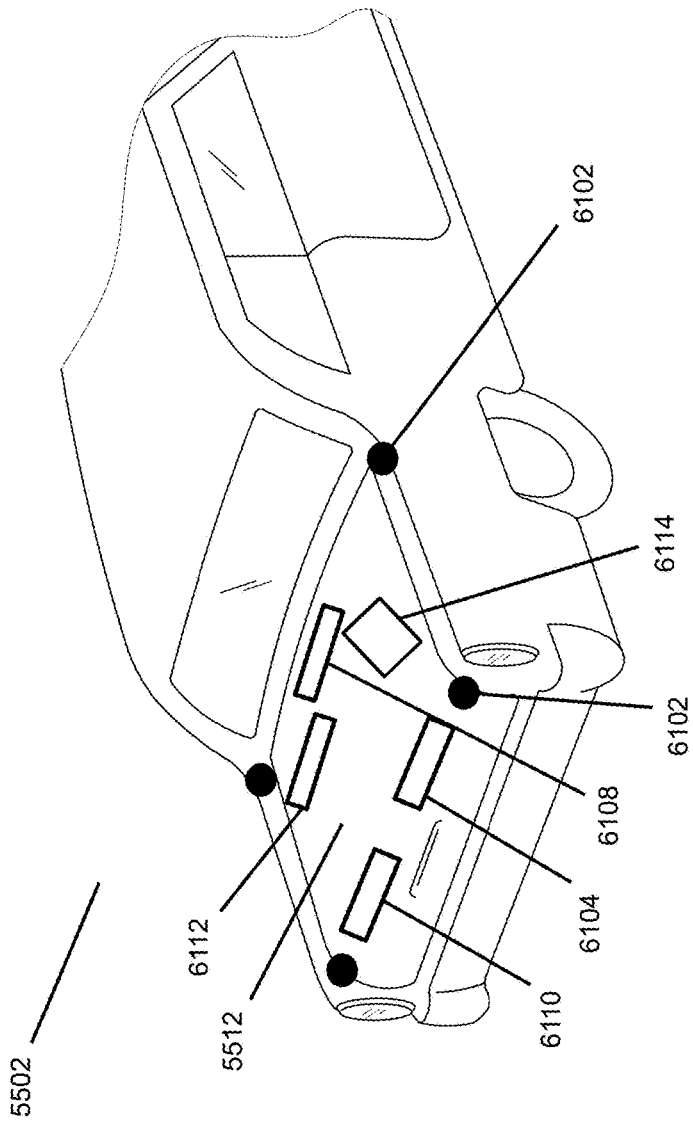
FIG. 27 depicts a plurality of wireless powered devices associated with the trunk of the car in accordance with an embodiment of the present invention.

In embodiments, referring to FIG. 27, wireless power may be utilized to provide electrical power to devices associated with the trunk 5512 of the car 5502 such that no electrical wiring may be required to bring electrical power to the electrical device from the car's primary power source.

In embodiments, electrical components associated with the trunk 5512 may take advantage of the present invention and may include wireless powered trunk door motors 6102, a wireless powered trunk locking system 6104, a wireless powered trunk lighting system 6108, wireless powered trunk electronics 6110, a wireless powered music system for the vehicle, and the like.

In embodiments, factory installed wireless energy transfer systems for energizing the trunk compartment in a vehicle may utilize one or more resonator configurations, such as type-A, type-B, type-C, type-D, and type-E resonators, or any other configuration described herein. Type-B, type-D, and type-E resonator configurations incorporate structures that shape the resonator fields away from lossy objects, and so may be particularly useful in such applications where the resonator may be in close proximity to steel portions of the body of the vehicle. Combinations of resonator types may also be incorporated into such application embodiments, providing more optimal performance for the given application. In an example, a factory installed source resonator may be installed to provide a region of wireless power within and/or around the trunk of the vehicle by wiring a type-B source resonator to the vehicle's wired electrical system and mounting the resonator within the trunk of the vehicle, where the type-B source resonator may provide shielding of the field to avoid lossy materials included in the body of the trunk. For example, the car 5502 may include a lighting system in the trunk 5512, where the type-B source resonator may provide shielding of the field to avoid lossy materials included in the trunk and surrounding environment, while creating a wireless energy zone within the truck volume. Normally, a lighting system would require a power harness connection to the main electrical power source in the car 5502. However, with wireless powered trunk lighting system 6108, there may be no need for power to be routed to the trunk 5512, thus minimizing the power harness associated with the trunk 5512.

Moreover, the wireless powered trunk lighting system 6108 may enable positioning of various lights at preferable positions within the trunk 5512. And by extending this implementation of wireless power and wireless communications to all electrical components, the automobile manufacturer may be able to completely eliminate the electrical harness from the trunk 5512. In this way, the present invention may decrease the cost, weight, and integration time associated with the harness, while providing a more reliable electrical system. In addition, wireless powered electrical trunk components may now be more modular in design, in that they may be more easily added to a vehicle, changed, upgraded, moved, removed, and the like, which may potentially increase the manufacturer's ability to accommodate customization to user needs.

It may be noted that the present invention has been explained by showing a trunk 5512 of the car 5502, but those skilled in the art would appreciate that wireless power may be used in the electrical components in the trunk of trucks, buses, jeeps, trailers, recreational vehicles, and the like. For example, the electrical components associated with the trunk of the truck may include, but may not be limited to, wireless powered trunk door motors, a wireless powered trunk locking system, a wireless powered trunk lighting system, wireless powered trunk electronics, and the like. The stated wireless powered devices of the trunk of the truck may take advantage of the present invention. For example, as described above, the trunk lighting system of the truck may use wireless power of the present invention (as explained for the car 5502). As described above, this may provide flexibility in the manufacturing design. In embodiments, the electrical components/devices present in the trunk of the truck may be company fitted.

Similarly, wireless power may be used in the electrical components of the trunk of utility trucks, tow trucks, road crew trucks, and the like. On the same pattern, wireless power may be used in the electrical components of the trunk of buses, which may include but may not be limited to, private buses, public buses, and the like. In like manner, wireless power may be used in the electrical components of the trunk of trailers, which may include but may not be limited to, commercial trailers, private trailers, and the like. To extend the implementation, wireless power may be used in the electrical components of the trunk of construction vehicles, which may include but may not be limited to, cranes, forklifts, cherry pickers, bulldozers, excavators, front loaders, cement trucks, asphalt pavers, and the like. In embodiments, all the electrical devices associated with the trunk of trucks, buses, jeeps, trailers, and recreational vehicles may be company fitted.

Trunk (Car, Trucks, Trailers, etc)—After Market Installations

In embodiments, referring to FIG. 27, some of the wireless powered devices of the trunk 5512 may be installed after the car 5502 is manufactured. These wireless powered devices may be installed based on the user's preference.

The wireless powered components associated with the trunk 5512 may be installed after the car 5502 is manufactured and may include a wireless powered extra lighting system 6112 and the like.

In embodiments, after-market wireless energy transfer systems for the trunk of a vehicle may utilize one or more resonator configurations, such as type-A, type-B, type-C, type-D, and type-E resonators, or any other configuration described herein. Type-B, type-D, and type-E resonator configurations incorporate structures that shape the resonator fields away from lossy objects, and so may be particularly useful in such applications where the resonator may be in close proximity to steel portions of the body of the vehicle. Combinations of resonator types may also be incorporated into such application embodiments, providing more optimal performance for the given application. In an example, an after-market source resonator may be installed to provide a region of wireless power within and/or around the trunk of the vehicle by wiring a type-B source resonator to the vehicle's wired electrical system and mounting the resonator within the trunk of the vehicle. For example, a user of the car 5502 may like to install extra light in the trunk of the car 5502, and the type-B source resonator may provide a zone of wireless energy within the truck such that the wireless light may be mounted anywhere within the truck compartment, where the type-B source resonator may provide shielding of the field to avoid lossy materials included in the body of the trunk. Traditionally, the user may use the services of a mechanic or a vendor to install an extra lighting system requiring a power harness connection to the main electrical power source in the car. The mechanic or the vendor may have to modify the existing wire harness of the trunk 5512 of the car 5502 to make the new installation. However, with wireless powered extra light 5834, there may be no need for power to be routed to the device, thus minimizing the power harness associated with the trunk 5512.

In addition, wireless powered trunk 5512 components/devices may now be more modular in design, in that they may be more easily added to a vehicle, changed, moved, removed, upgraded, and the like, which may potentially increase the manufacturer's ability to accommodate customization to user needs.

It may be noted that the present invention has been explained by installing some electrical components in the trunk 5512 of the car 5502, but those skilled in the art would appreciate that wireless power may be used by these installed electrical components in the trunk of trucks, buses, jeeps, trailers, recreational vehicles, and the like. For example, the wireless powered components, which may be installed in the trunk after the truck is manufactured, may include a wireless powered extra lighting system, and the like. The stated wireless powered device of the trunk of the truck may take advantage of the present invention. For example, as described above, the extra light of the truck may use wireless power of the present invention (as explained for the car 5502). As described above, this may provide flexibility in the manufacturing design.

Similarly, wireless power may be used in the electrical components of the trunk of utility trucks, tow trucks, road crew trucks, and the like. These components may be installed after the truck is manufactured. On the same pattern, wireless power may be used in the electrical components of the trunk of buses, which may include but may not be limited to, private buses, public buses, and the like. These components may be installed after the bus is manufactured. In like manner, wireless power may be used in the electrical components of the trunk of trailers, which may include but may not be limited to, commercial trailers, private trailers, and the like. These components may be installed after the trailer is manufactured. To extend the implementation, wireless power may be used in the electrical components of the trunk of construction vehicles, which may include but may not be limited to, cranes, forklifts, cherry pickers, bulldozers, excavators, front loaders, cement trucks, asphalt pavers, and the like. These components may be installed after the construction vehicle is manufactured.

Mounting—Electrical Components to the Outside of the Vehicle—Factory Supplied

Figure 28:
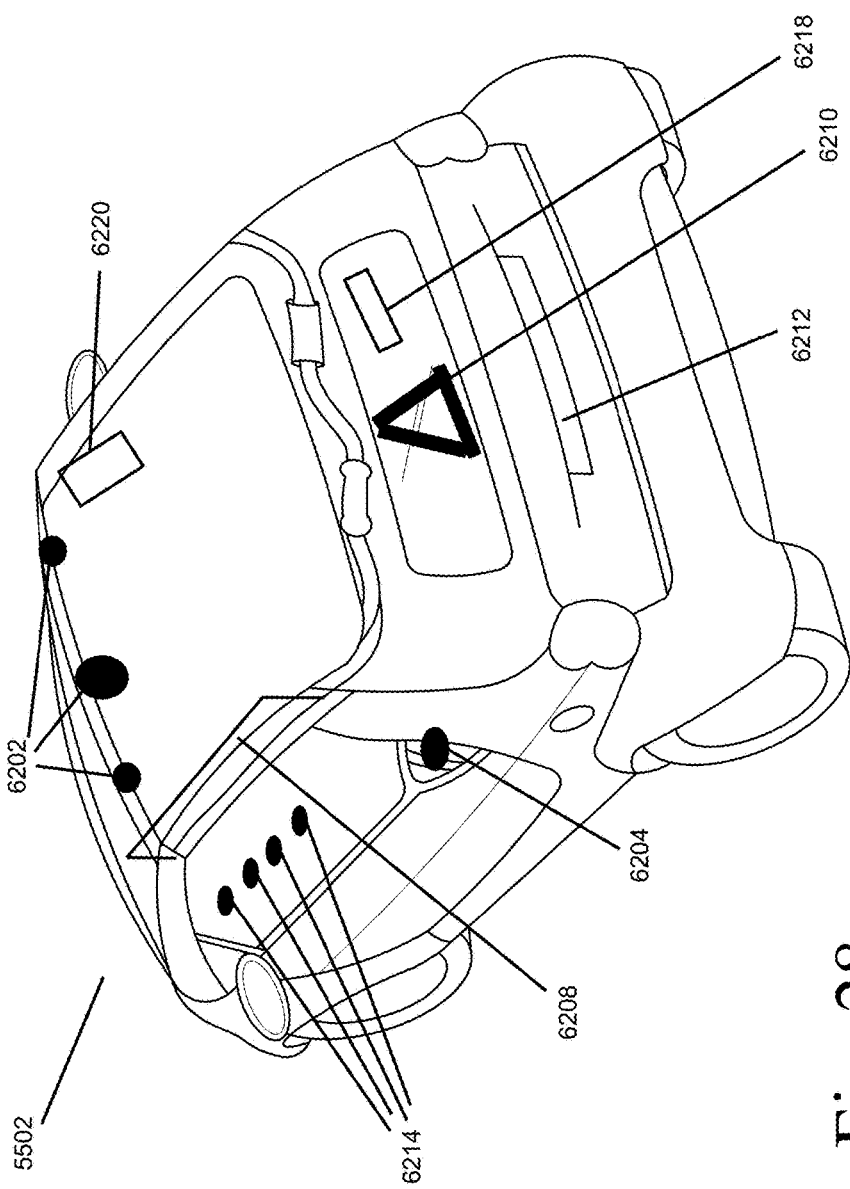
FIG. 28 depicts a plurality of wireless powered electrical mountings on the exterior to the car in accordance with an embodiment of the present invention.

In embodiments, referring to FIG. 28, wireless power may be utilized to provide electrical power to mountings associated with the car 5502 such that no electrical wiring may be required to bring electrical power to the electrical device from the car's primary power source.

In embodiments, the electrical mountings associated with the car 5502 may take advantage of the present invention, and may include wireless powered emergency lights 6202, wireless powered lighted signs 6210, wireless powered trim lights 6204, wireless powered sensors 6214 for monitoring from the inside of the vehicle, wireless powered de-icing device 6218, and the like.

In embodiments, factory installed wireless energy transfer systems for electrical components outside the vehicle may utilize one or more resonator configurations, such as type-A, type-B, type-C, type-D, and type-E resonators, or any other configuration described herein. Type-B, type-D, and type-E resonator configurations incorporate structures that shape the resonator fields away from lossy objects, and so may be particularly useful in such applications where the resonator may be in close proximity to steel portions of the body of the vehicle. Combinations of resonator types may also be incorporated into such application embodiments, providing more optimal performance for the given application. In an example, a factory installed source resonator may be installed to provide a region of wireless power around the exterior of the vehicle by wiring one or more type-B or type-D source resonators to the vehicle's wired electrical system and mounting the resonator to energize the external portions of the vehicle, where the type-B and type-D source resonators may provide shielding of the field to avoid lossy materials included in the body. For example, the car 5502 may include an emergency lighting system. Normally, an emergency lighting system would require a power harness connection to the main electrical power source in the car 5502. However, with wireless powered emergency lights 6202, there may be no need for power to be routed to it, such as by the vehicle having factory installed wireless resonators in the ceiling of the vehicle to energize the external emergency lighting system on the roof of the vehicle.

Moreover, wireless powered emergency lights 6202 may enable positioning of various lights at preferable positions within the exteriors of the car 5502. In addition, the manufacturer may not have to route power harnessing through the body of the vehicle by drilling the power harness though the car 5502 body. And by extending this implementation of wireless power and wireless communications to all electrical components, the automobile manufacturer may be able to completely eliminate the electrical harness from the electrical mountings to the exterior surface of the car 5502. In this way, the present invention may decrease the cost, weight, and integration time associated with the harness, while providing a more reliable electrical system. In addition, wireless powered electrical mountings may now be more modular in their design, in that they may be more easily added to a vehicle, changed, moved, removed, upgraded, and the like, which may potentially increase the manufacturer's ability to accommodate customization to user needs.

It may be noted that the present invention has been explained by showing mountings associated with the car 5502, but those skilled in the art would appreciate that wireless power may be used for the mountings associated with trucks, buses, jeeps, trailers, recreational vehicles, and the like. For example, the mountings associated with the truck may include, but may not be limited to, wireless powered emergency lights, wireless powered lighted signs, wireless powered trim lights, wireless powered sensors for monitoring from the inside of the vehicle, wireless powered de-icing device, and the like. The stated wireless powered devices associated with the truck may take advantage of the present invention. For example, as described above, the emergency lights of the truck may use wireless power of the present invention to fetch power for them (as explained for the car 5502). As described above, this may provide flexibility in the manufacturing design. In embodiments, the electrical mountings associated with the truck may be company fitted.

Similarly, wireless power may be used in the electrical mountings of the utility trucks, tow trucks, road crew trucks, and the like. On the same pattern, wireless power may be used in the electrical mountings of buses, which may include but may not be limited to, private buses, public buses, and the like. In like manner, wireless power may be used in the electrical mountings of trailers, which may include but may not be limited to, commercial trailers, private trailers, and the like. To extend the implementation, wireless power may be used in the electrical mountings of construction vehicles, which may include but may not be limited to, cranes, forklifts, cherry pickers, bulldozers, excavators, front loaders, cement trucks, asphalt pavers, and the like. In embodiments, all the electrical mountings associated with trucks, buses, jeeps, trailers, and recreational vehicles may be company fitted.

Mounting—Electrical Components to the Outside of the Vehicle—After Market Installation In embodiments, some of the mountings external to the car 5502, as shown in FIG. 28, may be installed after the car 5502 is manufactured. These wireless powered devices may be installed based on the user's preference.

The wireless powered components associated with the mountings may be installed after the car 5502 is manufactured and may include wireless powered advertising signs 6208, wireless powered devices applied to the outer surface of the vehicle, wireless powered entertainment devices 6220, such as a motorized device, and the like.

In embodiments, after-market wireless energy transfer systems for powering electrical components on the outside of the vehicle may utilize one or more resonator configurations, such as type-A, type-B, type-C, type-D, and type-E resonators, or any other configuration described herein. Type-B, type-D, and type-E resonator configurations incorporate structures that shape the resonator fields away from lossy objects, and so may be particularly useful in such applications where the resonator may be in close proximity to steel portions of the body of the vehicle. Combinations of resonator types may also be incorporated into such application embodiments, providing more optimal performance for the given application. In an example, an after-market source resonator may be installed to provide a region of wireless power around portions of the exterior of the vehicle by wiring one or more type-B or type-D source resonator to the vehicle's wired electrical system and mounting the resonator so as to energize electrical components on the exterior of the vehicle. Alternately, the source resonator may be fitted to plug into an electrical outlet or operate on some alternate form of energy, such as a battery, a solar cell taking energy through the glass of the vehicle, and the like. In an example, a user of the car 5502 may wish to advertise a product by installing advertising signs to the upper portion of the car 5502, where a type-B resonator may be installed on the ceiling of a vehicle, near the door of the vehicle, and the like, to energize a wireless advertising sign to the roof of the vehicle, where the type-B source resonator may provide shielding of the field to avoid lossy materials included in the ceiling. Traditionally, the user may use the services of a mechanic or a vendor to install an advertising sign requiring a power harness connection to the main electrical power source in the car. The mechanic or the vendor may have to modify the existing wire harness of the car 5502 to make the new installation. However, with wireless powered advertising signs 6208, there may be no need for power to be routed to the system, thus minimizing the power harness associated with the external mountings of the car 5502.

Moreover, the wireless powered advertising signs 6208 may be detached easily from the car 5502 as there may not be any electrical harness to restrict removal. Further, the manufacturer may not have to route power harnessing through the body of the vehicle by drilling the power harness though the car 5502 body. In addition, wireless powered electrical mountings may now be more modular in design, in that they may be more easily added to a vehicle, changed, moved, upgraded, and the like, which may potentially increase the ability to accommodate customization to user needs.

Bus Seats—Factory Supplied and After Market Installation

In embodiments, referring to FIG. 29, wireless power may be utilized to provide electrical power to devices of the seats 7000 of a commercial bus such that no electrical wiring may be required to bring electrical power to the electrical device from the truck's primary power source. This may prove advantageous for the initial design and manufacturing of the seats 7000, as it may not only reduce the weight, cost, and manufacturing time associated with the otherwise needed wire harness, but may also improve reliability due to the absence of the harness across the multiple devices/components. In addition, with the need for every electrical device/component to have an electrical harness connection eliminated, the seats manufacturer may now more easily add electrical components/devices, without affecting the layout, routing, and design of the power portion of the electrical harness.

It may be noted that the present invention has been explained by showing an exemplary seat 7000 of a commercial bus, but those skilled in the art would appreciate that wireless power may be used in seats of the private bus.

In embodiments, as shown in FIG. 29, the electrical components/devices associated with the seats 7000 that may take advantage of the present invention may include, but may not be limited to, a wireless powered auxiliary plug 7002, a wireless powered microphone, wireless powered seat motors 7004, a wireless powered storage container, a wireless powered massage device 7008, a wireless powered electronic heater 7010, a wireless powered air bag system, a wireless powered music system 7012, a wireless powered LCD, a wireless powered window operating system, wireless powered seat belts, and the like.

In embodiments, factory installed and after-market wireless energy transfer systems for a bus seat may utilize one or more resonator configurations, such as type-A, type-B, type-C, type-D, and type-E resonators, or any other configuration described herein. Type-B, type-D, and type-E resonator configurations incorporate structures that shape the resonator fields away from lossy objects, and so may be particularly useful in such applications where the resonator may be in close proximity to steel portions of the body of the vehicle. Combinations of resonator types may also be incorporated into such application embodiments, providing more optimal performance for the given application. In an example, a source resonator may be installed to provide a region of wireless power within and/or around the bus seat of the vehicle by wiring a type-B/C source resonator to the vehicle's wired electrical system and mounting the resonator to the interior or exterior back portion of the bus seat. Alternately, the source resonator may be fitted to plug into an electrical outlet or operate on some alternate form of energy, such as a battery, a solar cell taking energy through the glass of the vehicle, and the like. With the type-B/D resonator a field profile may be created that shields the field from the lossy materials of the bus seat, provides a planar field for other electrical devices mounted to the back of the bus seat, and also provides a more omni-directional field for energizing wireless devices within the area around the bus seat (e.g. mobile wireless devices of a passenger). In an example, the passenger of a commercial bus may like to get their legs massaged by using the massage device while seated in the bus seat. In the example, a normal massage device would require a power harness connection to the main electrical power source in the seats 7000. However, with the wireless powered massage device 7012 and the source resonator mounted in the bus seat, there is no need for power to be routed to it using an electrical harness, thus minimizing the power harness associated with the seats 7000 of a commercial bus.

Similarly, the wireless powered music system 7020 may reduce the electrical harness associated with the seats 7000 of a commercial bus and may provide the flexibility in the design of the seats 7000.

By extending this implementation of wireless powered and wireless communications to all electrical components, the seat manufacturer may be able to completely eliminate the electrical harness associated with the electrical devices. In this way, the present invention may decrease the cost, weight, and integration time associated with the harness, while increasing the reliability of the electrical system. In addition, the wireless powered electrical components may now be more modular in design, in that they may be more easily added to a vehicle, changed, upgraded, and the like, which may potentially increase the manufacturer's ability to customize as per user needs.

In embodiments, as shown in FIG. 29, the wireless powered devices of the seats 7000 of a commercial bus may be company fitted. In embodiments, the wireless powered devices of the seats 7000 of a commercial bus may be fitted after a commercial bus is manufactured.

Portable Devices

In embodiments, wireless power may be utilized to provide electrical power to portable devices such that no electrical wiring may be required to bring electrical power to the electrical device from the primary power source.

In embodiments, examples of the portable devices that may take advantage of this invention include but may not be limited to, a mobile phone, a lap top, a navigation database, a DVD system, a CD player system, a radio system, a mobile charger, an auxiliary plug, an electric ice cube box, an electric steam cup or any similar kind of device.

These portable devices may be used in the vehicle when required. For example, the user may wish to work on a laptop and may wish to get it charged after a certain time. Normally, the user may have to install a charging plug, such as on the dashboard 5504 of the car, in the back compartment of the car, and the like. However, with the present invention, the portable devices may be charged by wireless power, thereby reducing the need for extra equipments.

In embodiments, wireless power may be provided through factory installed wireless energy transfer systems, after-market wireless energy transfer systems, from other mobile devices brought into the vehicle by other passengers, and the like. As described herein, wireless energy may be provided from systems within the vehicle through one or more types of resonators, such as type-A, type-B, type-C, type-D, and type-E resonators, or any other configuration described herein. Type-B, type-D, and type-E resonator configurations incorporate structures that shape the resonator fields away from lossy objects, and so may be particularly useful in such applications where the resonator may be in close proximity to steel portions of the body of the vehicle. Combinations of resonator types may also be incorporated into such application embodiments, providing more optimal performance for the given application. In an example, a factory installed source resonator may be installed to provide a region of wireless power within and/or around the vehicle of the vehicle by wiring a type-E source resonator to the vehicle's wired electrical system and mounting the resonator to the ceiling of the vehicle to produce a wireless energy zone within the passenger compartment of the vehicle. The type-E source resonator may be advantageous in this application because in addition to being able to shape the field profile to avoid lossy materials in the vehicle's ceiling, the type-E resonator has the potential to be very thin, and so take up little headroom in the vehicle compartment. In embodiments, the ceiling-mounted type-E resonator may not be wired into the electrical system, but may act as a repeater for another source resonator in the vehicle. For instance, the vehicle may have come factory-equipped with a source resonator in the vicinity of the vehicle's dashboard, but it is found in a long vehicle (e.g. an SUV) the wireless energy provided to the back of the vehicle is not sufficient for some purpose, such as running a DVD player, charging a device, relaying power to a trailer or to the trunk area, or the like. To satisfy this need, the user may then install the type-E source resonator on the ceiling as a repeater so as to provide better coverage to the back seating area of the vehicle.

Similarly, the portable devices may be powered by using wireless power in other vehicles which include, but may not be limited to, the car 5502, excavator, the bulldozer, the crane, the forklift, the truck, the bus, and the like.

Trains

In embodiments, wireless power may be utilized to provide electrical power to devices associated with a train in a manner that no electrical wiring may be required to bring electrical power to the electrical devices from the train's primary power source. This may prove advantageous for the initial design and manufacturing of the train, as it may not only reduce the weight, cost, and manufacturing time associated with the otherwise needed wire harness, but may also improve reliability due to the absence of the harness across the train's electrical devices/components. In addition, having eliminated the need for every electrical device/component to have an electrical harness connection, the train manufacturer may now more easily add electrical components/devices to the various sections, without affecting the layout, routing, and design of the power portion of the electrical harness.

In embodiments, wireless power may be provided throughout the train through factory installed wireless energy transfer systems, after-market wireless energy transfer systems, from other mobile devices brought into the vehicle by other passengers, and the like. As described herein, wireless energy may be provided from systems within the vehicle through one or more types of resonators, such as type-A, type-B, type-C, type-D, and type-E resonators, or any other configuration described herein. Type-B, type-D, and type-E resonator configurations incorporate structures that shape the resonator fields away from lossy objects, and so may be particularly useful in such applications where the resonator may be in close proximity to steel portions of the body of the vehicle. Combinations of resonator types may also be incorporated into such application embodiments, providing more optimal performance for the given application. In an example, a factory installed source resonator may be installed to provide a region of wireless power within and/or around the train by wiring a type-B/D source resonator to the a train car's wired electrical system and mounting the resonator to the ceiling of the train car to produce a wireless energy zone at one end of the passenger compartment of the train car. With the type-B/D resonator a field profile may be created that shields the field from the lossy materials of the ceiling of the car, provides a planar field for other ceiling mounted resonators, and provide an omni-directional field for energizing wireless devices within that area of the car (e.g. mobile wireless devices of the passengers, lighting, audio systems). Additional type-B/D source resonators may then be mounted on the ceiling along the aisle-way as repeaters down through the remaining portion of the train car. Thus the entire car may be provided wireless energy. In embodiments, the first resonator may not need to be connected to the electrical system of the car, but receive its power from a resonator of another car, thus electrical energy may be provided from one car to the next, without additional wiring. These ceiling-mounted resonators may be retrofit to the train in an after-market configuration, or provided as part of a new design. Although the example depicts the resonators in the ceiling, it would be apparent to one skilled in the art, that many different resonator configurations may be envisioned in providing wireless energy to devices in the train, including a wide variety of wireless energy transfer applications that do not include the delivery of wireless power to a passenger, but rather help eliminate electrical distribution wiring in the train assembly.

It may be noted that the present invention may be explained by showing an exemplary train. However, those skilled in the art would appreciate that present application may be explained by using different type of trains. Examples of the types of trains in which wireless power may be used may include, but may not be limited to, freight trains, airport trains, commuter trains, and the like.

In embodiments, the train car may include, but may not be limited to, an engine, a passenger car, a cargo car, a vehicle carrier car, and the like. The electrical components/devices associated with the train may take advantage of the present invention. The electrical components associated with the train may include, but may not be limited to, wireless powered doors, wireless powered lights, wireless powered stairs, wireless powered windows, and the like.

Figure 30:
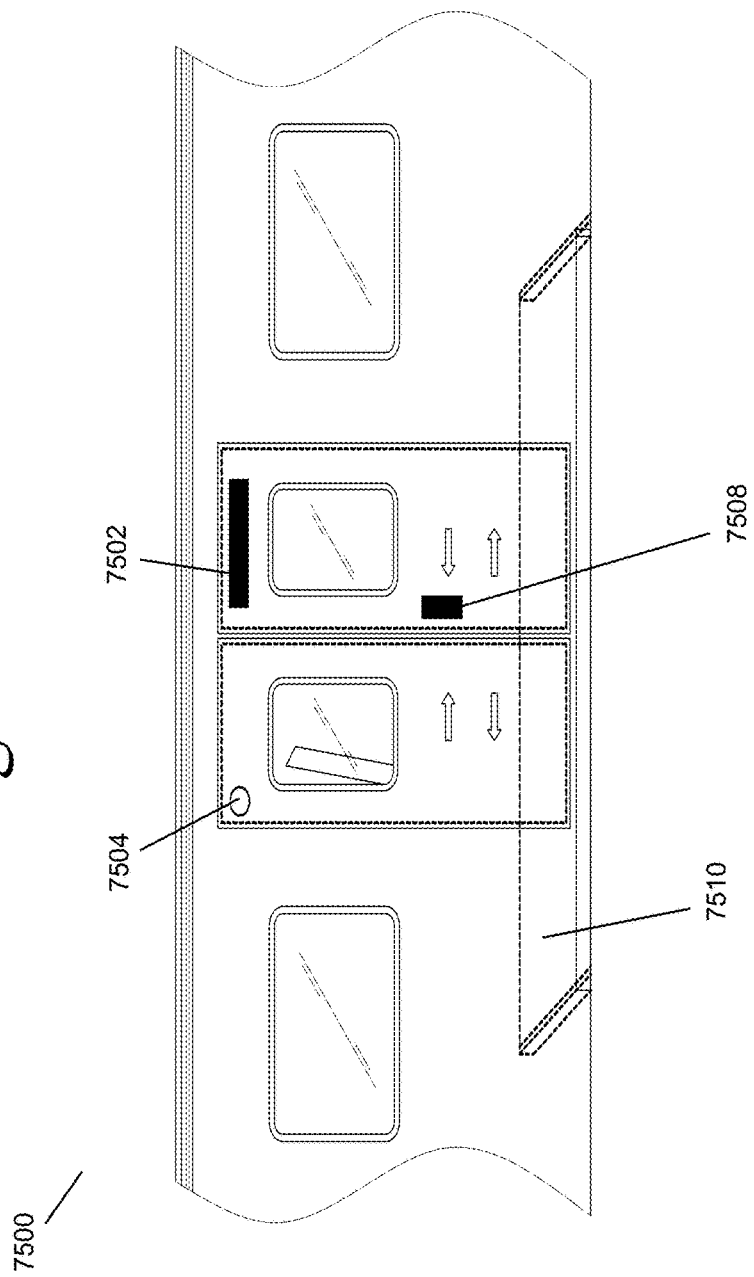
FIG. 30 depicts a plurality of wireless powered devices associated with a train in accordance with various embodiments of the present invention.

Similarly, as shown in FIG. 30, the electrical components associated with the wireless powered doors and windows of a train 7500 which may use wireless power, may include, but may not be limited to, wireless powered door motor 7502, wireless powered motion sensors 7504, a wireless powered electronic lock system 7508, a wireless powered exit walkway 7510, and the like.

Referring to FIG. 31, the electrical components associated with the exemplary passenger compartment, such as a plane, a train, and the like, which may use wireless power, may include but may not be limited to, wireless powered seats 7602, a wireless powered camera system 7604, a wireless powered video display 7608, a wireless powered refrigerator 7610, wireless powered lights 7612, wireless powered fans 7614, wireless powered blower 7618, and the like. Similarly, the electrical components associated with the wireless powered seats 7602 which may use wireless power, may include but may not be limited to, a wireless powered auxiliary plug, a wireless powered microphone, a wireless powered storage container, a wireless powered massage device, wireless powered electronic heaters, a wireless powered air bag system, a wireless powered music system, a wireless powered LCD, wireless powered seat belts, and the like. In addition, the wireless powered audio-video display 7608 may be kept at any preferable location in the passenger compartment. Also, there may not be any limitation to the number of wireless powered video displays to be placed in the passenger compartment.

By extending this implementation of wireless powered and wireless communications to all electrical components, the train manufacturer may be able to partially eliminate the electrical harness. In this way, the present invention may decrease the cost, weight, and integration time associated with the harness, while increasing the reliability of the functioning of the electrical devices. In addition, the wireless powered electrical components may now be more modular in their design, in that they may be more easily added to a vehicle, changed, upgraded, moved, removed and the like, which in turn may potentially increase the manufacturer's ability to customize the vehicle as per user needs.

It may also be noted that the wireless power of the present invention may be used in supplying power to the portable electrical devices within the compartment of the passenger compartment in a similar way as described herein for other vehicles. Example of the portable electrical devices may include, but may not be limited to, a laptop, a mobile, a DVD player, a personal digital assistant (PDA), and the like. For example, a passenger may carry a laptop in the train 7400 and may like to charge the battery of the laptop to do his work uninterruptedly. The wireless power of the present invention may charge the battery of the laptop and may reduce the need of an extra equipment/electrical plug to charge the battery. In addition, with the reduction of extra equipment and extra harness, the manufacturer may be free to flexibly design the various sections of the train 7400. Similarly, the passenger of the train 7400 may like to listen to the songs on its MP3 player. The passenger may like to charge its MP3 player at some point of time during its journey. The wireless power of the present invention may enable the charging of the MP3 player without the need of the extra electrical harness. In this way, the present invention may decrease the cost, weight, and integration time associated with the harness, while providing a more reliable electrical system.

It may be noted that wireless power of the present invention may be used in the electrical devices associated with the external lighting system of the train 7400. For example, the electrical devices of the external lighting system may include, but may not be limited to wireless powered head lights, wireless powered bogey lights, wireless powered tail lights, wireless powered anti-fog lights, wireless powered tunnel lights, and the like. Traditionally, these lights may be powered by drilling the internal portions of the train 7400. However, by using wireless power of the present invention, the use of electrical harness may be reduced.

Aircraft

In embodiments, wireless power may be utilized to provide electrical power to devices associated with an aircraft in a manner that no electrical wiring may be required to bring electrical power to the electrical devices from the aircraft's primary power source. This may prove advantageous for the initial design and manufacturing of the aircraft, as it may not only reduce the weight, cost, and manufacturing time associated with the otherwise needed wire harness, but may also improve reliability due to the absence of the harness across the aircraft's electrical devices/components. In addition, having eliminated the need for electrical device/components to have an electrical harness connection, the aircraft manufacturer may now more easily add electrical components/devices to the various sections, without affecting the layout, routing, and design of the power portion of the electrical harness. Further, a wireless power system may provide energy transfer to systems and devices from inside the aircraft to outside the aircraft without the need for a hole in the body of the aircraft.

In embodiments, wireless power may be provided throughout the airplane through factory installed wireless energy transfer systems, after-market wireless energy transfer systems, from other mobile devices brought into the vehicle by other passengers, and the like. As described herein, wireless energy may be provided from systems within the vehicle through one or more types of resonators, such as type-A, type-B, type-C, type-D, and type-E resonators, or any other configuration described herein. Type-B, type-D, and type-E resonator configurations incorporate structures that shape the resonator fields away from lossy objects, and so may be particularly useful in such applications where the resonator may be in close proximity to steel portions of the body of the vehicle. Combinations of resonator types may also be incorporated into such application embodiments, providing more optimal performance for the given application. In an example, a factory installed source resonator may be installed to provide a region of wireless power within and/or around the airplane by wiring a type-B/D source resonator to the a airplane's wired electrical system and mounting the resonator to the ceiling of the airplane to produce a wireless energy zone at one end of the passenger compartment of the airplane. With the type-B/D resonator a field profile may be created that shields the field from the lossy materials of the ceiling of the airplane, provides a planar field for other ceiling mounted resonators, and provide an omni-directional field for energizing wireless devices within that area of the airplane (e.g. mobile wireless devices of the passengers, overhead lighting, isle lighting, audio systems). Additional type-B/D source resonators may then be mounted on the ceiling along the aisle-way as repeaters down through the remaining portion of the airplane. Thus the entire airplane may be provided wireless energy. These ceiling-mounted resonators may be retrofit to the airplane in an after-market configuration, or provided as part of a new design. Although the example depicts the resonators in the ceiling, it would be apparent to one skilled in the art, that many different resonator configurations may be envisioned in providing wireless energy to devices in the airplane, including a wide variety of wireless energy transfer applications that do not include the delivery of wireless power to a passenger, but rather help eliminate electrical distribution wiring in the airplane assembly.

It may be noted that the present invention has been explained by showing an exemplary aircraft. However, those skilled in the art would appreciate that the present invention may any aircraft including, but not limited to, a military aircraft, a commercial aircraft, a general aviation aircraft, an experimental aircraft, an executive jet, a cargo aircraft, and the like.

Figure 32:
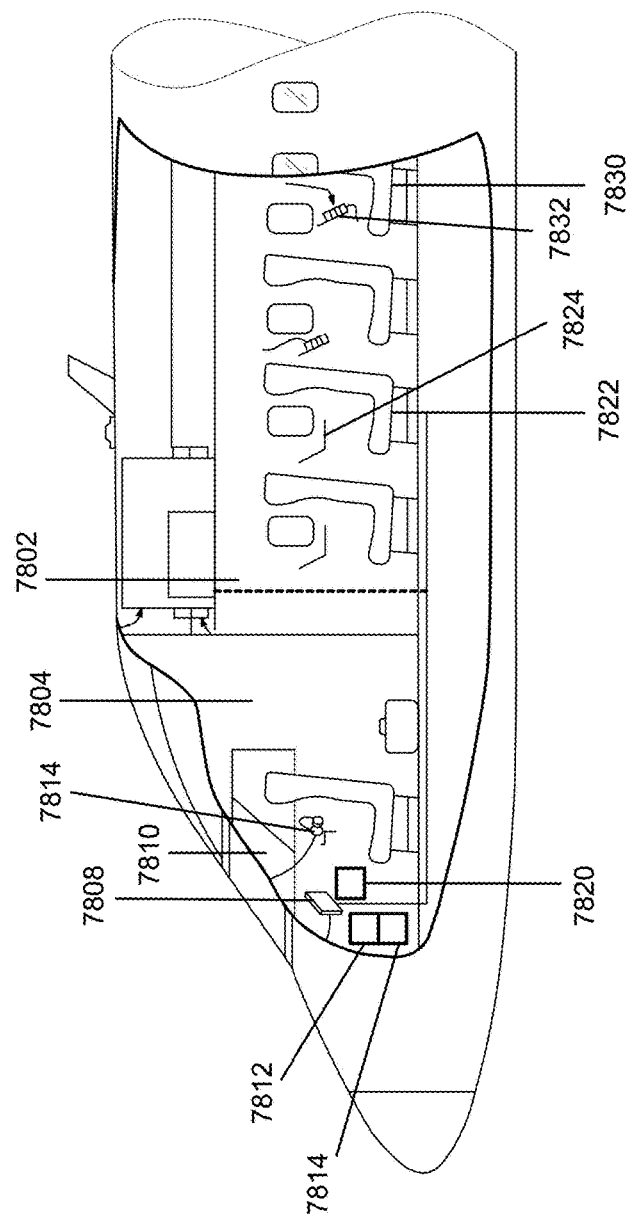
FIG. 32 depicts a plurality of wireless powered devices associated with an aircraft in accordance with various embodiments of the present invention.

In embodiments, as shown in FIG. 32, the aircraft may include, but may not be limited to, a pilot control room 7804, a passenger chamber 7802, and the like. The electrical components/devices associated with the pilot control room 7804 may take advantage of the present invention and may include, but may not be limited to, a wireless powered acoustic wind profiler system 7808, a wireless powered temperature profiler system control 7810, a wireless powered turbulence profiler system 7812, a wireless powered autorotation flight control system 7814, a wireless powered air purifier control system, a wireless powered parking brakes control system 7820, a wireless powered blade restraint control system, a wireless powered blade emergency detachment control system, a wireless powered wing camber control, and the like.

For example, the pilot of the aircraft may monitor the temperature of the body of the aircraft by using a temperature profiler system control. In the example, a traditional temperature profiler system control may require a power harness connection to the main electrical power source in the aircraft and to the upper part of the body of the aircraft. However, with the wireless powered temperature profiler system control 7810, there may be no need for power to be routed to it using electrical harness, thus minimizing the power harness associated with the aircraft.

By extending this implementation of wireless powered and wireless communications to all electrical components, the aircraft manufacturer may be able to partially eliminate the electrical harness. In this way, the present invention may decrease the cost, weight, and integration time associated with the harness, while increasing the reliability of the functioning of the electrical devices. In addition, the wireless powered electrical components may now be more modular in their design, in that they may be more easily added to a vehicle, changed, upgraded, moved, and the like, which in turn may potentially increase the manufacturer's ability to customize the vehicle as per user needs.

It may be noted that the present invention may be explained by using particular examples of wireless components within the aircraft pilot control room 7804, however those skilled in the art would appreciate that the present invention may be applicable to any of the wireless powered components associated with different sections/compartments of the pilot control room 7804.

It may also be noted that the wireless power may eliminate the need of electrical harness associated with the electrical components associated with the passenger chamber 7802. The electrical components which may take advantage of the wireless power of the present invention may include, but may not be limited to, wireless powered seats, a wireless powered camera system, a wireless powered video display, a wireless powered warning system, a wireless powered refrigerator, wireless powered lights, wireless powered fans, a wireless powered blower, and the like. Similarly, the electrical components associated with the seats which may use wireless power, may include but may not be limited to, a wireless powered auxiliary plug, a wireless powered microphone, a wireless powered storage container, a wireless powered massage device, wireless powered electronic heaters, a wireless powered air bag system, a wireless powered music system, a wireless powered LCD, wireless powered seat belts, and the like. These electrical components of the passenger chamber 7802 may decrease the cost, weight, and integration time associated with the harness, while increasing the reliability of the functioning of the overall electrical devices.

It may also be noted that the wireless power of the present invention may be used in supplying power to the portable electrical devices in the aircraft. For example, as shown in the FIG. 32, a passenger of the seat 7822 may use the laptop 7824 and may like to charge the battery of the laptop to do his work uninterruptedly. The wireless power of the present invention may charge the battery of the laptop and may reduce the need of an extra equipment/electrical plug to charge its battery. Similarly, a passenger seated on the seat 7830 may be using a mobile phone 7832 and may like to charge its battery during a long journey. The mobile phone 7832 may be charged using the wireless power of the present invention.

In a similar fashion, wireless power may be used in the electrical devices associated with the external lighting system of the aircraft of the present invention. The devices associated with the wireless powered external lighting system may not be powered by using the harness drilled through the body of the aircraft.

Water Craft

Figure 33:
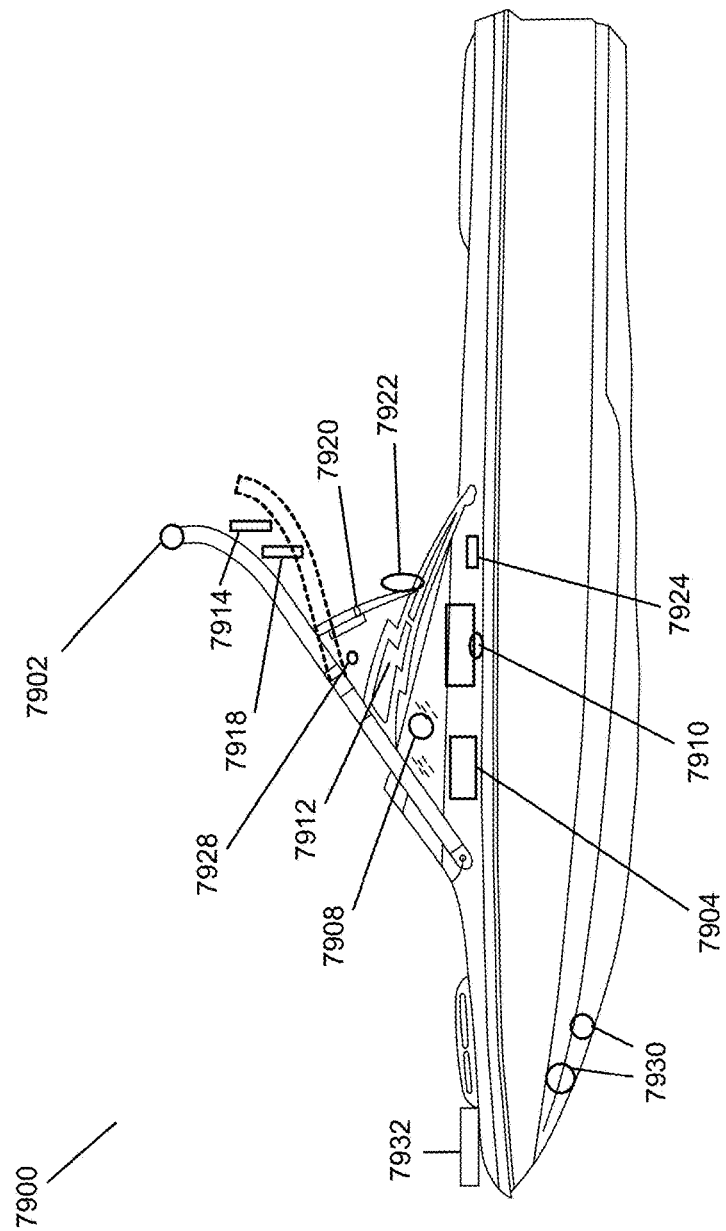
FIG. 33 depicts a plurality of wireless powered devices associated with a water craft in accordance with various embodiments of the present invention.

In embodiments, referring to FIG. 33, wireless power may be utilized to provide electrical power to devices associated with a water craft 7900 in a manner that no electrical wiring may be required to bring electrical power to the electrical devices from the water craft's primary power source. This may prove advantageous for the initial design and manufacturing of the water craft 7900, as it may not only reduce the weight, cost, and manufacturing time associated with the otherwise needed wire harness, but may also improve reliability due to the absence of the harness across the water craft's 7900 electrical devices/components. In addition, having eliminated the need for every electrical device/component to have an electrical harness connection, the 7900 manufacturer may now more easily add electrical components/devices to the various sections, without affecting the layout, routing, and design of the power portion of the electrical harness. In addition, the use of resonators may provide a more watertight electrical energy distribution system, such as by providing watertight resonator-equipped electrical components.

In embodiments, wireless power may be provided throughout the watercraft through factory installed wireless energy transfer systems, after-market wireless energy transfer systems, from other mobile devices brought into the vehicle by other passengers, and the like. As described herein, wireless energy may be provided from systems within the vehicle through one or more types of resonators, such as type-A, type-B, type-C, type-D, and type-E resonators, or any other configuration described herein. Type-B, type-D, and type-E resonator configurations incorporate structures that shape the resonator fields away from lossy objects, and so may be particularly useful in such applications where the resonator may be in close proximity to steel portions of the body of the vehicle. Combinations of resonator types may also be incorporated into such application embodiments, providing more optimal performance for the given application. In an example, type-A resonators may be used to distribute wireless power though the watercraft when the watercraft is made of substantially low lossy materials, such as fiberglass, and the like.

It may be noted that the present invention has been explained by showing an exemplary watercraft 7900. However, those skilled in the art would appreciate that the present invention may be explained by using different type of watercrafts. Examples of the type of water crafts in which wireless power may be used may include, but may not be limited to, a motor craft, speed and sports craft, personal watercraft, commercial water cruise, and the like.

In embodiments, as shown in FIG. 33, the electrical components associated with the water craft 7900 that may take advantage of the present invention, may include, but may not be limited to, a wireless powered safety signal apparatus 7902, a wireless powered loading and unloading apparatus control 7904, a wireless powered oil-spill combat control system 7908, a wireless powered braking control system 7910, a wireless powered steering control system 8012, a wireless powered navigation system 7914, a wireless powered radar 7918, a wireless powered propulsion control system 7920, wireless powered speed maneuvering controls 7922, a wireless powered saltwater intrusion prevention system 7924, a wireless powered temperature regulator 7928, a wireless powered liquid level sensor 7930, a wireless powered stabilizer 7932, and the like.

For example, the driver of the watercraft 7900 may like to stabilize it in stormy conditions by using a stabilizer. In the example, a traditional stabilizer may require a power harness connection to the main electrical power source in the watercraft 7900. However, with the wireless powered stabilizer 7932, there may be no need for power to be routed to it, thus minimizing the power harness associated with the watercraft 7900.

Similarly, a wireless powered liquid level sensor 7930 may not require a power harness connection to the main electrical power source in the watercraft 7900. In addition, wireless powered liquid level sensor 7930 may be kept at any preferable location in the bottom part of the watercraft 7900.

By extending this implementation of wireless powered and wireless communications to all electrical components, the watercraft 7900 manufacturer may be able to partially eliminate the electrical harness. In this way, the present invention may decrease the cost, weight, and integration time associated with the harness, while increasing the reliability of the functioning of the electrical devices. In addition, the wireless powered electrical components may now be more modular in their design, in that they may be more easily added to a vehicle, changed, moved upgraded, moved, removed, and the like, which in turn may potentially increase the manufacturer's ability to customize the watercraft 7900 as per user needs. Further, this may be done without regard to holes through the body of the watercraft, as the wireless power system requires no such hole.

It may be noted that the present invention may be explained by using the example of the wireless powered stabilizer 7932, and the wireless powered liquid level sensor 8030. However, those skilled in the art would appreciate that the present invention may be applicable to any of the wireless powered components associated with different sections/compartments of the watercraft 7900.

It may also be noted that the wireless power of the present invention may be used in supplying power to the portable electrical devices or recreational electrical devices in the watercraft 7900. In a similar fashion, wireless power may be used in the electrical devices associated with the external lighting system of the watercraft 7900 of the present invention. As explained in the above embodiments, the wireless powered devices associated with the external lighting system may now not be powered by using the harness drilled through the body of the watercraft 7900.

While the invention has been described in connection with certain preferred embodiments, other embodiments will be understood by one of ordinary skill in the art and are intended to fall within the scope of this disclosure, which is to be interpreted in the broadest sense allowable by law.

All documents referenced herein are hereby incorporated by reference.

What is claimed is:

1. A system for wireless energy distribution in a vehicle, the system comprising:
    a plurality of source magnetic resonators each coupled to a vehicle power source and creating a wireless power zone within the vehicle, each of the plurality of source magnetic resonators configured to generate an oscillating magnetic field at a resonant frequency to transfer power wirelessly to one or more device magnetic resonators coupled to a load, each of the one or more device magnetic resonators in wireless communication with at least one of the plurality of source magnetic resonators; and
    a power management facility in communication with the plurality of source magnetic resonators and the vehicle, wherein the power management facility coordinates power usage within the wireless power zone of the vehicle to allocate power to the one or more device magnetic resonators based on at least two modes of the vehicle, such that
        when the vehicle is in a vehicle operational mode, the power management facility adjusts the power to the one or more device magnetic resonators using a smart auto-tuning algorithm, and
        when the vehicle is in a conservation mode, the power management facility adjusts the power to the one or more device magnetic resonators to ensure the vehicle power source is never fully drained.

2. The system of claim 1, wherein the vehicle power source is a battery.

3. The system of claim 1, wherein the power management facility is built into electronics of each of the plurality of source magnetic resonators.

4. The system of claim 3, wherein the electronics of each of the plurality of source magnetic resonators includes at least one of tunable impedance matching circuits or drive frequency circuits to modulate the power supplied by the plurality of source magnetic resonators.

5. The system of claim 1, wherein the smart auto-tuning algorithm implements a power control protocol.

6. The system of claim 5, wherein the power control protocol causes at least one of the plurality of source magnetic resonators to power the one or more device magnetic resonators having the largest power draw.

7. The system of claim 5, wherein the power control protocol causes at least one of the plurality of source magnetic resonators to implement a hierarchical algorithm.

8. The system of claim 7, wherein the hierarchical algorithm prioritizes the one or more device magnetic resonators based on charges of the load of each of the one or more device magnetic resonators.

9. The system of claim 1, wherein the power management facility is built into electronics of each of the one or more device magnetic resonators.

10. The system of claim 1, further comprising a second power management facility using a second smart auto-tuning algorithm wherein the second power management facility is built into electronics of each of the plurality of source magnetic resonators.

11. The system of claim 1, further comprising a second power management facility using a second smart auto-tuning algorithm wherein the second power management facility is built into electronics of each of the one or more device magnetic resonators.

12. The system of claim 11, wherein the second power management facility detunes a first of the one or more device magnetic resonators when the first of the one or more device magnetic resonators is fully charged.

13. The system of claim 1, wherein the power management facility utilizes at least one of PMA, Qi, A4WP, or CEA protocols.

14. The system of claim 1, wherein the power management facility coordinates power usage within the wireless power zone of the vehicle to allocate power to the one or more device magnetic resonators based on an emergency mode when the vehicle power source reaches a predetermined level.

15. The system of claim 1, wherein at least one of the plurality of source magnetic resonators is arranged in at least one of a dashboard, a floor, a center console, a seat, or a cup holder of the vehicle.

16. The system of claim 1, wherein at least one of the one or more device magnetic resonators is located outside the vehicle.

17. The system of claim 1, wherein at least one of the one or more device magnetic resonators is located inside the vehicle.

18. The system of claim 1, wherein at least one of the one or more device magnetic resonators is a sensor in a tire to measure air-pressure.

* * * * *

UNITED STATES PATENT AND TRADEMARK OFFICE
CERTIFICATE OF CORRECTION

PATENT NO. : 9,744,858 B2  Page 1 of 1
APPLICATION NO. : 15/130246
DATED : August 29, 2017
INVENTOR(S) : Katherine L. Hall et al.

It is certified that error appears in the above-identified patent and that said Letters Patent is hereby corrected as shown below:

On the Title Page

Column 2 (U.S. Patent Documents), Line 1, delete "Telsa" and insert -- Tesla --

Signed and Sealed this
Fifth Day of December, 2017

Joseph Matal
*Performing the Functions and Duties of the*
*Under Secretary of Commerce for Intellectual Property and*
*Director of the United States Patent and Trademark Office*